(12) United States Patent
Shiraishi et al.

(10) Patent No.: US 12,199,114 B2
(45) Date of Patent: *Jan. 14, 2025

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Shouichirou Shiraishi, Nagasaki (JP); Takuya Maruyama, Kanagawa (JP); Shinichiro Yagi, Osaka (JP); Shohei Shimada, Tokyo (JP); Shinya Sato, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,496

(22) Filed: Oct. 10, 2023

(65) Prior Publication Data

US 2024/0038791 A1 Feb. 1, 2024

Related U.S. Application Data

(63) Continuation of application No. 18/129,383, filed on Mar. 31, 2023, now Pat. No. 12,027,540, which is a
(Continued)

(30) Foreign Application Priority Data

May 29, 2017 (JP) .................. 2017-105715
May 18, 2018 (JP) .................. 2018-095949

(51) Int. Cl.
*H01L 27/146* (2006.01)
*B60R 11/04* (2006.01)

(52) U.S. Cl.
CPC ........ *H01L 27/14607* (2013.01); *B60R 11/04* (2013.01); *H01L 27/14612* (2013.01);
(Continued)

(58) Field of Classification Search
CPC ......... H01L 27/14607; H01L 27/14612; H01L 27/14621; H01L 27/1463; H01L 27/14645
See application file for complete search history.

(56) References Cited

U.S. PATENT DOCUMENTS 11,075,236 B2  7/2021  Shiraishi et al.
11,688,747 B2  6/2023  Shiraishi et al.
(Continued)

FOREIGN PATENT DOCUMENTS

CN  102893400    1/2013
JP  2007-158109  6/2007
(Continued)

OTHER PUBLICATIONS

International Search Report prepared by the Japan Patent Office on Jul. 31, 2018 for International Application No. PCT/JP2018/020309.
(Continued)

*Primary Examiner* — Marc Anthony Armand
(74) *Attorney, Agent, or Firm* — SHERIDAN ROSS P.C.

(57) ABSTRACT

The present technology relates to a solid-state imaging device and an electronic apparatus capable of improving the accuracy of phase difference detection while suppressing degradation of a picked-up image. There is provided a solid-state imaging device including: a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of
(Continued)

pixels and an inter-pixel light blocking unit formed between the plurality of pixels protruding toward a center of the corresponding pixel in a projecting shape to form a projection portion. The present technology is applicable to, for example, a CMOS image sensor including a pixel for detecting the phase difference.

20 Claims, 70 Drawing Sheets

Related U.S. Application Data continuation of application No. 17/354,191, filed on Jun. 22, 2021, now Pat. No. 11,688,747, which is a continuation of application No. 16/486,936, filed as application No. PCT/JP2018/020309 on May 28, 2018, now Pat. No. 11,075,236.

(52) U.S. Cl.
CPC .... *H01L 27/14621* (2013.01); *H01L 27/1463* (2013.01); *H01L 27/14645* (2013.01)

(56) References Cited

U.S. PATENT DOCUMENTS

| | | | |
|---|---|---|---|
| 2013/0134536 A1 | 5/2013 | Mori et al. | |
| 2016/0099267 A1* | 4/2016 | Lee | H01L 27/14689 257/294 |
| 2016/0112614 A1 | 4/2016 | Masuda et al. | |
| 2017/0047363 A1 | 2/2017 | Choi | |
| 2017/0084651 A1 | 3/2017 | Yamaguchi | |
| 2017/0345853 A1 | 11/2017 | Kato et al. | |
| 2019/0081094 A1 | 3/2019 | Kato et al. | |
| 2023/0238404 A1 | 7/2023 | Shiraishi et al. | |

FOREIGN PATENT DOCUMENTS

| | | |
|---|---|---|
| JP | 2013030803 A | 2/2013 |
| JP | 2015106621 A | 6/2015 |
| JP | 2017-212351 | 11/2017 |
| KR | 2017-0019542 | 2/2017 |
| KR | 10-2554501 | 7/2023 |

OTHER PUBLICATIONS

Official Action (with English translation) for China Patent Application No. 202010330788.8, dated Mar. 17, 2023, 16 pages.
Official Action for U.S. Appl. No. 16/486,936, dated Dec. 18, 2020, 11 pages.
Notice of Allowance for U.S. Appl. No. 16/486,936, dated Mar. 25, 2021, 9 pages.
Official Action for U.S. Appl. No. 17/354,191, dated Oct. 6, 2022, 12 pages.
Notice of Allowance for U.S. Appl. No. 17/354,191, dated Jan. 23, 2023, 9 pages.
Notice of Allowance for U.S. Appl. No. 18/129,383, dated Jul. 20, 2023, 9 pages.

* cited by examiner

SOLID-STATE IMAGING DEVICE AND ELECTRONIC APPARATUS

CROSS REFERENCE TO RELATED APPLICATIONS

The present application is a continuation of and claims priority to U.S. patent application Ser. No. 18/129,383, filed Mar. 31, 2023, which is a continuation of and claims priority to U.S. patent application Ser. No. 17/354,191, filed on Jun. 22, 2021, now U.S. Pat. No. 11,688,747, which is a continuation of and claims priority to U.S. patent application Ser. No. 16/486,936, filed on Aug. 19, 2019, now U.S. Pat. No. 11,075,236, which is a national stage application under 35 U.S.C. 371 and claims the benefit of PCT Application No. PCT/JP2018/020309, having an international filing date of May 28, 2018, which designated the United States, which PCT application claimed the benefit of Japanese Patent Application Nos. 2017-105715, filed May 29, 2017, and 2018-095949, filed May 18, 2018, the entire disclosures of each of which are incorporated herein by reference.

TECHNICAL FIELD

The present technology relates to a solid-state imaging device and an electronic apparatus, and particularly to a solid-state imaging device and an electronic apparatus capable of improving the accuracy of phase difference detection while suppressing degradation of a picked-up image.

BACKGROUND ART

In recent years, a solid-state imaging device in which image surface phase difference detection pixels are arranged is used for increasing the speed of autofocus.

In this kind of solid-state imaging device, a method of partially blocking light by a metal film or the like is often and generally used for pupil-dividing light condensed by an on-chip lens. However, since it is difficult to use information acquired from a light-blocking pixel as information regarding a picked-up image, there is a need to use information acquired from a surrounding pixel for interpolation.

Further, such a solid-state imaging device has a disadvantage that since it is difficult to arrange the light-blocking pixels on the entire surface with respect to effective pixels, the amount of light received by the entire phase difference pixels is reduced, which reduces the accuracy of phase difference detection particularly when the amount of light is small.

As a technology for avoiding this, there is a method of performing pupil-division by embedding a plurality of photoelectric conversion devices under one on-chip lens. Such a method is used in, for example, a solid-state imaging device for a single-lens reflex camera or a camera incorporated in a smartphone (e.g., see Patent Literature 1).

CITATION LIST

Patent Literature

Patent Literature 1: Japanese Patent Application Laid-open No. 2002-165126

DISCLOSURE OF INVENTION

Technical Problem

Meanwhile, in a solid-state imaging device including two photoelectric conversion devices located immediately below a single on-chip lens, an output of one photoelectric conversion device is mixed with an output of the other photoelectric conversion device, which reduces the accuracy of phase difference detection in some cases.

As a technology for avoiding this, providing a physical separation unit between two photoelectric conversion devices is conceivable. However, particularly in the case where it is in focus, this separation unit interferes with photoelectric conversion in the photoelectric conversion device, which reduces the sensitivity. In addition, light scattering occurs in this separation unit, which deteriorates the spectral characteristics. As a result, the image quality of a picked-up image may be reduced.

The present technology has been made in view of the above circumstances to make it possible to improve the accuracy of phase difference detection while suppressing degradation of a picked-up image.

Solution to Problem

A solid-state imaging device according to an aspect of the present technology is a solid-state imaging device, including: a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

In a solid-state imaging device according to an aspect of the present technology, a pixel array unit is provided, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

A solid-state imaging device according to an aspect of the present technology is a solid-state imaging device, including: a pixel array unit, a plurality of pixels being two-dimensionally arranged in the pixel array unit, one photoelectric conversion device being formed in each of the plurality of pixels, the pixel array unit including pixels arranged with respect to one on-chip lens, a part of at least one of an inter-pixel separation unit formed between pixels constituting the pixels arranged with respect to the one on-chip lens and an inter-pixel light blocking unit formed between the pixels constituting the pixels arranged with respect to the one on-chip lens protruding toward a center of the pixels arranged with respect to the one on-chip lens in a projecting shape to form a projection portion.

In solid-state imaging device according to an aspect of the present technology, a pixel array unit is provided, a plurality of pixels being two-dimensionally arranged in the pixel array unit, one photoelectric conversion device being formed in each of the plurality of pixels, the pixel array unit including pixels arranged with respect to one on-chip lens, a part of at least one of an inter-pixel separation unit formed between pixels constituting the pixels arranged with respect to the one on-chip lens and an inter-pixel light blocking unit formed between the pixels constituting the pixels arranged with respect to the one on-chip lens protruding toward a center of the pixels arranged with respect to the one on-chip lens in a projecting shape to form a projection portion.

An electronic apparatus according to an aspect of the present technology is an electronic apparatus, including: a solid-state imaging device including a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

In a solid-state imaging device mounted on an electronic apparatus according to an aspect of the present technology, a pixel array unit is provided, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

Advantageous Effects of Invention

According to an aspect of the present technology, it is possible to improve the accuracy of phase difference detection while suppressing degradation of a picked-up image.

It should be noted that the effect described here is not necessarily limitative and may be any effect described in the present disclosure.

MODE(S) FOR CARRYING OUT THE INVENTION

Hereinafter, embodiments of the present technology will be described with reference to the drawings. Note that descriptions will be made in the following order.

1. Configuration of Solid-state Imaging Device
2. Prerequisite Technology
3. Embodiments of Present Technology
   (1) First Embodiment: Structure in which Projection Portion Is Provided in Inter-pixel Si Separation (Basic Structure)
   (2) Second Embodiment: Structure in which Projection Portion Is Provided in Inter-pixel Light Blocking
   (3) Third Embodiment: Structure in which Projection Portion Is Provided in Inter-pixel Si Separation and Inter-pixel Light Blocking
   (4) Fourth Embodiment: Structure in which Projection Portion Is Formed For R, G, or B Pixel
   (5) Fifth Embodiment: Structure in which Length of Projection Portion Is Adjusted
   (6) Sixth Embodiment: Structure in which Length of Projection Portion Is Adjusted for Each Pixel
   (7) Seventh Embodiment: Structure in which Elliptical On-chip Lens Is Used
   (8) Eighth Embodiment: Structure in which Plurality of Pixels Are Arranged with respect to Single On-chip Lens
   (9) Ninth Embodiment: Structure in which Physical Separation Is Performed from Surface Opposite to Light Incident Side
   (10) Tenth Embodiment: Structure in which Fixed Charge Amount Is Changed between Central Portion of PD and Other Portions
   (11) Eleventh Embodiment: Structure in which Central Portion of PDs of Same Colors Is Low Refractive Area and Central Portion of PDs of Different Colors Is Metal Area
   (12) Twelfth Embodiment: Structure in Which OCL Is Formed of Plurality of Types of Substances Having Different Refractive Indexes
   (13) Thirteenth Embodiment: Structure in which Vertical Transistor Is Formed In Central Portion of PDs of Same Colors
4. Circuit Configuration of Pixel
5. Modified Example
6. Configuration of Electronic Apparatus
7. Usage Example of Solid-state Imaging Device
8. Configuration Example of Stacked-type Solid-state Imaging Device to which Technology according to Present Disclosure Can Be Applied
9. Application Example to Moving Body

1. Configuration of Solid-state Imaging Device (Configuration Example of Solid-State Imaging Device)

Figure 1:
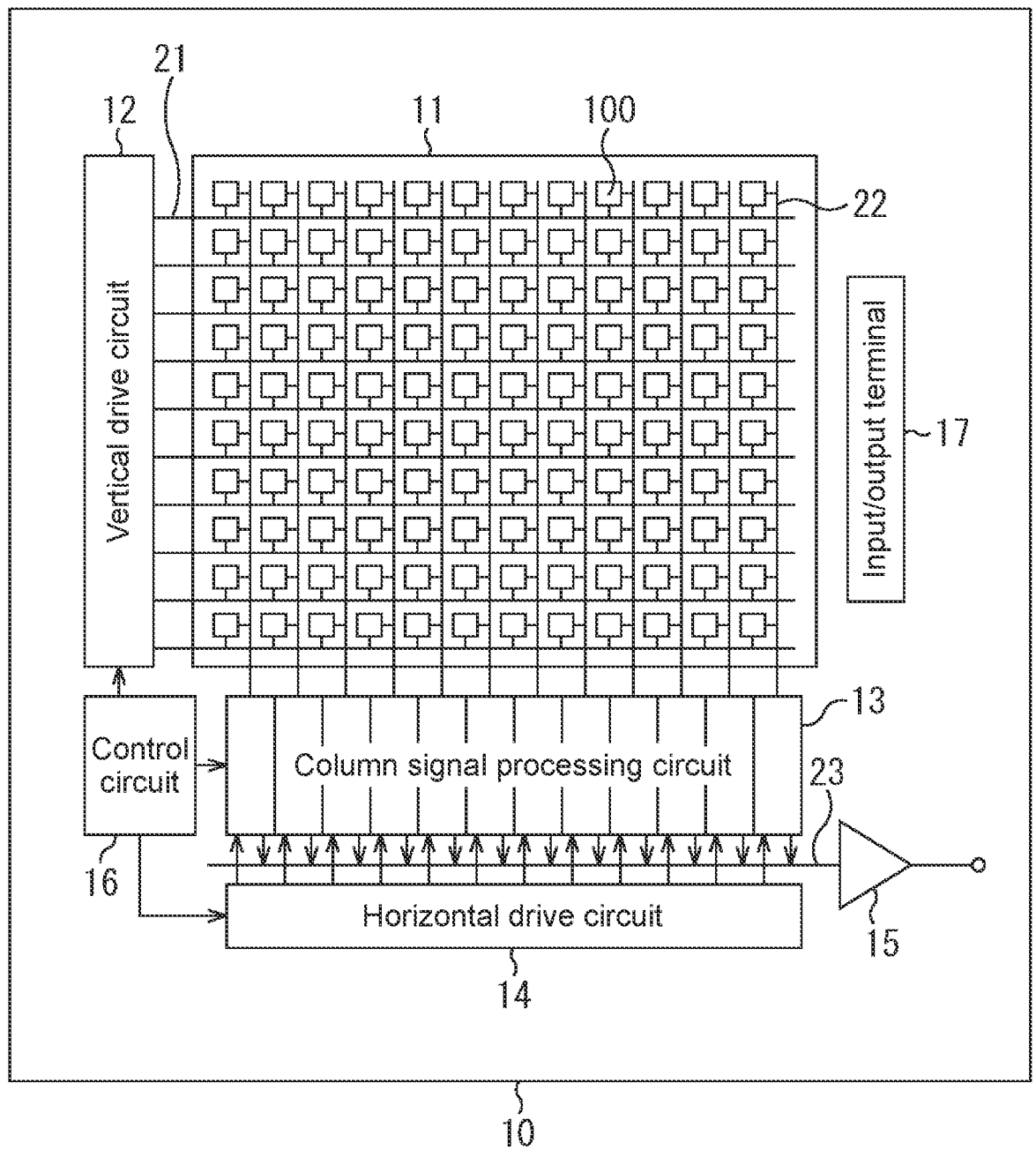
FIG. 1 is a diagram showing a configuration example of a solid-state imaging device to which an embodiment of the present technology is applied.

FIG. 1 is a diagram showing a configuration example of a solid-state imaging device to which an embodiment of the present technology is applied.

A CMOS image sensor 10 shown in FIG. 1 is an example of a solid-state imaging device using a CMOS (Complementary Metal Oxide Semiconductor). The CMOS image sensor 10 captures incident light (image light) from an object via an optical lens system (not shown), converts the light amount of the incident light imaged on an imaging surface into an electric signal on a pixel-by-pixel basis, and outputs the electric signal as a pixel signal.

In FIG. 1, the CMOS image sensor 10 includes a pixel array unit 11, a vertical drive circuit 12, a column signal processing circuit 13, a horizontal drive circuit 14, an output circuit 15, a control circuit 16, and an input/output terminal 17.

Note that in the following description, as the pixels to be arranged in the pixel array unit 11, a pixel 200, a pixel 300, a pixel 400, and a pixel 500 in addition to a pixel 100 will be described.

In the pixel array unit 11, a plurality of pixels 100 are arranged two-dimensionally (in a matrix pattern). The plurality of pixels 100 each include a photodiode (PD) as a photoelectric conversion device, and a plurality of pixel transistors. For example, the plurality of pixel transistors include a transfer transistor, a reset transistor, an amplification transistor, and a selection transistor.

The vertical drive circuit 12 includes, for example, a shift register, selects a predetermined pixel drive line 21, supplies a pulse for driving the pixels 100 to the selected pixel drive line 21, and drives the pixels 100 row by row. Specifically, the vertical drive circuit 12 sequentially selects and scans each pixel 100 in the pixel array unit 11 in the vertical direction row by row, and supplies a pixel signal based on the signal charge (charge) generated depending on the amount of received light in the photoelectric conversion device of each pixel 100 to the column signal processing circuit 13 through a vertical signal line 22.

The column signal processing circuit 13 is arranged for each column of the pixels 100, and performs, for each pixel column, signal processing such as noise removal on signals output from the pixels 100 in one row. For example, the column signal processing circuit 13 performs signal processing such as correlated double sampling (CDS) for removing fixed pattern noise unique to the pixel and AD (Analog Digital) conversion.

The horizontal drive circuit 14 includes, for example, a shift register, sequentially selects each of the column signal processing circuits 13 by sequentially outputting a horizontal scanning pulse, and causes each of the column signal processing circuits 13 to output a pixel signal to a horizontal signal line 23.

The output circuit 15 performs signal processing on the signal sequentially supplied from each of the column signal processing circuits 13 through the horizontal signal line 23, and outputs the processed signal. Note that the output circuit 15 performs, for example, only buffering, or black level adjustment, column variation correction, various types of digital signal processing, and the like in some cases.

The control circuit 16 controls the operation of the respective units of the CMOS image sensor 10.

Further, the control circuit 16 generates a clock signal and a control signal, which are used as the reference of the operation of the vertical drive circuit 12, the column signal processing circuit 13, the horizontal drive circuit 14, and the like, on the basis of a vertical synchronous signal, a horizontal synchronous signal, and a master clock signal. The control circuit 16 outputs the generated clock signal and control signal to the vertical drive circuit 12, the column signal processing circuit 13, the horizontal drive circuit 14, and the like.

The input/output terminal 17 transmits/receives signals to/from the outside.

The CMOS image sensor 10 in FIG. 1 configured as described above is a CMOS image sensor called a column AD method in which the column signal processing circuits 13 that perform CDS processing and AD conversion processing are arranged for each pixel column. Further, the CMOS image sensor in FIG. 1 may be, for example, a backside irradiation type CMOS image sensor.

2. Prerequisite Technology (Structure of Pixel)

Figure 2:
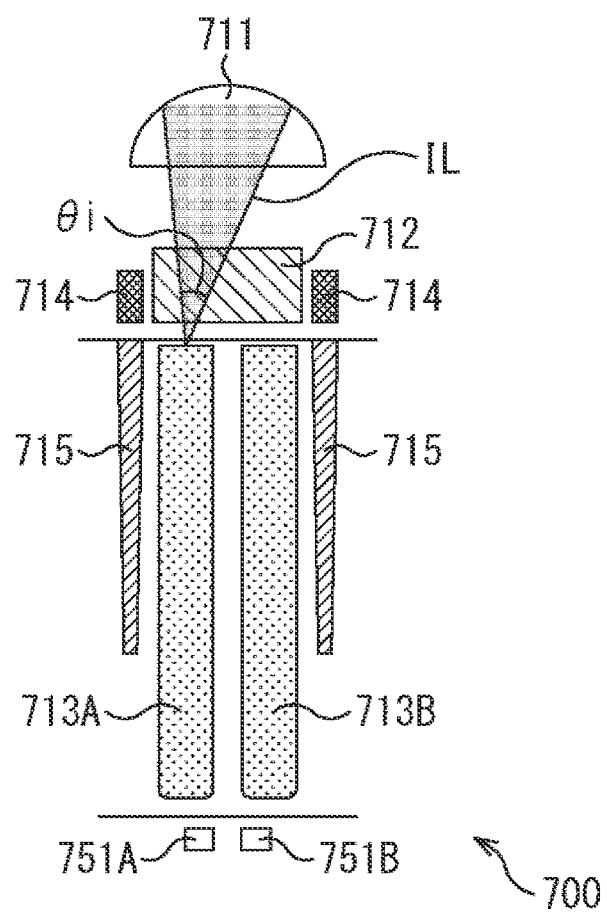
FIG. 2 is a cross-sectional view showing a structure of a pixel including two photoelectric conversion devices located immediately below one on-chip lens.

FIG. 2 is a cross-sectional view showing a structure of a pixel 700 including two photoelectric conversion devices 713A and 713B located immediately below one on-chip lens 711. Note that the pixel 700 includes a color filter 712, an inter-pixel light blocking unit 714, an inter-pixel separation unit 715, and transfer gates 151A and 151B in addition to the on-chip lens 711 and the photoelectric conversion devices 713A and 713B.

In FIG. 2, the pixel 700 has a structure in which two photoelectric conversion devices of the photoelectric conversion device 713A and the photoelectric conversion device 713B are provided with respect to the one on-chip lens 711. Note that in the following description, such a structure will be referred to also as the 2PD structure.

In the pixel 700, an incident light IL condensed by the on-chip lens 711 is transmitted through the color filter 712, and applied to a photoelectric conversion area of the photoelectric conversion device 713A or the photoelectric conversion device 713B.

In the example of FIG. 2, the incident light IL is intensively applied to the photoelectric conversion area of the photoelectric conversion device 713A in accordance with an incidence angle θi of the incident light IL. At this time, ideally, when the output of the photoelectric conversion device 713A is represented by 100, the output of the photoelectric conversion device 713B should be 0. However, actually, a certain amount of output is performed from the photoelectric conversion device 713B.

Figure 3:
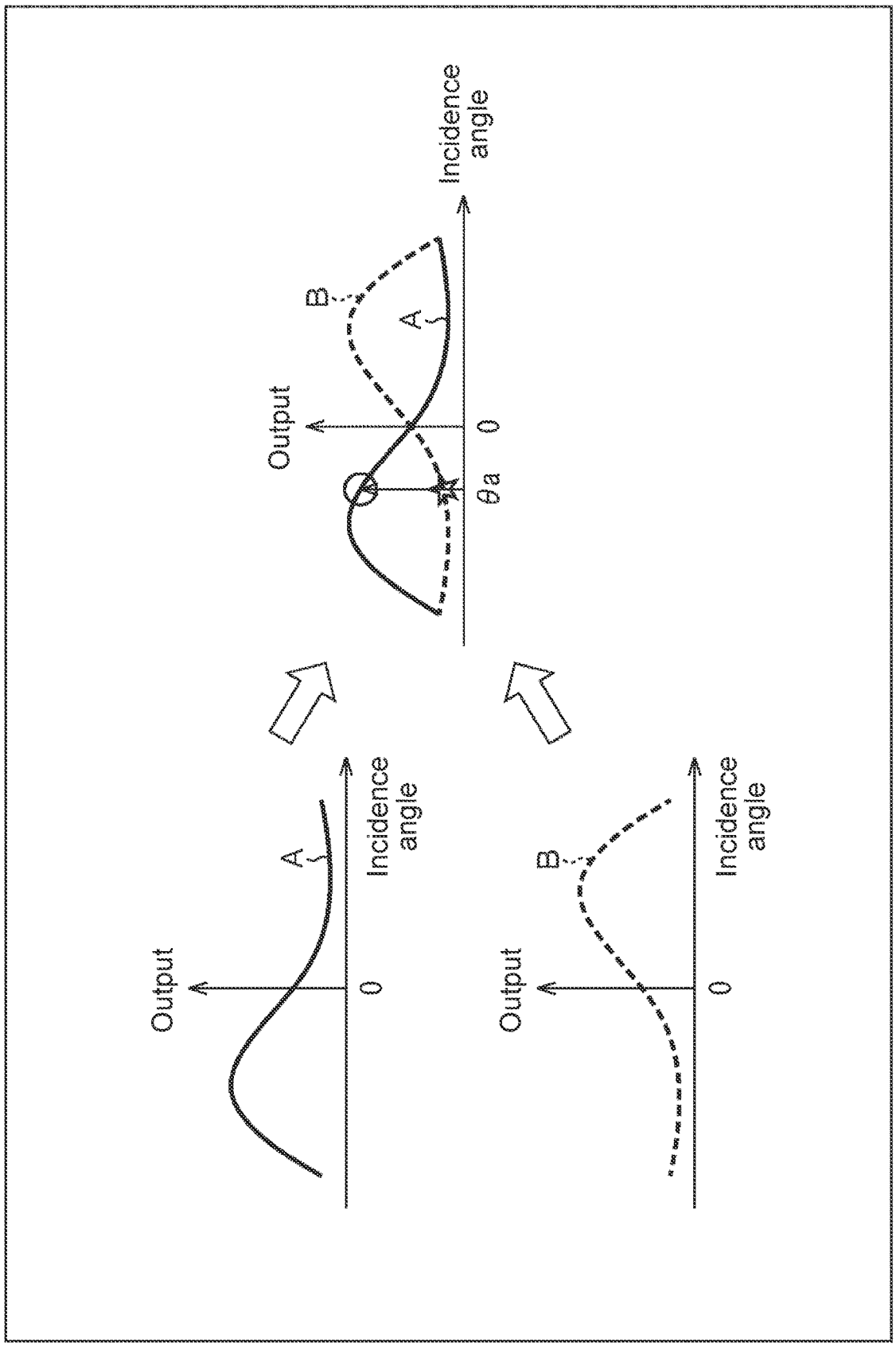
FIG. 3 is a diagram showing an output result depending on an incidence angle of light for each photoelectric conversion device.

FIG. 3 shows an output result depending on the incidence angle θi of light for each photoelectric conversion device 713. In FIG. 3, the output of the photoelectric conversion device 713A is represented by a solid line curve A, and the output of the photoelectric conversion device 713B is represented by a dotted line curve B.

In FIG. 3, the output values in the curve A depending on the output of the photoelectric conversion device 713A and the curve B depending on the output of the photoelectric conversion device 713B match in the case where the incidence angle θi is 0 degrees, i.e., light is incident from directly above. That is, the curve A and the curve B have a symmetrical relationship with the output when the incidence angle θi=0 as the symmetrical axis.

With such a relationship, for example, in the case where the incident light IL is intensively applied to the photoelectric conversion area of the photoelectric conversion device 713A shown in FIG. 2, an increase in not only the output of the photoelectric conversion device 713A but also the output of the photoelectric conversion device 713B results in reduction of the accuracy of phase difference detection. For example, focusing on an incidence angle θa in FIG. 3, not only the output of the photoelectric conversion device 713A but also the output of the photoelectric conversion device 713B is performed.

That is, although the photoelectric conversion device 713A and the photoelectric conversion device 713B are used in pairs for phase difference detection, mixing of the output of one photoelectric conversion device 713 (713A or 713B) with the output of the other photoelectric conversion device 713 (713B or 713A) results in reduction of the detection accuracy.

Now, as a structure for preventing the output of one photoelectric conversion device 713 from mixing with the output of the other photoelectric conversion device 713, a structure in which a physical separation unit is formed between the photoelectric conversion device 713A and the photoelectric conversion device 713B formed in a silicon (Si) layer will be considered.

Figure 4:
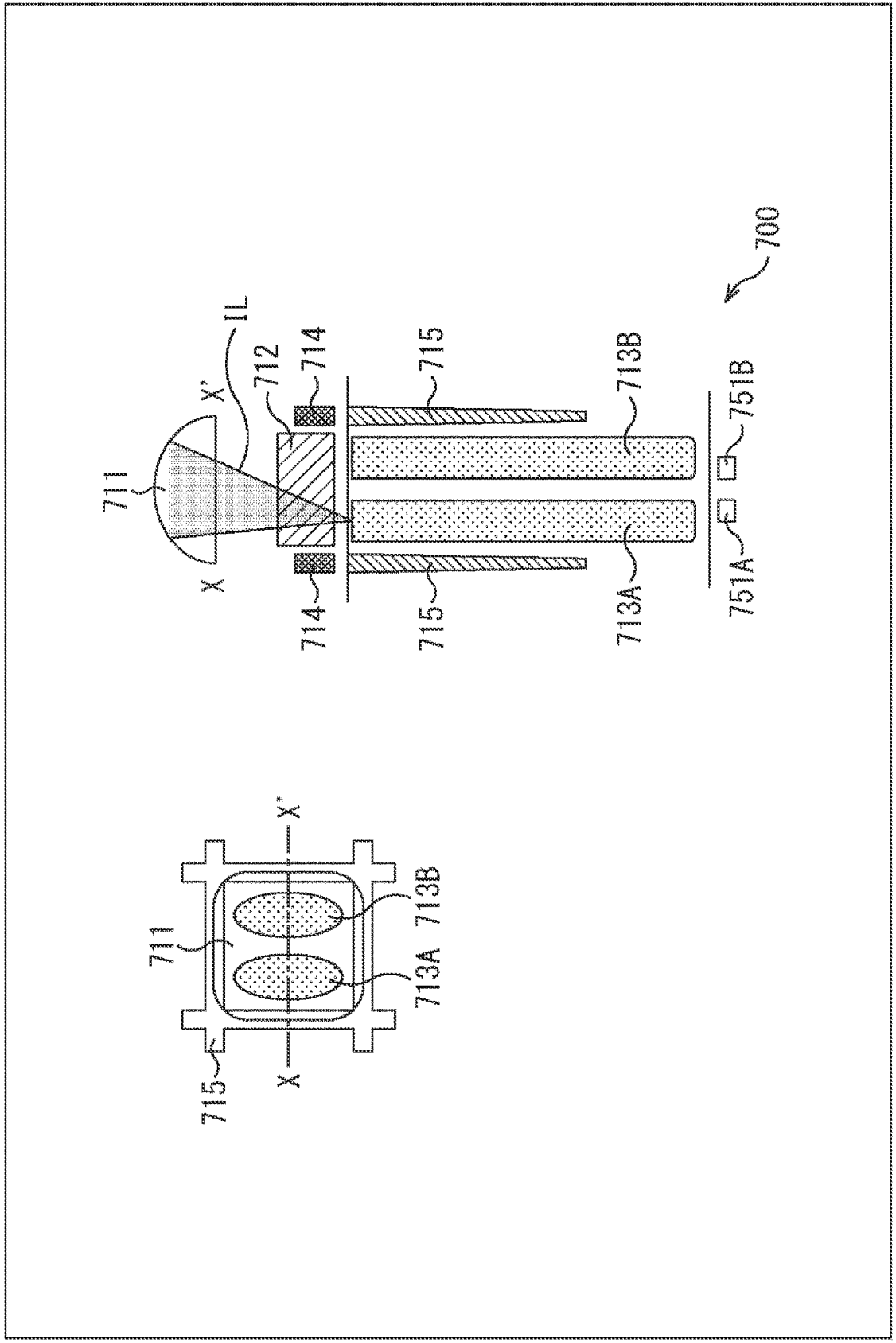
FIG. 4 is a diagram showing a structure of a pixel including two photoelectric conversion devices located immediately below one on-chip lens.

Specifically, the pixel 700 having the 2PD structure corresponding to FIG. 2 is shown in FIG. 4, and the inter-pixel light blocking unit 714 and the inter-pixel separation unit 715 are formed but no physical separation unit is formed between the photoelectric conversion device 713A and the photoelectric conversion device 713B as shown in the plan view or X-X' cross-sectional view.

Figure 5:
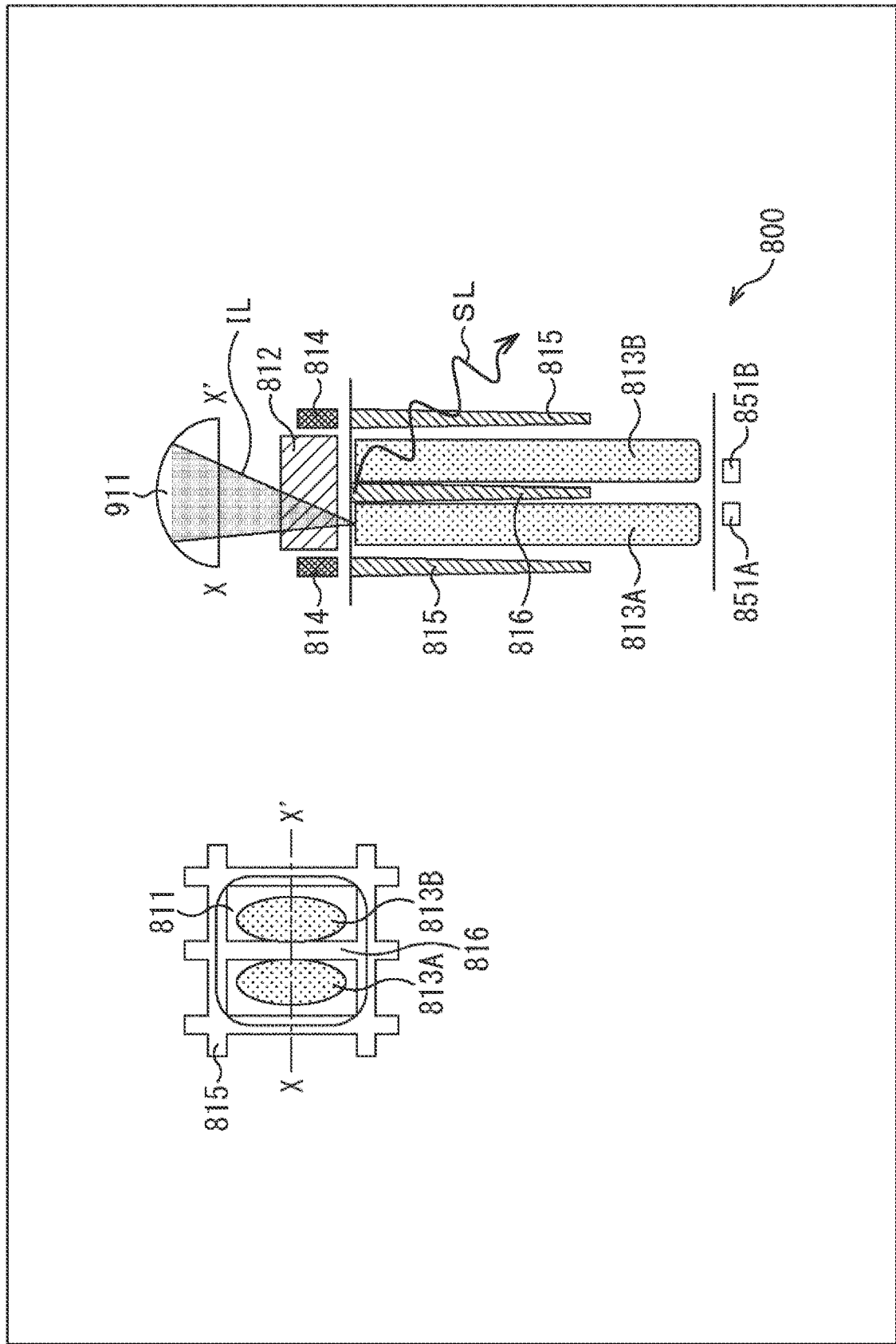
FIG. 5 is a diagram showing a structure of a pixel for improving the accuracy of phase difference detection.

Meanwhile, in FIG. 5, a pixel 800 in which a physical separation unit is provided between photoelectric conversion devices is shown. In the pixel 800 shown in FIG. 5, an inter-device separation unit 816 is formed in a silicon layer between a photoelectric conversion device 813A and a photoelectric conversion device 813B, and the photoelectric conversion device 813A and the photoelectric conversion device 813B are physically separated from each other.

Since the inter-device separation unit 816 is formed in the pixel 800 having the 2PD structure as described above, it is possible to improve the accuracy of phase difference detection by preventing the output of one photoelectric conversion device 813 (813A or 813B) from mixing with the output of the other photoelectric conversion device 813 (813B or 813A).

However, in the case where the inter-device separation unit 816 is formed in the pixel 800 shown in FIG. 5, particularly when it is in focus, the inter-device separation unit 816 may interfere with photoelectric conversion in a photoelectric conversion area of the photoelectric conversion device 813A or the photoelectric conversion device 813B, which reduces the sensitivity. In addition, it is shown that light scattering ("SL" in FIG. 5) occurs in the inter-device separation unit 816, which deteriorates the spectral characteristics, and thus, the image quality of a picked-up image is reduced.

3. Embodiments of Present Technology

Next, a structure of the pixel 100 to which an embodiment of the present technology will be described. Note that after describing a structure of a general pixel 900 with reference to FIG. 6 to FIG. 8 for comparison, the structure of the pixel 100 to which an embodiment of the present technology will be described with reference to FIG. 9 to FIG. 62.

(Structure of General Pixel)

Figure 6:
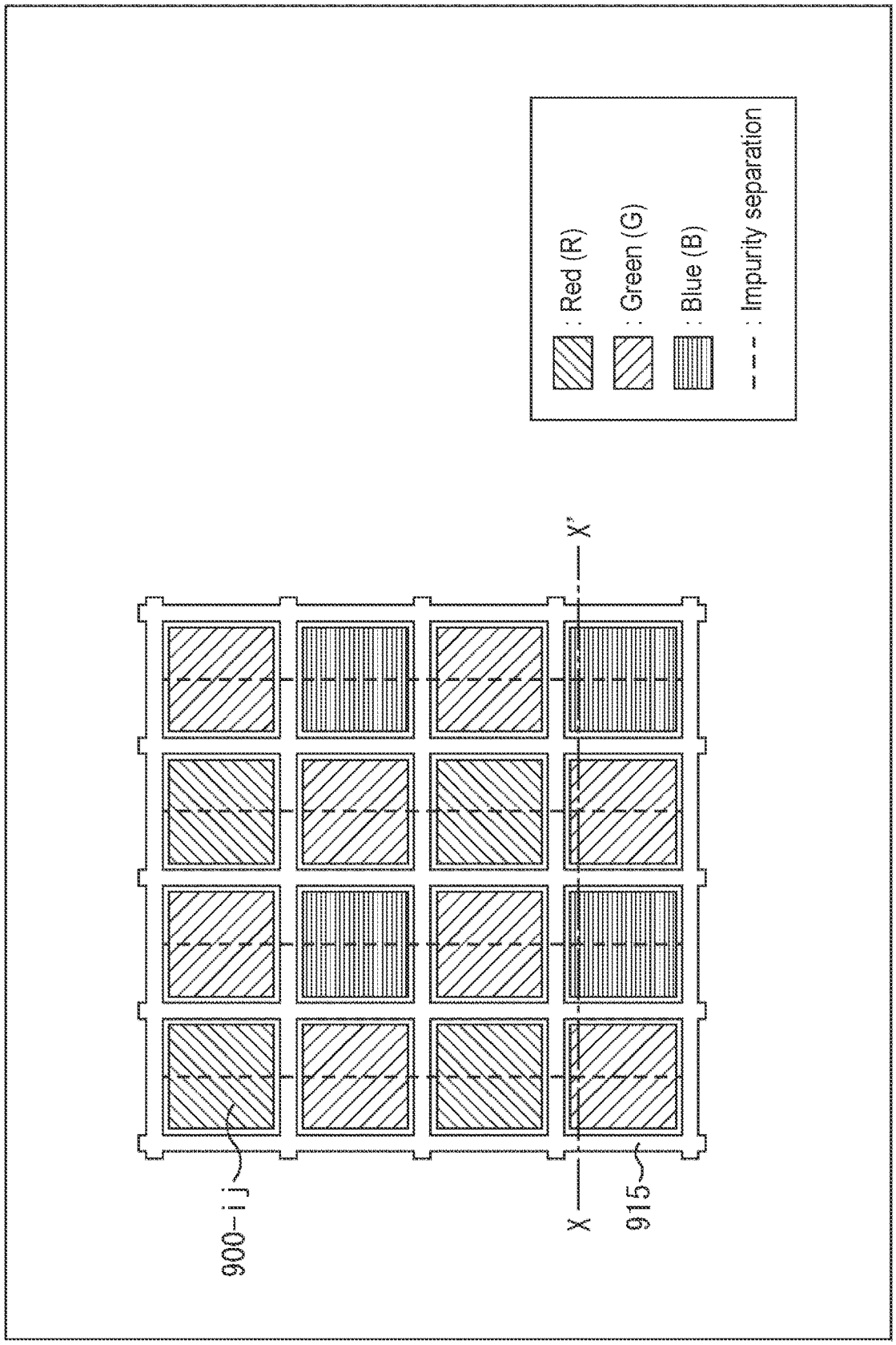
FIG. 6 is a diagram showing a plane layout of a general pixel.

First, a structure of the general pixel 900 will be described with reference to FIG. 6 to FIG. 8. FIG. 6 is a diagram showing a plane layout of the general pixel 900. Note that the pixel 900 includes an on-chip lens 911, a color filter 912, photoelectric conversion device 913A and 913B, an inter-pixel light blocking unit 914, an inter-pixel separation unit 915, and transfer gates 951A and 951B.

In FIG. 6, the pixels 900 in four rows and four columns arranged in a partial area among a plurality of pixels 900 arranged two-dimensionally (in a matrix pattern) in a pixel array unit are shown as a typical example. Further, in FIG. 6, i-rows and j-columns of the pixels 900 arranged in the pixel array unit are represented by pixel 900-*ij*.

In this pixel array unit, the plurality of pixels 900 are two-dimensionally arranged in a Bayer pattern. Note that the Bayer pattern represents an arrangement pattern in which green (G) pixels are arranged in a checkered pattern, and red (R) pixels and blue (B) pixels are alternately arranged for each line in the remaining area.

Note that in the following description, a pixel in which an R color filter that causes red (R) wavelength components to be transmitted therethrough is provided as a color filter and charges corresponding to light of R components are obtained from light transmitted through the R color filter will be referred to as R pixel. Further, a pixel in which charges corresponding to light of G components are obtained from light transmitted through a G color filter that causes green (G) wavelength components to be transmitted therethrough will be referred to as G pixel. Further, a pixel in which charges corresponding to light of B components are obtained from light transmitted through a B color filter that causes blue (B) wavelength components to be transmitted therethrough will be referred to as B pixel.

In the pixel array unit, each of the pixels 900 is a square unit pixel having the 2PD structure, and the pixels 900 are physically separated in the silicon layer by the inter-pixel separation unit 915 arranged in a square lattice. Note that although not shown in FIG. 6, in this pixel array unit, the inter-pixel light blocking unit 914 is arranged in a square lattice similarly to the inter-pixel separation unit 915.

Further, since each of the pixels 900 has the 2PD structure, a photoelectric conversion area of the photoelectric conversion device 913A and a photoelectric conversion area of the photoelectric conversion device 913B are formed in the silicon layer. These photoelectric conversion areas are separated by an impurity in the silicon layer as shown by dotted lines in the column direction in FIG. 6.

Figure 7:
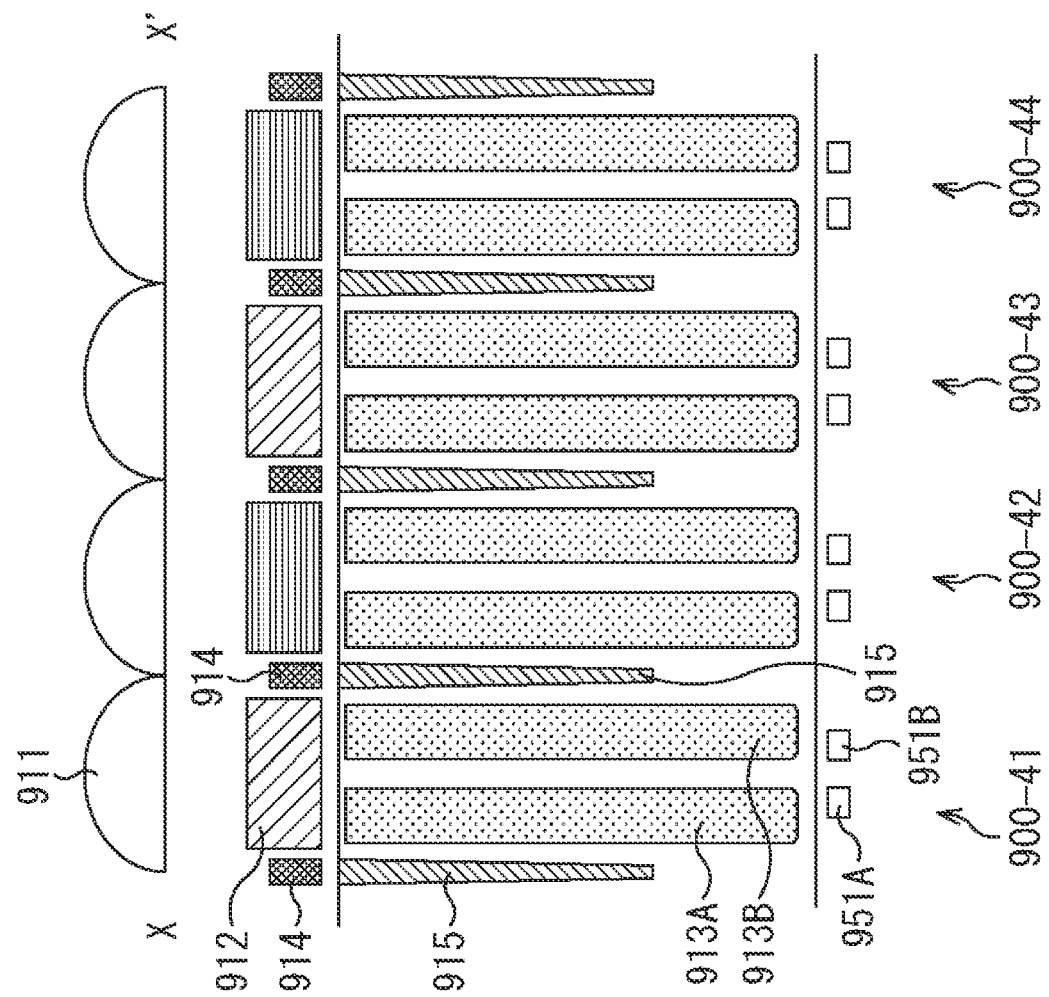
FIG. 7 is a cross-sectional view showing a structure of a general pixel.

The X-X' cross section in the plan view shown in FIG. 6 can be represented by the cross-sectional view shown in FIG. 7. Note that assumption is made that the upper left pixel 900 in the pixel arrangement in four rows and four columns shown in FIG. 6 is a pixel 900-11 in this example. Therefore, the pixels 900 shown in the X-X' cross section are four pixels of a G pixel 900-41, a B pixel 900-42, a G pixel 900-43, and a B pixel 900-44.

In FIG. 7, the G pixel 900-41 has the 2PD structure including the photoelectric conversion device 913A and the photoelectric conversion device 913B. In the photoelectric conversion device 913A, charges corresponding to light of G components are generated from light that is condensed by the on-chip lens 911 and transmitted through the G color filter 912. Further, in the photoelectric conversion device 913B, charges corresponding to light of G components are generated, similarly to the photoelectric conversion device 913A.

In the G pixel 900-43, charges corresponding to light of G components are generated by the photoelectric conversion device 913A and the photoelectric conversion device 913B, similarly to the G pixel 900-41. Further, in the B pixel 900-42 and the B pixel 900-44, charges corresponding to light of B components are generated by the photoelectric conversion device 913A and the photoelectric conversion device 913B.

The charges generated by the photoelectric conversion device 913A and the photoelectric conversion device 913B in each pixel 900 in this way are read via the transfer gate 951A and the transfer gate 951B, and used as information regarding phase difference detection.

Figure 8:
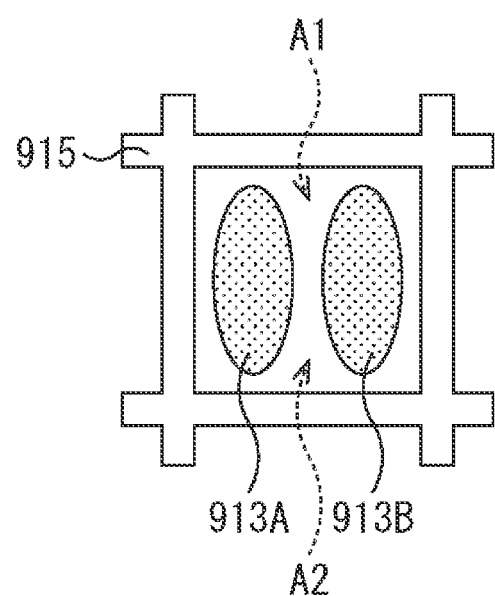
FIG. 8 is a diagram describing an N-type potential in a silicon layer of a general pixel.

FIG. 8 is a plan view of a surface (light incident surface) of the pixel 900 on the light incident side, and an N-type potential in the silicon layer is shown. Specifically, in the pixels 900 physically separated by the inter-pixel separation unit 915 formed in a square lattice, the photoelectric conversion area of the photoelectric conversion device 913A and the photoelectric conversion area of the photoelectric conversion device 913B are formed as N-type areas, and areas other than these photoelectric conversion areas are formed as P-type areas.

In the pixel 900 having such a structure, since charges are not stored in the P-type area other than the photoelectric conversion area, which of the photoelectric conversion device 913A and the photoelectric conversion device 913B charges generated in the P-type area move to is unknown. Note that in the N-type photoelectric conversion area, when considering the cross section thereof, since the concentration is higher as it is closer to the transfer gate 951, the concentration is low on the side of the light incident surface. Therefore, in the photoelectric conversion area, charges generated on the side of the light incident surface in which the N-type concentration is low are difficult to draw.

Specifically, in FIG. 8, since the contribution of isolation between the photoelectric conversion devices in P-type areas A1 and A2 is low, it is desired to separate the photoelectric conversion device 913A and the photoelectric conversion device 913B.

In the case of only providing a physical separation unit (inter-device separation unit 816 in FIG. 5) between the photoelectric conversion device 913A and the photoelectric conversion device 913B, the image quality of a picked-up image is reduced as described above.

In this regard, the technology according to the present disclosure (present technology) makes it possible to improve the accuracy of phase difference detection while suppressing degradation of a picked-up image by providing a projection portion that protrudes from the inter-pixel separation unit or the inter-pixel light blocking unit in a projecting shape with respect to the P-type areas A1 and A2 to divide the destination of charges generated in the P-type area.

Hereinafter, the specific content of the present technology will be described with a first embodiment to a ninth embodiment. First, a structure in which a projection portion is provided will be described in the first embodiment to the ninth embodiment, and then, other structure will be described in the tenth embodiment to the thirteenth embodiment.

(1) First Embodiment (Plane Layout of Pixel)

Figure 9:
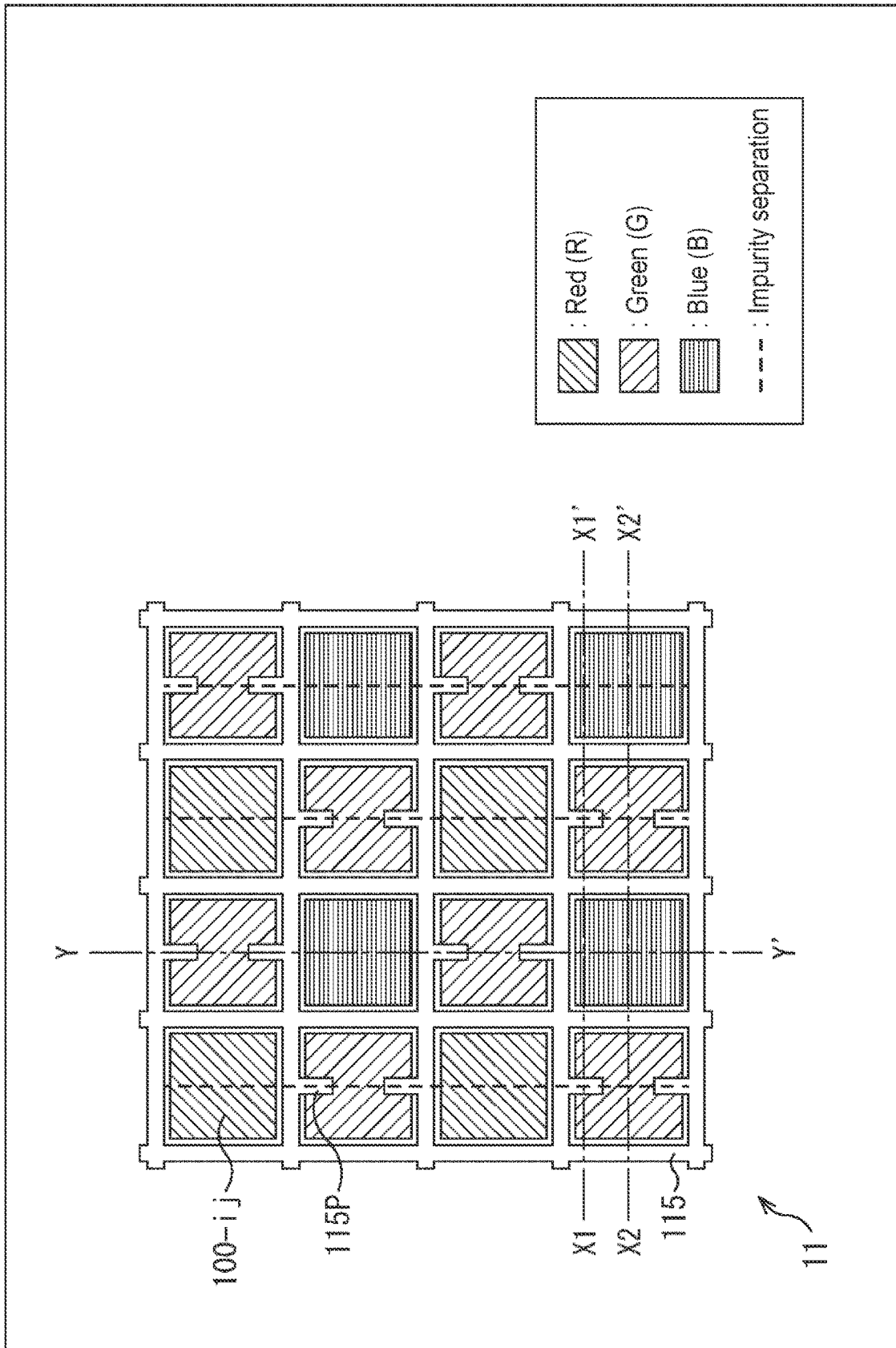
FIG. 9 is a diagram showing a plane layout of a pixel in a first embodiment.

FIG. 9 is a diagram showing a plane layout of the pixels 100 in a first embodiment.

In FIG. 9, pixels 100 in four rows and four columns arranged in a partial area among the plurality of pixels 100 two-dimensionally arranged in the pixel array unit 11 are shown as a typical example. In the pixel array unit 11, the plurality of pixels 100 are two-dimensionally arranged in a Bayer pattern. Since each of the pixels 100 has a 2PD structure, the pixel 100 can be used for both a pixel for acquiring an image and a pixel for detecting a phase difference.

Further, in FIG. 9, i-rows and j-columns of the pixels 100 arranged in the pixel array unit 11 are represented by pixel 100-ij. Note that this representation applies to other embodiments to be described later.

In the pixel array unit 11, each of the pixels 100 is a square unit pixel having the 2PD structure, and the pixels 100 are physically separated in a silicon layer (semiconductor layer) by an inter-pixel separation unit 115 arranged in a square lattice.

Note that with respect to G pixels 100 among the pixels 100 arranged in the pixel array unit 11, a part of the inter-pixel separation unit 115 is formed to protrude toward the center of the corresponding pixel 100 in a projecting shape. In the following description, this protruding portion in a projecting shape will be represented as projection portion 115P.

For example, assuming that the upper left pixel 100 in the pixel arrangement in four rows and four columns in the pixel array unit 11 shown in FIG. 9 is a pixel 100-11, the G pixels 100 for which the projection portion 115P is formed are a G pixel 100-12, a G pixel 100-14, a G pixel 100-21, a G pixel 100-23, a G pixel 100-32, a G pixel 100-34, a G pixel 100-41, and a G pixel 100-43.

Figure 10:
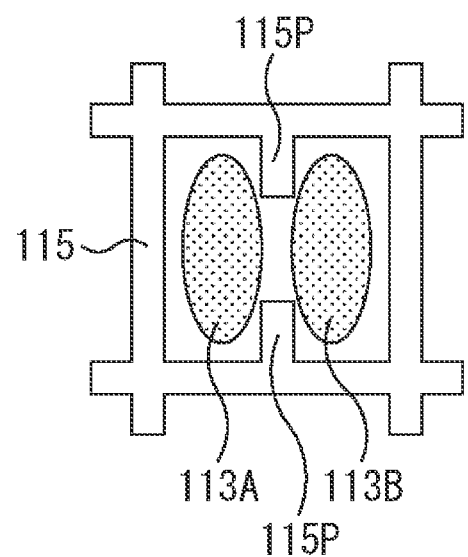
FIG. 10 is a diagram describing an N-type potential in a silicon layer of the pixel in the first embodiment.

Specifically, in these G pixels 100, a part of the inter-pixel separation unit 115 protrudes toward the center of the corresponding G pixel 100 in a projecting shape to form the projection portion 115P. Note that as shown in FIG. 10, the area in which the projection portion 115P is formed corresponds to the P-type areas A1 and A2 in which the contribution of isolation between the photoelectric conversion devices is low in FIG. 8.

Since the destination of charges generated in the P-type areas is divided by forming the projection portion 115P that projects in a projecting shape from the inter-pixel separation unit 115 in two areas corresponding to the P-type areas A1 and A2, it is possible to achieve improvement in the accuracy of phase difference detection while suppressing reduction of the sensitivity or increase in color mixture.

Further, since the G pixel 100 has the 2PD structure, a photoelectric conversion area of a photoelectric conversion device 113A and a photoelectric conversion area of a photoelectric conversion device 113B are formed in a silicon layer. These photoelectric conversion areas are separated by an impurity in the silicon layer as shown by dotted lines in the column direction in FIG. 9. That is, a physical separation unit (inter-device separation unit 816 in FIG. 5) is not formed at the center of the G pixel 100 that performs pupil-division, and the photoelectric conversion areas are separated by the impurity distribution in the silicon layer.

Figure 11:
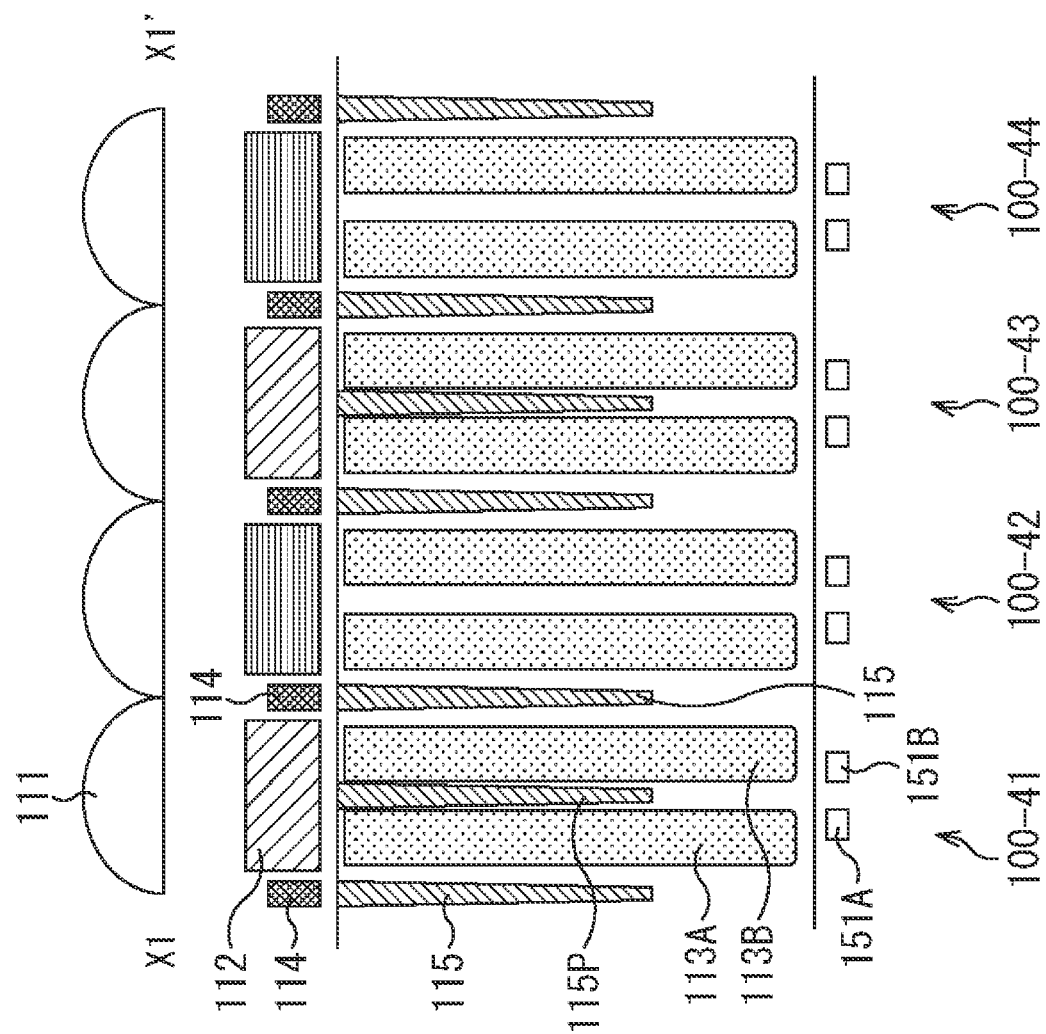
FIG. 11 is a first cross-sectional view showing a structure of the pixel in the first embodiment.

An X1-X1' cross section in the plan view of FIG. 9 can be represented by a cross-sectional view shown in FIG. 11. Note that also in this example, assuming that the upper left pixel 100 in the pixel arrangement in four rows and four columns is the pixel 100-11, the pixels 100 shown in the X1-X1' cross section are four pixels of the G pixel 100-41, a B pixel 100-42, the G pixel 100-43, and a B pixel 100-44.

In FIG. 11, the G pixel 100-41 has the 2PD structure including the photoelectric conversion device 113A and the photoelectric conversion device 113B. In the photoelectric conversion device 113A, charges corresponding to light of G components are generated from light that is condensed by an on-chip lens 111 and transmitted through a G color filter 112. Further, in the photoelectric conversion device 113B, charges corresponding to light of G components are generated, similarly to the photoelectric conversion device 113A.

In the G pixel 100-43, charges corresponding to light of G components are generated by the photoelectric conversion device 113A and the photoelectric conversion device 113B, similarly to the G pixel 100-41. Further, in the B pixel 100-42 and the B pixel 100-44, charges corresponding to light of B components are generated by the photoelectric conversion device 113A and the photoelectric conversion device 113B.

The charges generated by the photoelectric conversion device 113A and the photoelectric conversion device 113B in each pixel 100 in this way are read via the transfer gate 151A and the transfer gate 151B, and used as information regarding phase difference detection.

Note that each of the pixels 100-41 to 100-44 is a square unit pixel having the 2PD structure, and light is blocked between the adjacent pixels by an inter-pixel light blocking unit 114 arranged in a square lattice. The inter-pixel light blocking unit 114 is formed of a material such as metals including tungsten (W) and aluminum (Al), and arranged in the area between the on-chip lens 111 and the silicon layer in which a photoelectric conversion area is formed.

Further, in the pixels 100-41 to 100-44, the adjacent pixels in the silicon layer are physically separated by the inter-pixel separation unit 115 arranged in a square lattice. Specifically, in this example, for example, the inter-pixel separation unit 115 is formed by embedding, from the surface of the light incident side (light incident surface, e.g., back side), a material such as an oxidized film and a metal in a trench formed in a square lattice corresponding to the shape of the square unit pixel in the silicon layer in which a photoelectric conversion area is formed, by using a DTI (Deep trench Isolation) technology.

In the G pixel 100-41 and the G pixel 100-43, the projection portion 115P is formed between the photoelectric conversion device 113A and the photoelectric conversion device 113B. Specifically, in the G pixel 100-41 and the G pixel 100-43 shown in FIG. 11, a part of the inter-pixel separation unit 115 protrudes toward the center of the corresponding G pixel 100 in a projecting shape to form the projection portion 115P.

Figure 12:
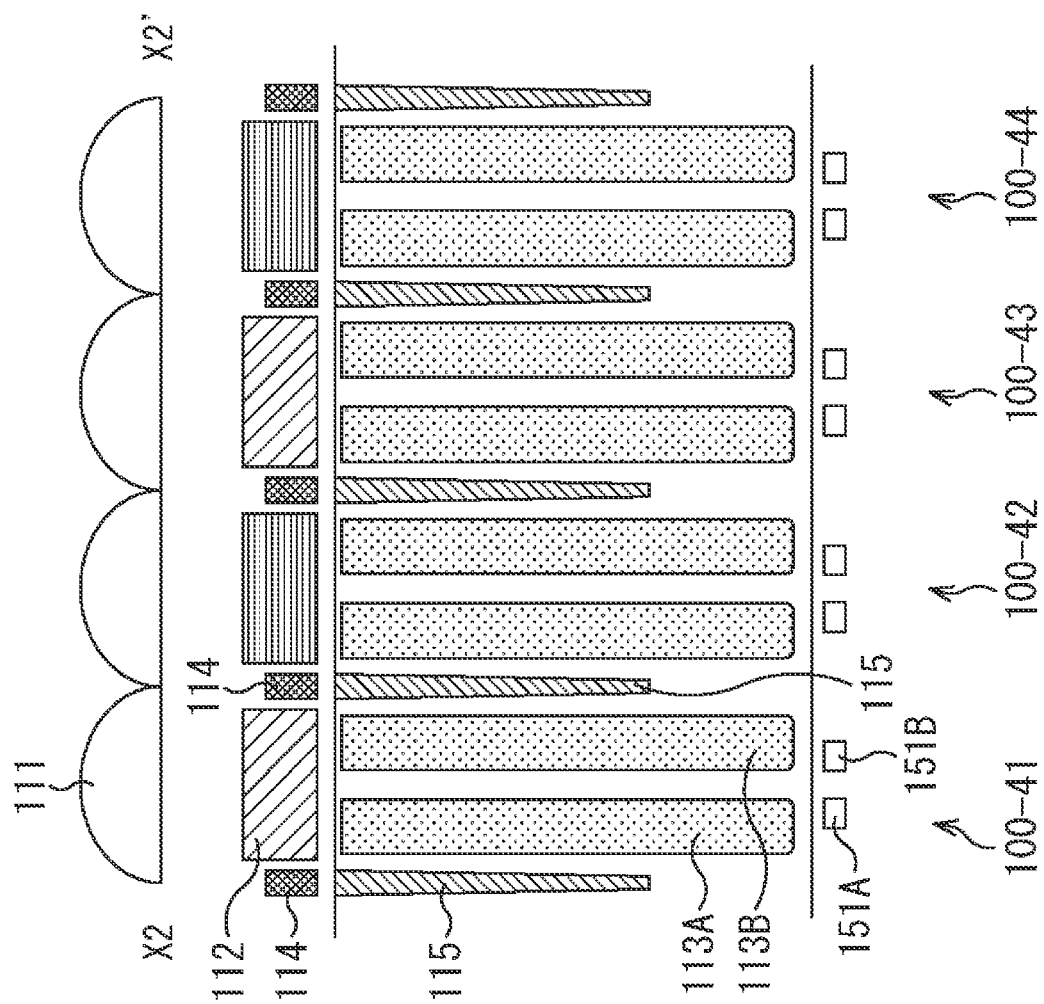
FIG. 12 is a second cross-sectional view showing the structure of the pixel in the first embodiment.

Further, an X2-X2' cross section in the plan view shown in FIG. 9 can be represented by a cross-sectional view shown in FIG. 12. Note that in FIG. 12, the pixels shown in the X2-X2' cross section are the G pixel 100-41, the B pixel 100-42, the G pixel 100-43, and the B pixel 100-44, similarly to FIG. 11.

Since the X2-X2' cross section is a cross section including the center of the G pixel 100, it does not include no projection portion 115P that protrudes toward the center of the corresponding G pixel 100 in a projecting shape. Specifically, in the G pixel 100-41 and the G pixel 100-43 shown in FIG. 12, no projection portion 115P is formed between the photoelectric conversion device 113A and the photoelectric conversion device 113B.

Figure 13:
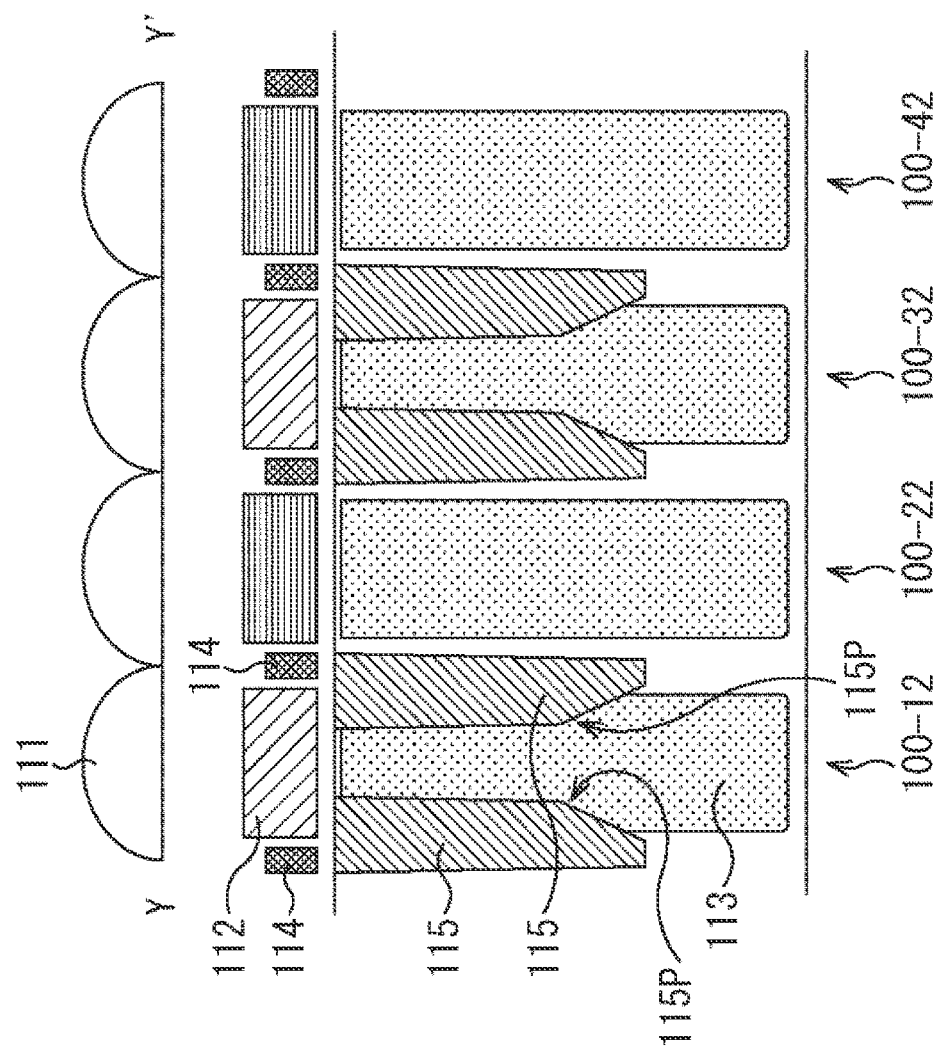
FIG. 13 is a third cross-sectional view showing the structure of the pixel in the first embodiment.

Further, a Y-Y' cross section in the plan view shown in FIG. 9 can be represented by a cross-sectional view shown in FIG. 13. Note that assuming that the upper left pixel 100 in the pixel arrangement in four rows and four columns is the pixel 100-11 also in this case, the pixels shown in the Y-Y' cross section are four pixels of the G pixel 100-12, a B pixel 100-22, the G pixel 100-32, and the B pixel 100-42.

In FIG. 13, in the G pixel 100-12 and the G pixel 100-32, a part of the inter-pixel separation unit 115 protrudes toward the center of the corresponding G pixel 100 in a projecting shape to form the projection portion 115P. Note that in the projection portion 115P shown in FIG. 13, the depth of the projection portion 115P differs for each protruding part (depth is not uniform).

Specifically, when viewed in the plan view shown in FIG. 9, it can be regarded that the projection portion 115P is formed in a T shape with respect to the inter-pixel separation unit 115. However, as shown in FIG. 13, the root part of the projection portion 115P has a depth similar to that of the inter-pixel separation unit 115, and the depth of the projection portion 115P is gradually reduced as it is closer to the tip thereof.

As described above, in the G pixel 100, a part of the inter-pixel separation unit 115 protrudes toward the center of the corresponding G pixel 100 to form the projection portion 115P. However, as shown in FIG. 11 to FIG. 13, the existence or non-existence of the projection portion 115P or the shape (depth) thereof differs depending on the cut of the cross section.

In other words, in the case where the projection portion 115P of the inter-pixel separation unit 115 is formed in the pixel 100 having the 2PD structure, a first cross section (e.g., the cross section shown in FIG. 11) including no center of the pixel 100 includes the cross section of the projection portion 115P between the two photoelectric conversion areas, but a second cross section (e.g., the cross section shown in FIG. 12) including the center of the pixel 100 includes no cross section of the projection portion 115P between the two photoelectric conversion areas.

(Structure of Pixel in First Embodiment)

Figure 14:
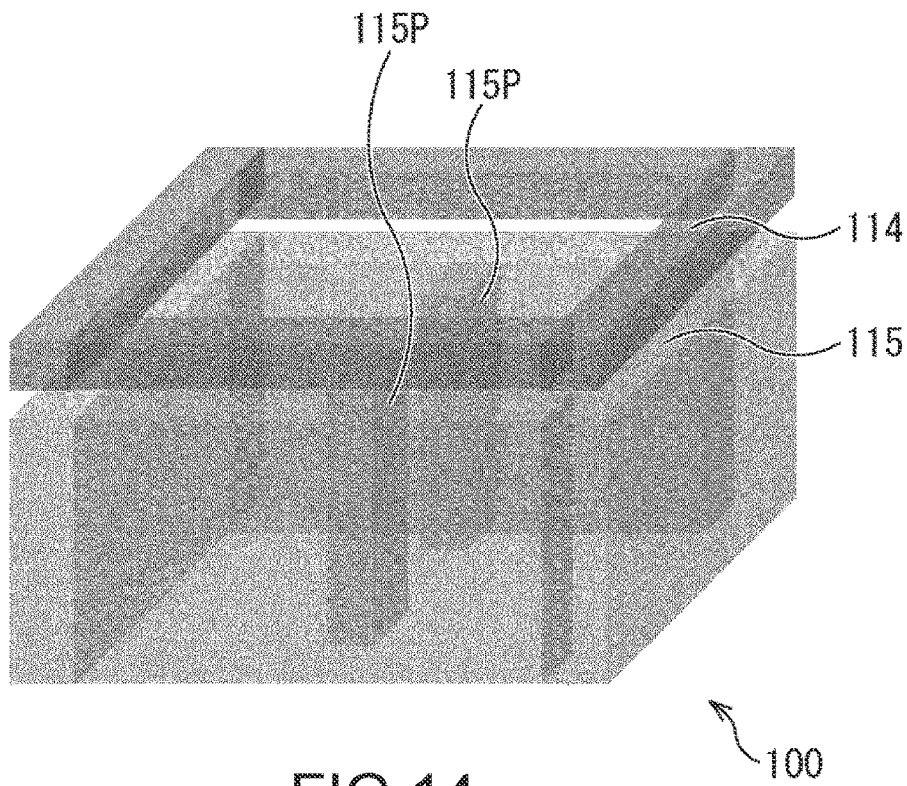
FIG. 14 is a three-dimensional diagram showing the structure of the pixel in the first embodiment.

FIG. 14 is a three-dimensional diagram showing the three-dimensional structure of the pixel 100 in the first embodiment.

In FIG. 14, an arbitrary pixel 100 (e.g., G pixel 100 in which the projection portion 115P is formed) among the plurality of pixels 100 two-dimensionally arranged in the pixel array unit 11 is shown. In the pixel array unit 11, the inter-pixel light blocking unit 114 and the inter-pixel separation unit 115 are formed in a square lattice between adjacent pixels.

The inter-pixel light blocking unit 114 is formed of a metal such as tungsten (W) and aluminum (Al) in a square lattice and blocks light between adjacent pixels. Further, the inter-pixel separation unit 115 is formed of an oxidized film, metal, or the like embedded in a trench in a square lattice, which is formed in a silicon layer, and physically separates adjacent pixels.

In the first embodiment, a part of the inter-pixel separation unit 115 out of the inter-pixel light blocking unit 114 formed in in a square lattice and the inter-pixel separation unit 115 formed in in a square lattice protrudes, in a projecting shape, toward the center of the square unit pixel 100 having the 2PD structure to form the projection portion 115P.

As the material of the projection portion 115P, the same material as that of the inter-pixel separation unit 115 or a different material may be used. For example, in the case where the inter-pixel separation unit 115 is formed of an oxidized film, also the projection portion 115P may be formed of an oxidized film. Further, for example, in the case where the inter-pixel separation unit 115 is formed of a metal, the projection portion 115P may be formed of an oxidized film.

As described above, the projection portions 115P formed at two places with respect to the inter-pixel separation unit 115 in the pixel 100 are formed in the areas where the contribution of isolation is low in the silicon layer. By forming the projection portion 115P in such areas, it is possible to achieve improvement in the accuracy of phase difference detection while suppressing reduction of the sensitivity or increase in color mixture.

Note that although detailed content will be described later with reference to FIG. 22 and FIG. 23, immediately below the on-chip lens 111, for example, a protruding length of the projection portion 115P can be determined depending on a focused spot diameter of the on-chip lens 111 so that physical isolation (silicon isolation) by the projection portion 115P is not made.

The first embodiment has been described heretofore.

(2) Second Embodiment (Structure of Pixel in Second Embodiment)

Figure 15:
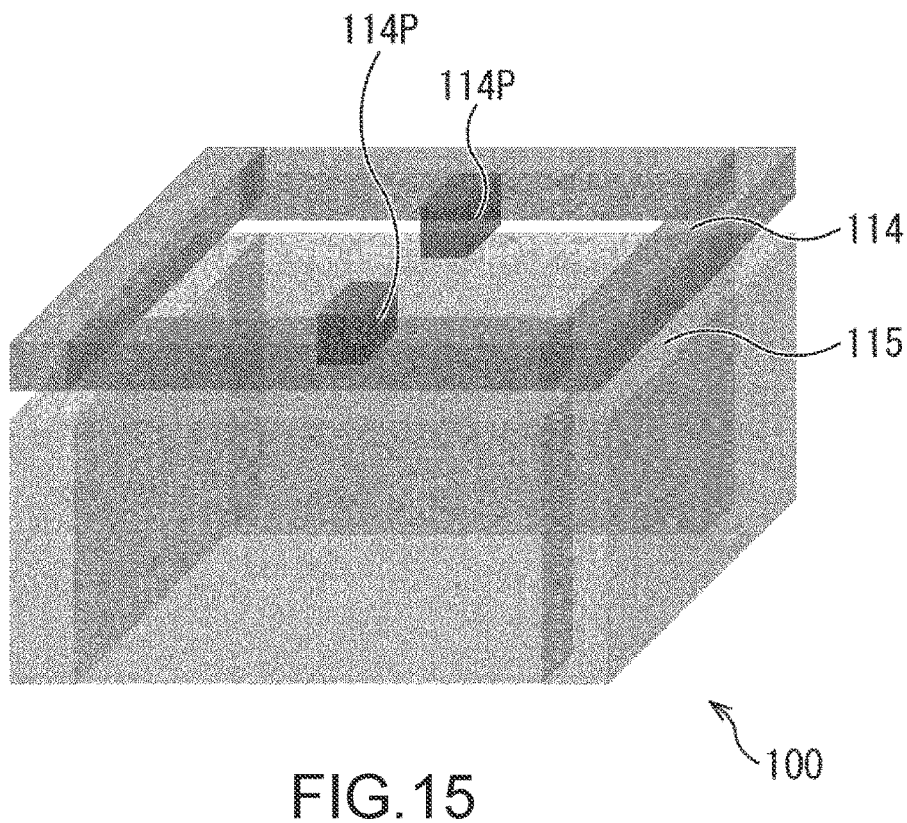
FIG. 15 is a three-dimensional diagram showing a structure of a pixel in a second embodiment.

FIG. 15 is a three-dimensional diagram showing a three-dimensional structure of the pixel 100 in a second embodiment.

In FIG. 15, an arbitrary pixel 100 among the plurality of pixels 100 two-dimensionally arranged in the pixel array unit 11 is illustrated, similarly to the above-mentioned FIG. 14. In the pixel array unit 11, between adjacent pixels, the inter-pixel light blocking unit 114 and the inter-pixel separation unit 115 are formed in a square lattice.

In the second embodiment, a part of the inter-pixel light blocking unit 114 out of the inter-pixel light blocking unit 114 formed in in a square lattice and the inter-pixel separation unit 115 formed in in a square lattice protrudes, in a projecting shape, toward the center of the square unit pixel 100 having the 2PD structure to form a projection portion 114P.

Note that as the material of the projection portion 114P, the same material as that of the inter-pixel light blocking unit 114 or a different material may be used.

As described above, although the case where the projection portion 115P is formed with respect to the inter-pixel separation unit 115 has been described in the above-mentioned first embodiment, the projection portion 114P is formed with respect to the inter-pixel light blocking unit 114 in the second embodiment.

Specifically, the projection portions 114P formed at two places with respect to the inter-pixel light blocking unit 114 in the pixel 100 are formed in the areas where the contribution of isolation is low in the silicon layer. By forming the projection portion 114P in such areas, it is possible to achieve improvement in the accuracy of phase difference detection while suppressing reduction of the sensitivity or increase in color mixture.

Note that although detailed content will be described later with reference to FIG. 22 and FIG. 23, for example, a protruding length of the projection portion 114P can be determined depending on a focused spot diameter of the on-chip lens 111.

The second embodiment has been described heretofore.

(3) Third Embodiment (Structure of Pixel in Third Embodiment)

Figure 16:
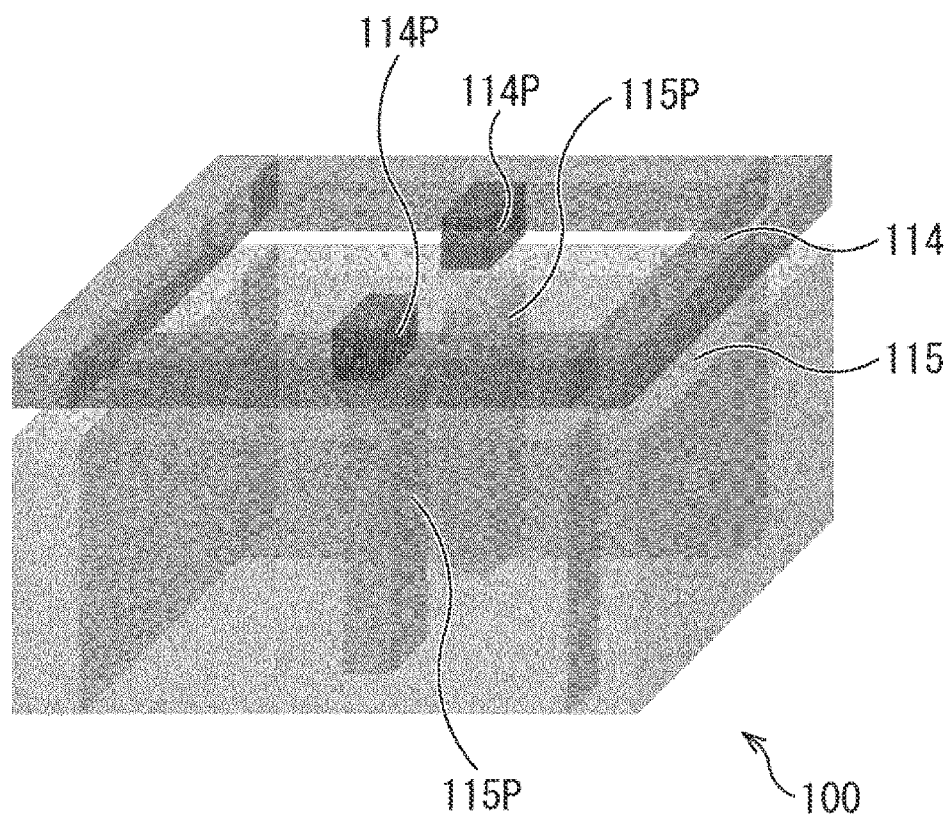
FIG. 16 is a three-dimensional diagram showing a structure of a pixel in a third embodiment.

FIG. 16 is a three-dimensional diagram showing a three-dimensional structure of the pixel 100 in a third embodiment.

In FIG. 16, an arbitrary pixel 100 among the plurality of pixels 100 two-dimensionally arranged in the pixel array unit 11 is illustrated, similarly to the above-mentioned FIG. 14 and FIG. 15. In the pixel array unit 11, between adjacent pixels, the inter-pixel light blocking unit 114 and the inter-pixel separation unit 115 are formed in a square lattice.

In the third embodiment, a part of the inter-pixel light blocking unit 114 formed in in a square lattice and a part of the inter-pixel separation unit 115 formed in in a square lattice protrude, in a projecting shape, toward the center of the square unit pixel 100 having the 2PD structure to form the projection portion 114P and the projection portion 115P, respectively.

Note that as the material of the projection portion 114P, the same material as that of the inter-pixel light blocking unit 114 or a different material may be used. Further, as the material of the projection portion 115P, the same material as that of the inter-pixel separation unit 115 or a different material may be used As described above, although the case where the projection portion 115P is formed with respect to the inter-pixel separation unit 115 has been described in the above-mentioned first embodiment and the case where the projection portion 114P is formed with respect to the inter-pixel light blocking unit 114 has been described in the second embodiment, the projection portion 114P and the projection portion 115P are respectively formed with respect to the inter-pixel light blocking unit 114 and the inter-pixel separation unit 115 in the third embodiment.

Specifically, the projection portions 114P formed at two places with respect to the inter-pixel light blocking unit 114 in the pixel 100 are formed in the areas where the contribution of isolation is low in the silicon layer. Further, the projection portions 115P formed at two places with respect to the inter-pixel separation unit 115 in the pixel 100 are formed in the areas where the contribution of isolation is low in the silicon layer. By forming the projection portion 114P and the projection portion 115P in such areas, it is possible to achieve improvement in the accuracy of phase difference detection while suppressing reduction of the sensitivity or increase in color mixture.

Note that although detailed content will be described later with reference to FIG. 22 and FIG. 23, for example, a protruding length of the projection portion 114P and a protruding length of the projection portion 115P can be determined depending on a focused spot diameter of the on-chip lens 111.

The third embodiment has been described heretofore.

(4) Fourth Embodiment (Structure in which Projection Portion is Formed Only with Respect to G Pixel)

Figure 17:
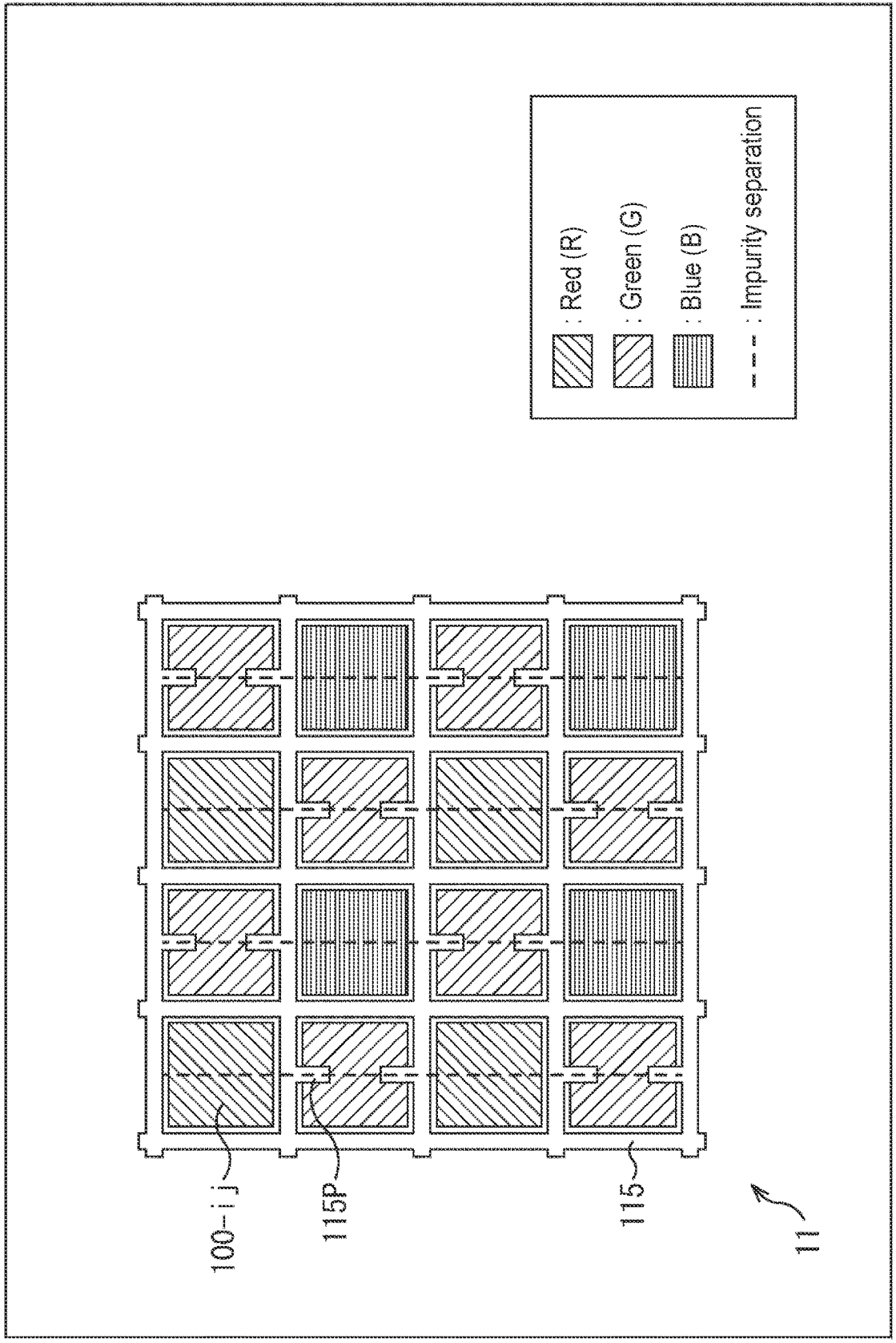
FIG. 17 is a plan view showing a structure of a pixel in a fourth embodiment.

FIG. 17 is a plan view showing a structure of the pixel 100 in a fourth embodiment.

In FIG. 17, the pixels 100 in four rows and four columns arranged in a partial area among the plurality of pixels 100 two-dimensionally arranged in the pixel array unit 11 are illustrated as a typical example. Among the pixels 100 arranged in a Bayer array, the projection portion 115P is formed with respect to the inter-pixel separation unit 115 only in the G pixel 100.

For example, assuming that the upper left pixel 100 in the pixel arrangement in four rows and four columns shown in FIG. 17 is the pixel 100-11, the G pixels 100 in which the projection portion 115P is formed are the G pixel 100-12, the G pixel 100-14, the G pixel 100-21, the G pixel 100-23, the G pixel 100-32, the G pixel 100-34, the G pixel 100-41, and the G pixel 100-43.

Now, assumption is made that when comparing information acquired from an output of the G pixel 100 and information acquired from outputs of the R pixel 100 and the B pixel 100, the amount of information acquired from the output of the G pixel 100 is the largest, e.g., the information acquired from the output of the G pixel 100 is dominant when acquiring information regarding phase difference detection. In this case, the structure in which the projection portion 115P is formed only in the G pixel 100 as shown in FIG. 17 can be employed.

Note that the structure in which the projection portion 115P is formed with respect to the inter-pixel separation unit 115 only in the G pixel 100 shown in FIG. 17 is similar to the above-mentioned structure shown in FIG. 9. Further, a photoelectric conversion area of the photoelectric conversion device 113A and a photoelectric conversion area of the photoelectric conversion device 113B in the pixel 100 are separated by an impurity in a silicon layer as shown by dotted lines in the column direction in FIG. 17.

Further, although the case where the projection portion 115P is formed with respect to the inter-pixel separation unit 115 corresponding to the above-mentioned first embodiment has been described in FIG. 17, the projection portion 114P may be formed with respect to the inter-pixel light blocking unit 114 only in the G pixel 100 corresponding to the above-mentioned second embodiment. Further, projection portions may be formed with respect to the inter-pixel light blocking unit 114 and the inter-pixel separation unit 115 only in the G pixel 100 corresponding to the above-mentioned third embodiment.

(Structure in which Projection Portions Are Formed in All Pixels)

Figure 18:
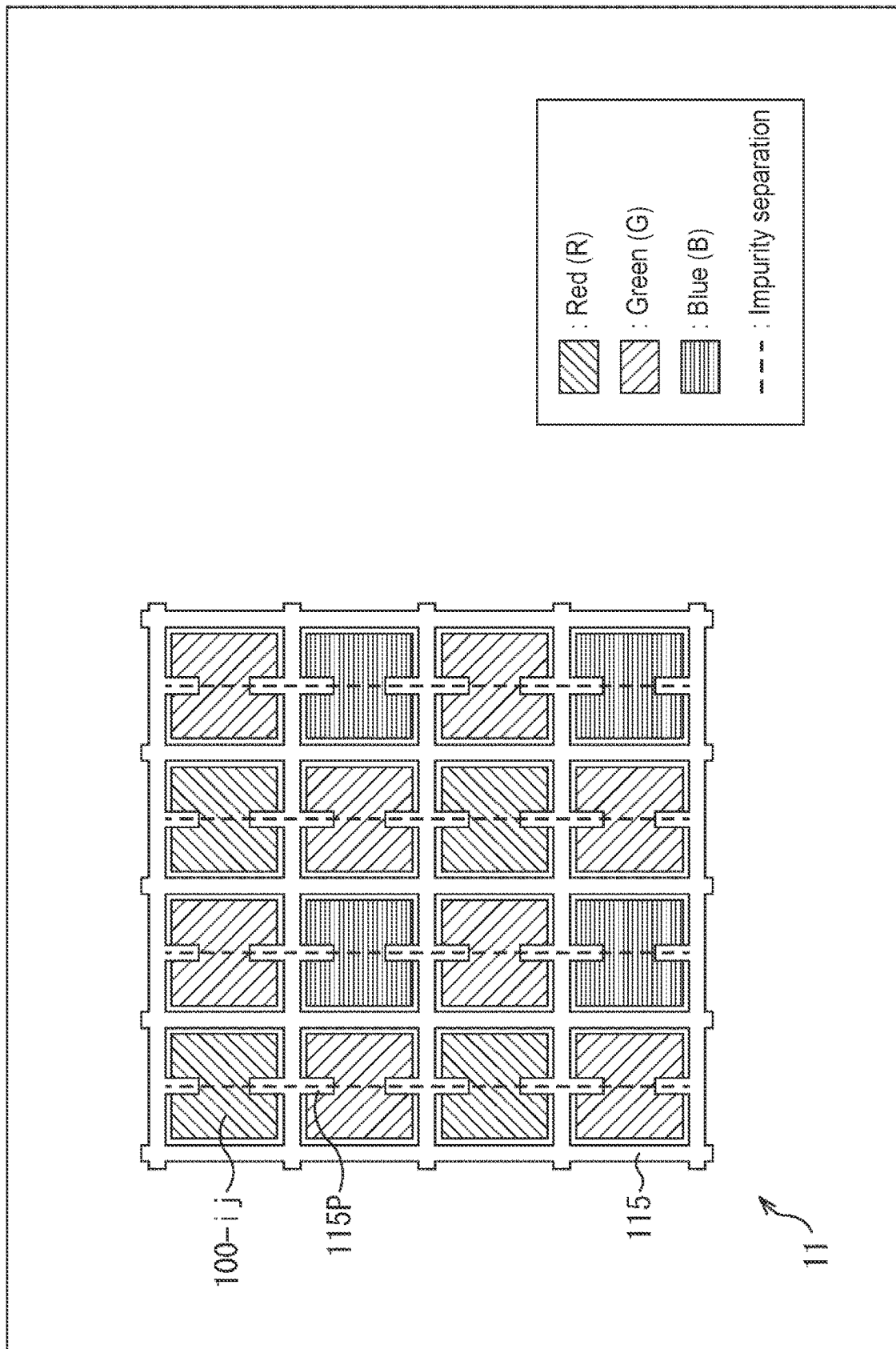
FIG. 18 is a plan view showing a first modified example of the structure of the pixel in the fourth embodiment.

FIG. 18 is a plan view showing a first modified example of the structure of the pixel 100 in the fourth embodiment.

In FIG. 18, arbitrary pixels 100 in four rows and four columns among the plurality of pixels 100 arranged in a Bayer array in the pixel array unit 11 are illustrated. In all of the pixels 100, the projection portion 115P is formed with respect to the inter-pixel separation unit 115.

For example, assuming the upper left pixel 100 in the pixel arrangement in four rows and four columns shown in FIG. 18 is the pixel 100-11, the pixels 100 in which the projection portion 115P is formed are the R pixels 100 (100-11, 100-13, 100-31, and 100-33), the G pixels 100 (100-12, 100-14, 100-21, 100-23, 100-32, 100-34, 100-41, and 100-43), and the B pixels 100 (100-22, 100-24, 100-42, and 100-44).

Note that in the case where the projection portion 115P is formed in the R pixel 100, the G pixel 100, and the B pixel 100, since information regarding phase difference detection can be acquired from outputs of all the pixels 100, a configuration in which the projection portion 115P is formed in all the pixels 100 as shown in FIG. 18 can be employed, for example, when it is desired to acquire information regarding phase difference detection from all the pixels 100.

Further, although the case where the projection portion 115P is formed with respect to the inter-pixel separation unit 115 corresponding to the above-mentioned first embodiment has been described in FIG. 18, the projection portion 114P may be formed with respect to the inter-pixel light blocking unit 114 in all the G pixel 100 corresponding to the above-mentioned second embodiment. Further, projection portions may be formed with respect to the inter-pixel light blocking unit 114 and the inter-pixel separation unit 115 in all the G pixel 100 corresponding to the above-mentioned third embodiment.

(Structure in which Projection Portion is Formed Only in R Pixel)

Figure 19:
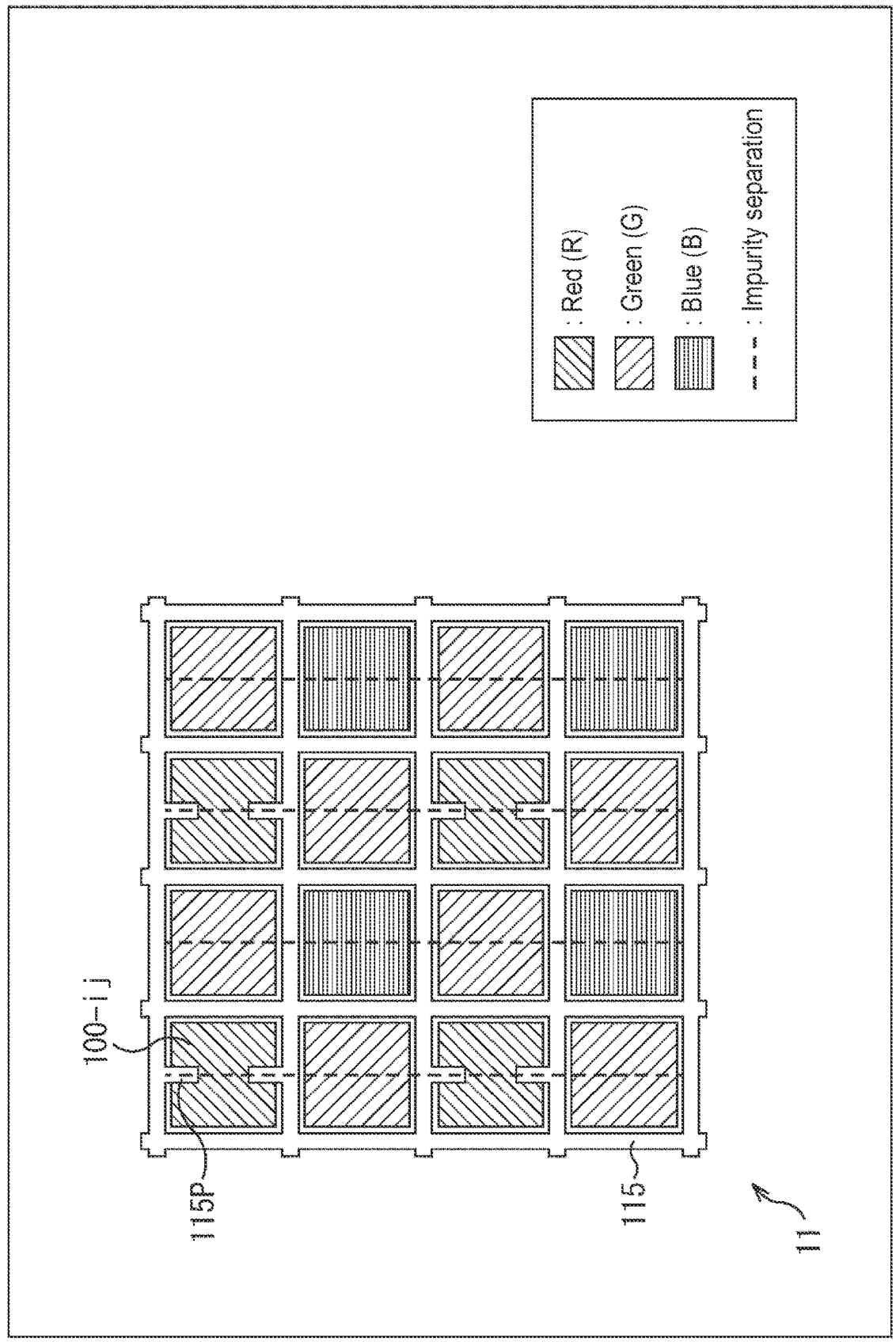
FIG. 19 is a plan view showing a second modified example of the structure of the pixel in the fourth embodiment.

FIG. 19 is a plan view showing a second modified example of the structure of the pixel 100 in the fourth embodiment.

In FIG. 19, arbitrary pixels 100 in four rows and four columns among the plurality of pixels 100 arranged in a Bayer array in the pixel array unit 11 are illustrated. Only in the R pixel 100, the projection portion 115P is formed with respect to the inter-pixel separation unit 115.

For example, assuming the upper left pixel 100 in the pixel arrangement in four rows and four columns shown in FIG. 19 is the pixel 100-11, the R pixels 100 in which the projection portion 115P is formed are the R pixel 100-11, the R pixel 100-13, the R pixel 100-31, and the R pixel 100-33.

Note that although the case where the projection portion 115P is formed with respect to the inter-pixel separation unit 115 corresponding to the above-mentioned first embodiment has been described in FIG. 19, the projection portion 114P may be formed with respect to the inter-pixel light blocking unit 114 only in the R pixel 100 corresponding to the above-mentioned second embodiment. Further, projection portions may be formed with respect to the inter-pixel light blocking unit 114 and the inter-pixel separation unit 115 only in the R pixel 100 corresponding to the above-mentioned third embodiment.

(Structure in which Projection Portion is Formed Only in B Pixel)

Figure 20:
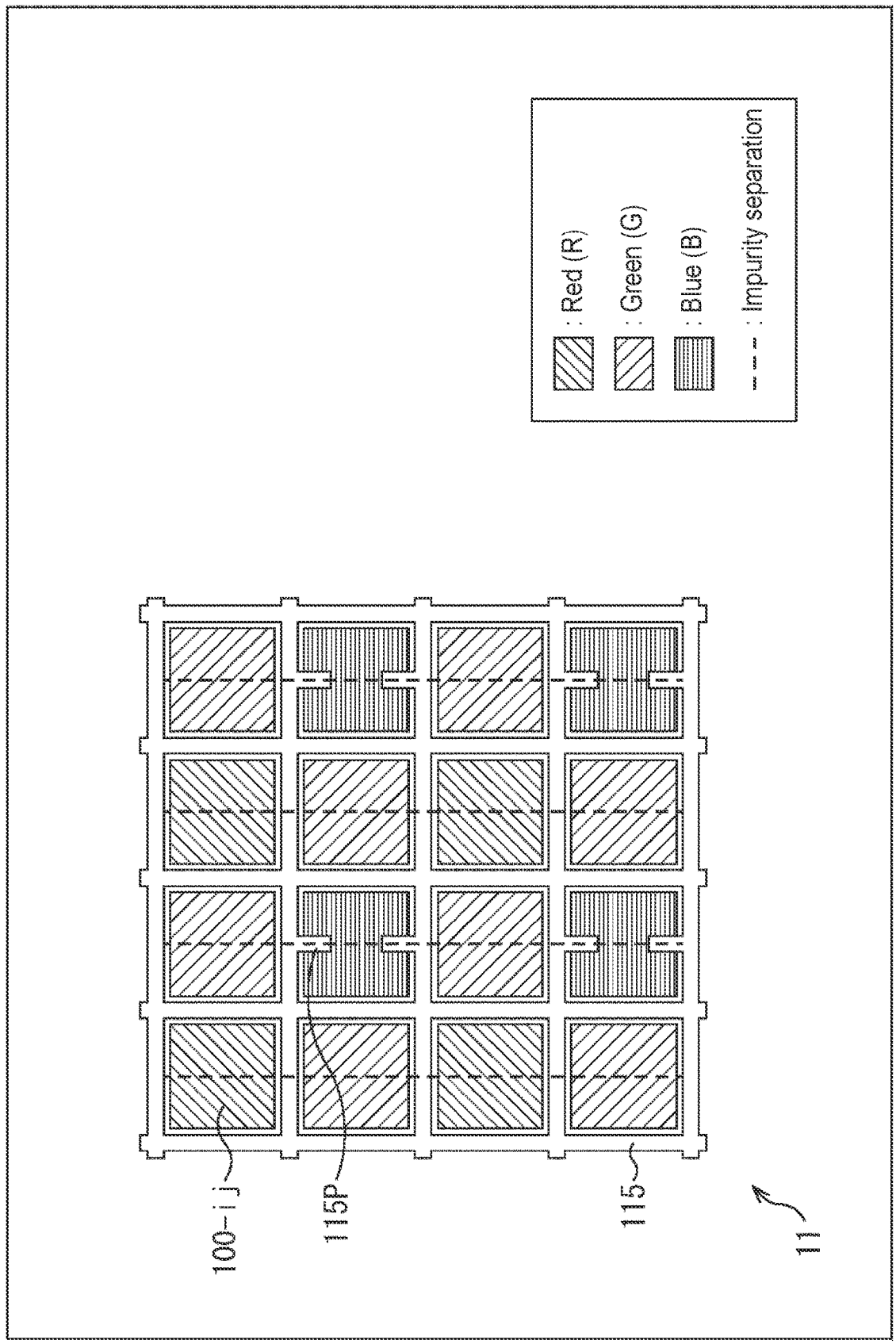
FIG. 20 is a plan view showing a third modified example of the structure of the pixel in the fourth embodiment.

FIG. 20 is a plan view showing a third modified example of the structure of the pixel 100 in the fourth embodiment.

In FIG. 20, arbitrary pixels 100 in four rows and four columns among the plurality of pixels 100 arranged in a Bayer array in the pixel array unit 11 are illustrated. Only in the B pixel 100, the projection portion 115P is formed with respect to the inter-pixel separation unit 115.

For example, assuming the upper left pixel 100 in the pixel arrangement in four rows and four columns shown in FIG. 20 is the pixel 100-11, the B pixels 100 in which the projection portion 115P is formed are the B pixel 100-22, the B pixel 100-24, the B pixel 100-42, and the B pixel 100-44.

Note that although the case where the projection portion 115P is formed with respect to the inter-pixel separation unit 115 corresponding to the above-mentioned first embodiment has been described in FIG. 20, the projection portion 114P may be formed with respect to the inter-pixel light blocking unit 114 only in the B pixel 100 corresponding to the above-mentioned second embodiment. Further, projection portions may be formed with respect to the inter-pixel light blocking unit 114 and the inter-pixel separation unit 115 only in the B pixel 100 corresponding to the above-mentioned third embodiment.

(Structure in which Projection Portions are Formed Only in G and B Pixels)

Figure 21:
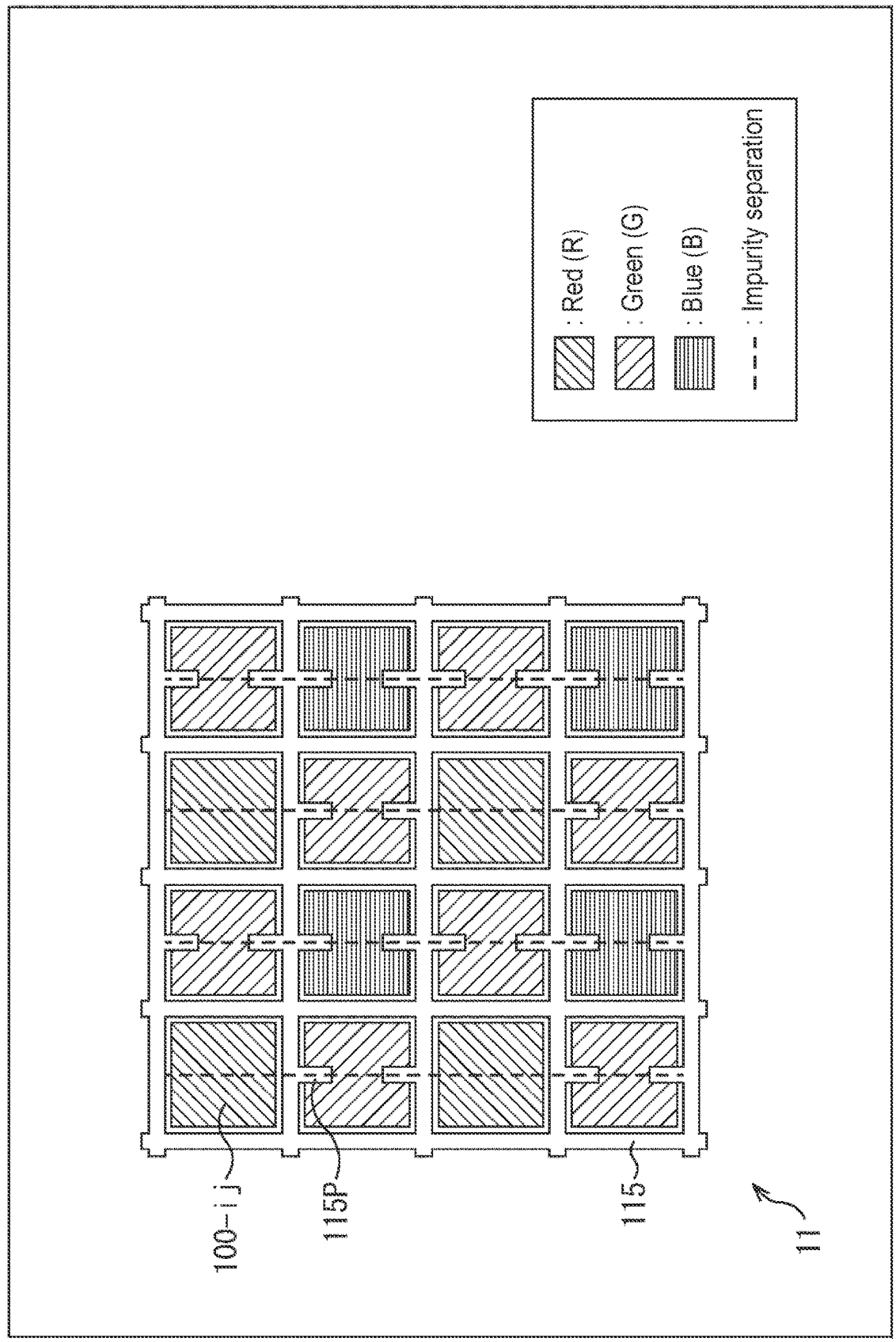
FIG. 21 is a plan view showing a fourth modified example of the structure of the pixel in the fourth embodiment.

FIG. 21 is a plan view showing a fourth modified example of the structure of the pixel 100 in the fourth embodiment.

In FIG. 21, arbitrary pixels 100 in four rows and four columns among the plurality of pixels 100 arranged in a Bayer array in the pixel array unit 11 are illustrated. Only in the G pixel 100 and the B pixel 100, the projection portion 115P is formed with respect to the inter-pixel separation unit 115.

For example, assuming the upper left pixel 100 in the pixel arrangement in four rows and four columns shown in FIG. 21 is the pixel 100-11, the pixels 100 in which the projection portion 115P is formed are the G pixels 100 (100-12, 100-14, 100-21, 100-23, 100-32, 100-34, 100-41, and 100-43) and the B pixels 100 (100-22, 100-24, 100-42, and 100-44).

Note that although the case where the projection portion 115P is formed with respect to the inter-pixel separation unit 115 corresponding to the above-mentioned first embodiment has been described in FIG. 21, the projection portion 114P may be formed with respect to the inter-pixel light blocking unit 114 only in the G pixel 100 and the B pixel 100 corresponding to the above-mentioned second embodiment. Further, projection portions may be formed with respect to the inter-pixel light blocking unit 114 and the inter-pixel separation unit 115 only in the G pixel 100 and the B pixel 100 corresponding to the above-mentioned third embodiment.

Further, although a combination of the G pixel 100 and the B pixel 100 is illustrated as a combination of the pixels 100 in which the projection portion 115P is formed in this example, the pattern of the combination of the pixels 100 in which the projection portion 115P is formed can be arbitrarily determined, e.g., a combination of the R pixel 100 and the G pixel 100 and a combination of the R pixel 100 and the B pixel 100.

The fourth embodiment has been described heretofore.

(5) Fifth Embodiment (Determination of Length of Projection Portion)

Figure 22:
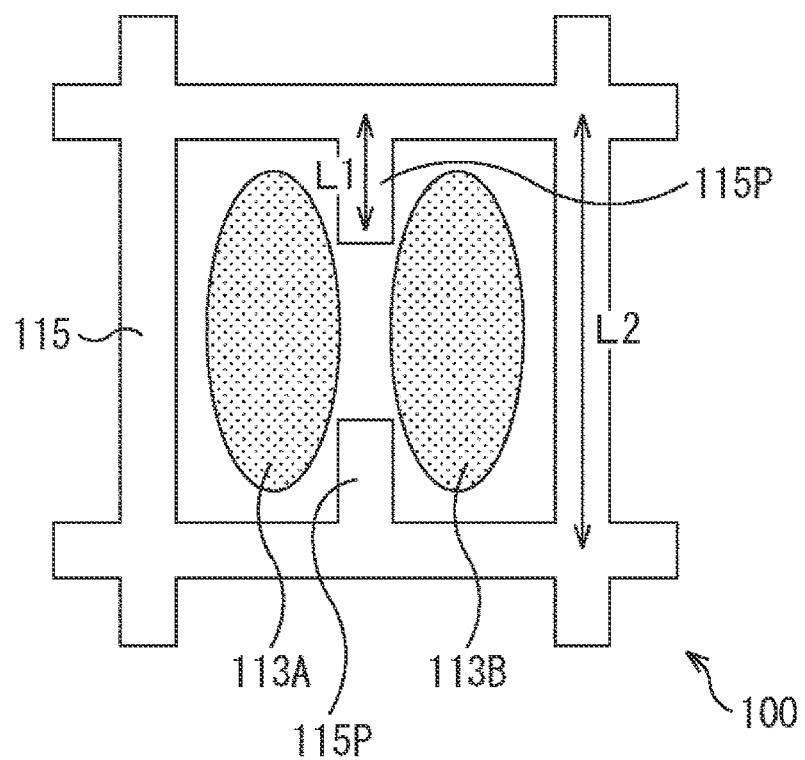
FIG. 22 is a plan view showing a structure of a pixel in a fifth embodiment.

FIG. 22 is a plan view showing a structure of the pixel 100 in a fifth embodiment.

In FIG. 22, in the pixel 100, a part of the inter-pixel separation unit 115 arranged in a square lattice protrudes toward the center of the pixel 100 in a projecting shape to form the projection portion 115P. A length of a protruding part of the projection portion 115P (hereinafter, referred to also as the projecting length) can be an arbitrary length. However, for example, the length may be determined as follows.

Specifically, for example, when the diameter of a focused spot S on the light incident surface in the silicon (Si) layer in which the photoelectric conversion devices 113A and 113B are formed is increased for some reason in the case where the height of the on-chip lens 111 in the optical axis direction (stacking direction) is changed, there is a need to reduce the projecting length to prevent light from scattering.

Since the projecting length of the projection portion 115P has a correlation with the diameter of the focused spot S of the on-chip lens 111 as described above, the projecting length of the projection portion 115P can be determined depending on the diameter of the focused spot S of the on-chip lens 111.

For example, the inventors of the present technology have found, by performing detailed simulation, that when the projecting length of the projection portion 115P is represented by L1 and a length of a side of a pitch of the on-chip lens 111 is represented by L2, L1 is favorably within the range of one seventh to one fourth a length of L2.

Figure 23:
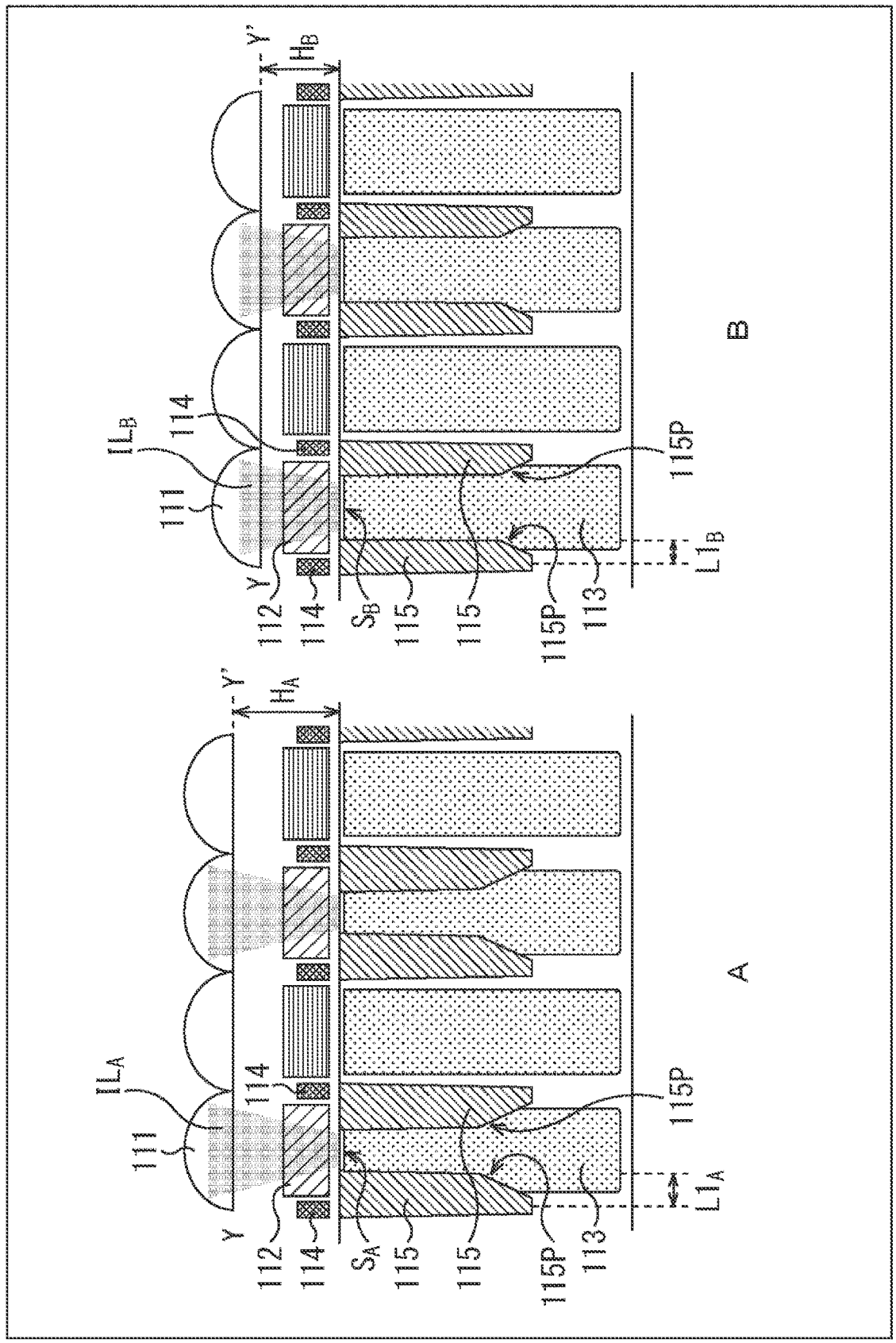
FIG. 23 is a diagram describing a relationship between a diameter of a spot of incident light and a length of a projection portion.

In FIG. 23, a structure in which the position of the on-chip lens 111 is high with respect to the light incident surface of the silicon layer is represented in a cross-sectional view shown in A of FIG. 23, and a structure in which the position of the on-chip lens 111 is low with respect to the light incident surface of the silicon layer is represented in a cross-sectional view shown in B of FIG. 23. Note that the cross-sectional view shown in FIG. 23 corresponds to the Y-Y' cross section in the plan view shown in FIG. 9.

In A of FIG. 23, the height of the on-chip lens 111 in the optical axis direction with respect to the light incident surface of the silicon layer is represented by $H_A$, and a focused spot on the light incident surface by an incident light $IL_A$ is represented by $S_A$. Meanwhile, in B of FIG. 23, the height of the on-chip lens 111 in the optical axis direction with respect to the light incident surface of the silicon layer is represented by $H_B$, and a focused spot on the light incident surface by an incident light $IL_B$ is represented by $S_B$.

When comparing the height of the on-chip lens 111 between A of FIG. 23 and B of FIG. 23, a relationship of $H_A > H_B$ is established. Then, since height of the on-chip lens 111 has such a relationship, when comparing the diameter of the focused spot between A of FIG. 23 and B of FIG. 23, a relationship of $S_A < S_B$ is established.

On the basis of such a relationship, a projecting length $L1_A$ of the projection portion 115P is adjusted depending on the diameter of the focused spot $S_A$ in A of FIG. 23, and a projecting length $L1_B$ of the projection portion 115P is adjusted depending on the diameter of the focused spot $S_B$ in B of FIG. 23. Note that since there is a need to reduce the projecting length to prevent light from scattering as the diameter of the focused spot is increased as described above, a relationship of $L1_A > L1_B$ is established in accordance with the relationship of $S_A < S_B$.

Note that although a method of determining the projecting length of the projection portion 115P of the inter-pixel separation unit 115 depending on the diameter of the focused spot S of the on-chip lens 111 has been described heretofore, also a length of a protruding part of the projection portion 114P of the inter-pixel light blocking unit 114 (projecting length) can be determined depending on the diameter of the focused spot S of the on-chip lens 111, similarly.

Further, the above-mentioned method of determining the projecting length of the projection portion 115P is an example, and the projecting length of the projection portion 115P may be determined by a method other than the method using the diameter of the focused spot S of the on-chip lens 111.

The fifth embodiment has been described heretofore.

(6) Sixth Embodiment (Structure in which Length of Projection Portion is Changed for Each Pixel)

Figure 24:
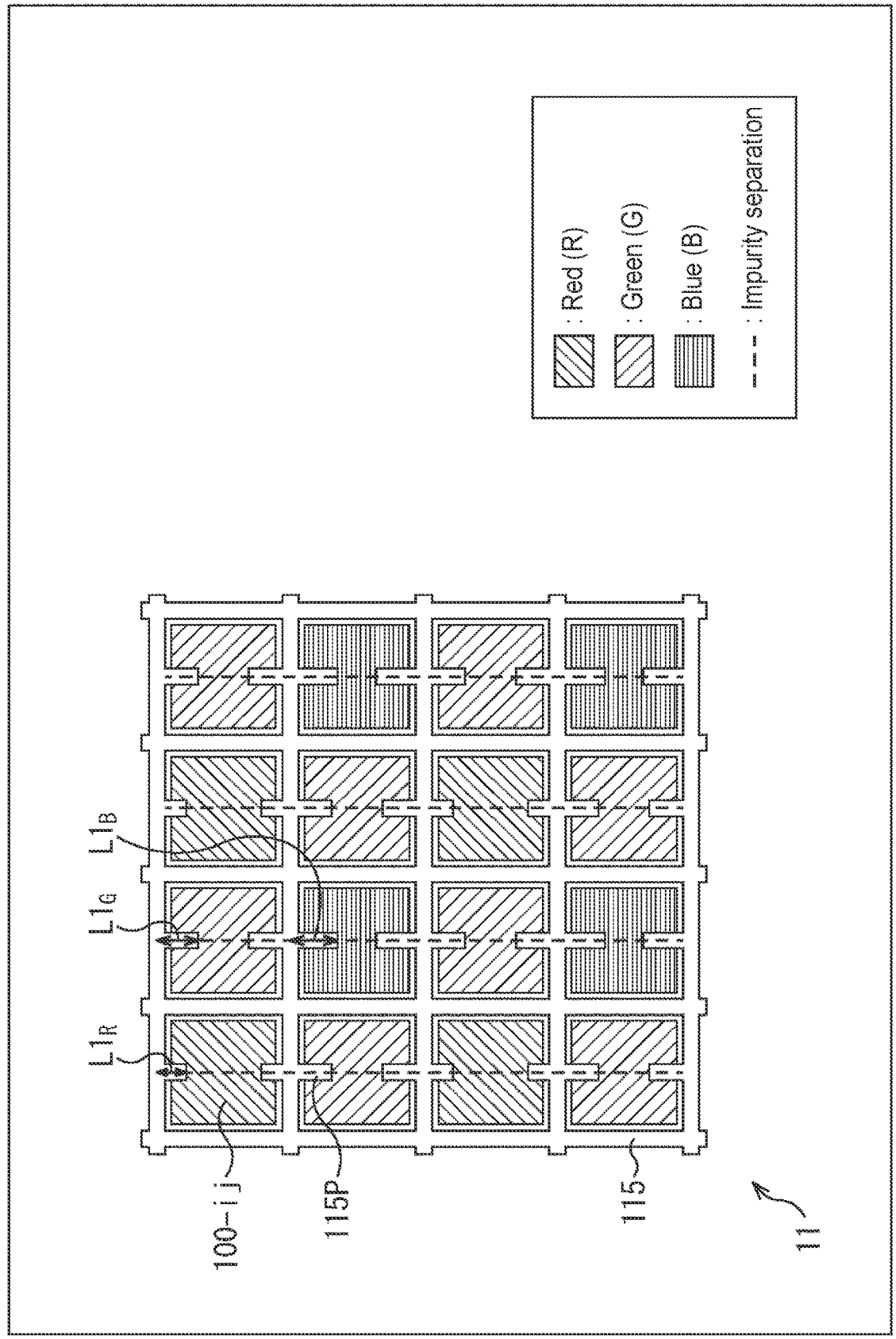
FIG. 24 is a plan view showing a structure of a pixel in a sixth embodiment.

FIG. 24 is a plan view showing a structure of the pixel 100 in a sixth embodiment.

In FIG. 24, arbitrary pixels 100 in four rows and four columns among the plurality of pixels 100 arranged in a Bayer array in the pixel array unit 11 are illustrated. In all the pixels 100, the projection portion 115P is formed with respect to the inter-pixel separation unit 115.

For example, assuming the upper left pixel 100 in the pixel arrangement in four rows and four columns shown in FIG. 24 is the pixel 100-11, the pixels 100 in which the projection portion 115P is formed are the R pixels 100 (100-11, 100-13, 100-31, and 100-33), the G pixels 100 (100-12, 100-14, 100-21, 100-23, 100-32, 100-34, 100-41, and 100-43), and the B pixels 100 (100-22, 100-24, 100-42, and 100-44).

Note that in FIG. 24, the projecting length of the projection portion 115P differs for each color pixel of the R pixel 100, the G pixel 100, and the B pixel 100. Specifically, in FIG. 24, the projecting length of the projection portion 115P formed in the R pixel 100 is shorter than the projecting length of the projection portion 115P formed in the G pixel 100 while the projecting length of the projection portion 115P formed in the B pixel 100 is longer than the projecting length of the projection portion 115P formed in the G pixel 100.

Specifically, when the projecting length of the projection portion 115P of the R pixel 100 is represented by $L1_R$, the projecting length of the projection portion 115P of the G pixel 100 is represented by $L1_G$, and the projecting length of the projection portion 115P of the B pixel 100 is represented by $L1_B$, a relationship of $L1_B > L1_G > L1_B$ is established.

For example, since the red (R) wavelength is longer than the green (G) or blue (B) wavelength, scattering of light is highly likely to occur in the R pixel 100 as compared with the G pixel 100 or the B pixel 100. In this regard, countermeasures that make the projecting length of the projection portion 115P of the R pixel 100 shorter than that of the G pixel 100 or the B pixel 100 can be considered.

Note that although the case where the projecting length of the projection portion 115P of the inter-pixel separation unit 115 is changed for each pixel 100 has been described, also a length of a protruding part (projecting length) of the projection portion 114P of the inter-pixel light blocking unit 114 may be changed for each pixel 100, similarly.

Further, although the case where the projecting length of the projection portion 115P in all the R pixel 100, the G pixel 100, and the B pixel 100 is changed has been described above, for example, a combination of the pixels 100 in which the projecting length of the projection portion 115P is changed can be arbitrarily determined, e.g., the projecting lengths of the projection portions 115P of the G pixel 100 and the B pixel 100 can be the same and only the projecting length of the projection portion 115P of the R pixel 100 can be reduced. Further, the projecting lengths of the projection portions 115P of not only the pixels 100 of different colors but also of the pixels 100 of the same color may be changed.

The sixth embodiment has been described heretofore.

(7) Seventh Embodiment (Structure in which On-Chip Lens Having Elliptical Shape in Row Direction is Used)

Figure 25:
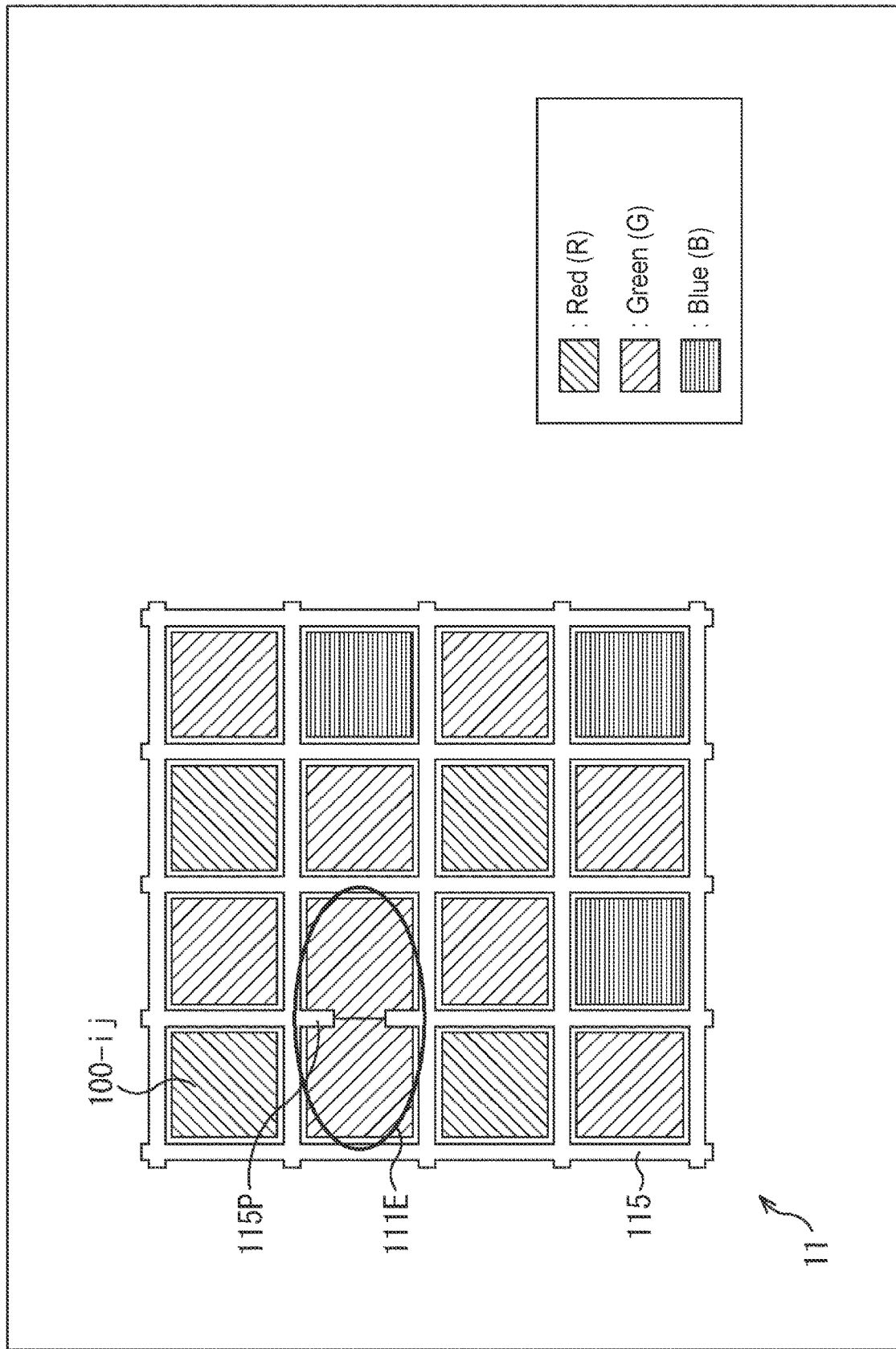
FIG. 25 is a plan view showing a structure of a pixel in a seventh embodiment.

FIG. 25 is a plan view showing a structure of the pixel 100 in a seventh embodiment.

In FIG. 25, arbitrary pixels 100 in four rows and four columns among the plurality of pixels 100 two-dimensionally arranged in the pixel array unit 11 are illustrated. Note that in the pixel arrangement in four rows and four columns shown in FIG. 25, each of the pixels 100 has a structure including one photoelectric conversion device 113. Specifically, in FIG. 25, each of the pixels 100 has not the 2PD structure but, so to speak, a 1PD structure. Here, in order to distinguish from the above-mentioned pixel 100 having the 2PD structure, the pixel 100 having the 1PD structure will be expressed as the pixel 100 (1PD).

For example, assuming that the upper left pixel 100 (1PD) in the pixel arrangement in four rows and four columns shown in FIG. 25 is the pixel 100-11 (1PD), an elliptical on-chip lens 111E is formed with respect to the G pixel 100-21 (1PD) and the G pixel 100-22 (1PD) arranged in the same row. Note that although not shown, in the pixels 100 (1PD) other than the G pixel 100-21 (1PD) and the G pixel 100-22 (1PD), one photoelectric conversion device 113 is formed with respect to one on-chip lens 111.

Specifically, in the pixel including the two pixels (G pixel 100-21 (1PD), 100-22 (1PD)) arranged in the same row, a structure in which the photoelectric conversion device 113 of the G pixel 100-21 (1PD) and the photoelectric conversion device 113 of the G pixel 100-22 (1PD) are formed with respect to one on-chip lens 111E is provided. Then, phase difference detection is performed by using outputs of the photoelectric conversion device 113 of the G pixel 100-21 (1PD) and the photoelectric conversion device 113 of the G pixel 100-22 (1PD) arranged in the same row.

Further, in this example, the projection portion 115P formed with respect to the inter-pixel separation unit 115 is formed between the G pixel 100-21 (1PD) and the G pixel 100-22 (1PD) while the elliptical on-chip lens 111E has a structure covering the G pixel 100-21 (1PD) and the G pixel 100-22 (1PD) in the row direction.

Also in this case, a part of the inter-pixel separation unit 115 protrudes, in a projecting shape, toward the center of the area including the G pixel 100-21 (1PD) and the G pixel 100-22 (1PD) to form the projection portion 115P at two places. Further, the projecting length of the projection portion 115P can be determined depending on the diameter of the focused spot of the elliptical on-chip lens 111E, for example.

(Structure Using On-Chip Lens Having Elliptical Shape in Column Direction)

Figure 26:
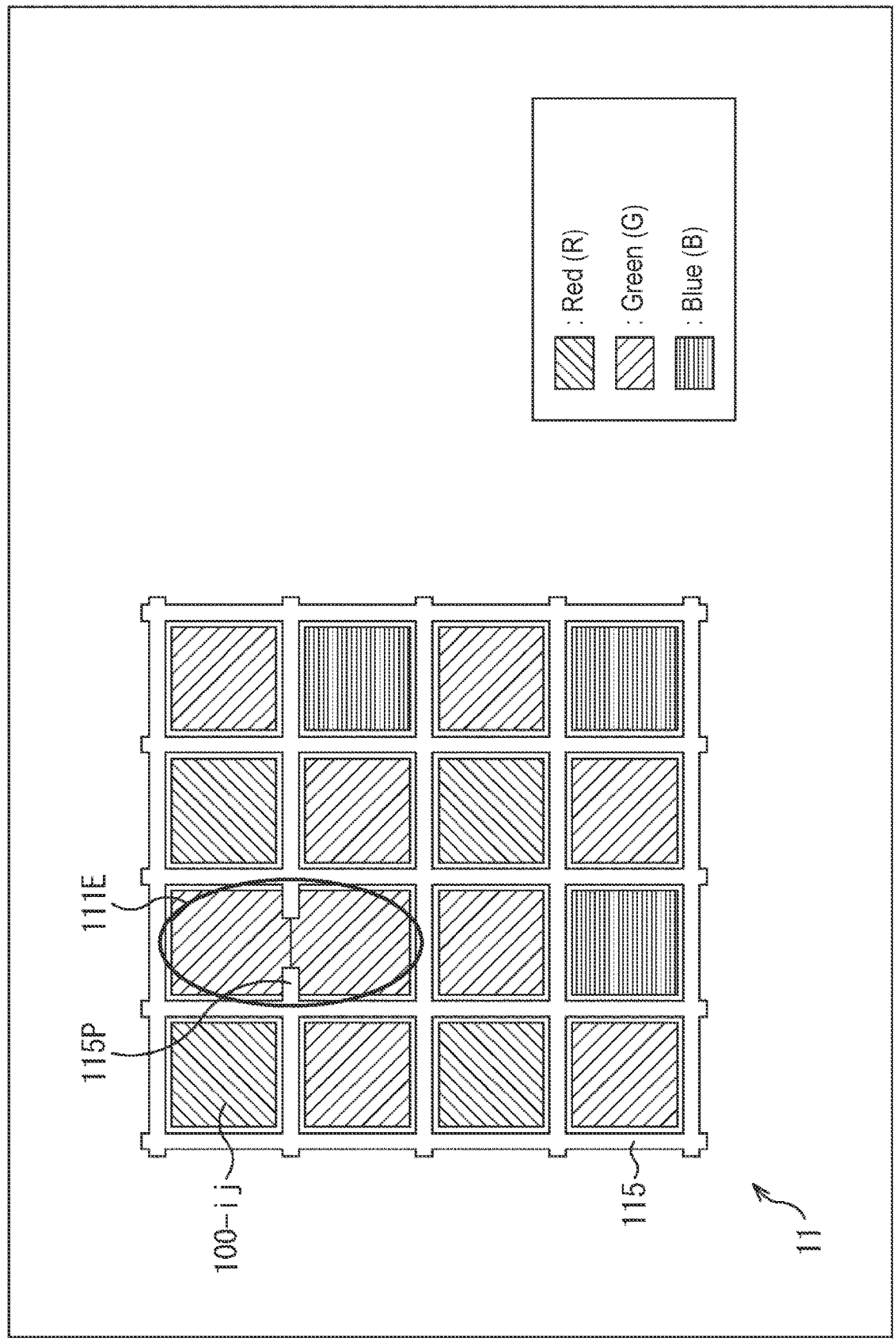
FIG. 26 is a plan view showing a modified example of the structure of the pixel in the seventh embodiment.

FIG. 26 is a plan view showing a modified example of the structure of the pixel 100 in the seventh embodiment.

In FIG. 26, arbitrary pixels 100 in four rows and four columns among the plurality of pixels 100 two-dimensionally arranged in the pixel array unit 11 are illustrated. Note that the pixels 100 in the pixel arrangement in four rows and four columns shown in FIG. 26 each have the 1PD structure, similarly to the above-mentioned pixels 100 shown in FIG. 25. The pixel 100 having the 1PD structure will be expressed as the pixel 100 (1PD).

Here, for example, in the pixel arrangement in four rows and four columns shown in FIG. 26, the elliptical on-chip lens 111E is formed with respect to the G pixel 100-12 (1PD) and the G pixel 100-22 (1PD) arranged in the same column. Note that although not shown, in the pixels 100 (1PD) other than the G pixel 100-12 (1PD) and the G pixel 100-22 (1PD), one photoelectric conversion device 113 is formed with respect to one on-chip lens 111.

Specifically, in the pixel including the two pixels (G pixel 100-12 (1PD), 100-22 (1PD)) arranged in the same row, a structure in which the photoelectric conversion device 113 of the G pixel 100-12 (1PD) and the photoelectric conversion device 113 of the G pixel 100-22 (1PD) are formed with respect to one on-chip lens 111E is provided. Then, phase difference detection is performed by using outputs of the photoelectric conversion device 113 of the G pixel 100-12 (1PD) and the photoelectric conversion device 113 of the G pixel 100-22 (1PD) arranged in the same column.

Further, in this example, the projection portion 115P formed with respect to the inter-pixel separation unit 115 is formed between the G pixel 100-12 (1PD) and the G pixel 100-22 (1PD) while the elliptical on-chip lens 111E has a structure covering the G pixel 100-12 (1PD) and the G pixel 100-22 (1PD) in the column direction.

Also in this case, a part of the inter-pixel separation unit 115 protrudes, in a projecting shape, toward the center of the area including the G pixel 100-12 (1PD) and the G pixel 100-22 (1PD) to form the projection portion 115P at two places. Further, the projecting length of the projection portion 115P can be determined depending on the diameter of the focused spot of the elliptical on-chip lens 111E, for example.

Note that although the case where the projection portion 115P of the inter-pixel separation unit 115 is formed with respect to the two pixels 100 (1PD) arranged in the same row or the same column for each elliptical on-chip lens 111E has been described, the projection portion 114P of the inter-pixel light blocking unit 114 may be formed.

Further, although the case where the two G pixels 100 (1PD) are arranged with respect to the elliptical on-chip lens 111E are arranged has been described above, instead of the G pixels 100 (1PD), the R pixels 100 (1PD) or the B pixels 100 (1PD) may be arranged with respect to the elliptical on-chip lens 111E.

The seventh embodiment has been described heretofore.

(8) Eight Embodiment (Structure in which Plurality of Pixels are Arranged with Respect to Single On-Chip Lens)

Figure 27:
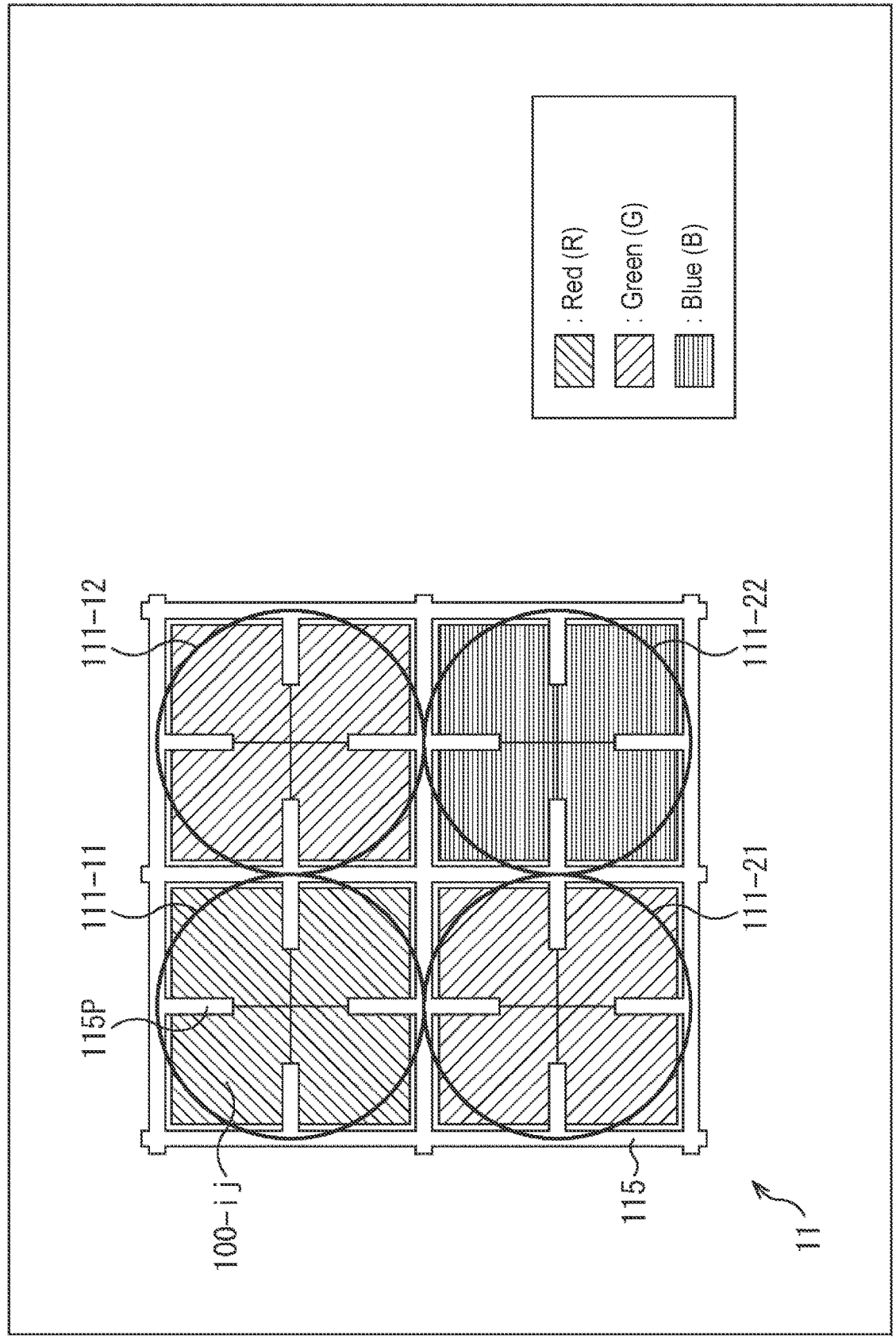
FIG. 27 is a plan view showing a structure of a pixel in an eighth embodiment.

FIG. 27 is a plan view showing a structure of the pixel 100 in an eighth embodiment.

In FIG. 27, arbitrary pixels 100 in four rows and four columns among the plurality of pixels 100 two-dimensionally arranged in the pixel array unit 11 are illustrated. Note that the pixels 100 in the pixel arrangement in four rows and four columns shown in FIG. 27 each have the 1PD structure, similarly to the above-mentioned pixels 100 shown in FIG. 25 and FIG. 26. The pixel 100 having the 1PD structure will be expressed as the pixel 100 (1PD).

In the pixel arrangement in four rows and four columns shown in FIG. 27, the circular on-chip lens 111 is formed for each four pixels 100 (1PD) of the same color.

For example, assuming that the upper left pixel 100 (1PD) in the pixel arrangement in four rows and four columns shown in FIG. 27 is the pixel 100-11 (1PD), one on-chip lens 111-11 is formed with respect to the pixel including the four R pixels 100 (1PD) of the R pixel 100-11 (1PD), the R pixel 100-12 (1PD), the R pixel 100-21 (1PD), and the R pixel 100-22 (1PD).

Further, a part of the inter-pixel separation unit 115 protrudes, in a projecting shape, toward the center of the area including the four R pixels 100 (1PD) to form the projection portion 115P at four places while the circular on-chip lens 111-11 has a structure covering the four R pixels 100 (1PD) (100-11 (1PD), 100-12 (1PD), 100-21 (1PD), and 100-22 (1PD)).

In the pixel arrangement shown in FIG. 27, one on-chip lens 111-12 is formed with respect to the pixel including the four G pixels 100 (1PD) of the G pixel 100-13 (1PD), the G pixel 100-14 (1PD), the G pixel 100-23 (1PD), and the G pixel 100-24 (1PD). Further, a part of the inter-pixel separation unit 115 protrudes, in a projecting shape, toward the center of the area including the four G pixels 100 (1PD) to form the projection portion 115P at four places while the circular on-chip lens 111-12 has a structure covering the four G pixels 100 (1PD) (100-13 (1PD), 100-14 (1PD), 100-23 (1PD), and 100-24 (1PD)).

Further, in the pixel arrangement shown in FIG. 27, one on-chip lens 111-21 is formed with respect to the pixel including the four G pixels 100 (1PD) of the G pixel 100-31 (1PD), the G pixel 100-32 (1PD), the G pixel 100-41 (1PD), and the G pixel 100-42 (1PD). Further, a part of the inter-pixel separation unit 115 protrudes, in a projecting shape, toward the center of the area including the four G pixels 100 (1PD) to form the projection portion 115P at four places while the circular on-chip lens 111-21 has a structure covering the four G pixels 100 (1PD) (100-31 (1PD), 100-32 (1PD), 100-41 (1PD), and 100-42 (1PD)).

Further, in the pixel arrangement shown in FIG. 27, one on-chip lens 111-22 is formed with respect to the pixel including the four B pixels 100 (1PD) of the B pixel 100-33 (1PD), the B pixel 100-34 (1PD), the B pixel 100-43 (1PD), and the B pixel 100-44 (1PD). Further, a part of the inter-pixel separation unit 115 protrudes, in a projecting shape, toward the center of the area including the four G pixels 100 (1PD) to form the projection portion 115P at four places while the circular on-chip lens 111-22 has a structure covering the four B pixels 100 (1PD) (100-33 (1PD), 100-34 (1PD), 100-43 (1PD), and 100-44 (1PD)).

As described above, in the pixel arrangement shown in FIG. 27, a structure in which the photoelectric conversion devices 113 of the four pixels 100 (1PD) are formed with respect to the pixel (including the four pixels 100 (1PD)) in which one on-chip lens 111 and one color filter 112 are provided is provided. Then, in this example, phase difference detection is performed by using outputs of the respective photoelectric conversion devices 113 of the four pixels 100 (1PD) sharing the one on-chip lens ill and the one color filter 112. Since the pixels 100 (1PD) in two rows and two columns are arranged with respect to the one on-chip lens 111 in this example, for example, it is possible to acquire information regarding phase difference detection in both directions of the row direction and the column direction.

Note that although the case where the projection portion 115P of the inter-pixel separation unit 115 is formed with respect to the pixels 100 (1PD) in two rows and two columns arranged for each on-chip lens 111 has been described, the projection portion 114P of the inter-pixel light blocking unit 114 may be formed.

The eighth embodiment has been described heretofore.

(9) Ninth Embodiment (Plane Layout of Pixel)

Figure 28:
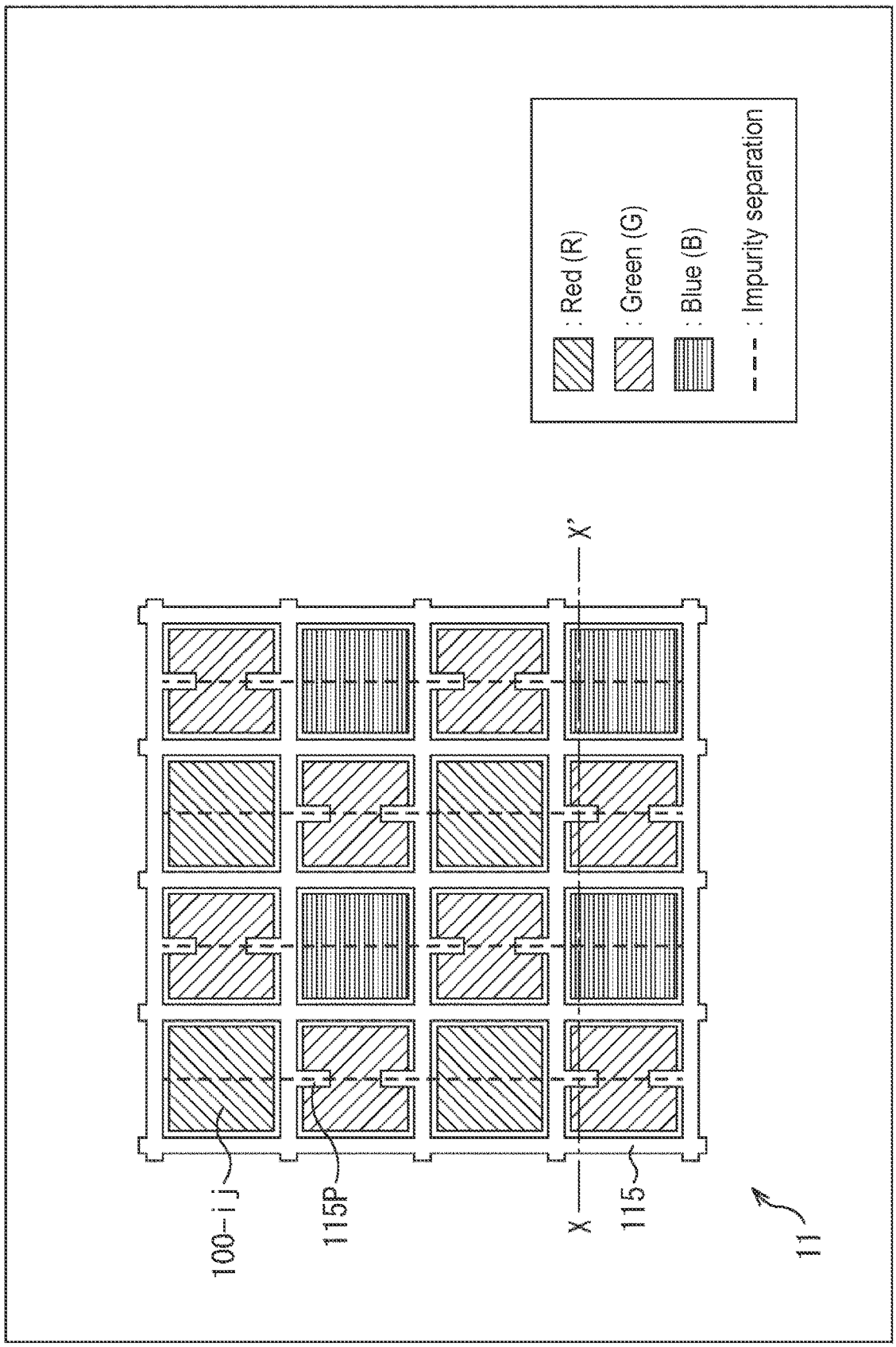
FIG. 28 is a diagram showing a plane layout of a pixel in a ninth embodiment.

FIG. 28 is a diagram showing a plane layout of the pixel 100 in a ninth embodiment.

In FIG. 28, arbitrary pixels 100 in four rows and four columns among the plurality of pixels 100 arranged in a Bayer array in the pixel array unit 11 are illustrated. Note that the pixels 100 in the pixel arrangement in four rows and four columns shown in FIG. 28 each have the 2PD structure, similarly to the pixels 100 shown in the above-mentioned FIG. 9 or the like.

Figure 29:
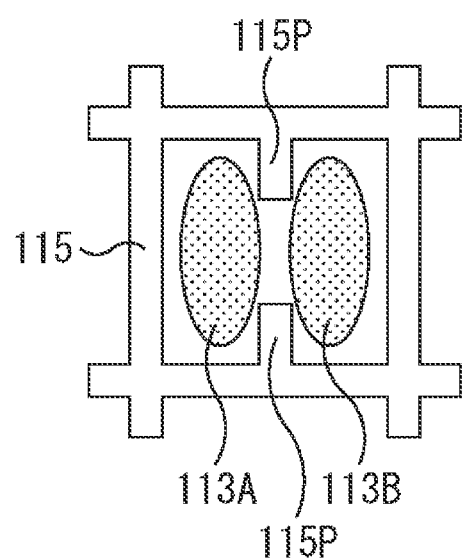
FIG. 29 is a diagram describing an N-type potential in a silicon layer of the pixel in the ninth embodiment.

Further, in FIG. 28, in the G pixels 100 among the pixels 100 in the pixel arrangement in four rows and four columns, a part of the inter-pixel separation unit 115 protrudes toward the center of the G pixel 100 in a projecting shape to form the projection portion 115P, similarly to the above-mentioned FIG. 9 or the like. More specifically, as shown in FIG. 29, the projection portion 115P of the inter-pixel separation unit 115 is formed in the areas corresponding to the P-type areas A1 and A2 in which the contribution of isolation between the photoelectric conversion devices is low in the above-mentioned FIG. 8.

Figure 30:
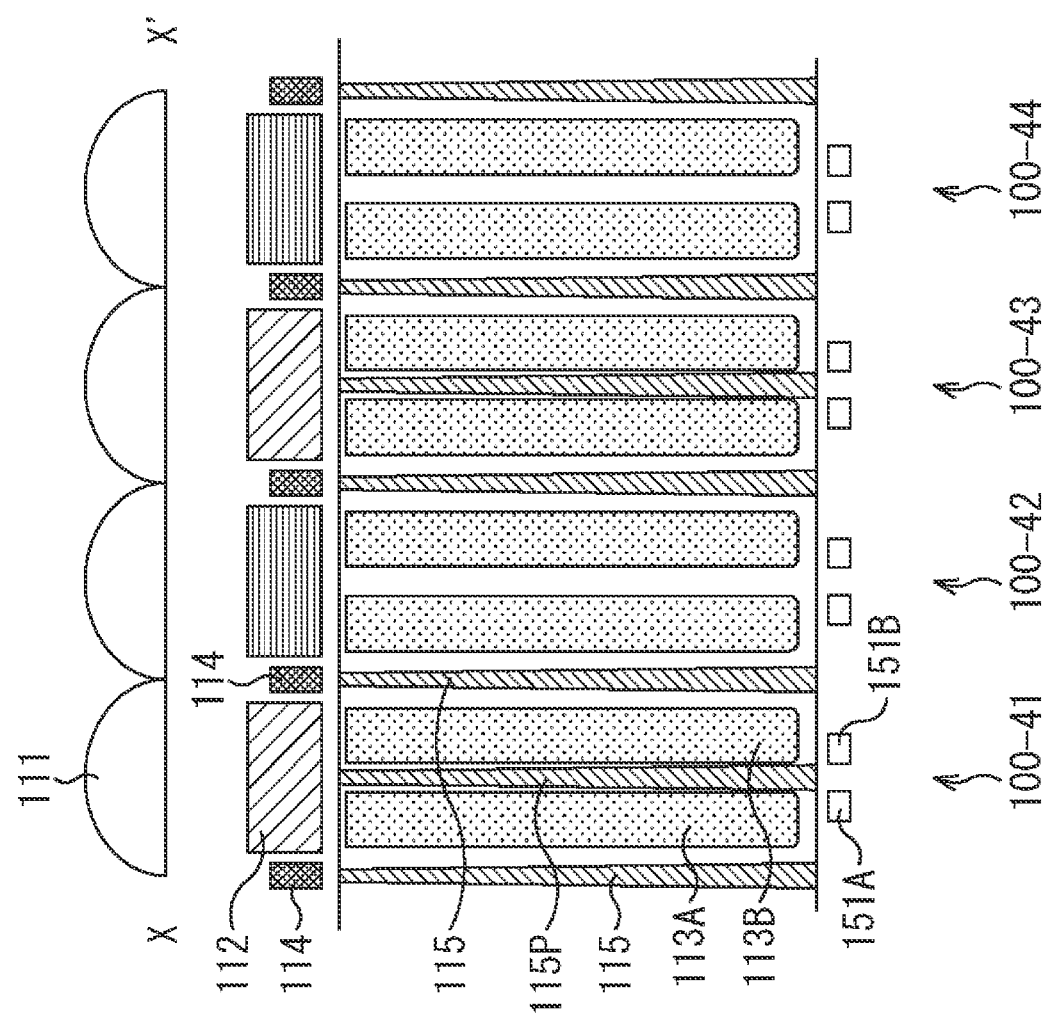
FIG. 30 is a cross-sectional view showing a structure of the pixel in the ninth embodiment.

An X-X' cross section in the plan view shown in FIG. 28 can be represented by a cross-sectional view shown in FIG. 30. Note that assuming that the upper left pixel 100 in the pixel arrangement in four rows and four columns is the pixel 100-11, the pixels 100 shown in the X-X' cross section are four pixels of the G pixel 100-41, the B pixel 100-42, the G pixel 100-43, and the B pixel 100-44.

The structure shown in the cross-sectional view of FIG. 30 is basically similar to that in the above-mentioned cross-sectional view of FIG. 11. However, the method (manufacturing process) of processing the inter-pixel separation unit 115 differs.

Specifically, in the above-mentioned FIG. 11, the inter-pixel separation unit 115 is formed by forming a trench from the surface on the light incident side (light incident surface) in a silicon layer by using a DTI technology and embedding the material such as an oxidized film and a metal in the trench. Meanwhile, in FIG. 30, the inter-pixel separation unit 115 is formed by forming a trench from the surface opposite to the light incident side (surface on the side of the transfer gates 151A and 151B, e.g., front side) in a silicon layer and embedding the material such as an oxidized film and a metal in the trench.

The ninth embodiment has been described heretofore.

(10) Tenth Embodiment

Meanwhile, in a solid-state imaging device such as a CMOS image sensor, in the case where the inter-device separation between the two photoelectric conversion devices immediately below the single on-chip lens is realized by implanting impurities by an implantation method (hereinafter, referred to as impurity implantation), it is assumed that the following problems will occur. Specifically, it is a problem that charges (negative charges, i.e., electrons (carriers)) generated in the vicinity of the silicon interface of the light incident surface (e.g., back side) where it is difficult to apply an electric field or at a part of the inter-device separation unit where an electric field is weak are not accumulated in desired right and left photoelectric conversion devices due to the impurity implantation, and the accuracy of phase difference detection is reduced.

In view of the above, in the tenth embodiment, as the pixels 200 to be two-dimensionally arranged in the pixel array unit 11 of the CMOS image sensor 10 (FIG. 1), a structure in which a fixed charge amount on the silicon interface between the central portion of the right and left photoelectric conversion devices and other portions is changed to form a potential gradient from the central portion to the right and left photoelectric conversion devices is employed. By employing such as structure, it is possible to improve the accuracy of phase difference detection by causing charges (electrons) photoelectrically converted in the vicinity of the silicon interface to be accumulated in desired right and left photoelectric conversion devices.

Hereinafter, the structure of the pixel in the tenth embodiment will be described with reference to FIG. 31 to FIG. 42.

First Example of Structure

Figure 31:
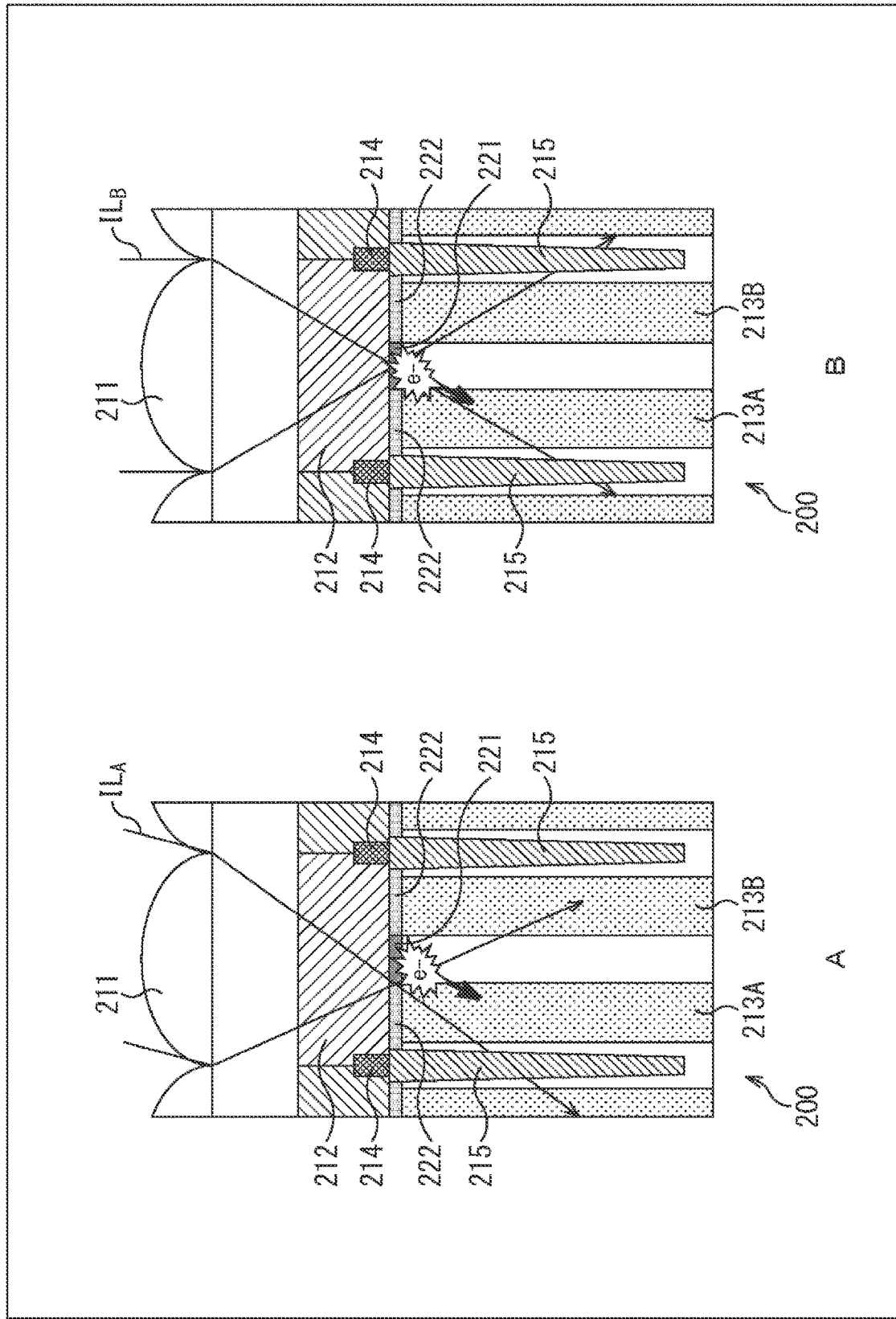
FIG. 31 is a cross-sectional view showing a first example of a structure of a pixel in a tenth embodiment.

FIG. 31 is a cross-sectional view showing a first example of the structure of the pixel in the tenth embodiment.

In FIG. 31, the pixel 200 has a 2PD structure, and includes an on-chip lens 211, a color filter 212, photoelectric conversion devices 213A and 213B, an inter-pixel light blocking unit 214, and an inter-pixel separation unit 215.

Note that since in the pixel 200, the on-chip lens 211 to the inter-pixel separation unit 215 respectively correspond to the on-chip lens 111, the color filter 112, the photoelectric conversion devices 113A and 113B, the inter-pixel light blocking unit 114, and the inter-pixel separation unit 115 in the pixel 100 (FIG. 11, etc.) in the above-mentioned embodiments, description thereof will be omitted as appropriate. However, in the pixel 200 in FIG. 31, the inter-pixel separation unit 215 includes an oxide film.

In the pixel 200, the incident light IL condensed by the on-chip lens 211 passes through the color filter 212 and is applied to the photoelectric conversion area in the photoelectric conversion device 213A or the photoelectric conversion device 213B.

A of FIG. 31 shows the case where the condensing spot of the incident light IL A is shifted to the left side from the central portion of the right and left photoelectric conversion devices 213A and 213B, i.e., there is a phase difference shift. Meanwhile, B of FIG. 31 shows the case where the condensing spot of the incident light IL B is at the center portion of the right and left photoelectric conversion devices 213A and 213B, i.e., there is no phase difference shift.

Here, in the silicon layer (semiconductor layer), the fixed charge amount on the silicon interface on the light incident side differs between the central portion of the right and left photoelectric conversion devices 213A and 213B and the other portions.

Specifically, in the case of comparing a fixed charge amount in a central area 221 (first area) that is an area of the central portion on the silicon interface on the light incident side and a fixed charge amount in a right-and-left area 222 (second area) that is an area (right and left areas of the central portion) excluding the central portion with other, the fixed charge amount in the central area 221 is larger than the fixed charge amount in the right-and-left area 222.

As described above, by changing the fixed charge amounts of the central area 221 and the right-and-left area 222 on the silicon interface on the light incident side to form a potential gradient from the central portion between the right and left photoelectric conversion devices 213A and 213B to the right and left photoelectric conversion devices 213A and 213B, it is possible to cause the electrons photoelectrically converted on the silicon interface to be accumulated in the desired right and left photoelectric conversion devices 213A and 213B.

For example, in the pixel 200 in A of FIG. 31, in the case where there is a phase difference shift as indicated by the incident light $IL_A$ in the figure, since the electrons photoelectrically converted in the vicinity of the silicon interface are accumulated in the desired right and left photoelectric conversion devices 213A and 213B due to the potential gradient and the separation ratio is improved, it is possible to improve the accuracy of phase difference detection.

Second Example of Structure

Figure 32:
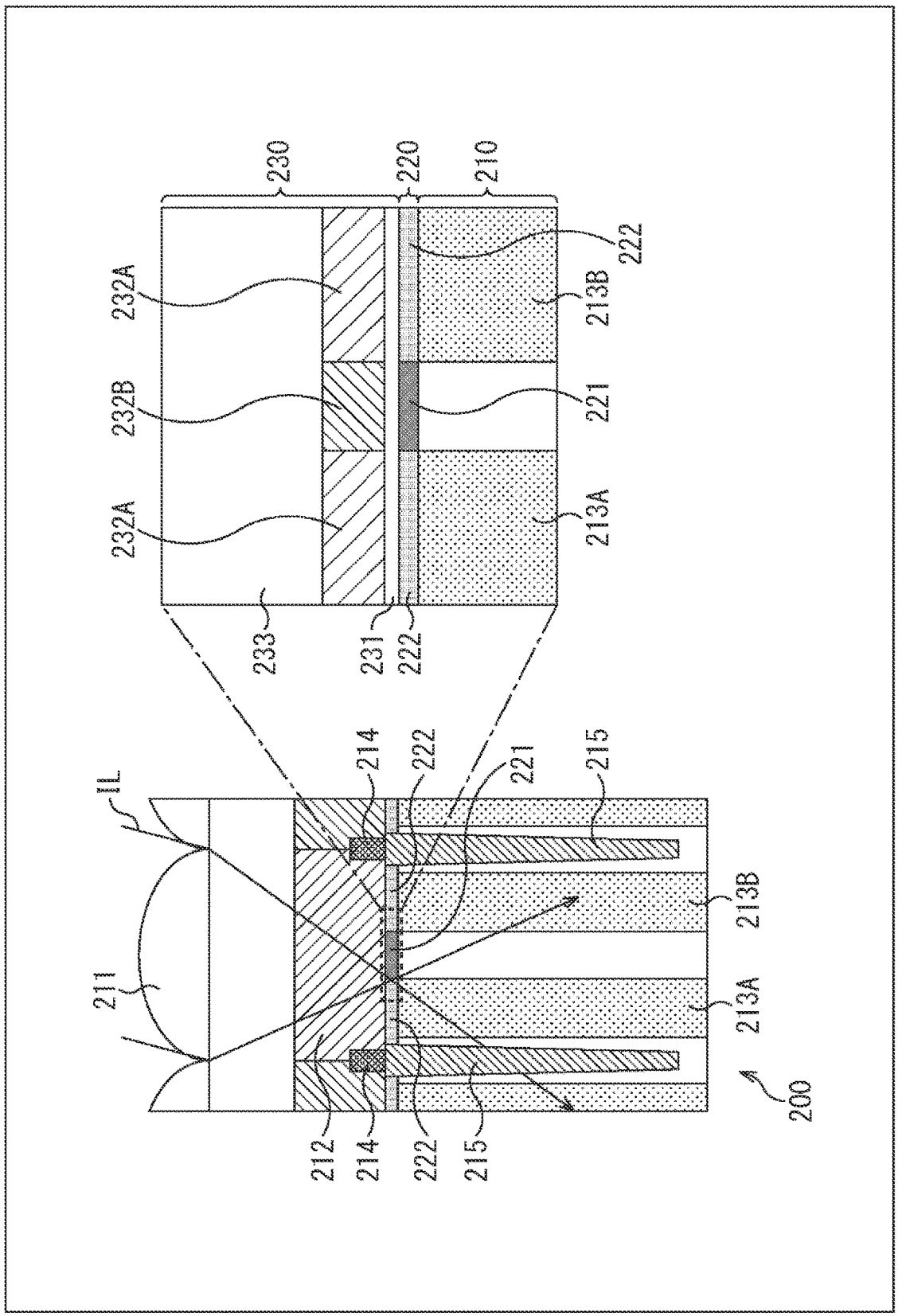
FIG. 32 is a cross-sectional view showing a second example of the structure of the pixel in the tenth embodiment.

FIG. 32 is a cross-sectional view showing a second example of the structure of the pixel in the tenth embodiment.

FIG. 32 shows, in an enlarged manner, an area including the central area 221 and the right-and-left area 222 on the silicon interface on the light incident side, of the cross section of the pixel 200 shown in FIG. 31. As shown in the enlarged view, an insulation layer 230 formed on (the interface layer 220 of) a silicon layer 210 has a structure in which a layer including a High-k film 232A and a High-k film 232B is stacked on an oxide film 231 and an oxide film 233.

The High-k film is a high dielectric constant insulation film (high dielectric constant film) formed of a material having a relative dielectric constant higher than that of an insulation film such as silicon dioxide ($SiO_2$).

Here, in the insulation layer 230, the High-k film 232A is formed on the oxide film 231 so as to correspond to the right-and-left area 222 in the interface layer 220. Further, in the insulation layer 230, the High-k film 232B is formed on the oxide film 231 so as to correspond to the central area 221 in the interface layer 220. Note that in the insulation layer 230, the oxide film 233 is formed as the upper layer of the layer including the High-k film 232A and the High-k film 232B.

The High-k film 232A and the High-k film 232B are different high dielectric constant films, and aluminum oxide ($Al_2O_3$), hafnium oxide ($HfO_2$), or the like can be used, for example. Further, as the oxide film 231 and the oxide film 233, for example, silicon dioxide ($SiO_2$) can be used.

As described above, in the pixel 200 in FIG. 32, the insulation layer 230 has a structure in which the High-k film 232B is formed in a part corresponding to the central area 221 that is the central portion between the right and left photoelectric conversion devices 213A and 213B, which has a large fixed charge amount, and the High-k film 232A is formed in a part corresponding to the right-and-left area 222 excluding the central portion, which has a low fixed charge amount.

With such a structure, in the pixel 200 in FIG. 32, in the case where there is a phase difference shift as indicated by the incident light IL in the figure, since the electrons photoelectrically converted in the vicinity of the silicon interface are accumulated in the desired right and left photoelectric conversion devices 213A and 213B, it is possible to improve the accuracy of phase difference detection.

(Third Example of Structure)

Figure 33:
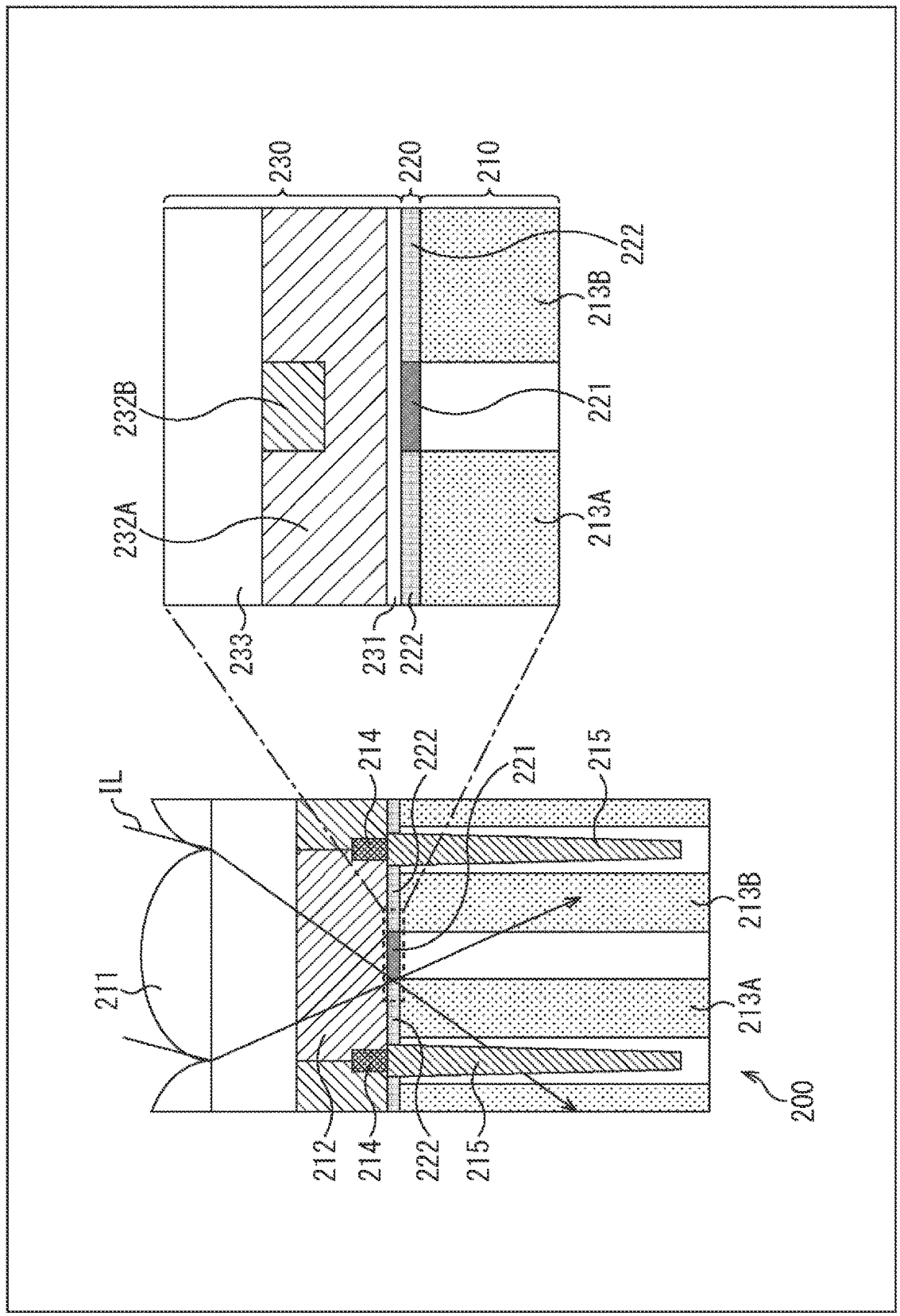
FIG. 33 is a cross-sectional view showing a third example of the structure of the pixel in the tenth embodiment.

FIG. 33 is a cross-sectional view showing a third example of the structure of the pixel in the tenth embodiment.

Similarly to FIG. 32 described above, FIG. 33 shows, in an enlarged manner, an area including the central area 221 and the right-and-left area 222 on the silicon interface, of the cross section of the pixel 200 shown in FIG. 31. However, the structure of the cross section of the insulation layer 230 is different from that in the enlarged view of FIG. 32 described above.

That is, the insulation layer 230 in FIG. 33 has a structure in which the layer to be formed between the oxide film 231 and the oxide film 233 is obtained by stacking a lower layer including only the High-k film 232A and an upper layer including the High-k film 232A and the High-k film 232B, and the High-k film 232B is embedded in a concave portion of the High-k film 232A having a concave shape.

As described above, in the pixel 200 in FIG. 33, the insulation layer 230 has a structure in which the High-k films 232A and 232B (A+B) are formed in a part corresponding to the central area 221 that is the central portion between the right and left photoelectric conversion devices 213A and 213B, which has a large fixed charge amount, and the High-k film 232A (A) is formed in a part corresponding to the right-and-left area 222 excluding the central portion, which has a low fixed charge amount.

In other words, in at least one of the High-k film of the part corresponding to the central area 221 and the High-k film of the part corresponding to the right-and-left area 222, two or more different high dielectric constant films are stacked.

With such a configuration, in the pixel 200 in FIG. 33, in the case where there is a phase difference shift as indicated by the incident light IL in the figured, the electrons photoelectrically converted in the vicinity of the silicon interface are accumulated in the desired right and left photoelectric conversion devices 213A and 213B, it is possible to improve the accuracy of phase difference detection.

Fourth Example of Structure

Figure 34:
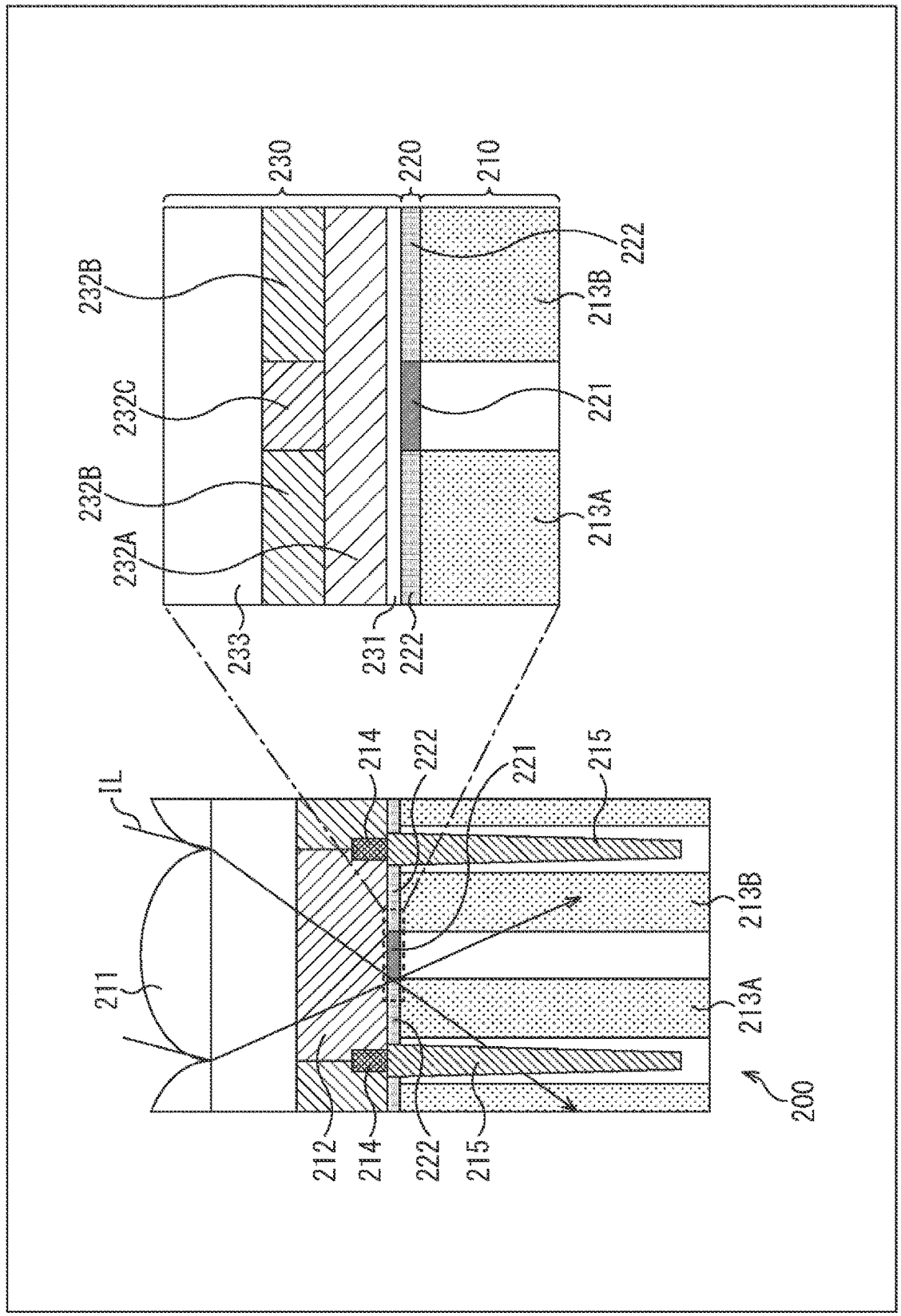
FIG. 34 is a cross-sectional view showing a fourth example of the structure of the pixel in the tenth embodiment.

FIG. 34 is a cross-sectional view showing a fourth example of the structure of the pixel in the tenth embodiment.

Similarly to FIG. 32 or the like described above, FIG. 34 shows, in an enlarged manner, an area including the central area 221 and the right-and-left area 222 on the silicon interface, of the cross section of the pixel 200 shown in FIG. 31. However, the structure of the cross section of the insulation layer 230 is different from that in the enlarged view of FIG. 32 or the like described above.

That is, the insulation layer 230 in FIG. 34 has a structure in which the layer to be formed between the oxide film 231 and the oxide film 233 is obtained by stacking a lower layer including only the High-k film 232A and an upper layer including the High-k film 232B and a High-k film 232C. Here, the High-k film 232C is a high dielectric constant film different from the High-k films 232A and 232B.

As described above, in the pixel 200 in FIG. 34, the insulation layer 230 has a structure in which the High-k films 232A and 232C (A+C) are formed in a part corresponding to the central area 221 that is the central portion between the right and left photoelectric conversion devices 213A and 213B, which has a large fixed charge amount, and the High-k films 232A and 232B (A+B) are formed in a part corresponding to the right-and-left area 222 excluding the central portion, which has a low fixed charge amount.

In other words, in at least one of the High-k film of the part corresponding to the central area 221 and the High-k film of the part corresponding to the right-and-left area 222, two or more different high dielectric constant films are stacked.

With such a structure, in the pixel 200 in FIG. 34, in the case where there is a phase difference shift as indicated by the incident light IL in the figure, since the electrons photoelectrically converted in the vicinity of the silicon interface are accumulated in the desired right and left photoelectric conversion devices 213A and 213B, it is possible to improve the accuracy of phase difference detection.

Fifth Example of Structure

Figure 35:
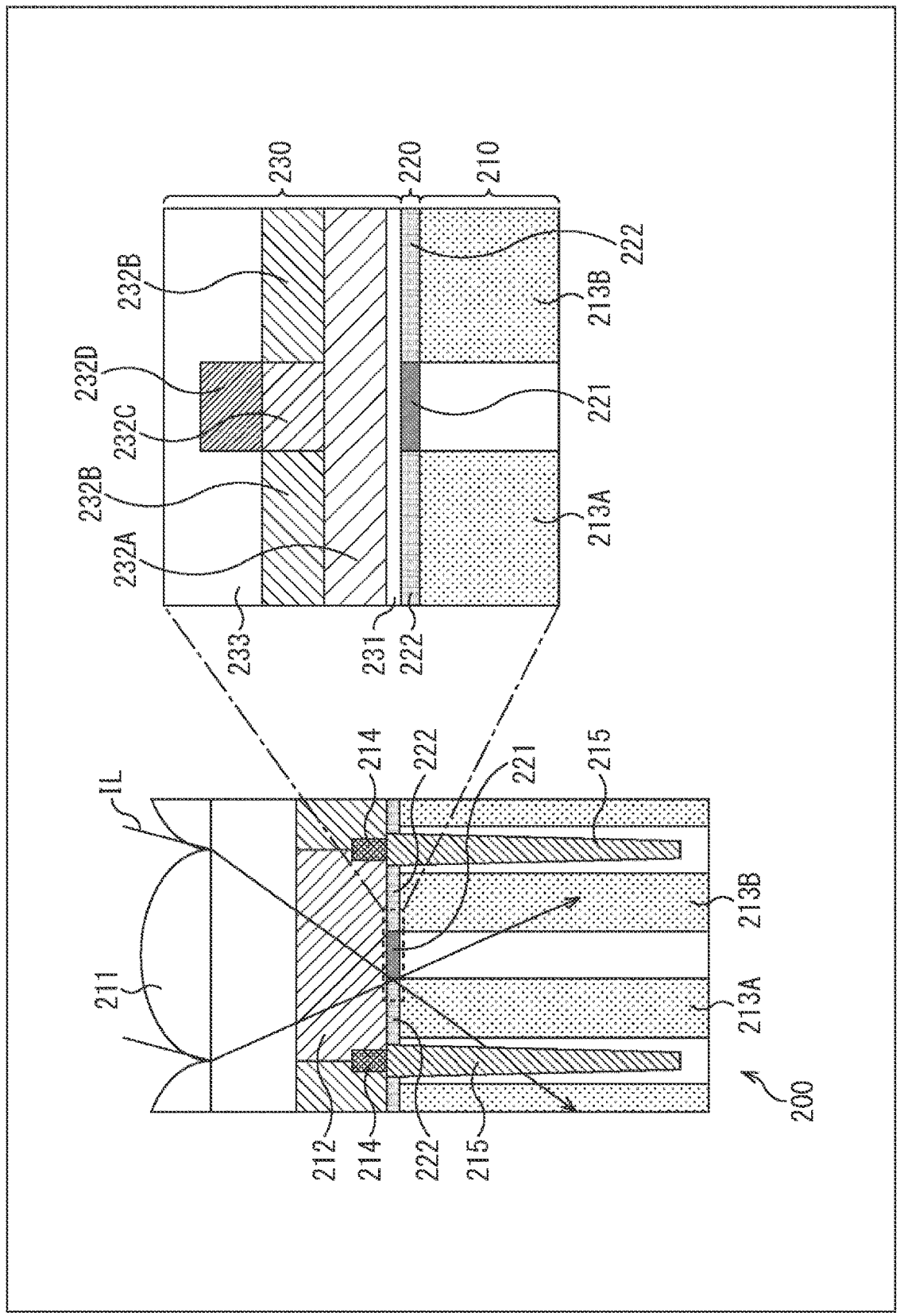
FIG. 35 is a cross-sectional view showing a fifth example of the structure of the pixel in the tenth embodiment.

FIG. 35 is a cross-sectional view showing a fifth example of the structure of the pixel in the tenth embodiment.

Similarly to FIG. 32 or the like described above, FIG. 35 shows, in an enlarged manner, an area including the central area 221 and the right-and-left area 222 on the silicon interface, of the cross section of the pixel 200 shown in FIG. 31. However, the structure of the cross section of the insulation layer 230 is different from that in the enlarged view of FIG. 32 or the like described above.

That is, the insulation layer 230 in FIG. 35 has a structure in which the layer to be formed between the oxide film 231 and the oxide film 233 is obtained by stacking a first layer including only the High-k film 232A, a second layer including the High-k film 232B and the High-k film 232C, and a third layer partially including a High-k film 232D.

Here, the High-k film 232D is a high dielectric constant film different from the High-k films 232A to 232C. Further, in the insulation layer 230, a portion of the third layer excluding the High-k film 232D is formed to include a part of the oxide film 233 that is the upper layer thereof.

As described above, in the pixel 200 in FIG. 35, the insulation layer 230 has a structure in which the High-k films 232A, 232C, and 232D (A+C+D) are formed in a part corresponding to the central area 221 that is the central portion between the right and left photoelectric conversion devices 213A and 213B, which has a large fixed charge amount, and the High-k films 232A and 232B (A+B) are formed in a part corresponding to the right-and-left area 222 excluding the central portion, which has a low fixed charge amount.

In other words, in at least one of the High-k film of the part corresponding to the central area 221 and the High-k film of the part corresponding to the right-and-left area 222, two or more different high dielectric constant films are stacked. Further, the number of stacked High-k films of the High-k film of the part corresponding to the central area 221 is larger than that of the High-k film of the part corresponding to the right-and-left area 222.

With such a structure, in the pixel 200 in FIG. 35, in the case where there is a phase difference shift as indicated by the incident light IL in the figure, since the electrons photoelectrically converted in the vicinity of the silicon interface are accumulated in the desired right and left photoelectric conversion devices 213A and 213B, it is possible to improve the accuracy of phase difference detection.

(Sixth Example of Structure)

Figure 36:
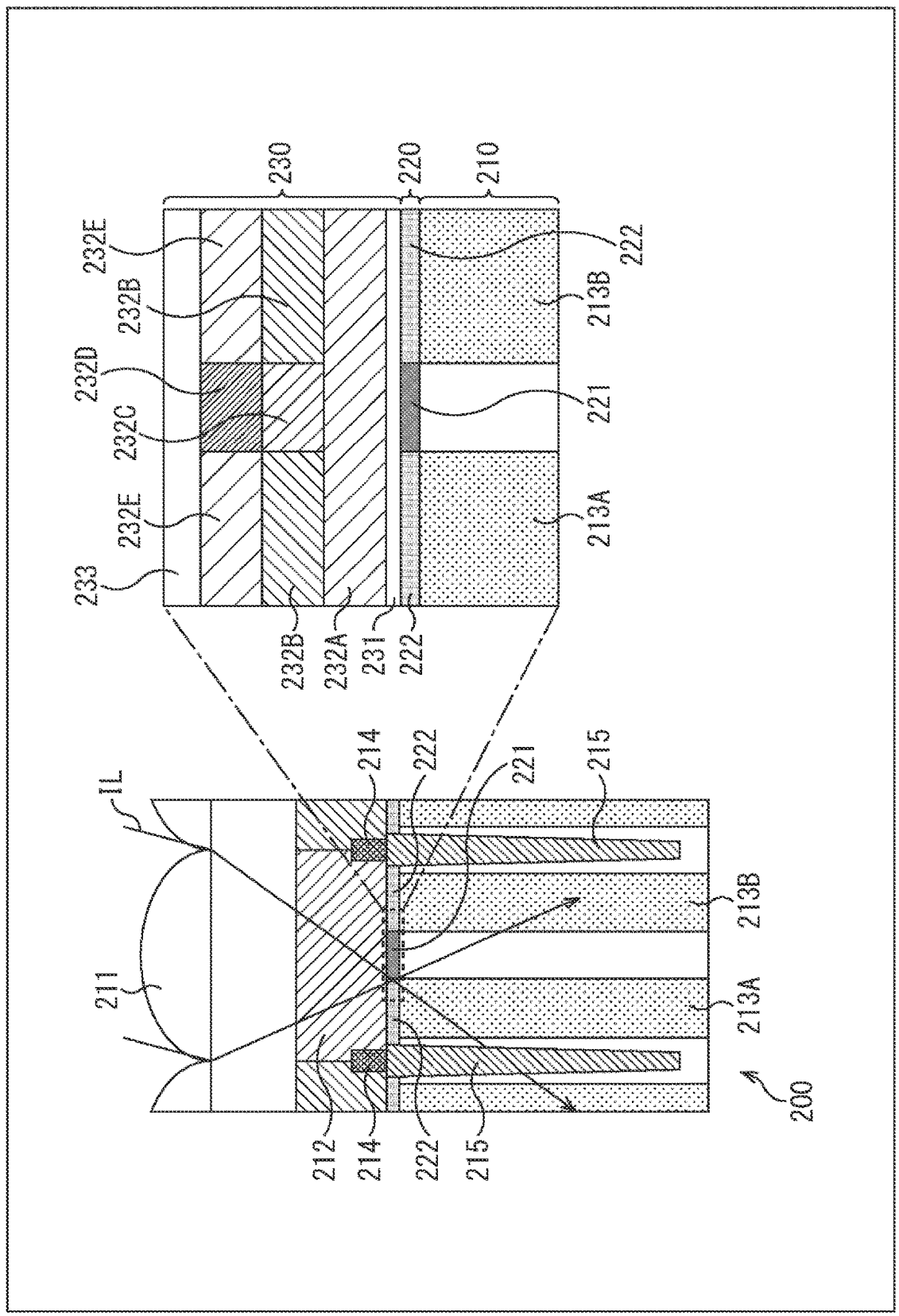
FIG. 36 is a cross-sectional view showing a sixth example of the structure of the pixel in the tenth embodiment.

FIG. 36 is a cross-sectional view showing a sixth example of the structure of the pixel in the tenth embodiment.

Similarly to FIG. 32 or the like described above, FIG. 36 shows, in an enlarged manner, an area including the central area 221 and the right-and-left area 222 on the silicon interface, of the cross section of the pixel 200 shown in FIG. 31. However, the structure of the cross section of the insulation layer 230 is different from that in the enlarged view of FIG. 32 or the like described above.

That is, the insulation layer 230 in FIG. 36 has a structure in which the layer to be formed between the oxide film 231 and the oxide film 233 is obtained by stacking the first layer including only the first layer including only the High-k film 232A, the second layer including the High-k film 232B and the High-k film 232C, and the third layer including the High-k film 232D and a High-k film 232E. Here, the High-k film 232E is a high dielectric constant film different from the High-k films 232A to 232D.

As described above, in the pixel 200 in FIG. 36, the insulation layer 230 has a structure in which the High-k films 232A, 232C, and 232D (A+C+D) are formed in a part corresponding to the central area 221 that is the central portion between the right and left photoelectric conversion devices 213A and 213B, which has a large fixed charge amount, and the High-k films 232A, 232B, and 232E (A+B+E) are formed in a part corresponding to the right-and-left area 222 excluding the central portion, which has a low fixed charge amount.

In other words, in at least one of the High-k film of the part corresponding to the central area 221 and the High-k film of the part corresponding to the right-and-left area 222, two or more different high dielectric constant films are stacked. Further, it can be said that the High-k film of the part corresponding to the central area 221 and the High-k film of the part corresponding to the right-and-left area 222 have the same number of stacked layers.

With such a structure, in the pixel 200 in FIG. 36, in the case where there is a phase difference shift as indicated by the incident light IL in the figure, since the electrons photoelectrically converted in the vicinity of the silicon interface are accumulated in the desired right and left photoelectric conversion devices 213A and 213B, it is possible to improve the accuracy of phase difference detection.

(Seventh Example of Structure)

Figure 37:
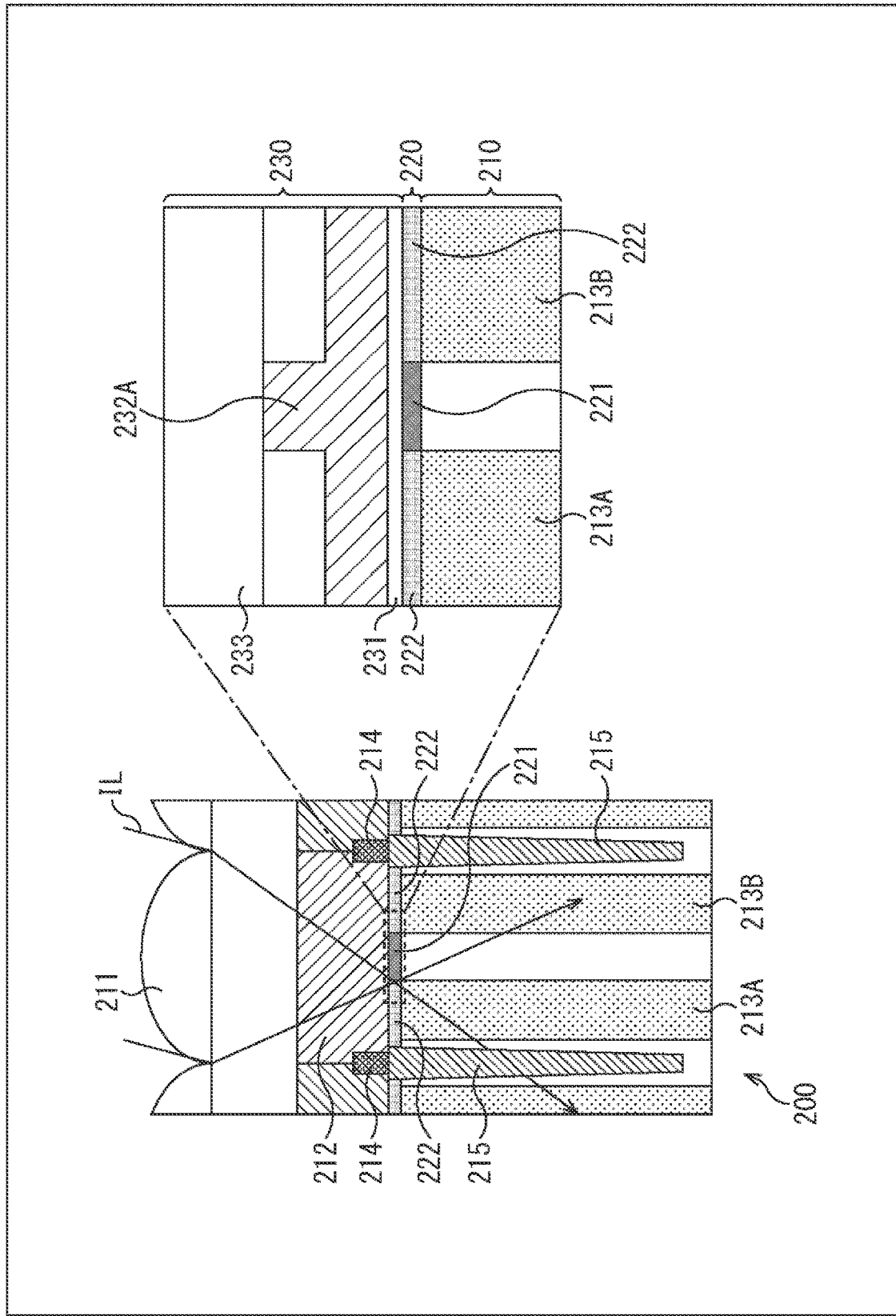
FIG. 37 is a cross-sectional view showing a seventh example of the structure of the pixel in the tenth embodiment.

FIG. 37 is a cross-sectional view showing a seventh example of the structure of the pixel in the tenth embodiment. Similarly to FIG. 32 or the like described above, FIG. 37 shows, in an enlarged manner, an area including the central area 221 and the right-and-left area 222 on the silicon interface, of the cross section of the pixel 200 shown in FIG. 31. However, the structure of the cross section of the insulation layer 230 is different from that in the enlarged view of FIG. 32 or the like described above.

That is, the insulation layer 230 in FIG. 37 has a structure in which the layer to be formed between the oxide film 231 and the oxide film 233 is obtained by stacking the first layer including only the High-k film 232A and the second layer partially including the High-k film 232A. Further, in the insulation layer 230, a portion of the second layer excluding the High-k film 232A is formed to include a part of the oxide film 233 that is the upper layer thereof.

As described above, in the pixel 200 in FIG. 37, the insulation layer 230 has a structure in which the High-k films 232A having different heights are formed in a part corresponding to the central area 221 that is the central portion between the right and left photoelectric conversion devices 213A and 213B, which has a large fixed charge amount, and a part corresponding to the right-and-left area 222 excluding the central portion, which has a low fixed charge amount.

In other words, in the insulation layer 230 in FIG. 37, the High-k film 232A has a convex structure because the part corresponding to the central area 221 of the central portion is higher than the part corresponding to the right-and-left area 222 excluding the central portion. Further, from such a structure, it can be also said that in the insulation layer 230 in FIG. 37, the thickness of the oxide film 233 differs between the part corresponding to the central area 221 and the part corresponding to the right-and-left area 222.

With such a structure, in the pixel 200 in FIG. 37, in the case where there is a phase difference shift as indicated by the incident light IL in the figure, since the electrons photoelectrically converted in the vicinity of the silicon interface are accumulated in the desired right and left photoelectric conversion devices 213A and 213B, it is possible to improve the accuracy of phase difference detection.

(Eighth Example of Structure)

Figure 38:
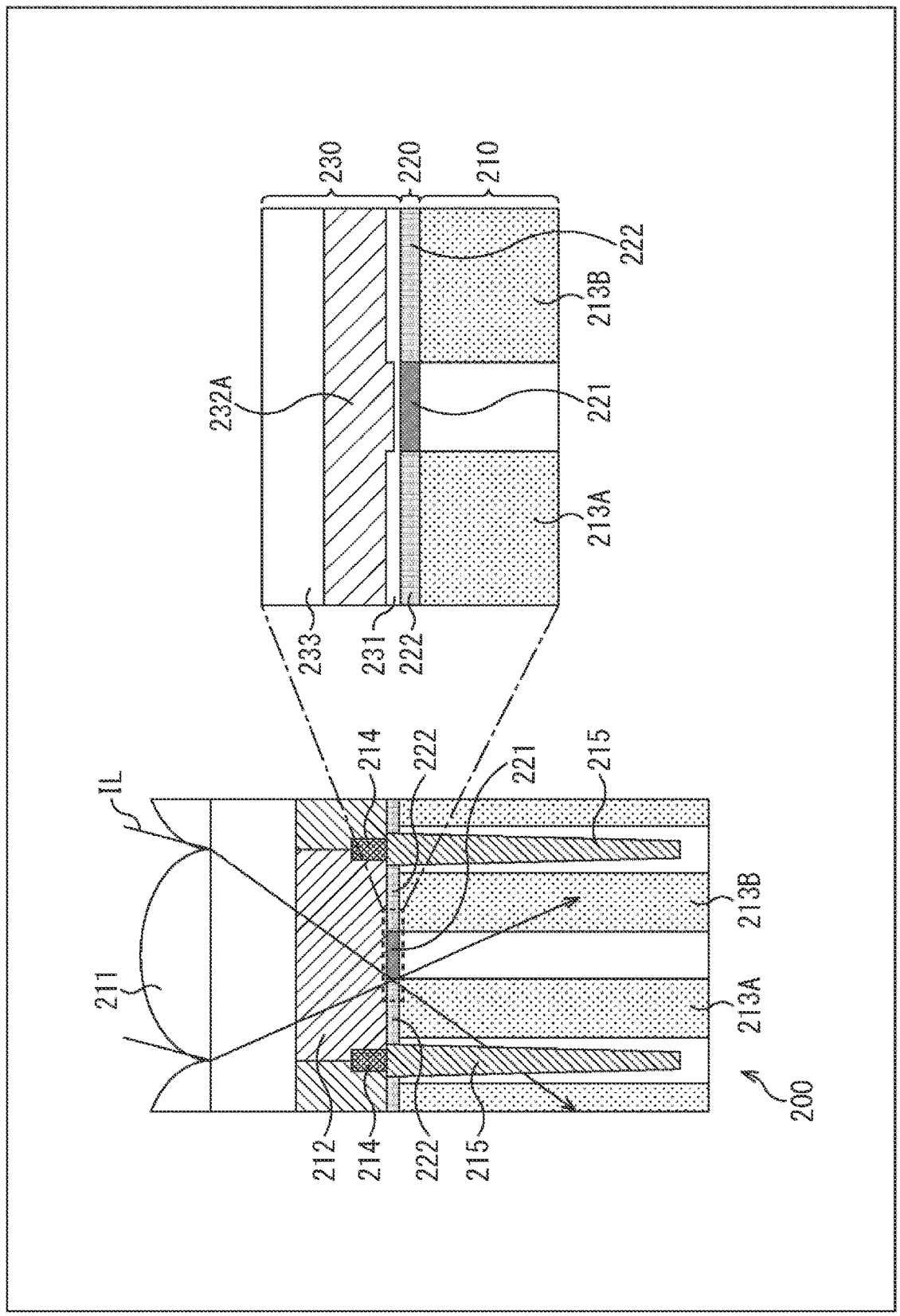
FIG. 38 is a cross-sectional view showing an eighth example of the structure of the pixel in the tenth embodiment.

FIG. 38 is a cross-sectional view showing an eighth example of the structure of the pixel in the tenth embodiment.

Similarly to FIG. 32 or the like described above, FIG. 38 shows, in an enlarged manner, an area including the central area 221 and the right-and-left area 222 on the silicon interface, of the cross section of the pixel 200 shown in FIG. 31. However, the structure of the cross section of the insulation layer 230 is different from that in the enlarged view of FIG. 32 or the like described above.

That is, the insulation layer 230 in FIG. 38 has a structure in which the layer to be formed between the oxide film 231 and the oxide film 233 forms a layer including only the High-k film 232A, but a part of the layer, which corresponds to the central area 221 of the central portion, protrudes downward with respect to the part corresponding to the right-and-left area 222 excluding the central portion.

As described above, in the pixel 200 in FIG. 38, the insulation layer 230 has a structure in which the thickness of the oxide film 231 differs between the part corresponding to the central area 221 that is the central portion between the right and left photoelectric conversion devices 213A and 213B, which has a large fixed charge amount, and the part corresponding to the right-and-left area 222 excluding the central portion, which has a low fixed charge amount.

With such a structure, in the pixel 200 in FIG. 38, in the case where there is a phase difference shift as indicated by the incident light IL in the figure, since the electrons photoelectrically converted in the vicinity of the silicon interface are accumulated in the desired right and left photoelectric conversion devices 213A and 213B, it is possible to improve the accuracy of phase difference detection.

(Ninth Example of Structure)

Figure 39:
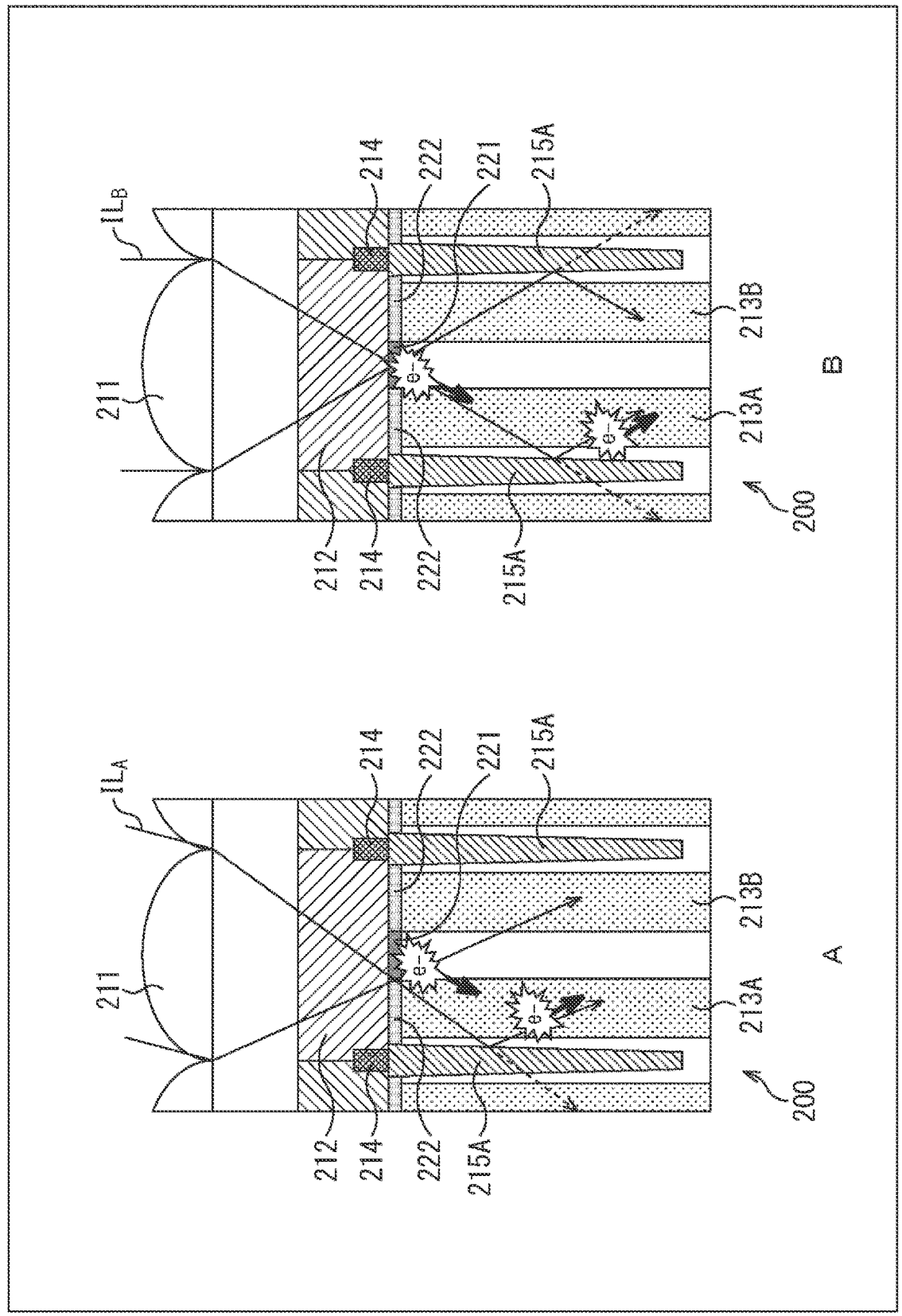
FIG. 39 is a cross-sectional view showing a ninth example of the structure of the pixel in the tenth embodiment.

FIG. 39 is a cross-sectional view showing a ninth example of the structure of the pixel in the tenth embodiment.

Although the case where the inter-pixel separation unit 215 includes an oxide film has been shown in FIG. 31 to FIG. 38 described above, the material of the inter-pixel separation unit 215 is not limited to the oxide film, and another material such as metal can be used. FIG. 39 shows the structure in the case where instead of the inter-pixel separation unit 215 described above, an inter-pixel separation unit 215A is formed by embedding metal in the pixel 200.

Here, for example, the inter-pixel separation unit 215A is formed by embedding metal in the groove (trench) dug, in accordance with the shape of the pixel in square units, into a square grid in a silicon layer in which a photoelectric conversion area has been formed from the side of the light incident surface using a DTI technology. Here, as the metal, tungsten (W), aluminum (Al), silver (Ag), rhodium (Rh), or the like can be used.

For example, in the pixel 200 in A of FIG. 39, in the case where there is a phase difference shift as indicated by the incident light IL A in the figure, since adjacent pixels in the silicon layer are physically separated by the inter-pixel separation unit 215A, when the electrons photoelectrically converted in the vicinity of the silicon interface are accumulated in the desired right and left photoelectric conversion devices 213A and 213B due to the potential gradient, the electrons can be prevented from flowing into the adjacent pixels. Note that similarly, the electrons can be prevented from flowing into the adjacent pixels also in the case where there is no phase difference as shown in B of FIG. 39.

As described above, in the pixel 200 in FIG. 39, it is possible to suppress color mixing in the bulk and improve the separation ratio by inter-pixel separation between different colors by metal of the formed inter-pixel separation unit 215A. Note that an oxide film and metal have been described as the material of the inter-pixel separation unit 215 (215A) in the above description, another substance may be used.

Note that although a groove is dug in the silicon layer 210 in which a photoelectric conversion area has been formed from the side of the light incident surface, and metal is embedded therein when forming the inter-pixel separation unit 215A in the pixel 200 in FIG. 39, a pinning film (negative fixed charge film) and an insulation film can be provided on the side wall of the groove at that time. Here, as the pinning film, hafnium oxide ($HfO_2$), tantalum oxide ($Ta_2O_5$), or the like can be used. Further, as the insulation film, silicon dioxide ($SiO_2$) or the like can be used.

(Tenth Example of Structure)

Figure 40:
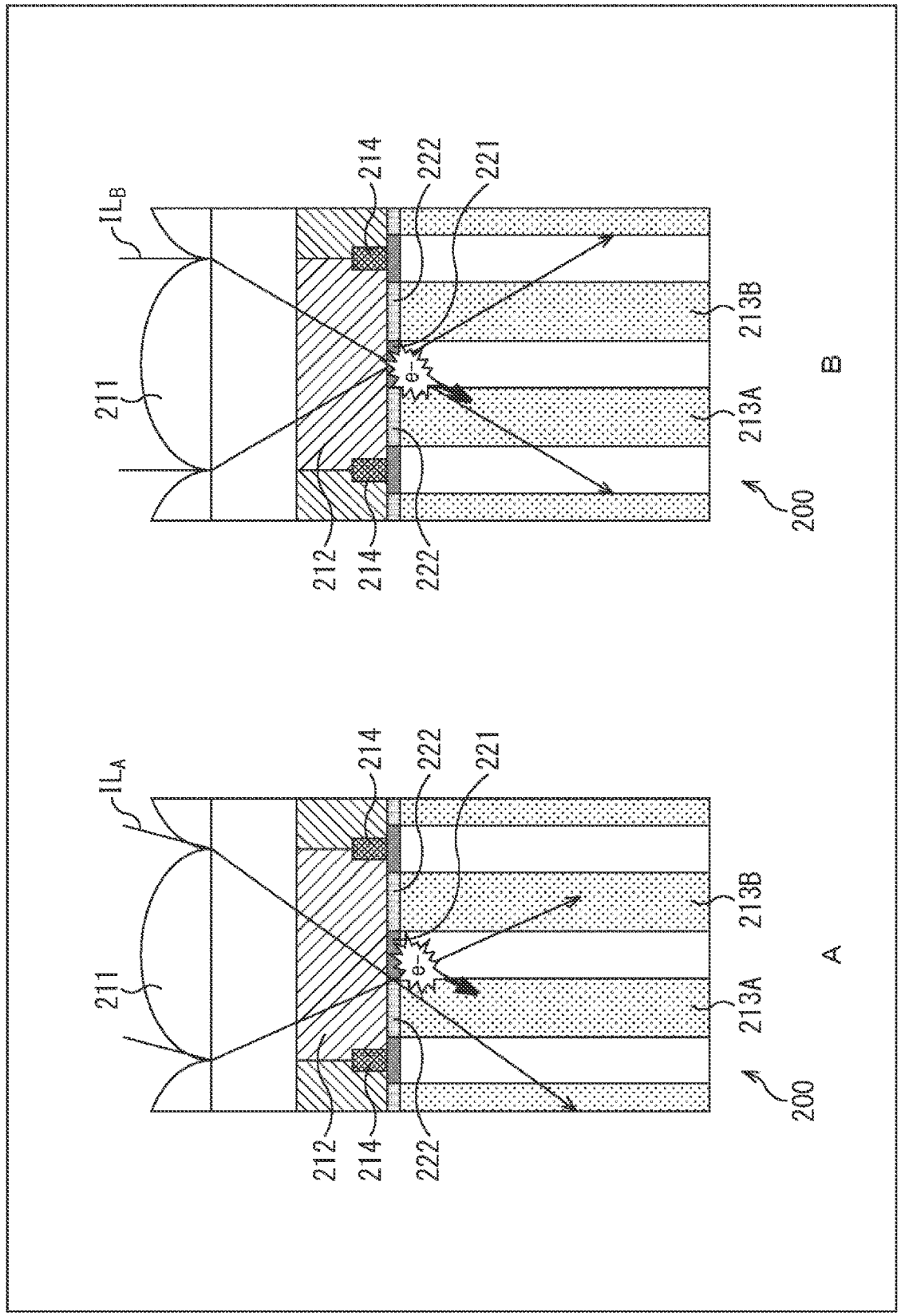
FIG. 40 is a cross-sectional view showing a tenth example of the structure of the pixel in the tenth embodiment.

FIG. 40 is a cross-sectional view showing a tenth example of the structure of the pixel in the tenth embodiment.

Although a structure in which the adjacent pixels are physically separated by the inter-pixel separation unit 215 including an oxide film or the inter-pixel separation unit 215A formed of metal has been shown in FIG. 31 to FIG. 38 or FIG. 39 described above, they may be separated by impurities in the silicon layer.

The pixel 200 in FIG. 40 has a structure in which the adjacent pixels are separated by the impurity distribution inside the silicon layer without forming a physical separation unit (inter-pixel separation unit) between the adjacent pixels. Here, A of FIG. 40 shows the case where there is a phase difference shift due to the incident light $IL_A$, and B of FIG. 40 shows the case where there is no phase difference shift due to the incident light $IL_B$.

(Eleventh Example of Structure)

Figure 41:
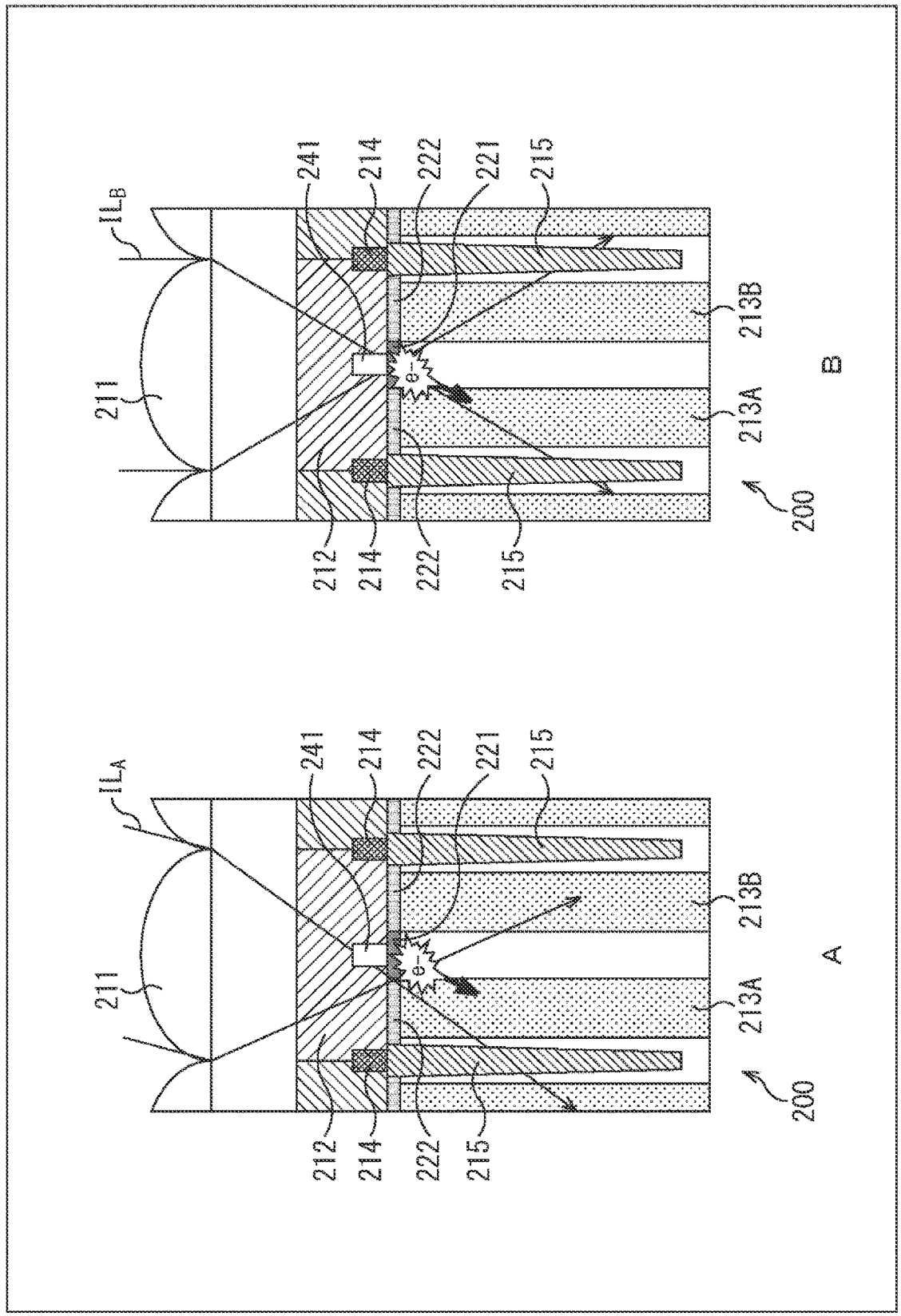
FIG. 41 is a cross-sectional view showing an eleventh example of the structure of the pixel in the tenth embodiment.

FIG. 41 is a cross-sectional view showing an eleventh example of the structure of the pixel in the tenth embodiment.

Similarly to FIG. 31 described above, FIG. 41 shows the cross section of the pixel 200. However, this cross section is different from that cross section in FIG. 31 described above in that a transparent electrode 241 is formed in the central portion of the right and left photoelectric conversion devices 213A and 213B. Note that A of FIG. 41 shows the case where there is a phase difference shift due to the incident light $IL_A$, and B of FIG. 41 shows the case where there is no phase difference shift due to the incident light $IL_B$.

In the pixel 200 in FIG. 41, the potential gradient from the central portion between the right and left photoelectric conversion devices 213A and 213B to the right and left photoelectric conversion devices 213A and 213B can be formed by applying a negative bias to the transparent electrode 241. As a result, in the pixel 200 in FIG. 41, the electrons photoelectrically converted in the vicinity of the silicon interface can be accumulated in the desired right and left photoelectric conversion devices 213A and 213B.

For example, in the pixel 200 in A of FIG. 41, in the case where there is a phase difference shift as indicated by the incident light $IL_A$ in the figure, by applying a negative bias to the transparent electrode 241 to form the potential gradient, since the electrons photoelectrically converted in the vicinity of the silicon interface are accumulated in the desired right and left photoelectric conversion devices 213A and 213B, it is possible to improve the accuracy of phase difference detection.

(Schematic Diagram of Potential Distribution)

Figure 42:
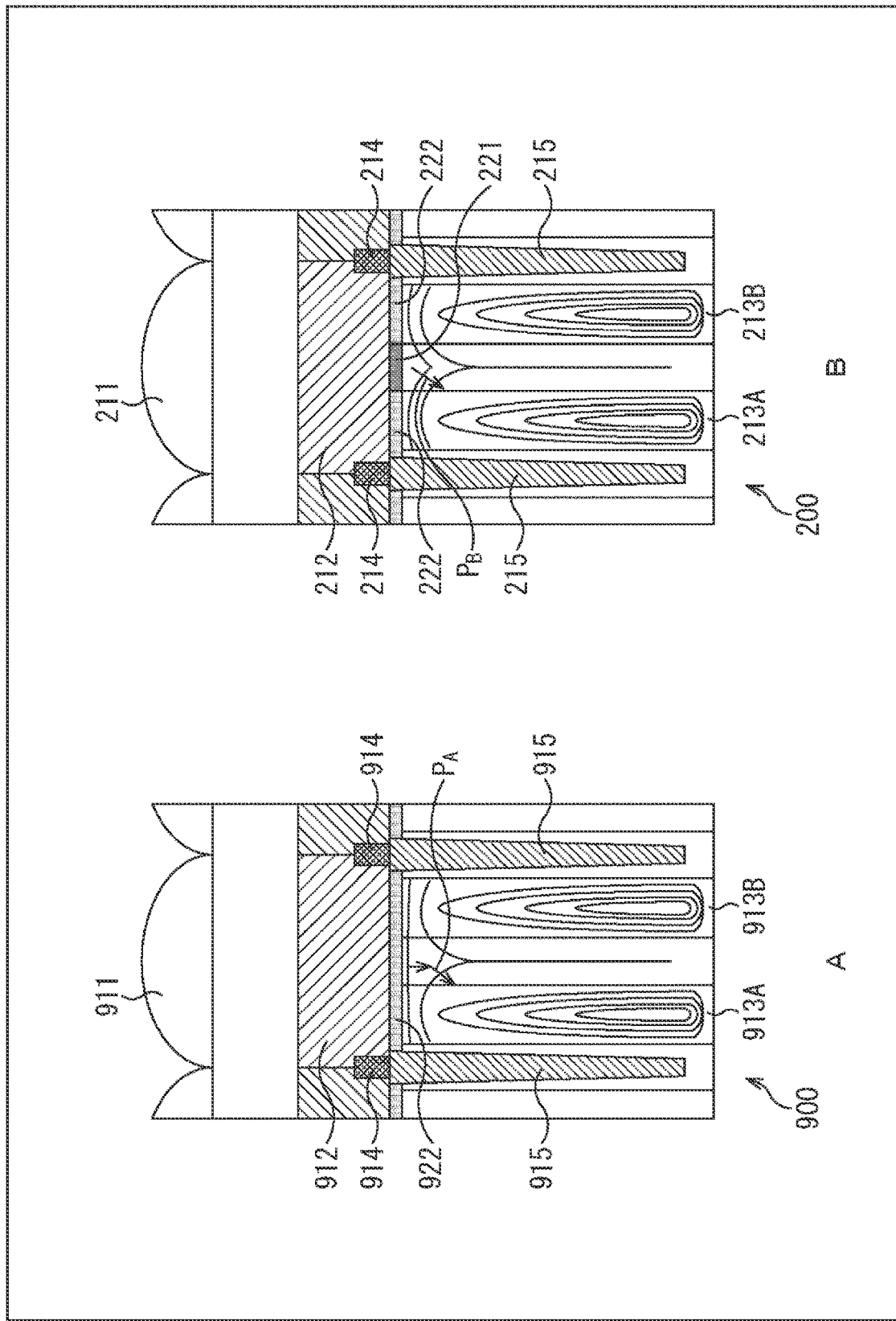
FIG. 42 is a diagram schematically illustrating a potential distribution of the pixel in the tenth embodiment.

FIG. 42 is a diagram schematically illustrating a potential distribution of the pixel in the tenth embodiment.

Note that in FIG. 42, for comparison, the potential distribution of the pixel 200 to which the present technology is applied is shown in B of FIG. 42 and the potential distribution of a general pixel 900 is shown in A of FIG. 42. Here, the potential distribution is represented by the lines drawn on the right and left photoelectric conversion devices or on the area between them. The denser these lines, the more potential gradient there is.

As shown in the potential distribution of the pixel 900 in A of FIG. 42, generally, in the silicon layer, it is difficult to apply a potential gradient on the light incident surface (e.g., back side) or the area of the central portion of the right and left photoelectric conversion devices 913A and 913B.

Meanwhile, in the pixel 200, by changing the fixed charge amounts of the central area 221 and the right-and-left area 222 on the silicon interface on the light incident surface (e.g., back side) to make it easy to apply a potential gradient in the area of the light incident surface and the central portion, the potential gradient from the central portion between the right and left photoelectric conversion devices 213A and 213B to the right and left photoelectric conversion devices 213A and 213B is formed.

Further, a transfer path P A shown in A of FIG. 42 and a transfer path P B shown in B of FIG. 42 respectively show the transfer paths derived from the potential distributions of the pixel 900 and the pixel 200. Here, since there is an effect of potential and diffusion in transferring electrons, it is assumed that if the transfer takes time, the electrons are diffuses by that amount and the electrons cannot be accumulated in the desired photoelectric conversion device 213 (213A or 213B).

For example, in A of FIG. 42, the transfer path P A is a combination of a path directed downward and a path directed diagonally downward to the left, and there is a possibility that the transfer of electrons takes time and the electrons are diffused. Meanwhile, for example, in B of FIG. 42, the transfer path P B is only a path directed diagonally downward to the left, and electron transfer can be performed quickly.

That is, in the pixel 200 in B of FIG. 42, since a potential gradient is applied by changing the fixed charge amounts of the central area 221 and the right-and-left area 222 on the silicon interface on the light incident surface, the transfer path P B is realized by, in a sense, the electric field assist in the lateral direction (direction orthogonal to the stacking direction) of the device boundary, and electron transfer can be performed more quickly. For that reason, in the pixel 200 in B of FIG. 42, the electrons photoelectrically converted in the vicinity of the silicon interface can be accumulated in the desired photoelectric conversion device 213 (213A or 213B).

The tenth embodiment has been described above.

(11) Eleventh Embodiment

As described above, in a solid-state imaging device such as a CMOS image sensor, by employing a pixel structure in which a plurality of photoelectric conversion devices is formed immediately below a single on-chip lens, since distance information can be acquired on the basis of a signal for phase difference detection acquired from each pixel, it is possible to simultaneously perform imaging and ranging. Further, in the pixel, a separation structure by impurity implantation can be used between the right and left photoelectric conversion devices.

By employing such a structure, it is possible to simultaneously acquire a signal for imaging and a signal for detecting a phase difference. However, when photoelectrically converting light that has entered from one on-chip lens, a component to be photoelectrically converted is generated in the part to be the separation wall located in the center of the right and left photoelectric conversion devices.

This separation wall has a certain width because this is formed by implantation separation. For that reason, there is a possibility that the charges (electrons) photoelectrically converted in the area flow into the photoelectric conversion device on the side opposite to the photoelectric conversion device on the side assumed as the phase difference, which generates an unnecessary component (color mixture component). Due to this influence, the separation ratio becomes insufficient, and the accuracy of phase difference detection is reduced.

Further, for example, in the case where the pixel has a separation structure in which the separation wall located in the center of the right and left photoelectric conversion devices is formed by using a low refractive material instead of implantation separation, the light that has entered the area is refracted and is likely to enter the photoelectric conversion device of another adjacent pixel as the more angled light, which makes optical color mixture of different colors occur.

In view of the above, in the eleventh embodiment, as pixels 300 to be two-dimensionally arranged in the pixel array unit 11 of the CMOS image sensor 10 (FIG. 1), a structure in which a low-refractive embedding device separation area is formed in the central portion (inter-same-color central portion) of the photoelectric conversion devices of the same colors and a metal embedding device separation area is formed in the central portion (inter-different-color central portion) of the photoelectric conversion devices of different colors is employed. By employing such a structure, it is possible to improve the separation ratio and prevent color mixture from occurring.

Hereinafter, the structure of the pixel in the eleventh embodiment will be described with reference to FIG. 43 to FIG. 48.

First Example of Structure

Figure 43:
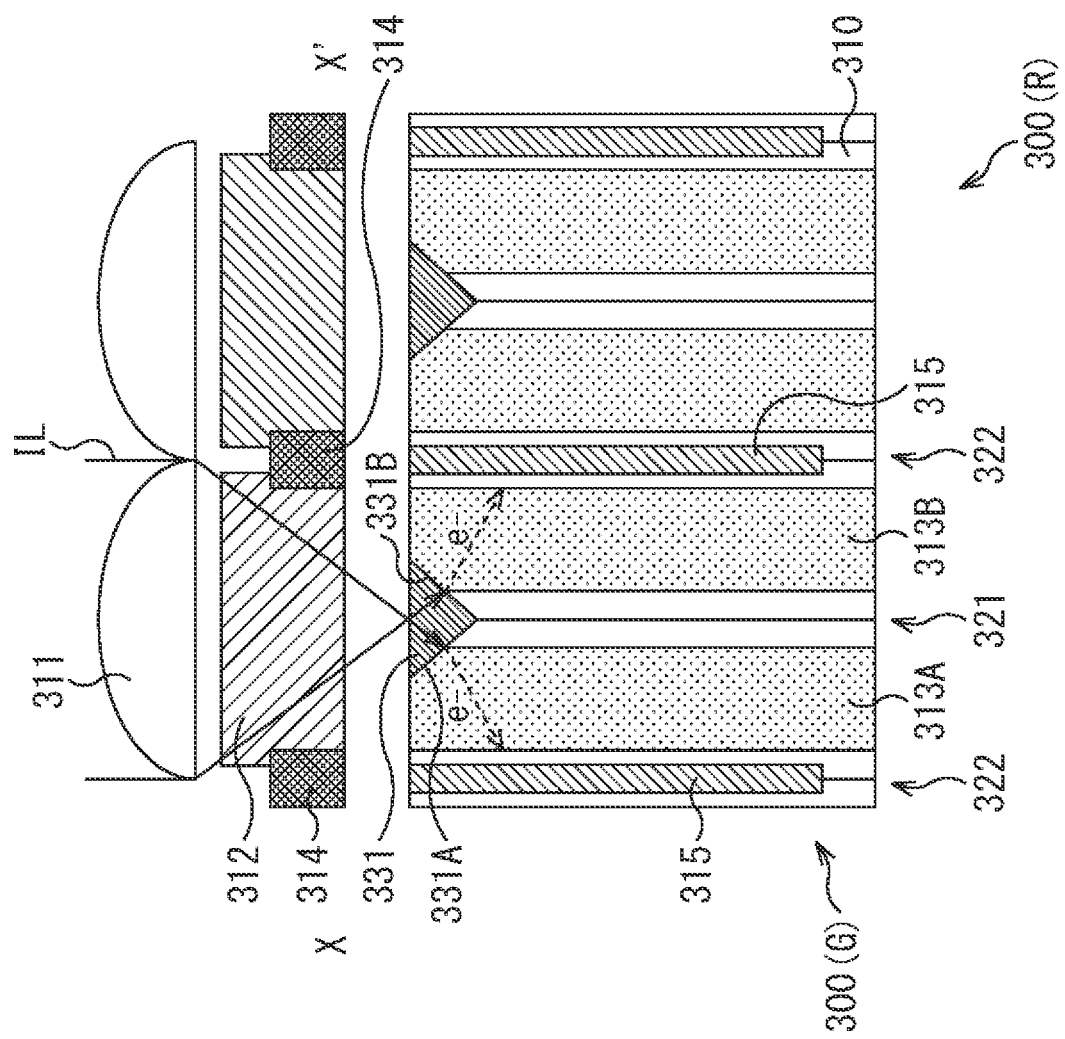
FIG. 43 is a cross-sectional view showing a first example of a structure of a pixel in an eleventh embodiment.

FIG. 43 is a cross-sectional view showing a first example of the structure of the pixel in the eleventh embodiment.

In FIG. 43, the pixel 300 has a 2PD structure and includes an on-chip lens 311, a color filter 312, photoelectric conversion devices 313A and 313B, an inter-pixel light blocking unit 314, and an inter-pixel separation unit 315.

Note that since the on-chip lens 311 to the inter-pixel separation unit 315 in the pixel 300 respectively correspond to the on-chip lens 111, the color filter 112, the photoelectric conversion devices 113A and 113B, the inter-pixel light blocking unit 114, and the inter-pixel separation unit 115 constituting the pixel 100 (FIG. 11, etc.) according to the above-mentioned embodiments, description thereof will be omitted as appropriate.

Further, for convenience of description, in the case where it is necessary to particularly distinguish the colors of the pixels 300, the R pixel 300 will be expressed as "300 (R)" and the G pixel 300 will be expressed as "300 (G)".

In the pixel 300, the incident light IL condensed by the on-chip lens 311 passes through the color filter 312 and is applied to the photoelectric conversion area of the photoelectric conversion device 313A or the photoelectric conversion device 313B.

Here, in the G pixel 300, a low-refractive material (embedding device) is embedded in an inter-same-color central portion 321 between the photoelectric conversion device 313A and the photoelectric conversion device 313B on the side of the light incident surface to form a low refraction area 331 serving as a device separation area. As the low-refractive material, for example, a low-refractive material such as an oxide film and glass can be used. More specifically, as the low-refractive material, for example, a material having a refractive index lower than that of a silicon layer 310 (semiconductor layer) in which a photoelectric conversion area has been formed can be used.

The cross-sectional shape of the low refraction area 331 is a triangular shape that is tapered and increases in width as it approaches the light incident surface. Further, the inter-same-color central portion 321, there is no low-refractive material (embedding device) serving as a separation material at a predetermined bulk depth (e.g., approximately several 100 nm) from the light incident surface, and the lower area is separated by impurities.

Further, in the case where the G pixel 300 and the R pixel 300 are adjacent to each other on the right and left, metal is embedded in a groove (trench) dug, in accordance with the shape of the pixel 300, in an inter-different-color central portion 322 between the photoelectric conversion device 313B on the right side of the G pixel 300 and the photoelectric conversion device 313A on the left side of the R pixel 300 from the side of the light incident surface to form the inter-pixel separation unit 315. Here, as the metal, tungsten (W), aluminum (Al), silver (Ag), rhodium (Rh), or the like can be used.

As described above, since the pixel 300 in FIG. 43 has a structure in which the low refraction area 331 whose cross section has an inverted triangle shape is formed in the inter-same-color central portion 321, the travelling direction of the light that has entered the low refraction area 331 is bent by the refracting surface. For example, in the pixel 300, light that has entered from the diagonally upper right direction, of the light that has entered the low refraction area 331, is refracted by a refracting surface 331A to enter the photoelectric conversion device 313A on the left side, while light that has entered from the diagonally upper left is refracted by a refracting surface 331B to enter the photoelectric conversion device 313B (arrows in the figure).

For that reason, in the case where the condensing spot of the light condensed by the on-chip lens 311 enters the low refraction area 331 formed in the inter-same-color central portion 321 between the right and left photoelectric conversion devices 313A and 313B, the incident light travels to a certain depth as it is without being photoelectrically converted, enters the photoelectric conversion device 313A or the photoelectric conversion device 313B when reaching the certain depth, and is photoelectrically converted. In particular, in the pixel 300 in FIG. 43, it is possible to cause the light that has entered the center of the light incident surface in the inter-same-color central portion 321 to enter the right and left photoelectric conversion device 313A or 313B.

Here, in the case where a separation wall is formed by implantation separation in the inter-same-color central portion 321, there is a possibility that the electrons photoelectrically converted in the area to be the separation wall flow into the photoelectric conversion device on the side opposite to the photoelectric conversion device on the side assumed as the phase difference, which reduces the accuracy of phase difference detection, as described above.

Meanwhile, such an event can be avoided in the pixel 300 in FIG. 43, because the pixel 300 has a separation structure using the low refraction area 331 formed in the inter-same-color central portion 321 and the incident light IL that has entered the low refraction area 331 enters the right and left photoelectric conversion device 313A or 313B as it is without being photoelectrically converted until reaching a certain depth. As a result, in the pixel 300 in FIG. 43, it is possible to optically and electrically improve the separation ratio, and improve the accuracy of phase difference detection.

Meanwhile, in the case of employing the separation structure using the low refraction area 331 in the inter-same-color central portion 321, there is a possibility that the light that has entered the low refraction area 331 is refracted to enter the photoelectric conversion device 313 of the adjacent pixel 300 of a different color as the more angled light, as described above.

Meanwhile, in the pixel 300 in FIG. 43, since the separation structure using the low refraction area 331 in the inter-same-color central portion 321 is provided and the inter-pixel separation unit 315 formed of metal is formed in the inter-different-color central portion 322, the light that has been refracted by the low refraction area 331 formed in the inter-same-color central portion 321 is reflected by the inter-pixel separation unit 315. As a result, in the pixel 300 in FIG. 43, it is possible to prevent optical color mixture of different colors from occurring.

Note that in the pixel 300 in FIG. 43, a groove (trench) is dug in the silicon layer 310 in which a photoelectric conversion area has been formed from the side of the light incident surface, and metal is embedded therein to form the inter-pixel separation unit 315. A pinning film (negative fixed charge film) and an insulation film can be provided on the side wall of the groove. Here, as the pinning film, hafnium oxide ($HfO_2$), tantalum oxide ($Ta_2O_5$), or the like can be used. Further, as the insulation film, silicon dioxide ($SiO_2$) or the like can be used.

Second Example of Structure

Figure 44:
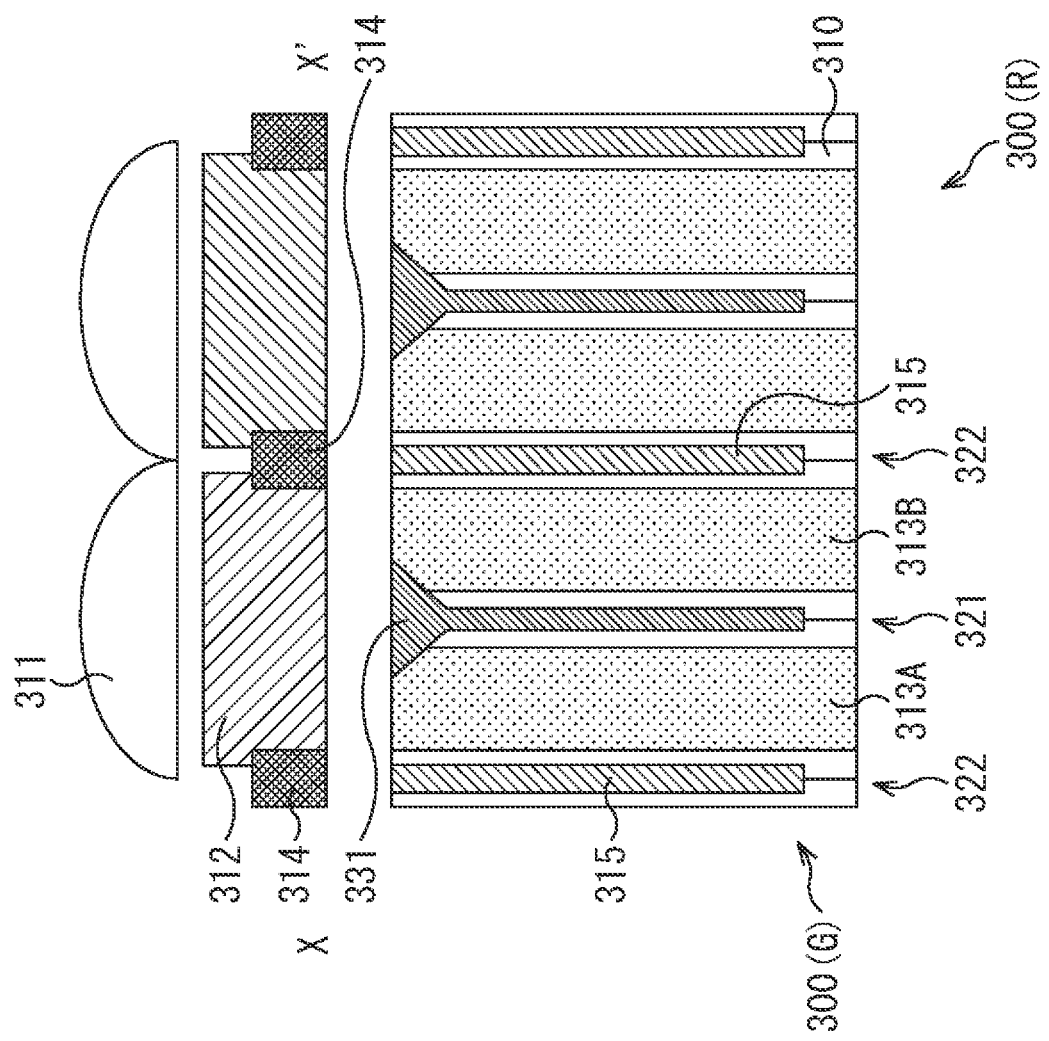
FIG. 44 is a cross-sectional view showing a second example of the structure of the pixel in the eleventh embodiment.

FIG. 44 is a cross-sectional view showing a second example of the structure of the pixel in the eleventh embodiment.

The shape of the cross section of the inter-same-color central portion 321 of the pixel 300 in FIG. 44 is different from that of the pixel 300 in FIG. 43. That is, in the inter-same-color central portion 321 of the pixel 300 in FIG. 44, the separation shape (shape of the cross section) of the low refraction area 331 having a tapered shape extends downward with a predetermined bulk depth (e.g., several 100 nm) from the light incident surface and a certain width, and the shape of the lower area has a rectangular shape (vertically long shape).

That is, the area below the low refraction area 331 is separated by impurities without forming the low-refractive material as a separation material in the case of the inter-same-color central portion 321 of the pixel 300 in FIG. 43, while the low refraction area 331 extends downward with a certain width in the case of the inter-same-color central portion 321 in the pixel 300 in FIG. 44, so that the lower portion having a rectangular shape (vertically long shape) separates the photoelectric conversion device 313A and the photoelectric conversion device 313B.

As described above, in the pixel 300 in FIG. 44, by forming, in a sense, an inter-device separation unit of the triangle portion in the low refraction area 331 and the portion extending downward therefrom, the photoelectric conversion device 313A and the photoelectric conversion device 313B are physically separated. As a result, in the pixel 300 in FIG. 44, it is possible to improve the accuracy of phase difference detection by preventing the output of one photoelectric conversion device 313 (313A or 313B) from mixing with the output of the other photoelectric conversion device 313 (313B or 313A).

Third Example of Structure

Figure 45:
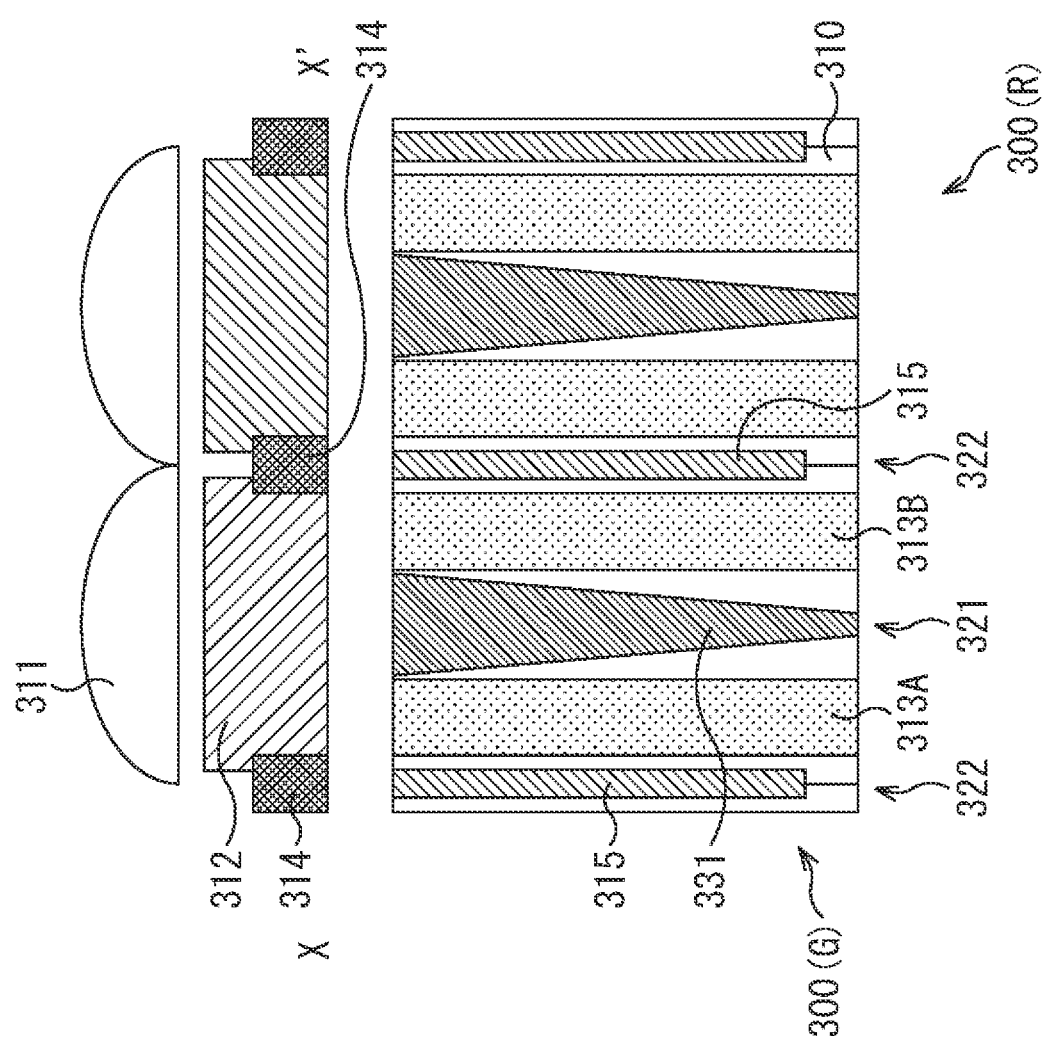
FIG. 45 is a cross-sectional view showing a third example of the structure of the pixel in the eleventh embodiment.

FIG. 45 is a cross-sectional view showing a third example of the structure of the pixel in the eleventh embodiment.

The shape of the cross section of the inter-same-color central portion 321 of the pixel 300 in FIG. 45 is different from that of the pixel 300 in FIG. 43. That is, in the inter-same-color central portion 321 of the pixel 300 in FIG. 45, the separation shape (shape of the cross section) of the low refraction area 331 is a trapezoidal shape (trapezoid whose bottom is shorter than the top) tapered from the light incident surface to the surface (the side of the transistor device surface) opposite thereto.

As described above, in the pixel 300 in FIG. 45, by forming, in a sense, an inter-device separation unit of the trapezoidal portion in the low refraction area 331, the photoelectric conversion device 313A and the photoelectric conversion device 313B are physically separated. As a result, in the pixel 300 in FIG. 45, it is possible to improve the accuracy of phase difference detection by preventing the output of one photoelectric conversion device 313 from mixing with the output of the other photoelectric conversion device 313.

Fourth Example of Structure

Figure 46:
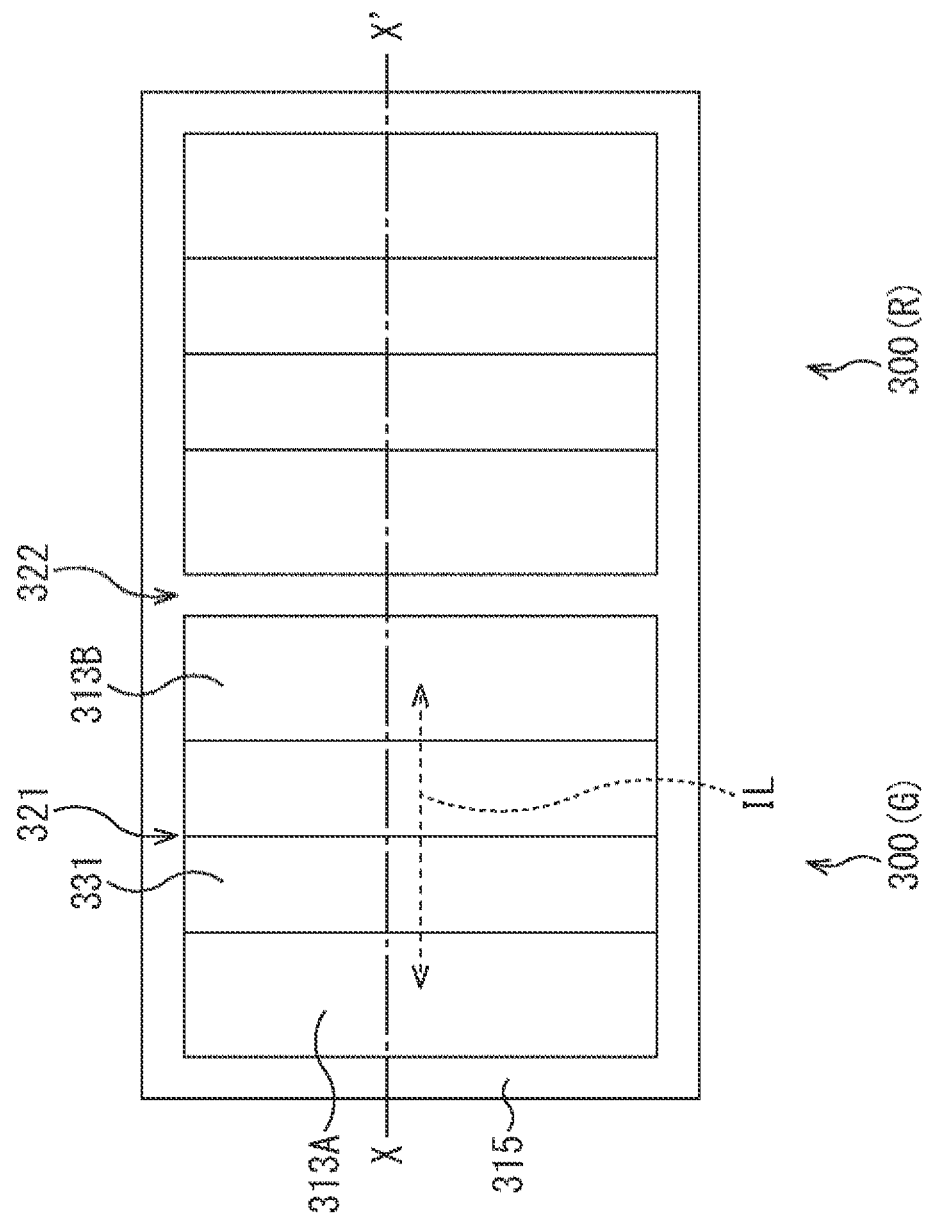
FIG. 46 is a cross-sectional view showing a fourth example of the structure of the pixel in the eleventh embodiment.

FIG. 46 is a cross-sectional view showing a fourth example of the structure of the pixel in the eleventh embodiment.

In the plan view shown in FIG. 46, the X-X' cross section corresponds to the cross-sectional view of the pixel 300 in FIG. 43. That is, in the pixel 300 in FIG. 46, the inter-same-color central portion 321 including the low refraction area 331 is formed between the photoelectric conversion device 313A and the photoelectric conversion device 313B, and the shape thereof is a rectangular shape (vertically long shape) when viewed from the side of the light incident surface.

Here, the dotted lines in the figure indicate the incident light IL. In the case where the light condensed by the on-chip lens 311 enters the low refraction area 331, the incident light travels to a certain depth as it is without being photoelectrically converted, enters the photoelectric conversion device 313A or the photoelectric conversion device 313B when reaching the certain depth, and is photoelectrically converted.

Note that although the case where the plan view shown in FIG. 46 corresponds to the cross-sectional view of the pixel 300 in FIG. 43 has been shown here, (the low refraction area 331 of) the inter-same-color central portion 321 is formed between the photoelectric conversion device 313A and the photoelectric conversion device 313B similarly also in the pixel 300 in FIG. 44 or the pixel 300 in FIG. 45.

Fifth Example of Structure

Figure 47:
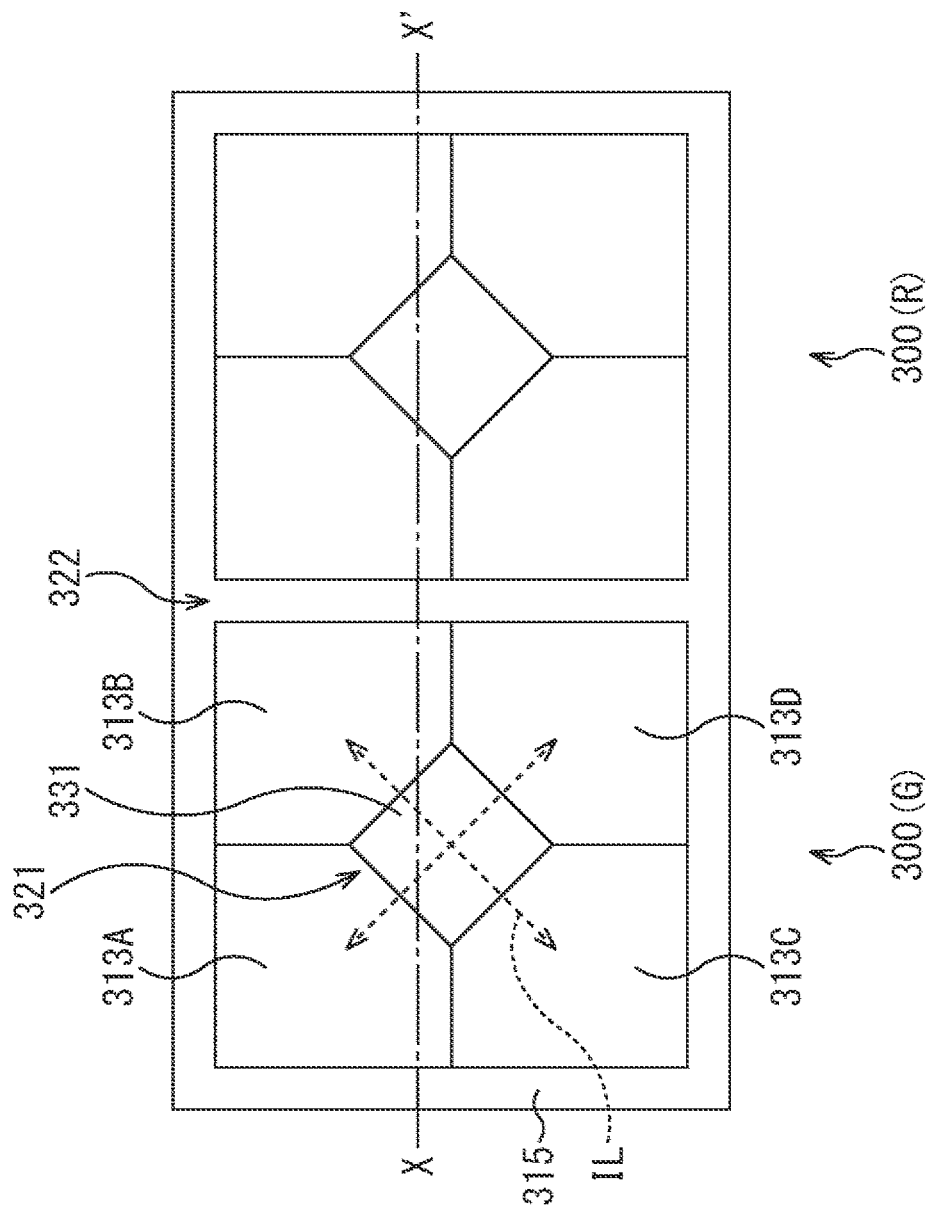
FIG. 47 is a cross-sectional view showing a fifth example of the structure of the pixel in the eleventh embodiment.

FIG. 47 is a cross-sectional view showing a fifth example of the structure of the pixel in the eleventh embodiment.

In the plan view shown in FIG. 47, the X-X' cross section corresponds to the cross-sectional view of the pixel 300 in FIG. 43. That is, in the pixel 300 in FIG. 47, the inter-same-color central portion 321 including the low refraction area 331 is formed for four photoelectric conversion devices 313, i.e., the photoelectric conversion device 313A, the photoelectric conversion device 313B, a photoelectric conversion device 313C, and a photoelectric conversion device 313D, and the shape thereof is a rhombus shape when viewed from the side of the light incident surface.

Here, the dotted line in the figure indicates the incident light IL. In the case where the light condensed by the on-chip lens 311 enters the low refraction area 331, the incident light travels to a certain depth as it is without being photoelectrically converted, enters any of the photoelectric conversion devices 313A to 313D when reaching the certain depth, and is photoelectrically converted.

Note that although the case where the plan view shown in FIG. 47 corresponds to the cross-sectional view of the pixel 300 in FIG. 43 has been shown here, (the low refraction area 331 of) the inter-same-color central portion 321 can be formed for four photoelectric conversion devices 313 similarly also in the pixel 300 in FIG. 44 or the pixel 300 in FIG. 45.

Further, the separation layout by (the low refraction area 331 of) the inter-same-color central portion 321 shown in FIG. 46 and FIG. 47 is only an example, and separation layout other than the rectangular shape for the two photoelectric conversion devices 313 and the rhombus shape for the four photoelectric conversion devices 313 may be used.

Sixth Example of Structure

Figure 48:
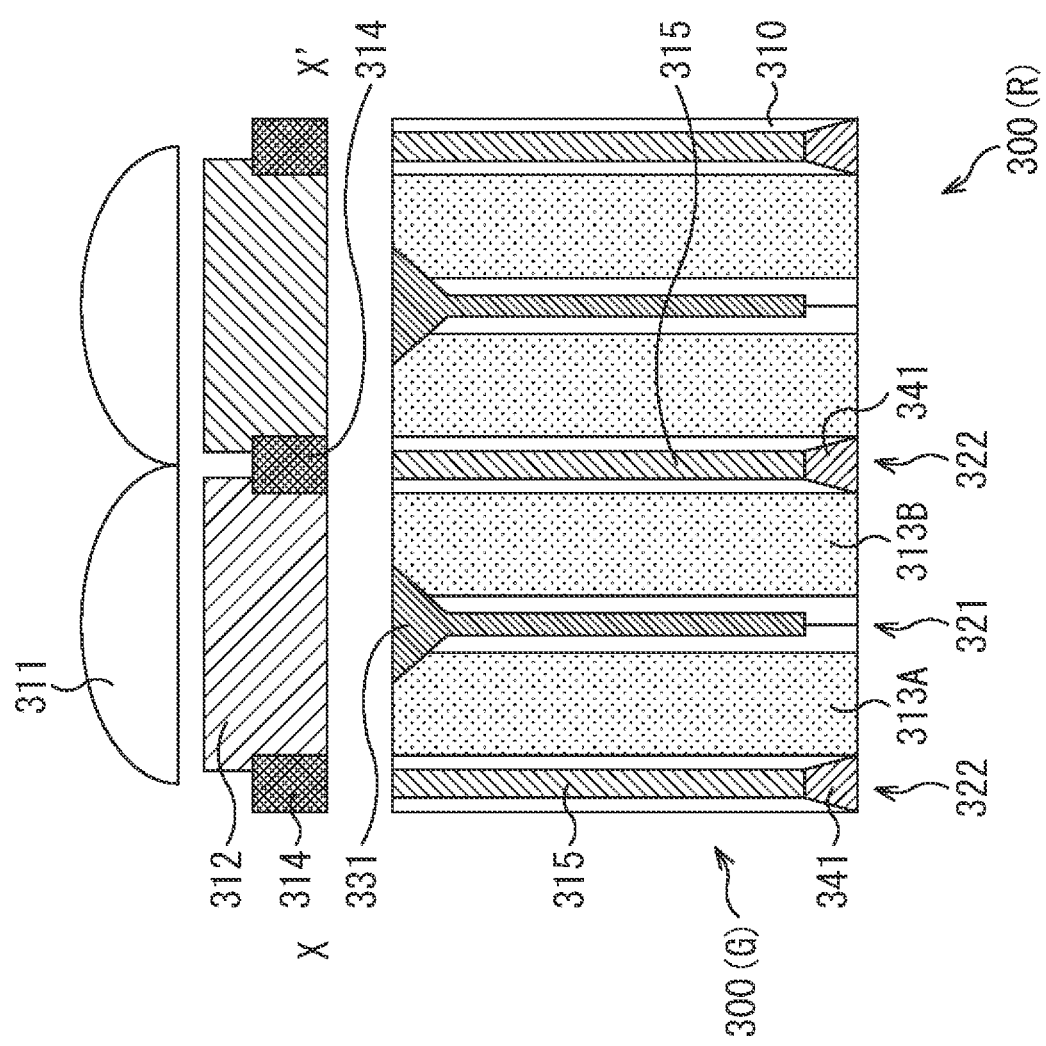
FIG. 48 is a cross-sectional view showing a sixth example of the structure of the pixel in the eleventh embodiment.

FIG. 48 is a cross-sectional view showing a sixth example of the structure of the pixel in the eleventh embodiment.

The shape of the cross section of the inter-different-color central portion 322 of the pixel 300 in FIG. 48 is different from that of the pixel 300 in FIG. 44. That is, in the inter-different-color central portion 322 of the pixel 300 in FIG. 48, a low refraction area 341 formed of a low-refractive material is formed in the area (area in the depth direction) below the inter-pixel separation unit 315 formed of metal.

More specifically, although a substance is embedded in a groove (trench) dug in silicon in which a photoelectric conversion area has been formed to form a separation unit for separating the pixels of different colors, a low-refractive material is embedded as a front side trench to form the low refraction area 341 and metal is embedded as a back side trench to form the inter-pixel separation unit 315 in the pixel 300 in FIG. 48.

Then, in the pixel 300 in FIG. 48, with the structure combining the inter-pixel separation unit 315 and the low refraction area 341, the inter-different-color central portion 322 separates the pixels of different colors, e.g., the photoelectric conversion device 313B on the right side of the G pixel 300 and the photoelectric conversion device 313A on the left side of the R pixel 300 shown in FIG. 48.

The eleventh embodiment has been described above.

(12) Twelfth Embodiment

As described above, in a solid-state imaging device including a pixel in which a plurality of photoelectric conversion devices is formed immediately below a single on-chip lens, it is possible to acquire distance information on the basis of a signal for phase difference detection acquired from each pixel.

However, in the structure of the general pixel, since a trade-off between the separation ratio and color mixture has occurred, it has been difficult to improve the accuracy of phase difference detection while suppressing the color mixture. In order to eliminate such a trade-off, in the past, information regarding the phase difference has been acquired simply by using only the bulk, or the separation ratio has been increased by using an optical waveguide without using an on-chip lens for highly accurate detection. However, it has been demanded to further improve the accuracy of phase difference detection while suppressing the color mixture.

In view of the above, in a twelfth embodiment, as pixels 400 to be two-dimensionally arranged in the pixel array unit 11 of the CMOS image sensor 10 (FIG. 1), a structure in which an on-chip lens is formed of a plurality of types of substances having different refractive indexes is employed. By employing such as structure, it is possible to further improve the accuracy of phase difference detection while suppressing color mixture. Here, the color mixture includes color mixture between a plurality of photoelectric conversion devices formed immediately below a single on-chip lens.

Here, the structure of the pixel in the twelfth embodiment will be described with reference to FIG. 49 to FIG. 56.

First Example of Structure

Figure 49:
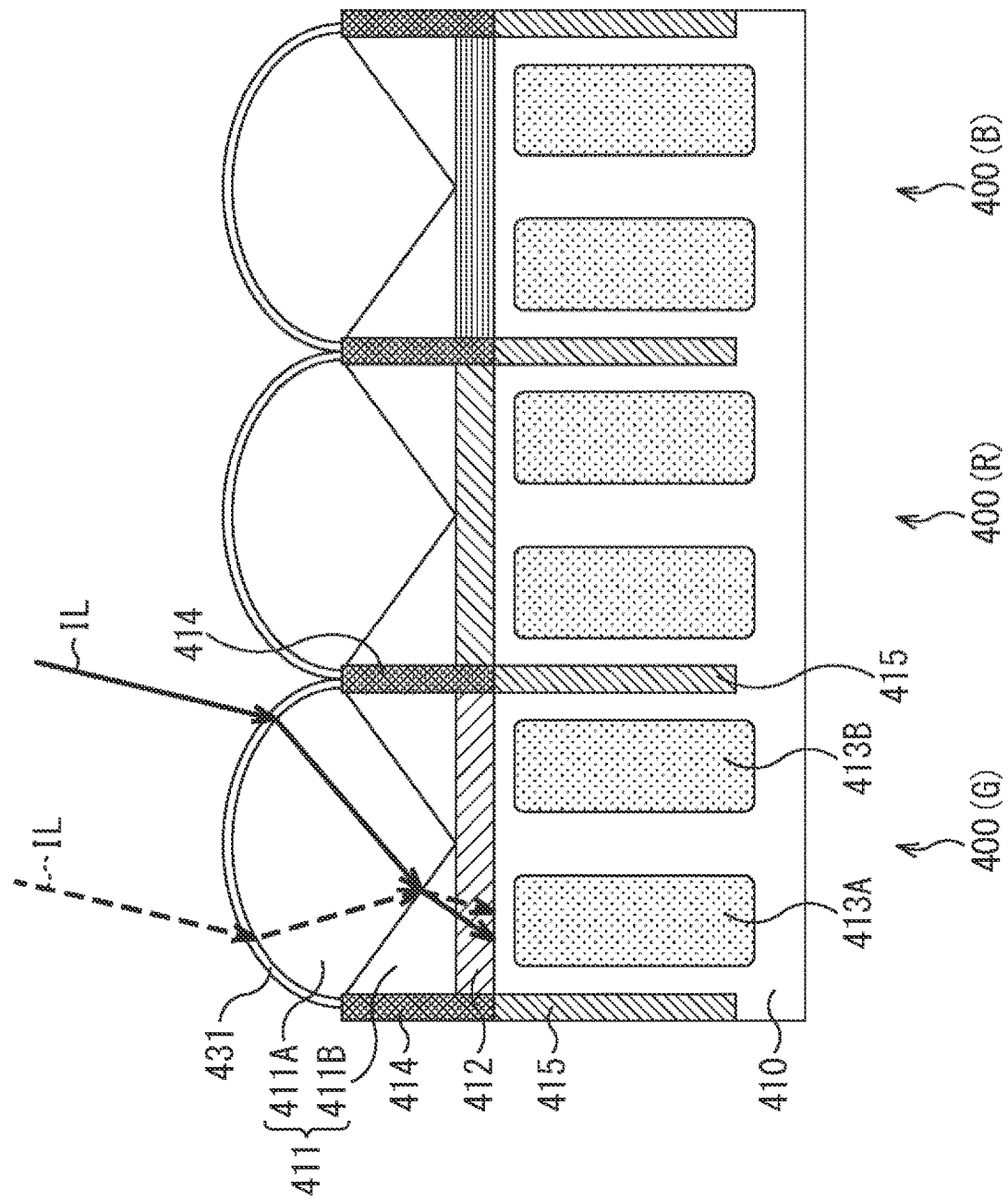
FIG. 49 is a cross-sectional view showing a first example of a structure of a pixel in a twelfth embodiment.

FIG. 49 is a cross-sectional view showing a first example of a structure of a pixel in a twelfth embodiment.

In FIG. 49, the pixel 400 has a 2PD structure, and includes an on-chip lens 411, a color filter 412, photoelectric conversion devices 413A and 413B, an inter-pixel light blocking unit 414, and an inter-pixel separation unit 415.

Note that since the on-chip lens 411 to the inter-pixel separation unit 415 in the pixel 400 respectively correspond to the on-chip lens 111, the color filter 112, the photoelectric conversion devices 113A and 113B, the inter-pixel light blocking unit 114, and the inter-pixel separation unit 115 constituting the pixel 100 (FIG. 11, etc.) according to the above-mentioned embodiments, description thereof will be omitted here.

Further, for convenience of description, in the case where it is necessary to particularly distinguish the colors of the pixel 400, the R pixel 400 will be expressed as "400 (R)", the G pixel 400 will be expressed as "400 (G)", and the B pixel 400 will be expressed as "400 (B)".

In the pixel 400, the on-chip lens 411 is formed of a member 411A and a member 411B as two types of substances having different refractive indexes. In the on-chip lens 411, the member 411B has a shape dug into a V shape and a part of the member 411A (part on the side opposite to the light incident surface) is embedded in the V-shape part.

That is, the member 411A (first member) has a curved surface on which light is incident and a part corresponding to the V-shape part of the member 411B, and the member 411B (second member) has a surface on the side opposite to the curved surface on which light is incident and a part having a V shape. Note that although the case where the junction portion between the member 411A and the member 411B has a V shape will be described, the shape of the junction portion may be another shape other than the V shape.

For example, the member 411A is formed of a high-refractive material (High-n material), which is a material having a refractive index higher than that of the member 411B. Meanwhile, for example, the member 411B is formed of a low-refractive material (Low-n material), which is a material having a refractive index lower than that of the member 411A. Further, an antireflection film 431 is formed on the surface on the light incident side of the on-chip lens 411.

In the pixel 400, the incident light IL that has entered the on-chip lens 411 is refracted on the light incident surface of the member 411A as indicated by the arrow of FIG. 49, and then is refracted on the boundary between the member 411A and the member 411B to be applied to the photoelectric conversion area of the photoelectric conversion device 413A.

As described above, in the pixel 400 in FIG. 49, the on-chip lens 411 is formed of the member 411A and the member 411B having different refractive indexes, the light that has entered the photoelectric conversion device 413A or 413B is accumulated in the desired right and left photoelectric conversion device 413A or 413B without being mixed (no color mixture).

Figure 50:
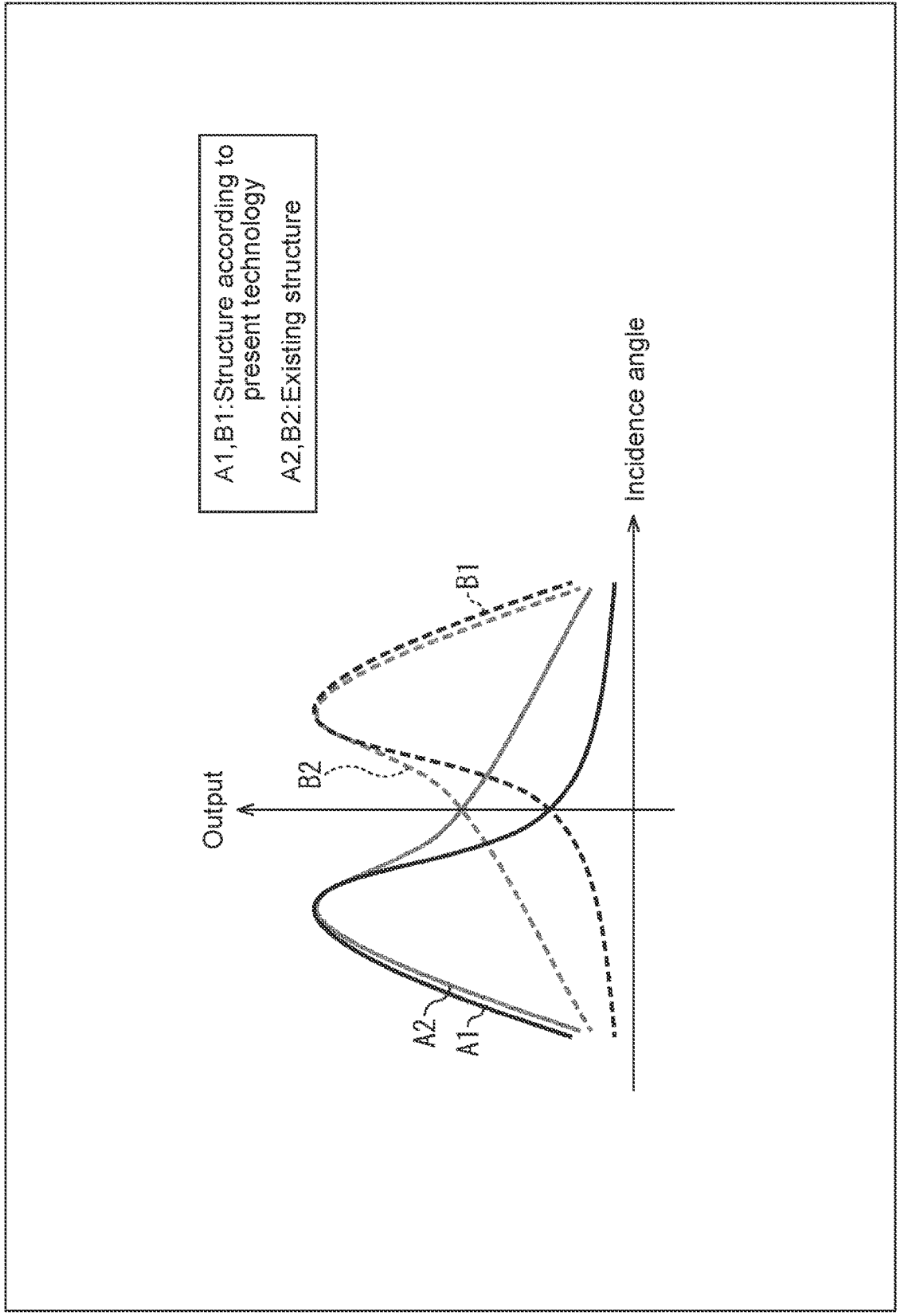
FIG. 50 is a diagram showing an output result corresponding to an incident angle of light for each photoelectric conversion device.

FIG. 50 is a diagram showing an output result corresponding to an incident angle of light for each photoelectric conversion device 413 in the pixel 400 in FIG. 49.

Note that in FIG. 50, for comparison, also the output result of right and left photoelectric conversion devices 913A and 913B (existing structure) of the general pixel 900 is shown together with the output result of the photoelectric conversion devices 413A and 413B (structure according to the present technology) of the pixel 400 in FIG. 49. However, in the pixel 900, the structure of the on-chip lens 911 is different from the structure of the on-chip lens 411 of the pixel 400. That is, in the pixel 900, the on-chip lens 911 is not formed of a plurality of substances having different refractive indexes.

That is, in FIG. 50, for the pixel 400 in FIG. 49, the output of the photoelectric conversion device 413A on the left side is indicated by a solid curve A1, and the output of the photoelectric conversion device 413B on the right side is indicated by a dotted curve B1. Further, for the general pixel 900, the output of the photoelectric conversion device 913A on the left side is indicated by a solid curve A2, and the output of the photoelectric conversion device 913B on the right side is indicated by a dotted curve B2.

Here, in the curve A1 corresponding to the output of the photoelectric conversion device 413A on the left side and the curve B1 corresponding to the output of the photoelectric conversion device 413B on the right side, the value of the output matches in the case where an incident angle θi is 0 degree, i.e., light is incident from directly above. That is, the curve A1 and the curve B1 have a line-symmetric relationship with the output in the case where the incident angle θi=0 as the symmetry axis.

Similarly, the curve A2 corresponding to the output of the photoelectric conversion device 913A on the left side and the curve B2 corresponding to the output of the photoelectric conversion device 913B on the right side have a line-symmetric relationship with the output when the incident angle θi=0 as the symmetry axis.

At this time, when comparing the curves A1 and B1 of the pixel 400 in FIG. 49 and the curves A2 and B2 of the general pixel 900 with each other, they have the following relationship.

That is, in the case where the incident angle Gi is negative and attention is paid to the curve A1 and the curve A2, although the peak values of the output of the photoelectric conversion device 413A and the output of the photoelectric conversion device 913A are substantially the same, the output of the photoelectric conversion device 413B is mixed with the output of the photoelectric conversion device 413A while the output of the photoelectric conversion device 913B is mixed with the output of the photoelectric conversion device 913A.

At this time, in the case where attention is paid to the curve B1 and the curve B2, since the output of the photoelectric conversion device 413B is small as compared with the output of the photoelectric conversion device 913B, the output of the photoelectric conversion device 413B mixed with the output of the photoelectric conversion device 413A is reduced.

Meanwhile, in the case where the incident angle θi is positive and attention is paid to the curve B1 and the curve B2, although the peak values of the output of the photoelectric conversion device 413B and the output of the photoelectric conversion device 913B are substantially the same, the output of the photoelectric conversion device 413A is mixed with the output of the photoelectric conversion device 413B while the output of the photoelectric conversion device 913A is mixed with the output of the photoelectric conversion device 913B.

At this time, in the case where attention is paid to the curve A1 and the curve A2, since the output of the photoelectric conversion device 413A is small as compared with the output of the photoelectric conversion device 913A, the output of the photoelectric conversion device 413A mixed with the output of the photoelectric conversion device 413B is reduced.

As describe above, in the pixel 400 in FIG. 49, by forming the on-chip lens 411 of the member 411A and the member 411B having different refractive indexes, it is possible to improve the accuracy of phase difference detection by preventing the output of one photoelectric conversion device 413 (413A or 413B) from mixing with the output of the other photoelectric conversion device 413 (413B or 413A). As a result, in the electronic apparatus including the CMOS image sensor 10 is capable of realizing more-accurate autofocus.

Second Example of Structure

Figure 51:
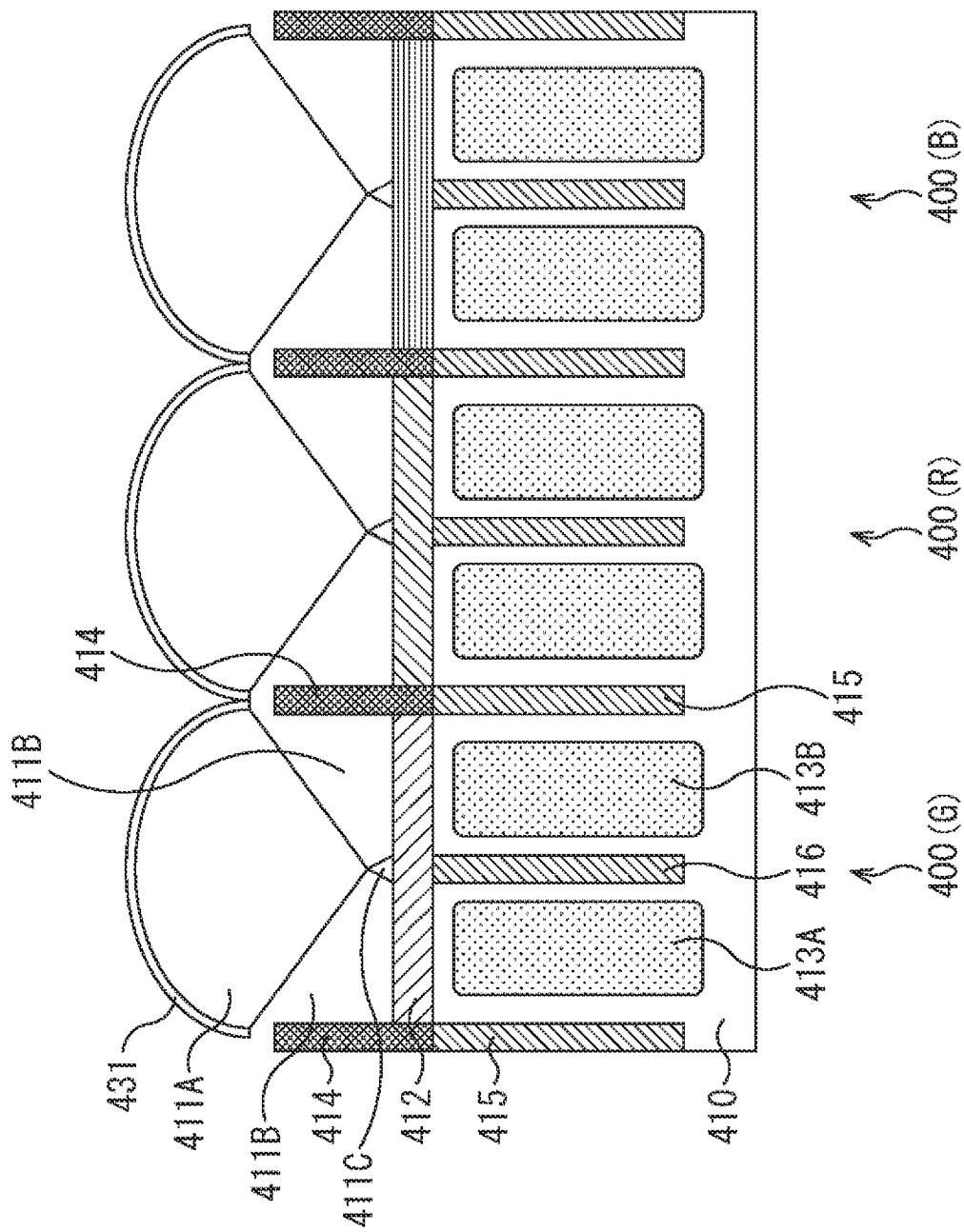
FIG. 51 is a cross-sectional view showing a second example of the structure of the pixel in the twelfth embodiment.

FIG. 51 is a cross-sectional view showing a second example of the structure of the pixel in the twelfth embodiment.

The pixel 400 in FIG. 51 is different from the pixel 400 in FIG. 49 in that an inter-device separation unit 416 is formed between the right and left photoelectric conversion devices 413A and 413B, and the shape of the cross section of the on-chip lens 411 of the pixel 400 in FIG. 51 is different from that in the pixel 400 in FIG. 49. That is, in the pixel 400 in FIG. 51, the on-chip lens 411 further includes a member 411C formed of a different substance in addition to two types of substances, i.e., the member 411A and the member 411B having different refractive indexes.

In the on-chip lens 411, the member 411B has a shape dug into a V shape on the side of the light incident surface, and a part (part on the side opposite to the light incident surface) of the member 411A is embedded in the V-shape part. Further, in the on-chip lens 411, the member 411B has a shape dug into a V shape also on the side opposite to the light incident surface, and (all) the member 411C is embedded in the V-shape part.

Although when forming the member 411A and the member 411C to have a cross section having a V shape for the member 411B, the vertexes of the V shapes are in contact with each other and the cross section having a V shape of the member 411C is smaller than the cross section having a V shape of the member 411A here, the shape of the cross section shown in FIG. 51 is merely an example and another shape may be employed.

Further, in the case where in the on-chip lens 411, the member 411A is formed of a high-refractive material (High-n material) and the member 411B is formed of a low-refractive material (Low-n material), the member 411C can be formed of a material having a refractive index capable of reducing the amount of light to enter the inter-device separation unit 416 formed in a silicon layer 410. In this case, the refractive index of the member 411C can be a refractive index different from those of the member 411A and the member 411B. Note that the refractive index of the member 411C may be the same refractive index as that of the member 411A.

As described above, in the pixel 400 in FIG. 51, by employing a structure in which the on-chip lens 411 includes the member 411C in addition to the member 411A and the member 411B in the case of providing the inter-device separation unit 416 between the right and left photoelectric conversion devices 413A and 413B, it is possible to reduce the amount of light that enters the inter-device separation unit 416.

Third Example of Structure

Figure 52:
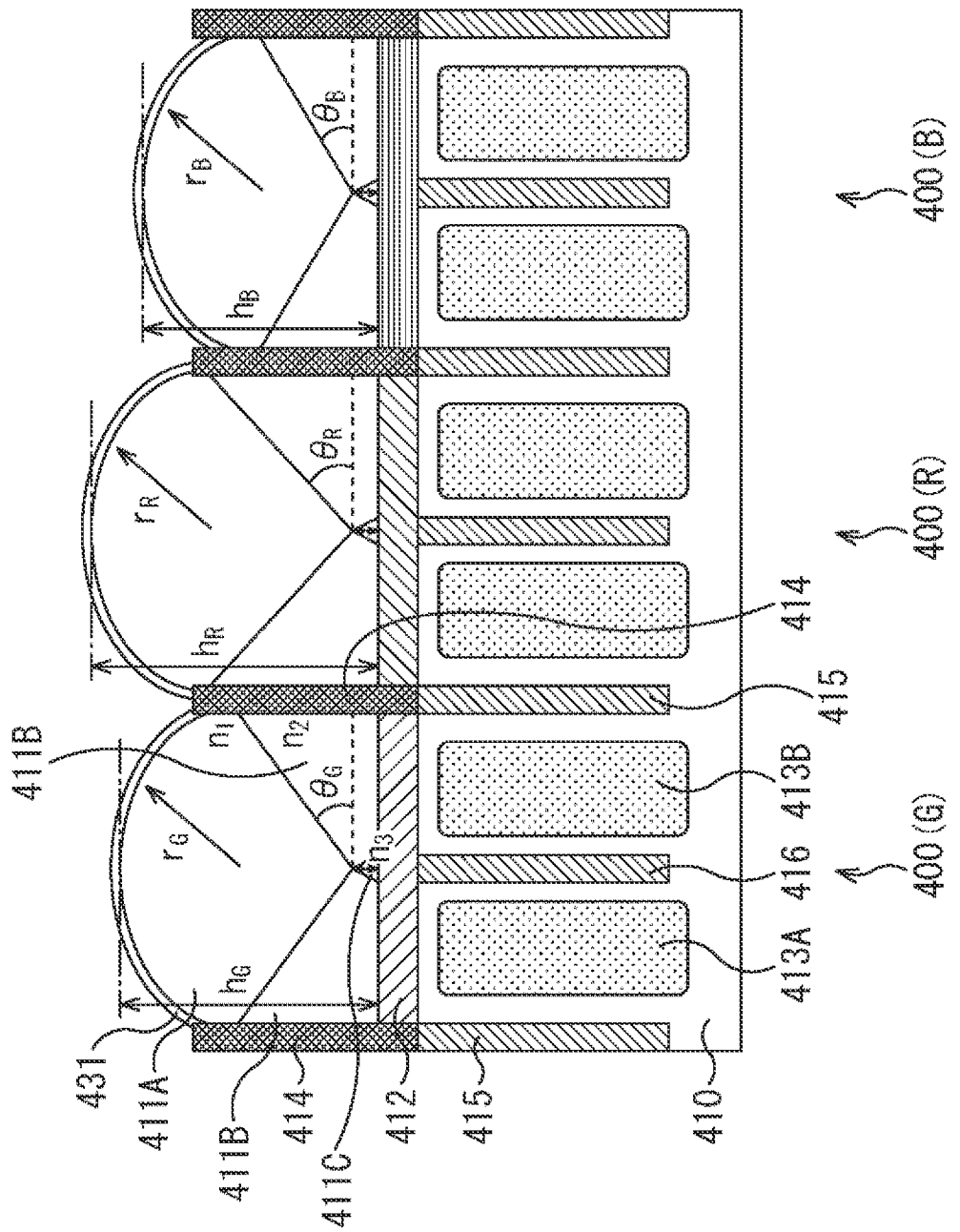
FIG. 52 is a cross-sectional view showing a third example of the structure of the pixel in the twelfth embodiment.

FIG. 52 is a cross-sectional view showing a third example of the structure of the pixel in the twelfth embodiment.

The pixel 400 in FIG. 52 is the same as the pixel 400 in FIG. 51 in that the inter-device separation unit 416 is provided and the on-chip lens 411 includes the member 411A to the member 411C, but is different from the pixel 400 in FIG. 51 in that the height in the optical axis direction (stacking direction) is optimized for each color in accordance with the material of the on-chip lens 411.

In FIG. 52, in each pixel 400, refractive indexes of the member 411A, the member 411B, and the member 411C are respectively indicated by $n_1$, $n_2$, and $n_3$. Further, in the G pixel 400, the curvature radius and height of the on-chip lens 411 are respectively indicated by $r_G$ and $h_G$. Similarly, the curvature radius and height of the on-chip lens 411 in the R pixel 400 are respectively indicated by $r_R$ and $h_R$, and the curvature radius and height of the on-chip lens 411 in the B pixel 400 are respectively indicated by $r_B$ and $h_B$.

Here, the height h G in the G pixel 400, the height h R in the R pixel 400, and the height h B in the B pixel 400 are optimized for each color in accordance with the material of the on-chip lens 411, i.e., the refractive indexes $n_1$, $n_2$, and $n_3$ of the member 411A to the member 411C.

For example, the relationship between the heights $h_G$, $h_R$, and h B of the on-chip lens 411 for each color can be a relationship expressed by the following formula (1), taking into account of the chromatic aberration.

$$h_R > h_G > h_B \tag{1}$$

Note that although the case where the height h of the on-chip lens 411 is adjusted as the parameter for performing optimization for each color has been exemplified here, another parameter may be used. For example, in the case of adjusting a curvature radius r of the on-chip lens 411, for example, a relationship expressed by the following formula (2) can be used, taking into account of the chromatic aberration.

$$r_R > r_G > r_R \tag{2}$$

As described above, in the pixel 400 in FIG. 52, by optimizing the parameter such as the height and the curvature radius for each color in accordance with the material (refractive indexes of a plurality of types of members) of the on-chip lens 411, for example, it is possible to improve the quantum efficiency of each color and the separation ratio, or prevent color mixture from occurring.

Note that in FIG. 52, in the G pixel 400, the angle between the boundary surface of the member 411B with the member 411A and the horizontal plane is indicated by $\theta_G$.

Similarly, in the R pixel 400 and the B pixel 400, respectively, the angles between the boundary surface of the member 411B with the member 411A and the horizontal plane are indicated by $\theta_R$ and $\theta_B$. For example, the angles $\theta_G$, $\theta_R$, and $\theta_B$ may be used as the parameter other than the above-mentioned height h and curvature radius r of the on-chip lens 411, and optimized.

Fourth Example of Structure

Figure 53:
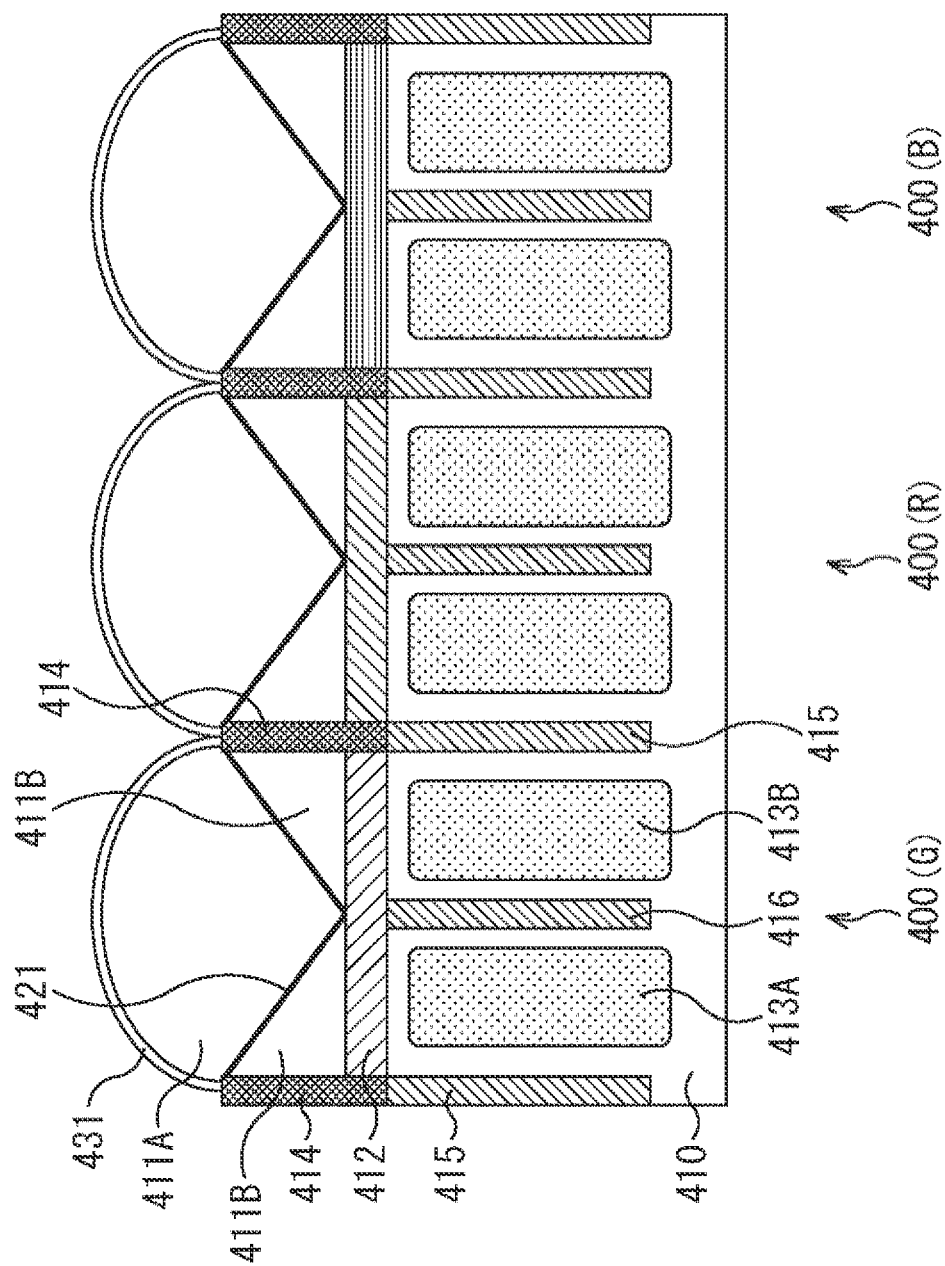
FIG. 53 is a cross-sectional view showing a fourth example of the structure of the pixel in the twelfth embodiment.

FIG. 53 is a cross-sectional view showing a fourth example of the structure of the pixel in the twelfth embodiment.

The pixel 400 in FIG. 53 is different from the pixel 400 in FIG. 49 in that the inter-device separation unit 416 is provided and a control member 421 is provided between the member 411A and the member 411B in the on-chip lens 411.

The control member 421 is formed of, for example, a photonic crystal. The photonic crystal is a nanostructure whose refractive index changes periodically. By forming the control member 421 between the member 411A and the member 411B, the on-chip lens 411 has a structure capable of controlling the dependency on the incident angle of light.

That is, by providing the control member 421 formed of a photonic crystal, for example, the pixel 400 can have a structure that totally reflects the incident light from the direction on the left side in the figure so as not to enter the photoelectric conversion device 413A on the left side, or a structure totally reflects the incident light from the direction on the right side in the figure so as not to enter the photoelectric conversion device 413B on the right side. That is, the pixel 400 has a structure in which the dependency on the incident angle is further increased by efficiently using the dependency on the incident angle of the photonic crystal.

As described above, in the pixel 400 in FIG. 53, by employing a structure in which the dependency on the incident angle of light can be controlled by forming the control member 421 formed of a photonic crystal between the member 411A and the member 411B in the on-chip lens 411, it is possible to further improve the accuracy of phase difference detection while suppressing color mixture.

Fifth Example of Structure

Figure 54:
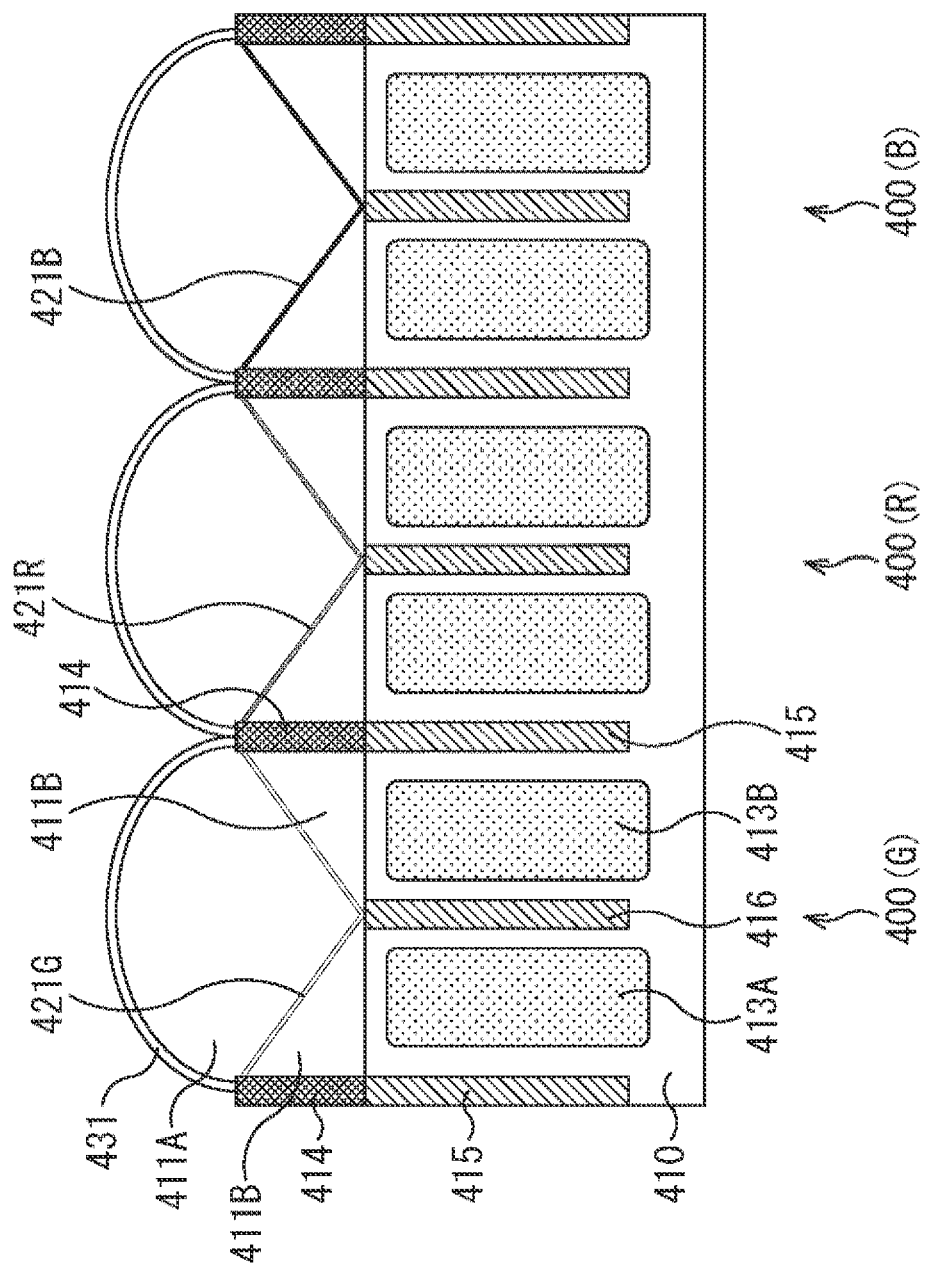
FIG. 54 is a cross-sectional view showing a fifth example of the structure of the pixel in the twelfth embodiment.

FIG. 54 is a cross-sectional view showing a fifth example of the structure of the pixel in the twelfth embodiment.

The pixel 400 in FIG. 54 is different from the pixel 400 in FIG. 53 in that the color filters 412 corresponding to the respective colors are removed and the control member 421 (421R, 421G, and 421B) has a spectral function.

The control member 421 (421R, 421G, and 421B) is formed of, for example, a photonic crystal. Here, since in the photonic crystal, only light having a specific wavelength resonates with the periodic structure to cause reflection and transmission, a spectral function can be provided using this characteristic similarly to the color filter.

That is, the G pixel 400 in FIG. 54 has a structure in which the G color filter 412 is not provided, by making it possible to cause, when forming the control member 421G formed of a photonic crystal between the member 411A and the member 411B, the control member 421G to function as a filter through which the green (G) wavelength component is transmitted by the photonic crystal structure.

Similarly, the R pixel 400 in FIG. 54 has a structure in which the R color filter 412 is not provided, by causing, when forming the control member 421R, the control member 421R to function as a filter through which the red (R) wavelength component is transmitted by the photonic crystal structure. Further, similarly, the B pixel in FIG. 54 has a structure in which the B color filter 412 is not provided, by causing it to function as a filter through which the blue (B) component is transmitted by the photonic crystal structure.

As described above, the pixel 400 in FIG. 54 can have a structure in which not only the dependency on the incident angle can be further increased by efficiently using the dependency on the incident angle of the photonic crystal but also the color filter 412 is not provided, by causing, when forming the control member 421 formed of a photonic crystal, the control member 421 to function similarly as the color filter for each color using the photonic crystal structure.

Sixth Example of Structure

Figure 55:
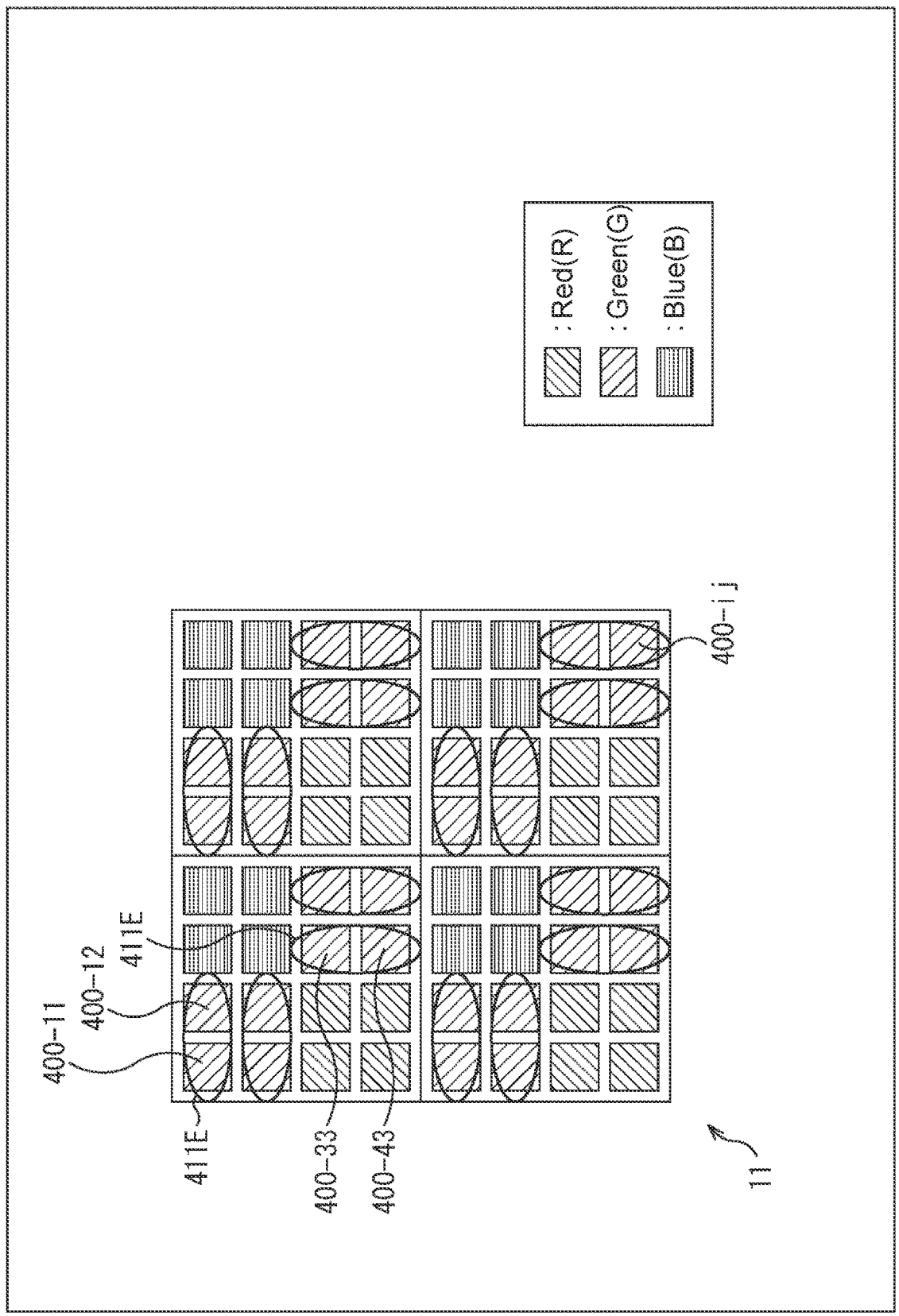
FIG. 55 is a cross-sectional view showing a sixth example of the structure of the pixel in the twelfth embodiment.

FIG. 55 is a cross-sectional view showing a sixth example of the structure of the pixel in the twelfth embodiment.

Although the pixels 400 are two-dimensionally (in a matrix) arranged in the pixel array unit 11 (FIG. 1), it goes without saying that, of the pixels to be arranged in the pixel array unit 11 (FIG. 1), all the pixel may have a structure similar to that of the pixel 400 or a part of the pixels may have a structure similar to that of the pixel 400.

For example, as shown in FIG. 55, also in the case where the pixel array unit 11 employs the arrangement pattern in which shared pixels each sharing the pixel circuit by neighboring pixels (2×2, i.e., four pixels of the same color) of the same color are regularly arranged, a part of the pixels can have a structure similar to that of the pixel 400.

However, in the pixel arrangement shown in FIG. 55, each pixel 400 has a structure (1PD structure) including one photoelectric conversion device. Here, in order to distinguish from the above-mentioned pixel 400 having the 2PD structure, the pixel 400 having the 1PD structure will be referred to as the pixel 400 (1PD).

Here, for example, in the pixel arrangement shown in FIG. 55, an elliptical on-chip lens 411E is formed for a G pixel 400-11 (1PD) and a G pixel 400-12 (1PD) arranged in the same row. This on-chip lens 411E has a structure formed of a plurality of types of substances having different refractive indexes similarly to the above-mentioned on-chip lens 411 (FIG. 49, etc.).

That is, a structure in which one photoelectric conversion device 413 (corresponding to, for example, the photoelectric conversion device 413A in FIG. 49) of the G pixel 400-11 (1PD) and one photoelectric conversion device 413 (corresponding to, for example, the photoelectric conversion device 413B in FIG. 49) of the G pixel 400-12 (1PD) are provided for the one on-chip lens 411E is provided. Then, here, phase difference detection is performed using the output of each of the photoelectric conversion device 413 of the G pixel 400-11 (1PD) and the photoelectric conversion device 413 of the G pixel 400-12 (1PD) arranged in the same row.

Further, similarly, the elliptical on-chip lens 411E is formed also for a G pixel 400-21 (1PD) and a G pixel 400-22 (1PD) arranged on the same row, or the like, and phase difference detection using the output of each of the photoelectric conversion devices 413 (corresponding to, for example, the photoelectric conversion devices 413A and 413B in FIG. 49) of the G pixels 400 (1PD) is performed.

Further, for example, the elliptical on-chip lens 411E may be formed in the column direction as in a G pixel 400-33 (1PD) and a G pixel 400-43 (1PD) or a G pixel 400-34 (1PD) and a G pixel 400-44 (1PD) arranged in the same column.

Note that although the case where two G pixels 400 (1PD) are arranged for the elliptical on-chip lens 411E has been described in the pixel arrangement shown in FIG. 55, R pixels 400 (1PD) or B pixels 400 (1PD) may be arranged for the elliptical on-chip lens 411E in the row direction or column direction.

Seventh Example of Structure

Figure 56:
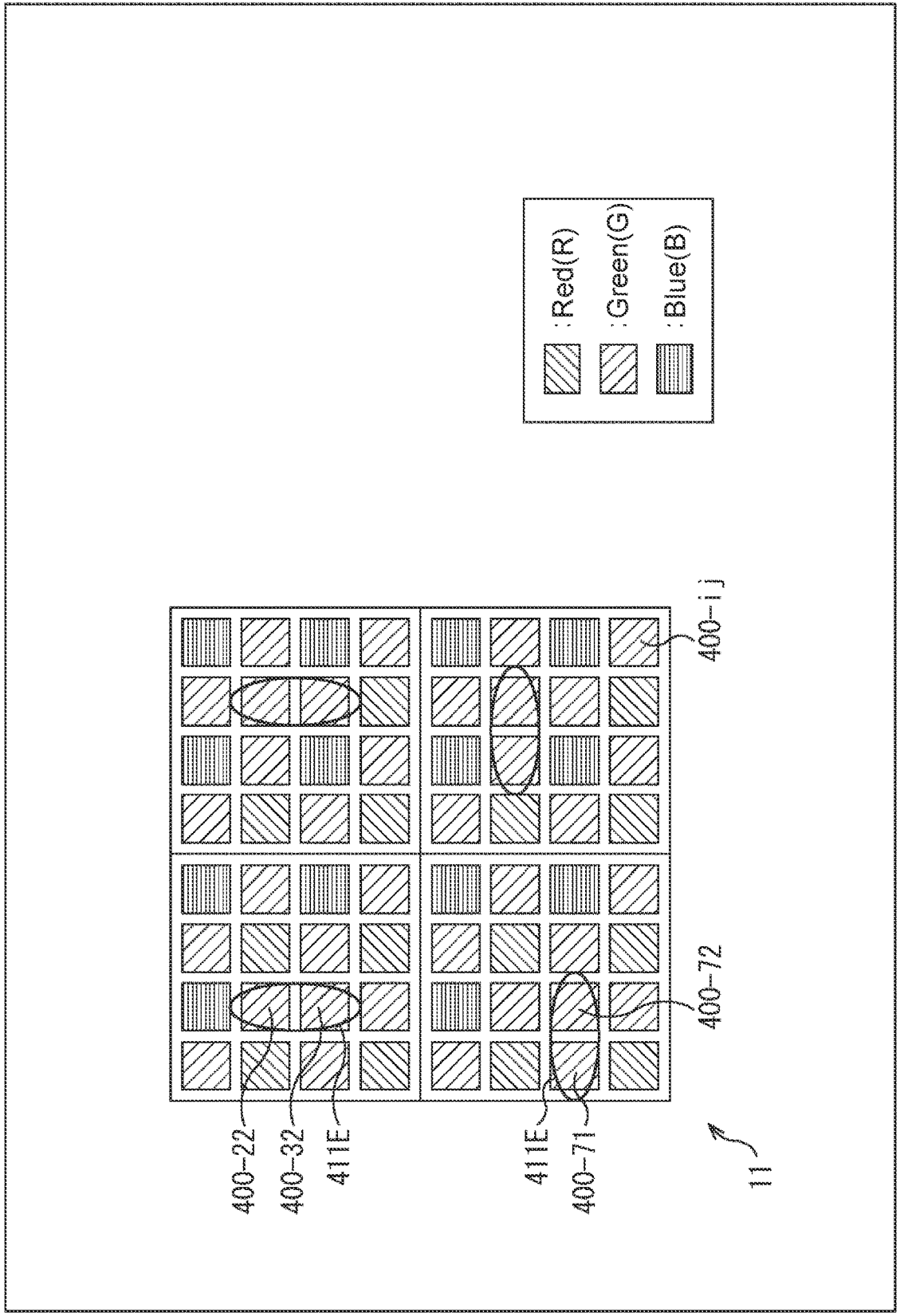
FIG. 56 is a cross-sectional view showing a seventh example of the structure of the pixel in the twelfth embodiment.

FIG. 56 is a cross-sectional view showing a seventh example of the structure of the pixel in the twelfth embodiment.

As shown in FIG. 56, also in the case where a Bayer array is employed in the pixel array unit 11 (FIG. 1), a part of the pixels can have a structure similar to that of the pixel 400.

However, also in the pixel arrangement shown in FIG. 56, each pixel 400 has a structure (1PD structure) including one photoelectric conversion device, and the pixel 400 having the 1PD structure will be referred to as the pixel 400 (1PD).

Here, for example, in the pixel arrangement shown in FIG. 56, the elliptical on-chip lens 411E is formed for the G pixel 400-22 (1PD) and a G pixel 400-32 (1PD) arranged in the same row. This on-chip lens 411E has a structure formed of a plurality of types of substances having different refractive indexes, similarly to the above-mentioned on-chip lens 411 (FIG. 49, etc.).

That is, a structure in which one photoelectric conversion device 413 (corresponding to, for example, the photoelectric conversion device 413A in FIG. 49) of the G pixel 400-22 (1PD) and one photoelectric conversion device 413 (corresponding to, for example, the photoelectric conversion device 413B in FIG. 49) of the G pixel 400-32 (1PD) are provided for one on-chip lens 411E is provided, and phase difference detection using the output of each of the photoelectric conversion devices 413 of the G pixels 400 (1PD) is performed.

Further, similarly, the elliptical on-chip lens 411E is formed also for a G pixel 400-27 (1PD) and a G pixel 400-37 (1PD) arranged in the same column, or the like, and phase difference detection using the output of each of the photoelectric conversion devices 413 (corresponding to, for example, the photoelectric conversion devices 413A and 413B in FIG. 49) of the G pixels 400 is performed.

Further, for example, the elliptical on-chip lens 411E in the row direction may be formed as in a G pixel 400-71 (1PD) and a G pixel 400-72 (1PD) or a G pixel 400-66 (1PD) and a G pixel 400-67 (1PD) arranged in the same row, or the like.

Note that although the case where two G pixels 400 (1PD) are arranged for the elliptical on-chip lens 411E has been described in the Bayer arrangement shown in FIG. 56, R pixels 400 (1PD) or B pixels 400 (1PD) may be arranged for the elliptical on-chip lens 411E in the row direction or the column direction.

The twelfth embodiment has been described above.

(13) Thirteenth Embodiment

Figure 57:
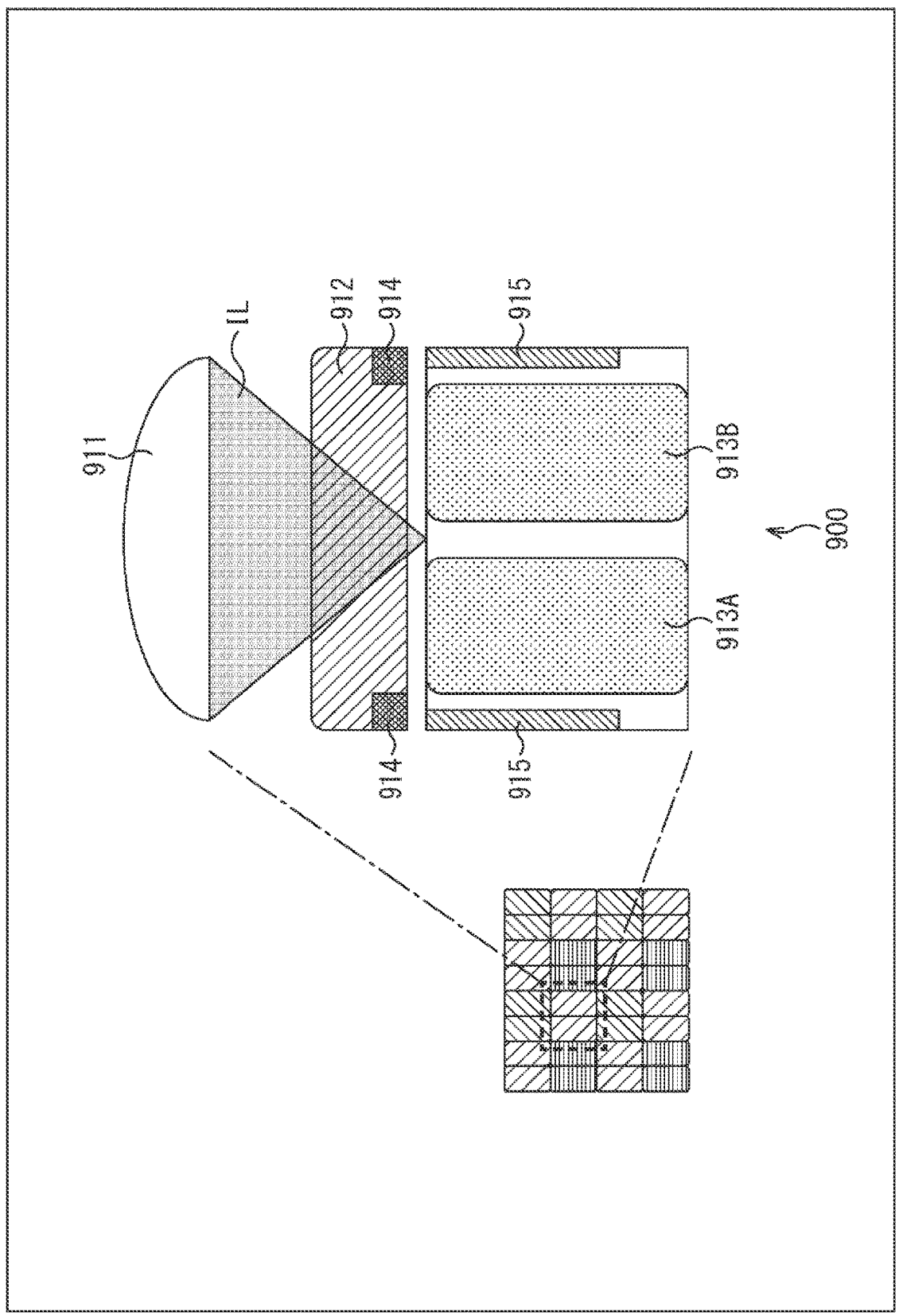
FIG. 57 is a diagram showing an example of the planar layout and cross section of a pixel in a thirteenth embodiment.

FIG. 57 shows the structure of the pixels to be two-dimensionally arranged in the pixel array unit of the CMOS image sensor.

In FIG. 57, the pixel 900 has a 2PD structure including the photoelectric conversion device 913A and the photoelectric conversion device 913B. In the photoelectric conversion devices 913A and 913B, charges corresponding to the components of the respective colors are generated from the light that has been condensed by the on-chip lens 911 and transmitted through the color filter through which the wavelength of each of the colors, i.e., red (R), green (G), and blue (B).

In the pixel 900, the charges generated by the photoelectric conversion device 913A and the photoelectric conversion device 913B are read via a transfer gate and used as information for phase difference detection.

Incidentally, in the pixel 900, as a structure for preventing the output of one photoelectric conversion device 913 mixing with the output of the other photoelectric conversion device 913, a structure in which a physical separation unit is formed between the right and left photoelectric conversion devices 913 can be employed.

Figure 58:
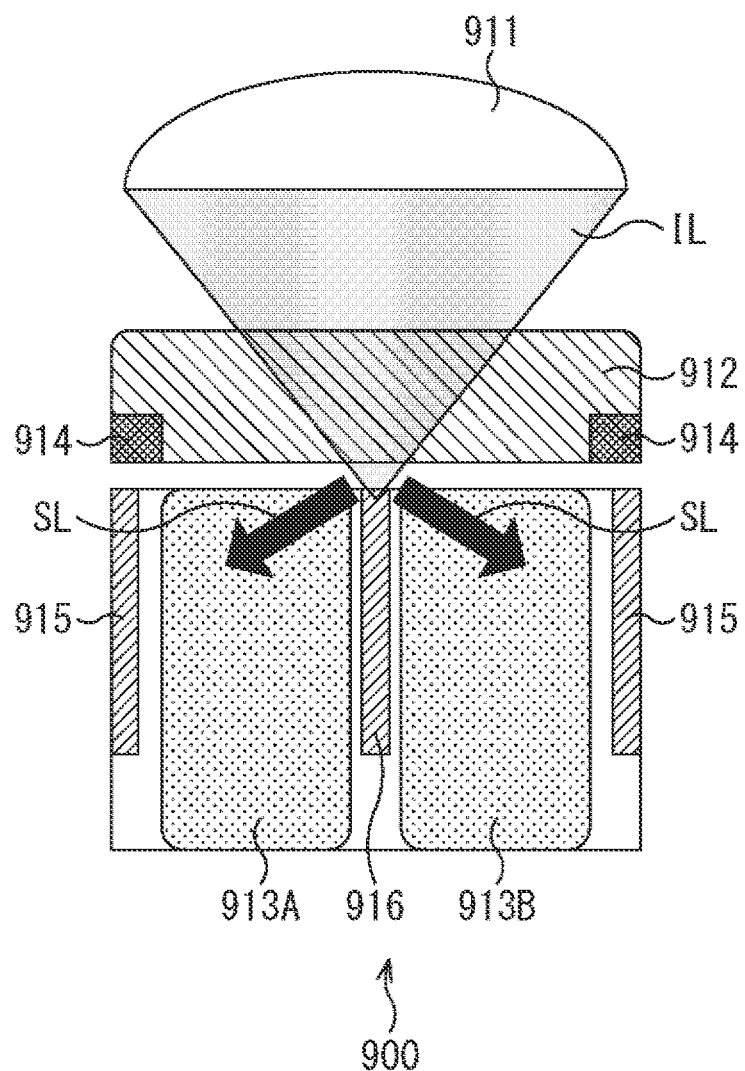
FIG. 58 is a cross-sectional view showing a structure of a general pixel.

FIG. 58 shows the structure of the pixel in which a physical separation unit is provided between the right and left photoelectric conversion devices.

In the pixel 900 in FIG. 58, an inter-device separation unit 916 is formed between the photoelectric conversion device 913A and the photoelectric conversion device 913B, and the photoelectric conversion device 913A and the photoelectric conversion device 913B are physically separated. By forming the inter-device separation unit 916 in this way, it is possible to improve the accuracy of phase difference detection by preventing the output of one photoelectric conversion device 913 from mixing with the output of the other photoelectric conversion device 913.

However, in the pixel 900, in the case where the inter-device separation unit 916 is formed between the photoelectric conversion device 913A and the photoelectric conversion device 913B from the side of the light incident surface (back side) using a DTI technology in order to improve the characteristics of phase difference, since the condensing spot is located immediately above the processing surface, there is a possibility that scattering (arrows SL in FIG. 58) of light from the processing interface occurs, which deteriorates spectral characteristics and degrades a picked-up image.

In view of the above, in the thirteenth embodiment, as pixels 500 to be two-dimensionally arranged in the pixel array unit 11 of the CMOS image sensor 10 (FIG. 1), a structure in which a vertical transistor has been formed in the central portion (inter-same-color central portion) of the photoelectric conversion devices of the same color is employed. By employing such a structure, it is possible to optically separate incident light to enter the desired right and left photoelectric conversion devices more efficiently.

Hereinafter, the structure of the pixel in the thirteenth embodiment will be described with reference to FIG. 59 to FIG. 61.

First Example of Structure

Figure 59:
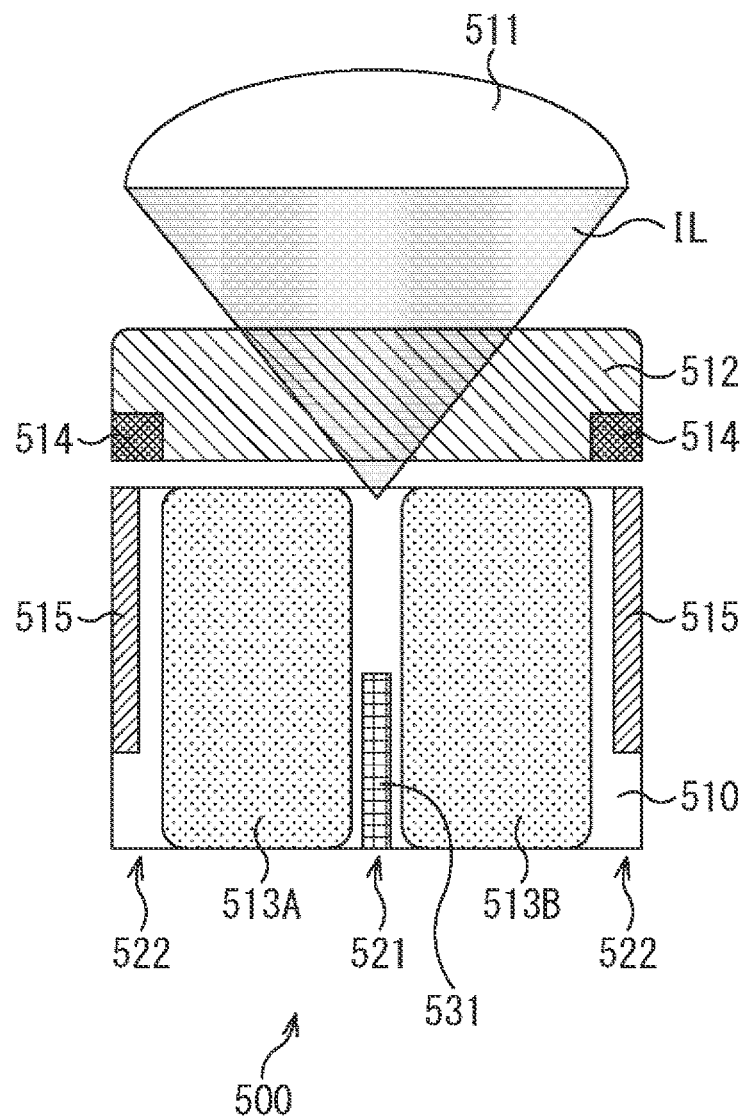
FIG. 59 is a cross-sectional view showing a first example of a structure of the pixel in the thirteenth embodiment.

FIG. 59 is a cross-sectional view showing a first example of a structure of the pixel in the thirteenth embodiment.

In FIG. 59, the pixel 500 has a 2PD structure, and includes an on-chip lens 511, a color filter 512, photoelectric conversion devices 513A and 513B, an inter-pixel light blocking unit 514, and an inter-pixel separation unit 515.

Note that in the pixel 500, since the on-chip lens 511 to the inter-pixel separation unit 515 respectively correspond to the on-chip lens 111, the color filter 112, the photoelectric conversion devices 113A and 113B, the inter-pixel light blocking unit 114, and the inter-pixel separation unit 115 constituting the pixel 100 (FIG. 11, etc.) in the above-mentioned embodiments, description thereof will be omitted here as appropriate.

In the pixel 500, the incident light IL condensed by the on-chip lens 511 is transmitted through the color filter 512 and applied to the photoelectric conversion area in the photoelectric conversion device 513A or the photoelectric conversion device 513B.

Here, in an inter-same-color central portion 521 between the photoelectric conversion device 513A and the photoelectric conversion device 513B in the pixel 500, a vertical transistor 531 is formed in a silicon layer 510 from a surface on the side opposite to the light incident surface. That is, here, in addition to the transfer transistors provided for the photoelectric conversion devices 513A and 513B, the vertical transistor 531 is provided between the devices.

Instead of forming, in the inter-same-color central portion 521, an inter-device separation unit from the light incident surface (e.g., back side), the vertical transistor 531 is formed from the surface (e.g., front side) on the side opposite thereto as described above, and thus, it is possible to realize efficient optical separation for the right and left photoelectric conversion devices 513A and 513B without condensing light immediately above the processing surface.

Further, here, the function of the vertical transistor 531 formed in the inter-same-color central portion 521 may be used. That is, by applying a voltage (e.g., a positive voltage) to the vertical transistor 531, it is possible to form a blooming path (channel) between the photoelectric conversion device 513A and the photoelectric conversion device 513B (above the vertical transistor 531). In the pixel 500, via this blooming path, it is possible to exchange the charges accumulated in the right and left photoelectric conversion devices 513A and 513B.

Here, since the pixel 500 can be used as both a pixel for acquiring an image and a pixel for detecting a phase difference, the pixel 500 functions as a pixel for detecting a phase difference at the time of autofocusing and is capable of functioning a pixel for acquiring an image at the time of imaging after the end of the autofocusing.

Then, in the case where the pixel 500 functions as a pixel for acquiring an image, for example, when the charges accumulated in one photoelectric conversion device 513 (513A or 513B) of the right and left photoelectric conversion devices 513A and 513B are likely to be saturated (the charges generated by the right and left photoelectric conversion devices 513A and 513B are unbalanced), it is possible to prevent the charges from being saturated, by accumulating the charges in the other photoelectric conversion device 513 (513B or 513A) via the blooming path. As a result, in the pixel 500, it is possible to control the output linearity by performing control of the voltage on the vertical transistor 531.

Note that in the pixel 500, in an inter-different-color central portion 522 between the photoelectric conversion device 513A or 513B and a photoelectric conversion device of an adjacent pixel, the inter-pixel separation unit 515 formed of metal or the like is formed in the silicon layer 510 from the light incident surface. Here, as the metal, tungsten (W), aluminum (Al), silver (Ag), rhodium (Rh), or the like can be used.

Further, in the pixel 500 in FIG. 59, although a groove is dug in the silicon layer 510 in which a photoelectric conversion area has been formed from the side of the light incident surface, and metal is embedded therein when forming the inter-pixel separation unit 515, a pinning film (negative fixed charge film) and an insulation film can be provided on the side wall of the groove at that time. Here, as the pinning film, hafnium oxide (HfO$_2$), tantalum oxide (Ta$_2$O$_5$), or the like can be used. Further, as the insulation film, silicon dioxide (SiO$_2$) or the like can be used. As described above, the pixel 500 in FIG. 59 has a structure in which the vertical transistor 531 is formed in the inter-same-color central portion 521 between the photoelectric conversion device 513A and the photoelectric conversion device 513B from the surface on the side opposite to the light incident surface, and thus, a groove (trench) can be formed without exposing the processing surface to the light reception surface side of the photoelectric conversion devices 513A and 513B, thereby achieving high phase difference separation characteristics.

Second Example of Structure

Figure 60:
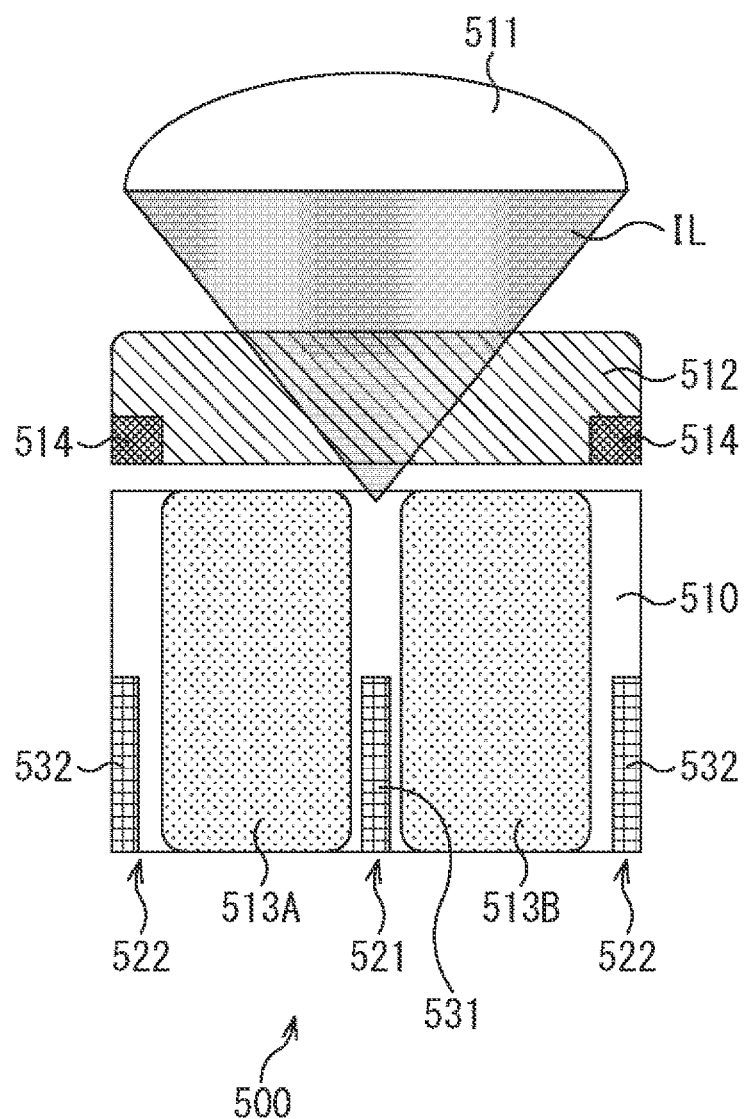
FIG. 60 is a cross-sectional view showing a second example of the structure of the pixel in the thirteenth embodiment.

FIG. 60 is a cross-sectional view showing a second example of the structure of the pixel in the thirteenth embodiment.

The pixel 500 in FIG. 60 is different from the pixel 500 in FIG. 59 in that a vertical transistor 532 is formed instead of the inter-pixel separation unit 515 in the inter-different-color central portion 522.

That is, the pixel 500 in FIG. 60 has a structure in which the vertical transistor 531 is formed in the inter-same-color central portion 521 from the surface on the side opposite to the light incident surface and also the vertical transistor 532 is formed in the inter-different-color central portion 522 from the surface on the side opposite to the light incident surface.

In the inter-different-color central portion 522, instead of forming an inter-pixel separation unit from the light incident surface, the vertical transistor 532 is formed from the surface on the side opposite thereto, and thus, the effect of suppressing color mixture due to long wavelength light can be maintained although it is inferior to the structure in which an inter-pixel separation unit is formed.

Further, here, the function of the vertical transistor 532 formed in the inter-different-color central portion 522 may be used. That is, by applying a voltage (e.g., a negative voltage) to the vertical transistor 532, charges (negative charges) can be generated in the silicon layer 510 to enhance pinning. As a result, white spots can be suppressed. Further, also in this case, by applying a voltage (e.g., a positive voltage) to the vertical transistor 531 formed in the inter-same-color central portion 521, it is possible to control the output linearity of the right and left photoelectric conversion devices 513A and 513B.

As described above, since the pixel 500 FIG. 60 has a structure in which the vertical transistor 531 and the vertical transistor 532 are respectively formed in the inter-same-color central portion 521 and the inter-different-color central portion 522 from the surface on the side opposite to the light incident surface, it is possible to achieve high phase difference separation characteristics, enhance pinning, and control the output linearity while maintaining the effect of suppressing color mixture due to long wavelength light.

Third Example of Structure

Figure 61:
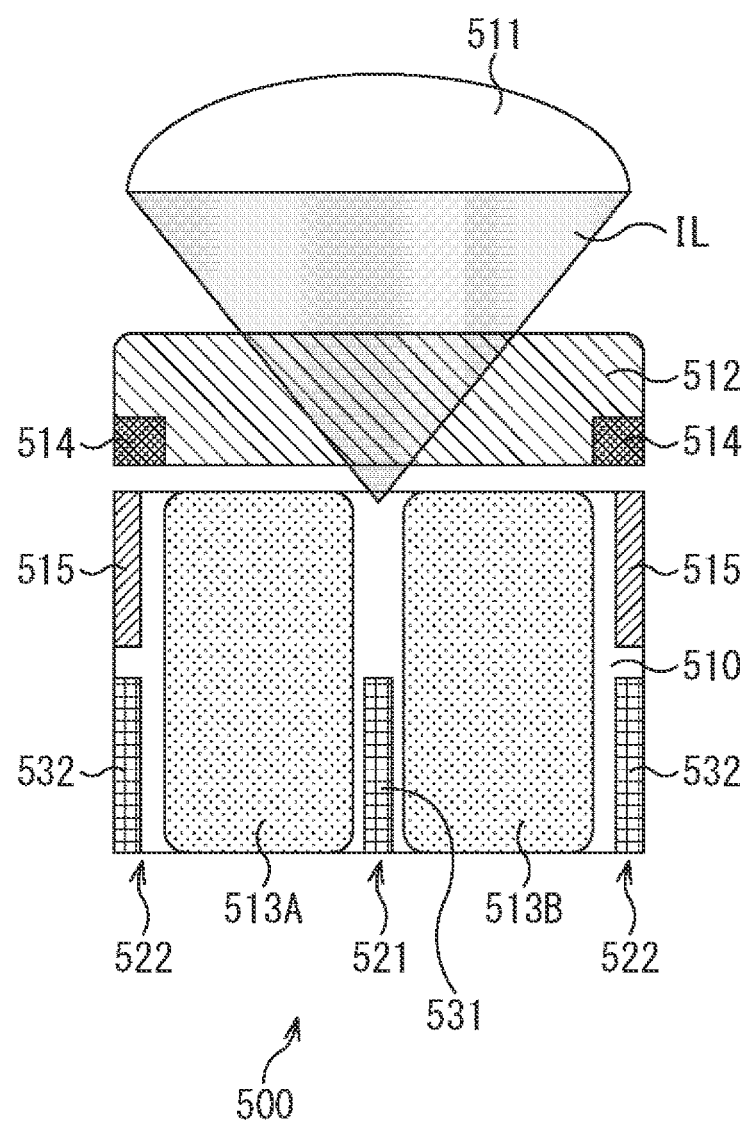
FIG. 61 is a cross-sectional view showing a third example of the structure of the pixel in the thirteenth embodiment.

FIG. 61 is a cross-sectional view showing a third example of the structure of the pixel in the thirteenth embodiment.

The pixel 500 in FIG. 61 is different from the pixel 500 in FIG. 59 in that the vertical transistor 532 is formed not only in the inter-same-color central portion 521 but also in the inter-different-color central portion 522.

That is, the pixel 500 in FIG. 61 has a structure in which the inter-pixel separation unit 515 formed of metal or the like is formed in the inter-different-color central portion 522 from the light incident surface and the vertical transistor 532 is formed from the surface on the side opposite thereto.

By employing such a structure, it is possible to increase the effect of suppressing color mixture by the amount of further forming the vertical transistor 532, as compared with the case where only the inter-pixel separation unit 541 is formed in the inter-different-color central portion 522.

Further, also in this case, by applying a voltage (e.g., a negative voltage) to the vertical transistor 532 using the function of the vertical transistor 532 formed in the inter-different-color central portion 522, it is possible to enhance pinning and suppress white spots. Note that by applying a voltage (e.g., a positive voltage) to the vertical transistor 531 formed in the inter-same-color central portion 521, it is possible to control the output linearity of the right and left photoelectric conversion devices 513A and 513B.

As described above, since the pixel 500 in FIG. 61 has a structure in which the inter-pixel separation unit 515 is formed in the inter-different-color central portion 522 from the light incident surface and the vertical transistor 531 and the vertical transistor 532 are respectively formed in the inter-same-color central portion 521 and the inter-different-color central portion 522 from the surface on the side opposite to the light incident surface, it is possible to achieve high phase difference separation characteristics, further increase the effect of suppressing color mixture, enhance pinning, and control the output linearity.

The thirteenth embodiment has been described above.

4. Circuit Configuration of Pixel

Figure 62:
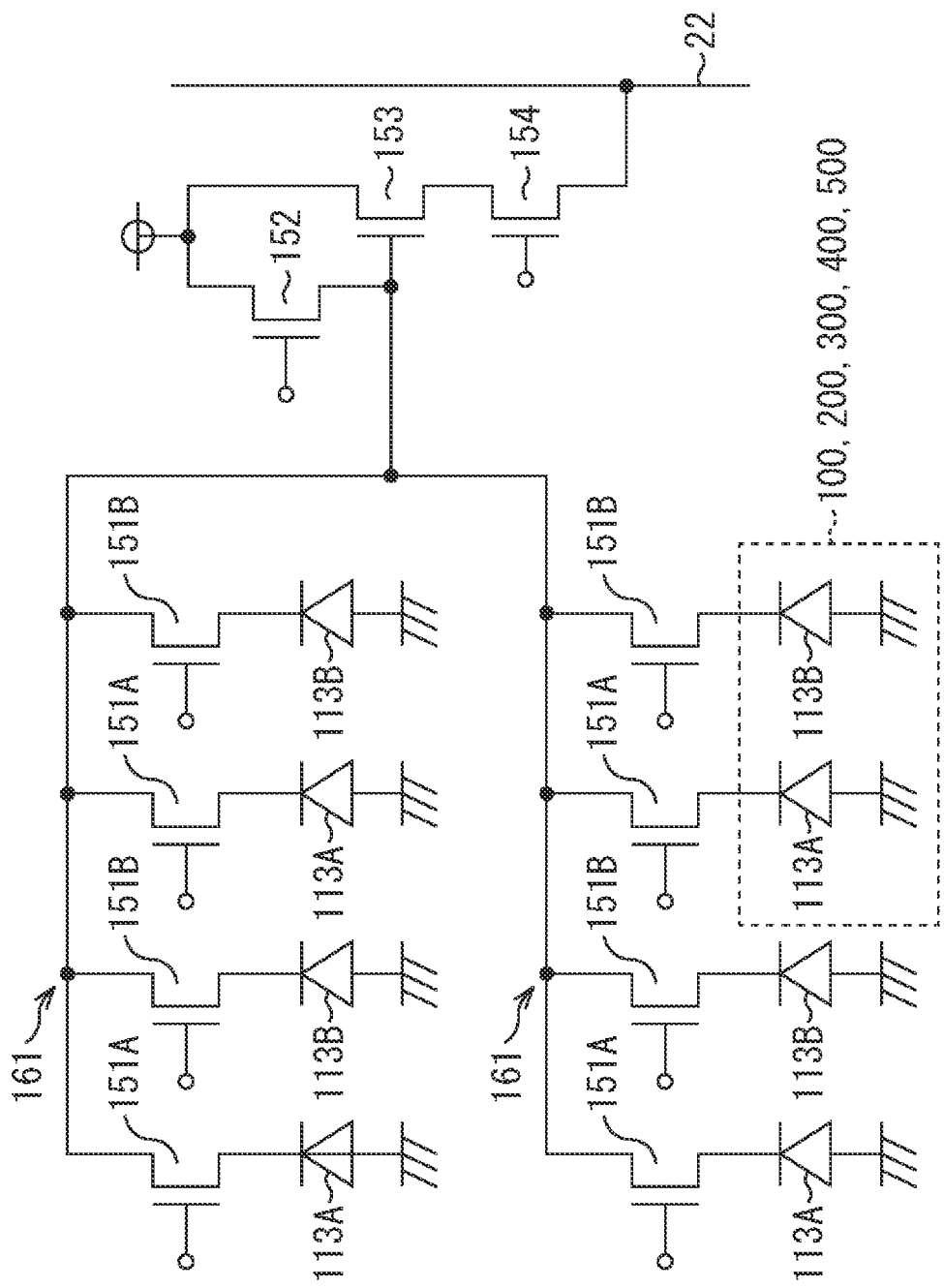
FIG. 62 is a diagram showing a circuit configuration of a pixel in each embodiment.

FIG. 62 is a diagram showing a circuit configuration of the pixel 100 in each embodiment.

In FIG. 62, the respective two pixels 100 provided at the upper stage and the lower stage in FIG. 62 share a floating diffusion area (FD: Floating Diffusion). Note that each of the pixels 100 has the 2PD structure including the photoelectric conversion device 113A and the photoelectric conversion device 113B, and one on-chip lens 111 and one color filter 112 are shared. Further, transfer transistors 151A and 151B respectively correspond to the transfer gates 151A and 151B.

An anode of the photodiode as the photoelectric conversion device 113A is grounded, and a cathode of the photodiode is connected to a source of the transfer transistor 151A. A drain of the transfer transistor 151A is connected to a source of a reset transistor 152 and a gate of an amplification transistor 153.

An anode of the photodiode as the photoelectric conversion device 113B is grounded, and a cathode of the photodiode is connected to a source of the transfer transistor 151B. A drain of the transfer transistor 151B is connected to the source of the reset transistor 152 and the gate of the amplification transistor 153.

The connection point between the drains of the transfer transistors 151A and 151B of the two pixels at the upper stage, the source of the reset transistor 152, and the gate of the amplification transistor 153 forms a floating diffusion area (FD) 161. Similarly, the connection point between the drains of the transfer transistors 151A and 151B of the two pixels at the lower stage, the source of the reset transistor 152, and the gate of the amplification transistor 153 forms a floating diffusion area (FD) 161.

A drain of the reset transistor 152 and a source of the amplification transistor 153 are connected to a power source. A drain of the amplification transistor 153 is connected to a source of a selection transistor 154, and a drain of the selection transistor 154 is connected to the vertical signal line 22.

Gates of the transfer transistors 151A and 151B, a gate of the reset transistor 152, and a gate of the selection transistor 154 are connected to the vertical drive circuit 12 (FIG. 1) via the pixel drive line 21, and a pulse as a drive signal is supplied to each gate of the transistors.

Next, the basic function of the pixel 100 shown in FIG. 62 will be described.

The reset transistor 152 turns on/off discharging of charges accumulated in the floating diffusion area (FD) 161 in accordance with a drive signal RST input to the gate of the reset transistor 152.

The photoelectric conversion device 113A performs photoelectric conversion on incident light, generates charges corresponding to the amount of the incident light, and accumulates the charges. The transfer transistor 151A turns on/off transferring of the charges from the photoelectric conversion device 113A to the floating diffusion area (FD) 161 in accordance with a drive signal TRG input to the gate of the transfer transistor 151A.

The photoelectric conversion device 113B performs photoelectric conversion on incident light, generates charges corresponding to the amount of the incident light, and accumulates the charges. The transfer transistor 151B turns on/off transferring of the charges from the photoelectric conversion device 113B to the floating diffusion area (FD) 161 in accordance with a drive signal TRG input to the gate of the transfer transistor 151B.

The floating diffusion area (FD) 161 has a function of accumulating the charges transferred from the photoelectric conversion device 113A via the transfer transistor 151A or the charges transferred from the photoelectric conversion device 113B via the transfer transistor 151B. The potential of the floating diffusion area (FD) 161 is modulated depending on the amount of the accumulated charges.

The amplification transistor 153 operates as an amplifier that regards the change in the potential of the floating diffusion area (FD) 161 connected to the gate of the amplification transistor 153 as an input signal, and the output signal voltage is output to the vertical signal line 22 via the selection transistor 154.

The selection transistor 154 turns on/off outputting of a voltage signal from the amplification transistor 153 to the vertical signal line 22 in accordance with a drive signal SEL input to the gate of the selection transistor 154.

As described above, the pixel 100 having the 2PD structure is driven in accordance with the drive signals (TRG, RST, and SEL) supplied from the vertical drive circuit 12 (FIG. 1).

Note that although the circuit configuration of the pixel 100 in the first embodiment to the ninth embodiment has been described in FIG. 62, a circuit configuration similar thereto can be employed also for the pixel 200 in the tenth embodiment, the pixel 300 in the eleventh embodiment, the pixel 400 in the twelfth embodiment, or the pixel 500 in the thirteenth embodiment.

5. Modified Example

Example of Combination of Embodiments

It goes without saying that the above-mentioned nine embodiments are each established as a single embodiment. An embodiment in which all or a part of the embodiments are combined in a possible range may be employed.

For example, by combining the above-mentioned second embodiment and the above-mentioned seventh embodiment, the projection portion 114P may be formed by the inter-pixel light blocking unit 114 in the plurality of pixels 100 (pixels 100 having the 1PD structure) in a configuration in which the plurality of pixels 100 are arranged in the row direction or the column direction with respect to the on-chip lens 111E having an elliptical shape in the row direction or the column direction.

Further, for example, by combining the above-mentioned third embodiment and the above-mentioned seventh embodiment, the projection portion 114P may be formed by the inter-pixel light blocking unit 114 as well as the projection portion 115P may be formed by the inter-pixel separation unit 115 in the plurality of pixels 100 (pixels 100 having the 1PD structure) in a configuration in which the plurality of pixels 100 are arranged in the row direction or the column direction with respect to the on-chip lens 111E having an elliptical shape in the row direction or the column direction.

For example, by combining the above-mentioned second embodiment and the above-mentioned eighth embodiment, the projection portion 114P may be formed by the inter-pixel light blocking unit 114 in the pixels 100 (pixels 100 having the 1PD structure) in two rows and two columns in a configuration in which the pixels 100 in two rows and two columns are arranged with respect to one on-chip lens 111.

Further, for example, by combining the above-mentioned third embodiment and the above-mentioned eighth embodiment, the projection portion 114P may be formed by the inter-pixel light blocking unit 114 as well as the projection portion 115P may be formed by the inter-pixel separation unit 115 in the pixels 100 (pixels 100 having the 1PD structure) in two rows and two columns in a configuration in which the pixels 100 in two rows and two columns are arranged with respect to one on-chip lens 111.

Further, for example, by combining any of the above-mentioned first to ninth embodiments and any of the above-mentioned tenth to thirteenth embodiments, for example, the inter-pixel separation unit 215 (the inter-pixel separation unit 315, the inter-pixel separation unit 415, or the inter-pixel separation unit 515) may form a projection portion 215P (a projection portion 315P, a projection portion 415P, or a projection portion 515P) in the pixel 200 (the pixel 300, the pixel 400, or the pixel 500).

In this case, for example, the inter-pixel light blocking unit 214 (the inter-pixel light blocking unit 314, the inter-pixel light blocking unit 414, or the inter-pixel light blocking unit 514) may form a projection portion 214P (a projection portion 314P, a projection portion 414P, or a projection portion 514P) in the pixel 200 (the pixel 300, the pixel 400, or the pixel 500).

Note that although the pixel 100 has a structure (2PD structure) in which the right and left photoelectric conversion devices 113A and 113B are provided for one on-chip lens 111 in the above description, the right and left photoelectric conversion devices 113A and 113B may be regarded as the left pixel 100A and the right pixel 100B. That is, it can be said that the pixel 100 is a pixel unit that includes a left pixel 100A including a photoelectric conversion device 113A and a right pixel 100B including a photoelectric conversion device 113B.

Similarly, also the pixel 200 (the pixels 300, the pixel 400, or the pixel 500) can be regarded as the pixel unit that includes a left pixel 200A (a left pixel 300A, a left pixel 400A, or a left pixel 500 A) including the photoelectric conversion device 213A (the photoelectric conversion device 313A, the photoelectric conversion device 413A, or the photoelectric conversion device 513A) and a right pixel 200B (a right pixel 300B, a right pixel 400B, or a right pixel 500B) including the photoelectric conversion device 213B (the photoelectric conversion device 313B, the photoelectric conversion device 413B, or the photoelectric conversion device 513B).

Note that although the case where a photodiode (PD) is used as the photoelectric conversion devices 113A and 113B of the pixel 100 has been described above, for example, another member (device) such as a photoelectric conversion film may be used. Further, it can be said that the on-chip lens 111 is a lens on the pixel, which perform focus detection, and is also a microlens. The same applies also to the pixel 200, the pixel 300, the pixel 400, or the pixel 500.

Further, although the inter-pixel light blocking unit 114 and the inter-pixel separation unit 115 are formed in a square grid for the pixel 100 in the above description, the present technology is not limited to the square grid and another shape such as a quadrilateral including a rectangle may be used. Further, also the pixel 100 is not limited to a square unit, and may be formed in another unit. The same applies also to the pixel 200, the pixel 300, the pixel 400, or the pixel 500.

Further, although R pixels, G pixels, and B pixels have been shown as the pixels 100 (the pixels 200, the pixels 300, the pixels 400, or the pixels 500) to be two-dimensionally arranged in the pixel array unit 11 (FIG. 1) in the above description, for example, pixels other than RGB pixels, such as W pixels corresponding to white (W) and IR pixels corresponding to infrared light (IR) may be included. Note that the W pixel is a pixel that causes light in the entire wavelength region to be transmitted therethrough and obtains charges corresponding to the light. Further, the IR pixel is a pixel that causes infrared light (IR) to be transmitted therethrough and has sensitivity to the wavelength band of infrared light.

(Another Example of Solid-State Imaging Device)

Further, although a case where an embodiment of the present technology is applied to the CMOS image sensor in which the pixels are two-dimensionally arranged has been described as an example in the above-mentioned embodiments, the present technology is not limited to application to the CMOS image sensor. That is, the present technology is applicable to all X-Y address type solid-state imaging devices in which the pixels are two-dimensionally arranged, e.g., a CCD (Charge Coupled Device) image sensor.

Further, the present technology is not limited to application to a solid-state imaging device that detects distribution of the amount of incident light of visible light and images the distribution as an image, and is applicable to all solid-state imaging devices that image distribution of the incident amount of infrared rays, X-rays, particles, or the like, as an image. Further, although the pixel 100 having the 2PD structure in which two photoelectric conversion devices 113 are formed with respect to one on-chip lens 111 has been mainly described in the above-mentioned embodiments, the present technology is applicable to the pixel 100 in which a plurality of photoelectric conversion devices 113 are formed with respect to one on-chip lens 111, similarly.

6. Configuration of Electronic Apparatus

Figure 63:
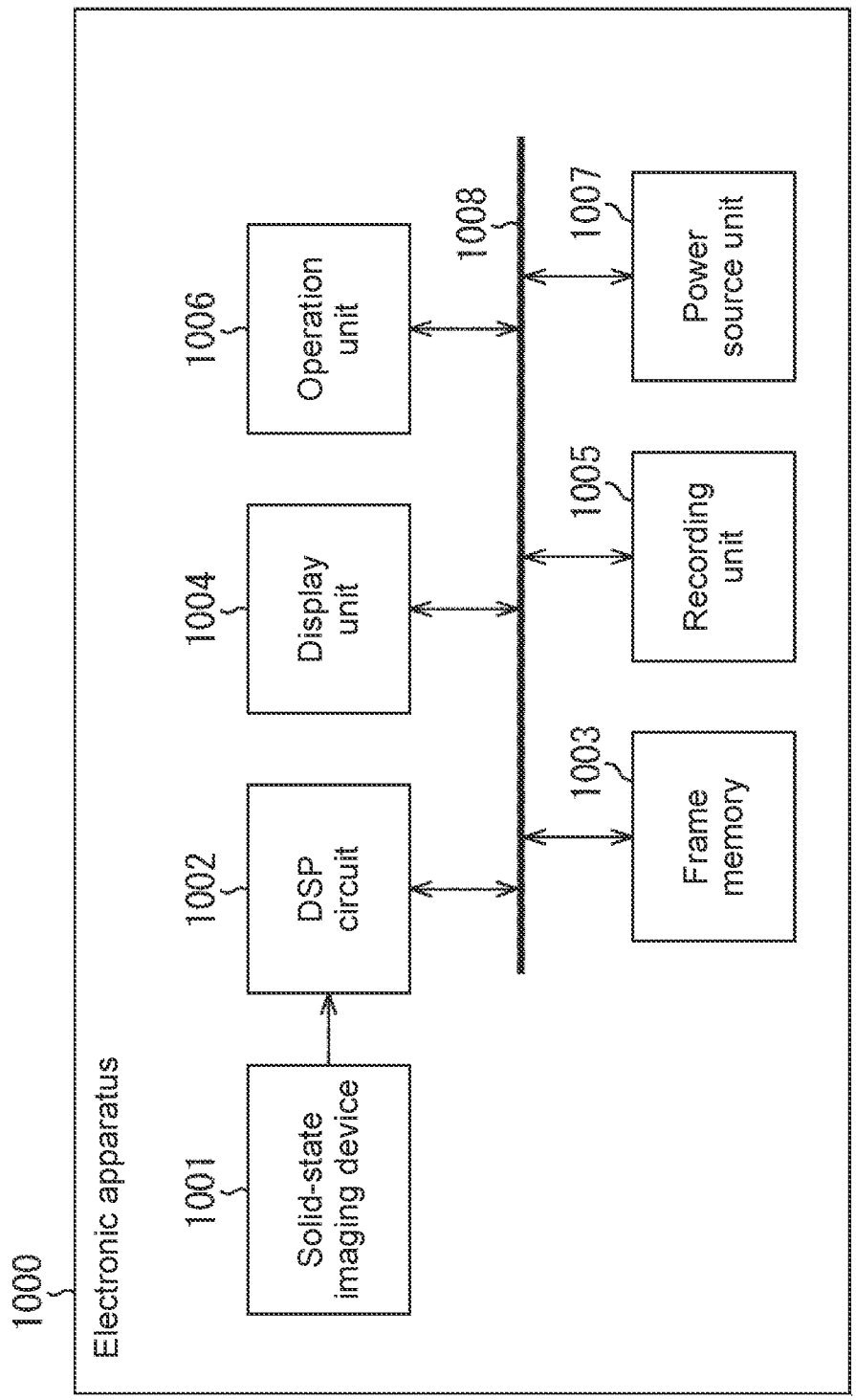
FIG. 63 is a block diagram showing a configuration example of an electronic apparatus including a solid-state imaging device to which an embodiment of the present technology is applied.

FIG. 63 is a block diagram showing a configuration example an electronic apparatus including a solid-state imaging device to which an embodiment of the present technology is applied.

An electronic apparatus 1000 is, for example, an electronic apparatus such as an imaging apparatus such as a digital still camera and a video camera, and a portable terminal apparatus such as a smartphone and a tablet terminal.

The electronic apparatus 1000 includes a solid-state imaging device 1001, a DSP circuit 1002, a frame memory 1003, a display unit 1004, a recording unit 1005, an operation unit 1006, and a power source unit 1007. Further, in the electronic apparatus 1000, the DSP circuit 1002, the frame memory 1003, the display unit 1004, the recording unit 1005, the operation unit 1006, and the power source unit 1007 are connected to each other via a bus line 1008.

The solid-state imaging device 1001 corresponds to the above-mentioned CMOS image sensor 10 (FIG. 1), and the pixels 100 shown in the above-mentioned first to ninth embodiments can be employed as the pixels 100 two-dimensionally arranged in the pixel array unit 11 (FIG. 1).

Accordingly, in the electronic apparatus 1000, it is possible to detect phase difference on the basis of the signal for phase difference detection acquired from the pixels 100 (image surface phase difference pixels) shown in the above-mentioned first to ninth embodiments, and perform control of focusing on an in-focus object.

Further, as the pixels to be two-dimensionally arranged in the pixel array unit 11 (FIG. 1), the pixels 200, the pixels 300, the pixels 400, or the pixels 500 shown in the above-mentioned tenth to thirteenth embodiments may be arranged. Also in this case, in the electronic apparatus 1000, it is possible to detect phase difference on the basis of the signal for phase difference detection acquired from the pixels 200, the pixels 300, the pixels 400, or the pixels 500, and perform control of focusing on an in-focus object.

Note that since the pixel 100 has a structure (2PD structure) in which the two photoelectric conversion devices 113A and 113B are provided for one on-chip lens 111, the pixel signal (A+B signal) generated by adding up the charges accumulated in the photoelectric conversion devices 113A and 113B is used as a signal for acquiring an image, and the pixel signal (A signal) obtained from the charges accumulated in the photoelectric conversion device 113A and the pixel signal (B signal) obtained from the charges accumulated in the photoelectric conversion device 113B can be independently read and used as a signal for detecting a phase difference.

As described above, the pixel 100 has a 2PD structure, and can be used as both a pixel for acquiring an image and a pixel for detecting a phase difference (image plane phase difference detection pixel). Further, although detailed description is omitted, similarly, also the pixel 200, the pixel 300, the pixel 400, and the pixel 500 can be used as both a pixel for acquiring an image and a pixel for detecting a phase difference because they have a 2PD structure.

The DSP circuit 1002 is a camera signal processing circuit that processes a signal supplied from the solid-state imaging device 1001. The DSP circuit 1002 outputs image data acquired by processing the signal from the solid-state imaging device 1001. The frame memory 1003 temporarily stores, in units of frames, the image data processed by the DSP circuit 1002.

The display unit 1004 includes, for example, a panel display apparatus such as a liquid crystal panel and an organic EL (Electro Luminescence) panel, and displays a moving image or a still image imaged by the solid-state imaging device 1001. The recording unit 1005 stores the image data of the moving image or still image imaged by the solid-state imaging device 1001 in a recording medium such as a semiconductor memory and a hard disk.

The operation unit 1006 outputs operation commands for various functions of the electronic apparatus 1000 in accordance with a user operation. The power source unit 1007 appropriately supplies various kinds of power sources as operation power sources for the DSP circuit 1002, the frame memory 1003, the display unit 1004, the recording unit 1005, and the operation unit 1006 to these supply targets.

The electronic apparatus 1000 is configured as described above. An embodiment of the present technology is applied to the solid-state imaging device 1001, as described above. Specifically, the CMOS image sensor 10 (FIG. 1) can be applied to the solid-state imaging device 1001. By applying an embodiment of the present technology to the solid-state imaging device 1001 and forming a projection portion by the inter-pixel light blocking unit 114 or the inter-pixel separation unit 115 in an area in which the contribution of isolation is low in the pixel 100, it is possible to improve the accuracy of phase difference detection while suppressing degradation of a picked-up image.

7. Usage Examples of Solid-State Imaging Device

Figure 64:
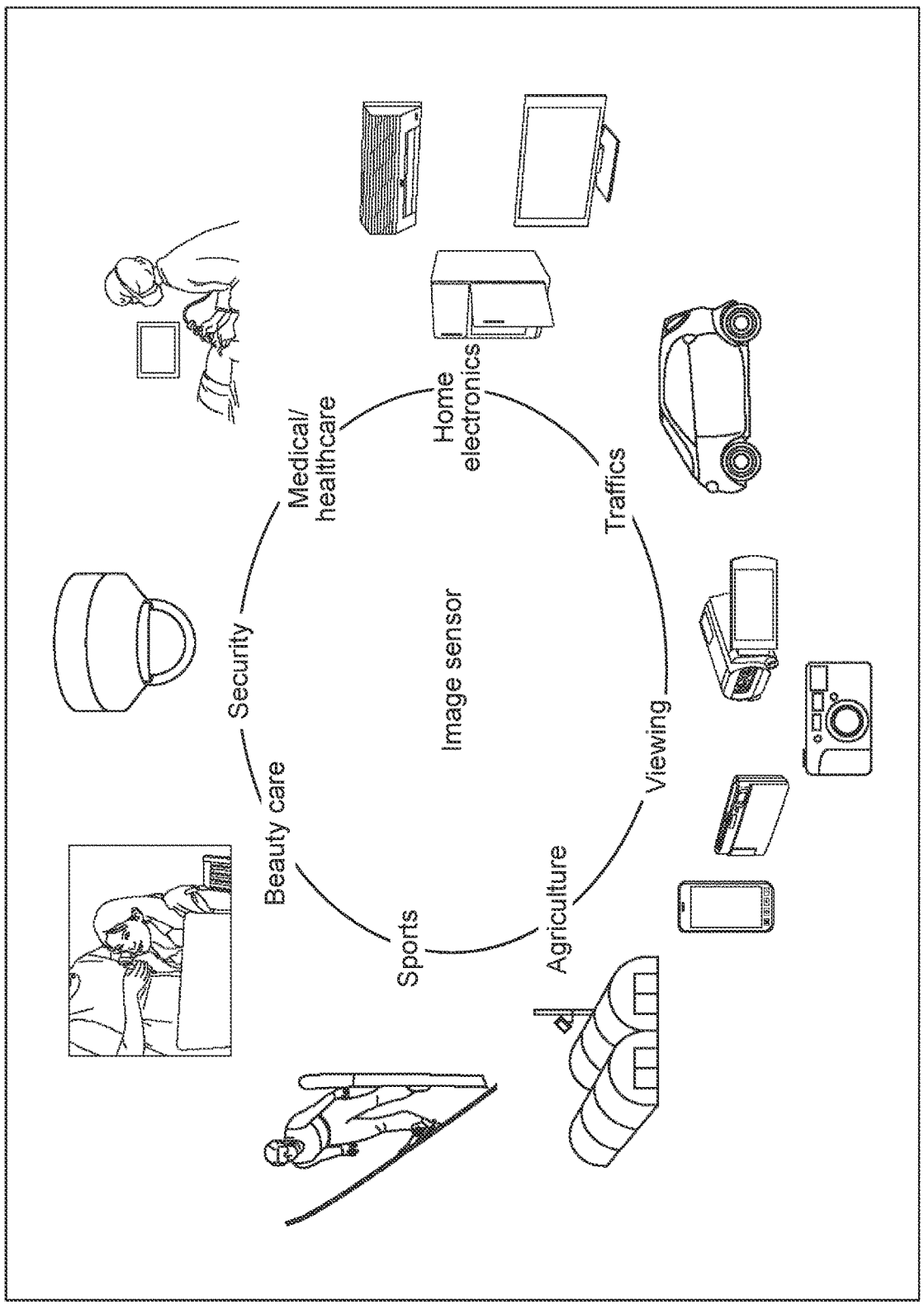
FIG. 64 is a diagram showing a usage example of a solid-state imaging device to which an embodiment of the present technology is applied.

FIG. 64 is a diagram showing usage examples of a solid-state imaging device to which an embodiment of the present technology is applied.

The CMOS image sensor 10 (FIG. 1) can be used in various cases of sensing light such as visible light, infrared light, ultraviolet light, and X-rays as follows, for example. That is, as shown in FIG. 64, the CMOS image sensor 10 can be used for not only an apparatus used in the appreciation field for photographing images to be viewed but also apparatuses used in the traffic field, the home electronics field, the medical and healthcare field, the security field, the beauty care field, the sports field, and the agriculture field, for example.

Specifically, in the appreciation field, the CMOS image sensor 10 can be used for an apparatus for photographing images to be viewed (e.g., the electronic apparatus 1000 shown in FIG. 63), such as a digital camera, a smartphone, and a camera-equipped mobile phone.

In the traffic field, the CMOS image sensor 10 can be used for an apparatus used for traffic purposes, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver condition, and the like.

In the home electronics field, the CMOS image sensor 10 can be used for an apparatus used in home electronics such as a television receiver, a refrigerator, and an air conditioner, for photographing gestures of users and executing apparatus operations according to the gestures. Further, in the medical and healthcare field, the CMOS image sensor 10 can be used for an apparatus used for medical and healthcare purposes, such as an endoscope and an apparatus that performs blood vessel photographing by receiving infrared light.

In the security field, the CMOS image sensor 10 can be used for an apparatus used for security purposes, such as a surveillance camera for crime-prevention purposes and a camera for person authentication purposes. Further, in the beauty care field, the CMOS image sensor 10 can be used for an apparatus used for beauty care purposes, such as a skin measurement apparatus that photographs skins and a microscope that photographs scalps.

In the sports field, the CMOS image sensor 10 can be used for an apparatus used for sports purposes, such as an action camera and a wearable camera for sports purposes. Further, in the agriculture field, the CMOS image sensor 10 can be used for an apparatus for agriculture purposes, such as a camera for monitoring states of fields and crops.

8. Configuration Example of Stacked-Type Solid-State Imaging Device to which Technology According to Present Disclosure can be Applied FIG. 65 is a diagram showing the outline of a configuration example of the stacked-type solid-state imaging device to which the technology according to the present disclosure can be applied.

Figure 65:
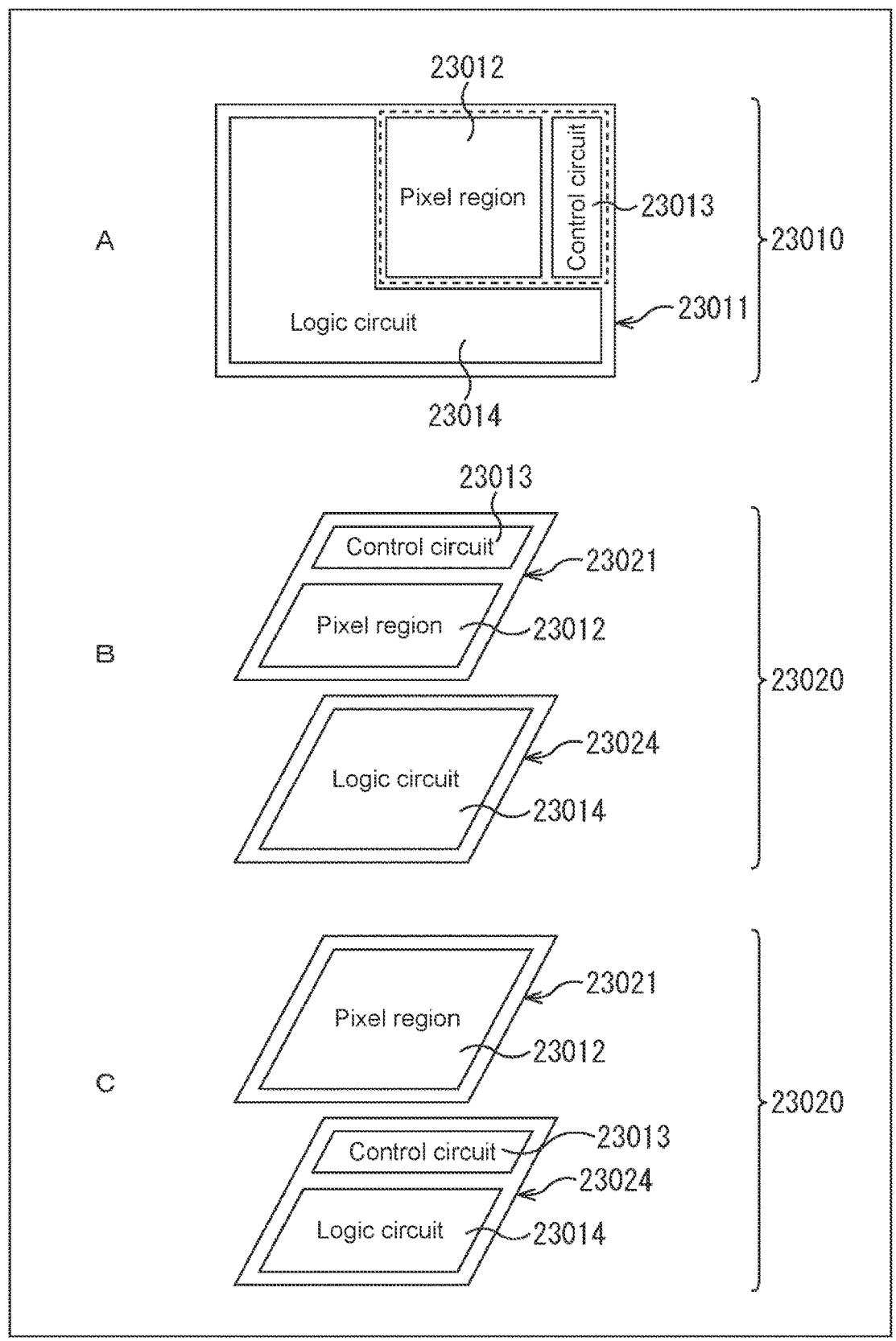
FIG. 65 is a diagram showing an overview of a configuration example of a stacked-type solid-state imaging device to which the technology according to the present disclosure can be applied.

A of FIG. 65 shows a schematic configuration example of a non-stacked-type solid-state imaging device. As shown in A of FIG. 65, a solid-state imaging device 23010 includes a single die (semiconductor substrate) 23011. This die 23011 installs a pixel region 23012 in which pixels are arranged in an array, a control circuit 23013 that controls driving of the pixels and performs other various controls, and a logic circuit 23014 for signal processing.

B and C of FIG. 65 show a schematic configuration example of the stacked-type solid-state imaging device. As shown in B and C of FIG. 65, two dies of a sensor die 23021 and a logic die 23024 are stacked and electrically connected to each other. In this manner, the solid-state imaging device 23020 is configured as a single semiconductor chip.

In B of FIG. 65, the sensor die 23021 installs the pixel region 23012 and the control circuit 23013. The logic die 23024 installs the logic circuit 23014 including a signal processing circuit that performs signal processing.

In C of FIG. 65, the sensor die 23021 installs the pixel region 23012. The logic die 23024 installs the control circuit 23013 and the logic circuit 23014.

Figure 66:
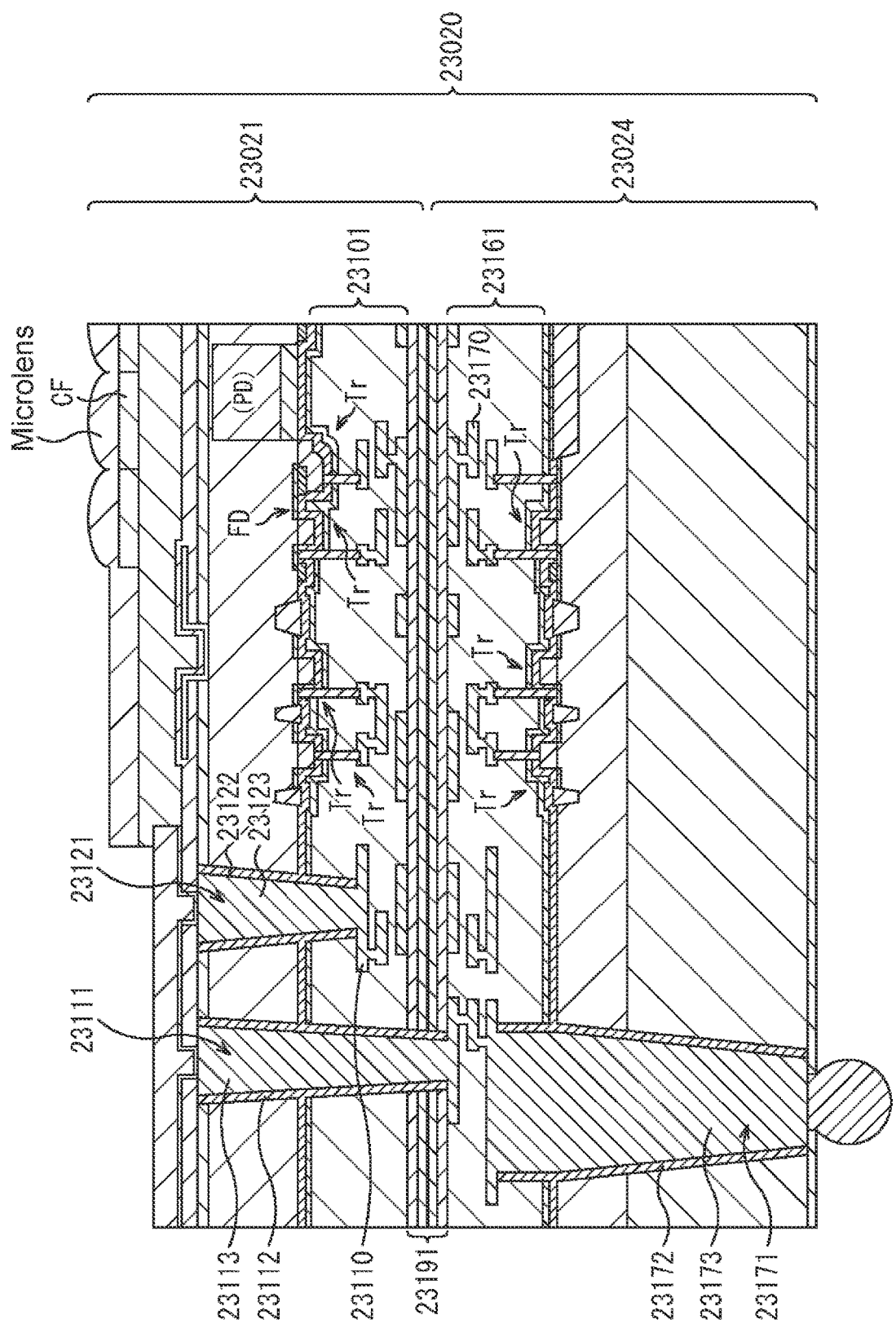
FIG. 66 is a cross-sectional view showing a first configuration example of the stacked-type solid-state imaging device.

FIG. 66 is a cross-sectional view showing a first configuration example of the stacked-type solid-state imaging device 23020.

In the sensor die 23021, a photodiode (PD), a floating diffusion (FD), and transistors (Tr) (MOS FET), which constitute a pixel that becomes the pixel region 23012, and Tr and the like, which become the control circuit 23013, are formed. In addition, a wiring layer 23101 is formed in the sensor die 23021. The wiring layer 23101 includes a plurality of layers, in this example, three-layer wires 23110. Note that (Tr that becomes) the control circuit 23013 can be formed in not the sensor die 23021 but the logic die 23024.

Tr constituting the logic circuit 23014 is formed in the logic die 23024. In addition, a wiring layer 23161 is formed in the logic die 23024. The wiring layer 23161 includes a plurality of layers, in this example, three-layer wires 23170. Further, a connection hole 23171 is formed in the logic die 23024. The connection hole 23171 has an insulation film 23172 formed on an inner wall surface thereof. A connection conductor 23173 to be connected to the wire 23170 and the like is embedded in the connection hole 23171.

The sensor die 23021 and the logic die 23024 are bonded to each other such that the wiring layers 23101 and 23161 thereof face each other. With this, the stacked-type solid-state imaging device 23020 in which the sensor die 23021 and the logic die 23024 are stacked is formed. A film 23191 such as a protection film is formed in a face on which the sensor die 23021 and the logic die 23024 are bonded to each other.

A connection hole 23111 is formed in the sensor die 23021. The connection hole 23111 penetrates the sensor die 23021 from the backside (side on which light enters the PD) (upper side) of the sensor die 23021 and reaches an uppermost layer wire 23170 of the logic die 23024. In addition, a connection hole 23121 is formed in the sensor die 23021. The connection hole 23121 is located in proximity of the connection hole 23111 and reaches a first-layer wire 23110 from the backside of the sensor die 23021. An insulation film 23112 is formed on an inner wall surface of the connection hole 23111. An insulation film 23122 is formed on an inner wall surface of the connection hole 23121. Then, connection conductors 23113 and 23123 are embedded in the connection holes 23111 and 23121, respectively. The connection conductor 23113 and the connection conductor 23123 electrically connected to each other on the back side of the sensor die 23021. With this, the sensor die 23021 and the logic die 23024 are electrically connected to each other via the wiring layer 23101, the connection hole 23121, the connection hole 23111, and the wiring layer 23161.

Figure 67:
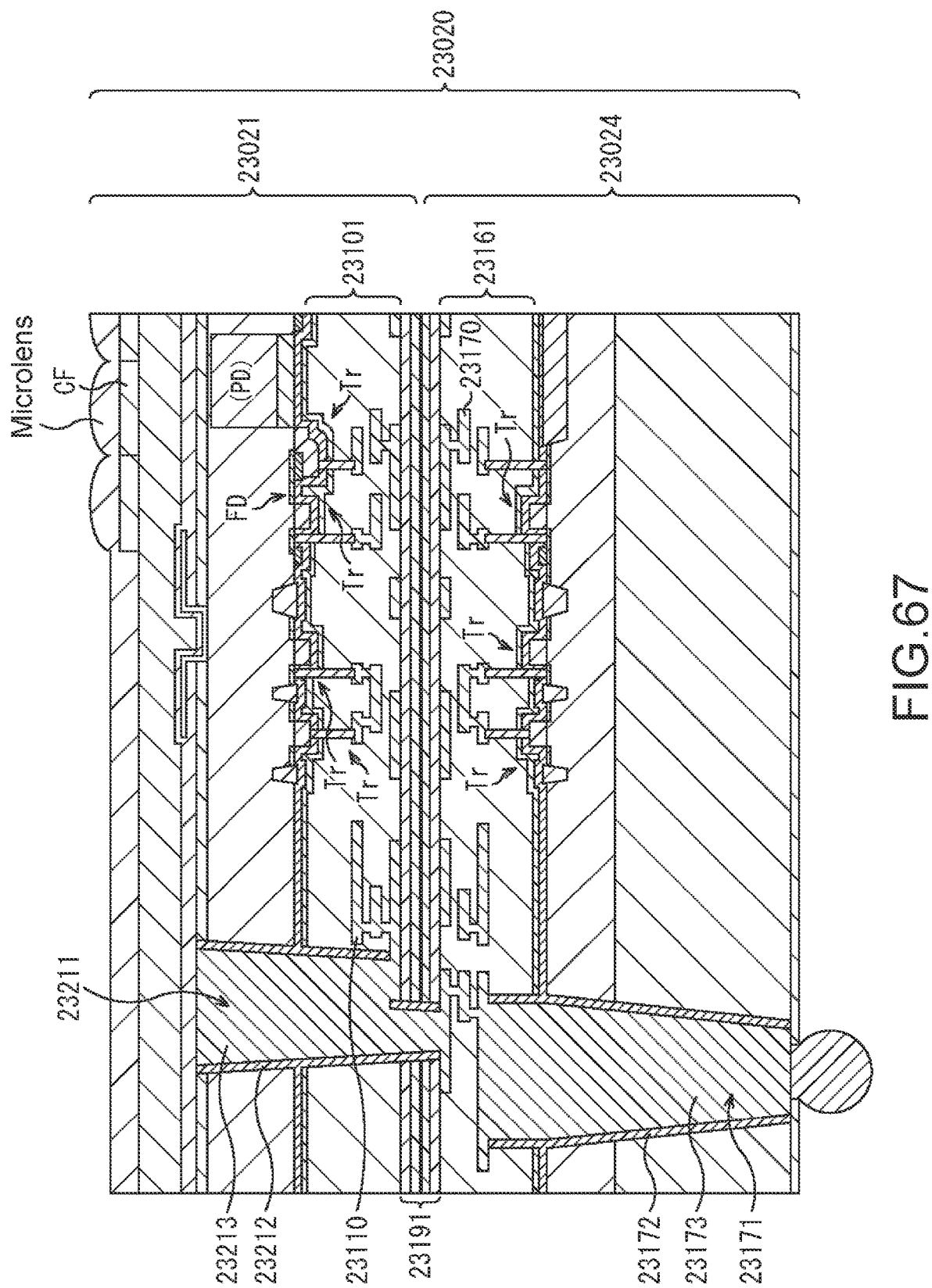
FIG. 67 is a cross-sectional view showing a second configuration example of the stacked-type solid-state imaging device.

FIG. 67 is a cross-sectional view showing a second configuration example of the stacked-type solid-state imaging device 23020.

In a second configuration example of the solid-state imaging device 23020, ((the wire 23110 of) the wiring layer 23101 of) the sensor die 23021 and ((the wire 23170 of) the wiring layer 23161 of) the logic die 23024 are electrically connected to each other through a single connection hole 23211 formed in the sensor die 23021.

That is, in FIG. 67, the connection hole 23211 is formed penetrating the sensor die 23021 from the back side of the sensor die 23021 and reaching an uppermost layer wire 23170 of the logic die 23024 and an uppermost layer wire 23110 of the sensor die 23021. An insulation film 23212 is formed on the inner wall surface of the connection hole 23211. A connection conductor 23213 is embedded in the connection hole 23211. In FIG. 66 described above, the sensor die 23021 and the logic die 23024 are electrically connected to each other through the two connection holes 23111 and 23121. On the other hand, in FIG. 67, the sensor die 23021 and the logic die 23024 are electrically connected to each other through the single connection hole 23211.

Figure 68:
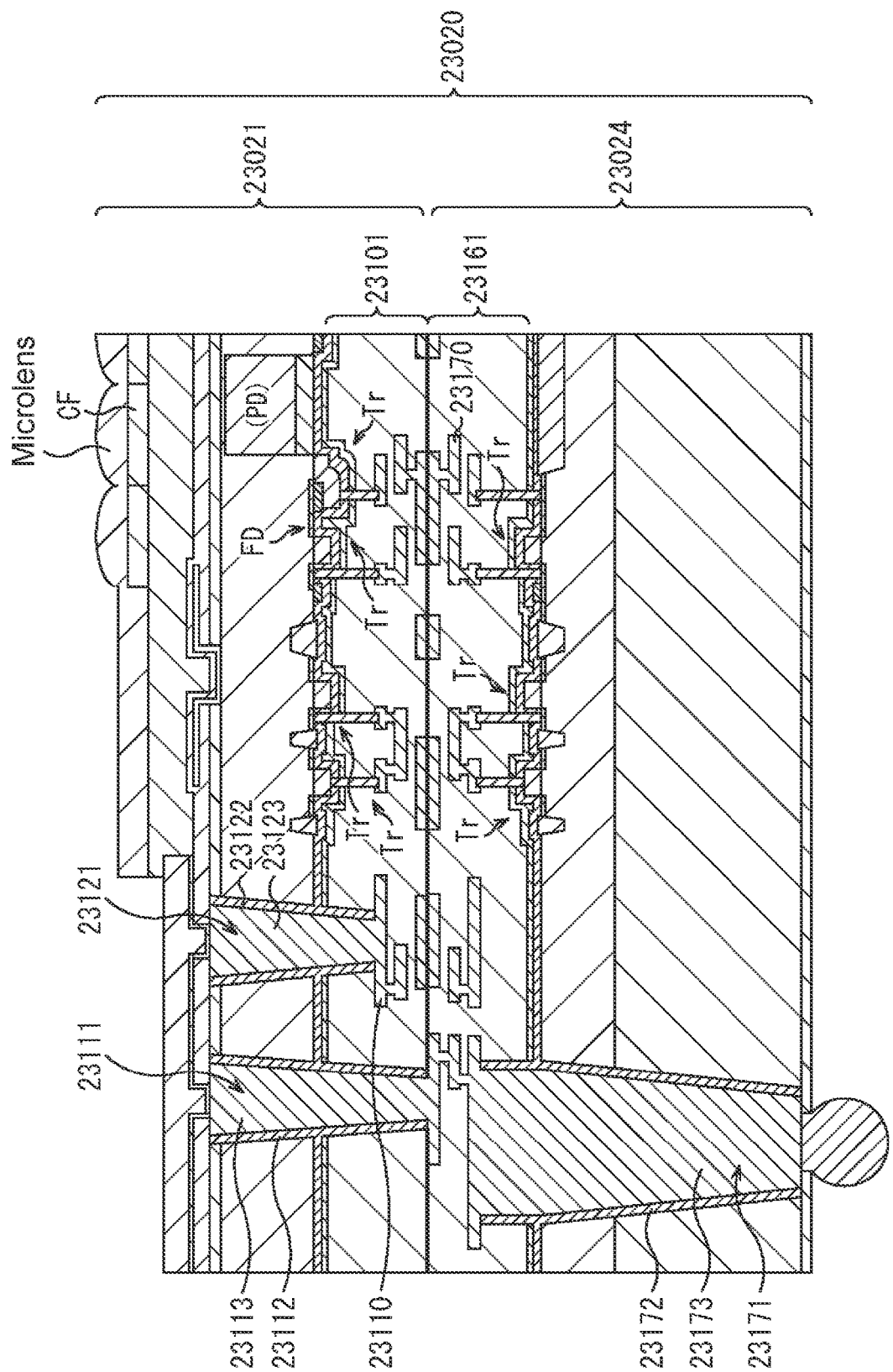
FIG. 68 is a cross-sectional view showing a third configuration example of the stacked-type solid-state imaging device.

FIG. 68 is a cross-sectional view showing a third configuration example of the stacked-type solid-state imaging device 23020.

In the solid-state imaging device 23020 of FIG. 68, the film 23191 such as the protection film is not formed in a face on which the sensor die 23021 and the logic die 23024 are bonded to each other. In the case of FIG. 66, the film 23191 such as the protection film is formed in the face on which the sensor die 23021 and the logic die 23024 are bonded to each other. In this point, the solid-state imaging device 23020 of FIG. 68 is different from the case of FIG. 66.

The sensor die 23021 and the logic die 23024 are superimposed on each other such that the wires 23110 and 23170 are held in direct contact. Then, the wires 23110 and 23170 are directly joined with each other by heating the wires 23110 and 23170 while adding necessary weight on the wires 23110 and 23170. In this manner, the solid-state imaging device 23020 of FIG. 68 is formed.

Figure 69:
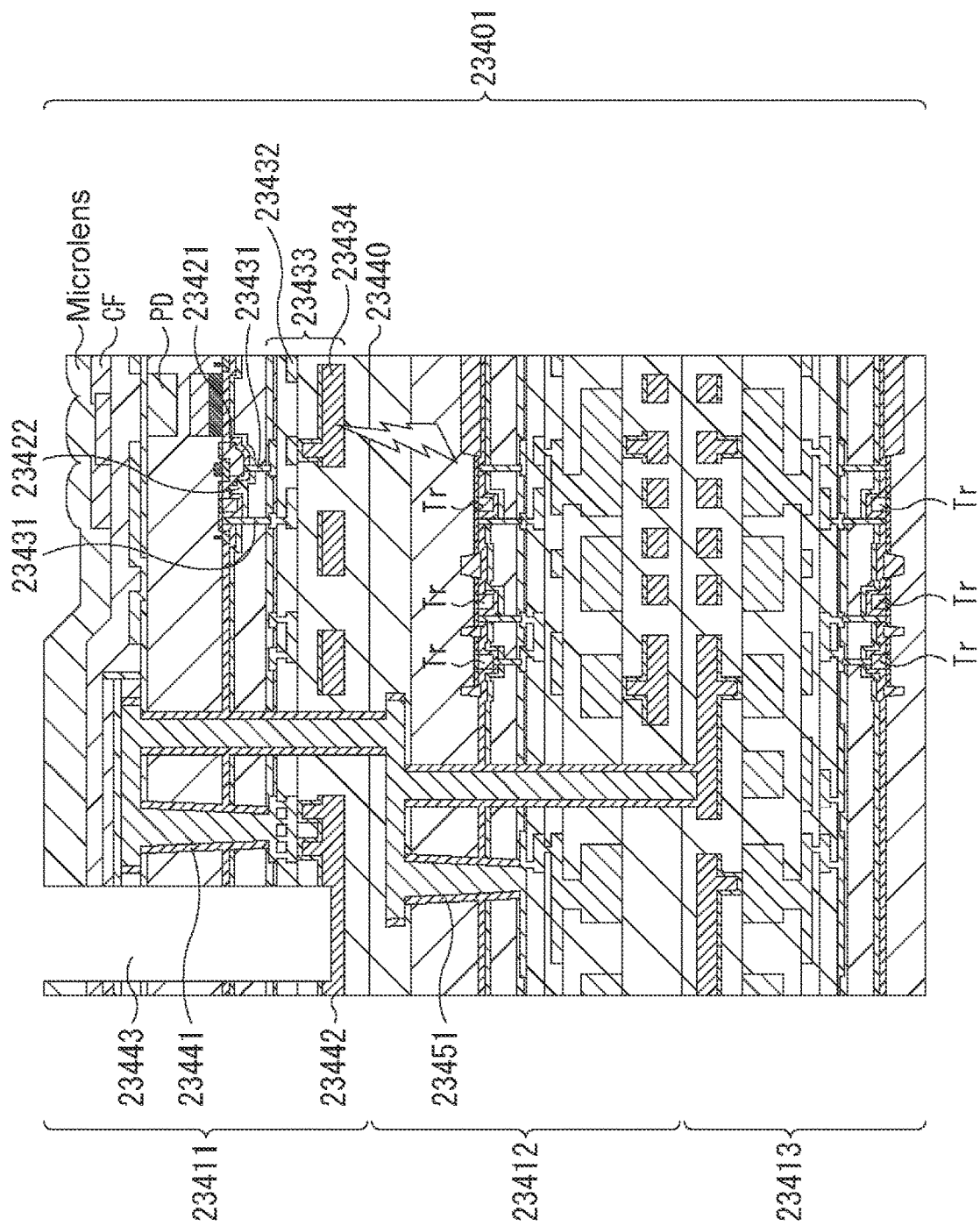
FIG. 69 is a cross-sectional view showing another configuration example of a stacked-type solid-state imaging device to which the technology according to the present disclosure can be applied.

FIG. 69 is a cross-sectional view showing another configuration example of the stacked-type solid-state imaging device to which the technology according to the present disclosure can be applied.

In FIG. 69, a solid-state imaging device 23401 has a three-layer laminate structure. In this three-layer laminate structure, three dies of a sensor die 23411, a logic die 23412, and a memory die 23413 are stacked.

The memory die 23413 includes a memory circuit. The memory circuit stores data temporarily necessary in signal processing performed in the logic die 23412, for example.

In FIG. 69, the logic die 23412 and the memory die 23413 are stacked below the sensor die 23411 in the stated order. However, the logic die 23412 and the memory die 23413 may be stacked below the sensor die 23411 in inverse order, i.e., in the order of the memory die 23413 and the logic die 23412.

Note that, in FIG. 69, a PD that becomes a photoelectric conversion portion of the pixel and source/drain regions of a pixel Tr are formed in the sensor die 23411.

A gate electrode is formed via a gate insulation film around the PD. A pixel Tr 23421 and a pixel Tr 23422 are formed by the gate electrode and the paired source/drain regions.

The pixel Tr 23421 adjacent to the PD is a transfer Tr. One of the paired source/drain regions that constitute the pixel Tr 23421 is an FD.

Further, an inter-layer insulation film is formed in the sensor die 23411. A connection hole is formed in the inter-layer insulation film. The pixel Tr 23421 and connection conductors 23431 that connects to the pixel Tr 23422 are formed in the connection hole.

In addition, a wiring layer 23433 having a plurality of layers with layer wires 23432 which connect to each of the connection conductors 23431 is formed in the sensor die 23411.

Further, an aluminum pad 23434 that becomes an electrode for external connection is formed in a lowermost layer of the wiring layer 23433 of the sensor die 23411. That is, in the sensor die 23411, the aluminum pad 23434 is formed at a position closer to a surface 23440 bonding with the logic die 23412 than the wires 23432. The aluminum pad 23434 is used as one end of a wire associated with input/output of signals into/from the outside.

In addition, a contact 23441 used for electric connection with the logic die 23412 is formed in the sensor die 23411. The contact 23441 is connected to a contact 23451 of the logic die 23412 and also connected to an aluminum pad 23442 of the sensor die 23411.

Then, a pad hole 23443 is formed in the sensor die 23411, reaching the aluminum pad 23442 from a backside (upper side) of the sensor die 23411.

The technology according to the present disclosure can also be applied to the solid-state imaging device as described above.

9. Example of Application to Movable Object

The technology according to the present disclosure (the present technology) is applicable to various products. For example, the technology according to the present disclosure may be, for example, realized as a device mounted on any kind of movable objects such as a car, an electric car, a hybrid electric car, a motorcycle, a bicycle, a personal mobility, an aircraft, a drone, a ship, and a robot.

Figure 70:
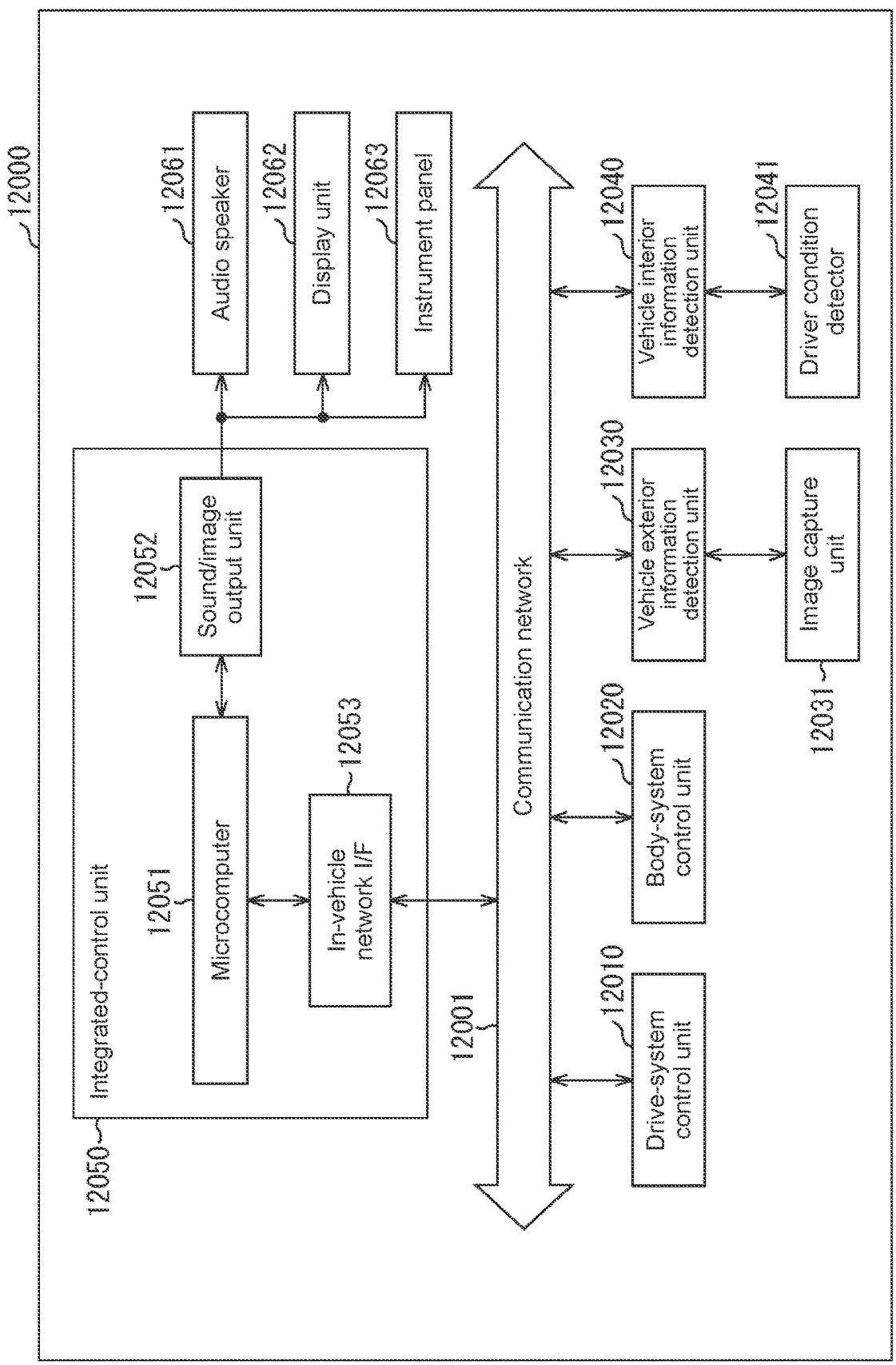
FIG. 70 is a block diagram showing an example of a schematic configuration of a vehicle control system.

FIG. 70 is a block diagram showing an example of a schematic configuration of a vehicle control system, which is an example of a movable object control system to which the technology according to the present disclosure is applied.

A vehicle control system 12000 includes a plurality of electronic control units connected to each other via a communication network 12001. In the example of FIG. 70, the vehicle control system 12000 includes a drive-system control unit 12010, a body-system control unit 12020, a vehicle exterior information detection unit 12030, a vehicle interior information detection unit 12040, and an integrated-control unit 12050. Further, as the functional configuration of the integrated-control unit 12050, a microcomputer 12051, a sound/image output unit 12052, and an in-vehicle network interface (I/F) 12053 are shown.

The drive-system control unit 12010 executes various kinds of programs, to thereby control the operations of the devices related to the drive system of the vehicle. For example, the drive-system control unit 12010 functions as a control device that controls driving force generation devices such as an internal-combustion engine and a driving motor for generating a driving force of the vehicle, a driving force transmission mechanism for transmitting the driving force to wheels, a steering mechanism that adjusts the steering angle of the vehicle, a brake device that generates a braking force of the vehicle, and the like.

The body-system control unit 12020 executes various kinds of programs, to thereby control the operations of the various kinds devices equipped in a vehicle body. For example, the body-system control unit 12020 functions as a control device that controls a keyless entry system, a smart key system, a power window device, or various lamps such as head lamps, back lamps, brake lamps, side-turn lamps, and fog lamps. In this case, an electric wave transmitted from a mobile device in place of a key or signals from various switches may be input in the body-system control unit 12020. The body-system control unit 12020 receives the input electric wave or signal, and controls a door lock device, the power window device, the lamps, and the like of the vehicle.

The vehicle exterior information detection unit 12030 detects information outside the vehicle including the vehicle control system 12000. For example, an image capture unit 12031 is connected to the vehicle exterior information detection unit 12030. The vehicle exterior information detection unit 12030 causes the image capture unit 12031 to capture an environment image and receives the captured image. The vehicle exterior information detection unit 12030 may perform an object detection process of detecting a man, a vehicle, an obstacle, a sign, a signage on a road, or the like on the basis of the received image, or may perform a distance detection process on the basis of the received image.

The image capture unit 12031 is an optical sensor that receives light and outputs an electric signal corresponding to the amount of light received. The image capture unit 12031 may output the electric signal as an image or may output as distance measurement information. Further, the light that the image capture unit 12031 receives may be visible light or invisible light such as infrared light.

The vehicle interior information detection unit 12040 detects vehicle interior information. For example, a driver condition detector 12041 that detects the condition of a driver is connected to the vehicle interior information detection unit 12040. For example, the driver condition detector 12041 may include a camera that captures an image of a driver. The vehicle interior information detection unit 12040 may calculate the fatigue level or the concentration level of the driver on the basis of the detected information input from the driver condition detector 12041, and may determine whether the driver is sleeping.

The microcomputer 12051 may calculate the control target value of the driving force generation device, the steering mechanism, or the brake device on the basis of the vehicle interior/vehicle exterior information obtained by the vehicle exterior information detection unit 12030 or the vehicle interior information detection unit 12040, and may output a control command to the drive-system control unit 12010. For example, the microcomputer 12051 may perform coordinated control for the purpose of realizing the advanced driver assistance system (ADAS) function including avoiding a vehicle collision, lowering impacts of a vehicle collision, follow-up driving based on a distance between vehicles, constant speed driving, vehicle collision warning, a vehicle's lane departure warning, or the like.

Further, by controlling the driving force generation device, the steering mechanism, the brake device, or the like on the basis of information about the environment around the vehicle obtained by the vehicle exterior information detection unit 12030 or the vehicle interior information detection unit 12040, the microcomputer 12051 may perform coordinated control for the purpose of realizing self-driving, i.e., autonomous driving without the need of drivers' operations, and the like.

Further, the microcomputer 12051 may output a control command to the body-system control unit 12020 on the basis of vehicle exterior information obtained by the vehicle exterior information detection unit 12030. For example, the microcomputer 12051 may perform coordinated control including controlling the head lamps on the basis of the location of a leading vehicle or an oncoming vehicle detected by the vehicle exterior information detection unit 12030 and changing high beams to low beams, for example, for the purpose of anti-glare.

The sound/image output unit 12052 transmits at least one of a sound output signal and an image output signal to an output device, which is capable of notifying a passenger of the vehicle or a person outside the vehicle of information visually or auditorily. In the example of FIG. 70, an audio speaker 12061, a display unit 12062, and an instrument panel 12063 are shown as examples of the output devices. For example, the display unit 12062 may include at least one of an on-board display and a head-up display.

Figure 71:
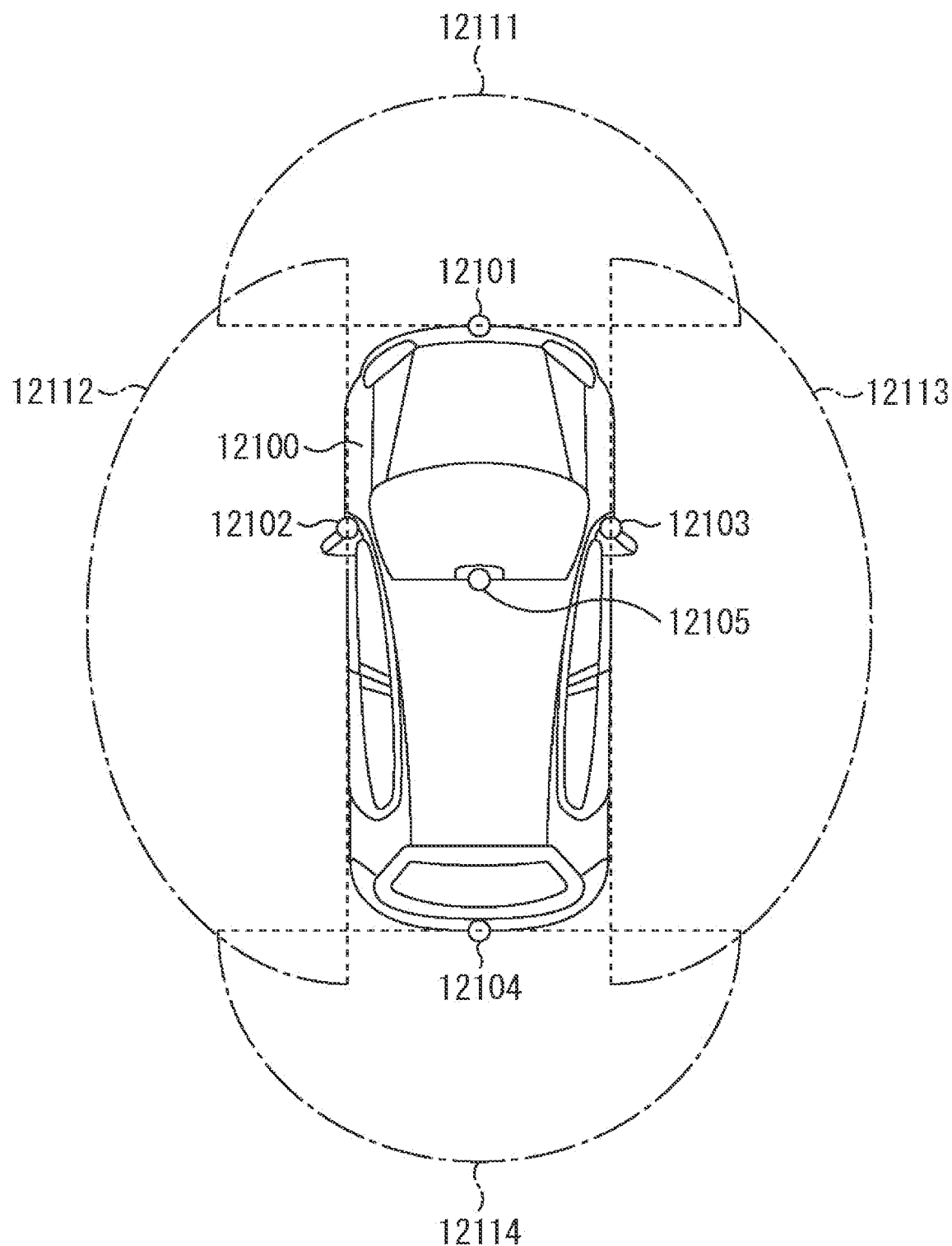
FIG. 71 is an explanatory diagram showing examples of mounting positions of a vehicle exterior information detection unit and image capture units.

FIG. 71 is a diagram showing examples of mounting positions of the image capture units 12031.

In FIG. 71, a vehicle 12100 includes, as the image capture units 12031, image capture units 12101, 12102, 12103, 12104, and 12105.

For example, the image capture units 12101, 12102, 12103, 12104, and 12105 are provided at positions such as the front nose, the side-view mirrors, the rear bumper or the rear door, and an upper part of the windshield in the cabin of the vehicle 12100. Each of the image capture unit 12101 on the front nose and the image capture unit 12105 on the upper part of the windshield in the cabin mainly obtains an image of the front of the vehicle 12100. Each of the image capture units 12102 and 12103 on the side-view mirrors mainly obtains an image of a side of the vehicle 12100. The image capture unit 12104 on the rear bumper or the rear door mainly obtains an image of the rear of the vehicle 12100. The image capture unit 12105 provided on the upper part of the windshield in the cabin is mainly used for detecting a leading vehicle or detecting a pedestrian, an obstacle, a traffic light, a traffic sign, a lane, or the like.

Note that FIG. 71 shows examples of image capture ranges of the image capture units 12101 to 12104. The image capture range 12111 indicates the image capture range of the image capture unit 12101 on the front nose, the image capture ranges 12112 and 12113 indicate the image capture ranges of the image capture units 12102 and 12103 on the side-view mirrors, respectively, and the image capture range 12114 indicates the image capture range of the image capture unit 12104 on the rear bumper or the rear door. For example, by overlaying the image data captured by the image capture units 12101 to 12104 each other, a plane image of the vehicle 12100 as viewed from above is obtained.

At least one of the image capture units 12101 to 12104 may have a function of obtaining distance information. For example, at least one of the image capture units 12101 to 12104 may be a stereo camera including a plurality of image sensors or an image sensor including pixels for phase difference detection.

For example, by obtaining the distance between the vehicle 12100 and each three-dimensional (3D) object in the image capture ranges 12111 to 12114 and the temporal change (relative speed to the vehicle 12100) of the distance on the basis of the distance information obtained from the image capture units 12101 to 12104, the microcomputer 12051 may extract, as a leading vehicle, a 3D object which is especially the closest 3D object driving on the track on which the vehicle 12100 is driving at a predetermined speed (e.g., 0 km/h or more) in the direction substantially the same as the driving direction of the vehicle 12100. Further, by presetting a distance between the vehicle 12100 and a leading vehicle to be secured, the microcomputer 12051 may perform autobrake control (including follow-up stop control), automatic acceleration control (including follow-up start-driving control), and the like. In this way, it is possible to perform coordinated control for the purpose of realizing self-driving, i.e., autonomous driving without the need of drivers' operations, and the like.

For example, the microcomputer 12051 may sort 3D object data of 3D objects into motorcycles, standard-size vehicles, large-size vehicles, pedestrians, and the other 3D objects such as utility poles on the basis of the distance information obtained from the image capture units 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is a preset value or more and when there is a possibility of a collision occurrence, the microcomputer 12051 may perform driving assistance to avoid a collision, in which the microcomputer 12051 outputs warning to the driver via the audio speaker 12061 or the display unit 12062, or mandatorily reduces the speed or performs collision-avoidance steering via the drive-system control unit 12010.

At least one of the image capture units 12101 to 12104 may be an infrared camera that detects infrared light. For example, the microcomputer 12051 may recognize a pedestrian by determining whether or not images captured by the image capture units 12101 to 12104 include the pedestrian. The method of recognizing a pedestrian includes, for example, the step of extracting characteristic points in the images captured by the image capture units 12101 to 12104 being infrared cameras, and the step of performing the pattern matching process with respect to a series of characteristic points indicating an outline of an object, to thereby determine whether or not the object is a pedestrian. Where the microcomputer 12051 determines that the images captured by the image capture units 12101 to 12104 include a pedestrian and recognizes the pedestrian, the sound/image output unit 12052 controls the display unit 12062 to display a rectangular contour superimposed on the recognized pedestrian to emphasize the pedestrian. Further, the sound/image output unit 12052 may control the display unit 12062 to display an icon or the like indicating a pedestrian at a desired position.

The above describes an example of the vehicle control system to which the technology according to the present disclosure may be applied. The technology according to the present disclosure may be applied to the image capture unit 12031 having the above-mentioned configuration. Specifically, the CMOS image sensor 10 shown in FIG. 1 can be applied to the image capture unit 12031. The image capture unit 12031, to which the technology according to the present disclosure is applied, is effective for more accurately recognizing an obstacle such as a pedestrian by acquiring a picked-up image with higher quality, because it is possible to improve the accuracy of phase difference detection while suppressing degradation of a picked-up image.

Note that embodiments of the present technology are not limited to the above-mentioned embodiments but various modifications can be made without departing from the gist of the present technology.

It should be noted that the present technology can also take the following configurations.

(1)

A solid-state imaging device, including:

a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

(2)

The solid-state imaging device according to (1) above, in which each of the plurality of pixels is a square unit pixel, and the projection portion is formed toward a center of the square unit pixel.

(3)

The solid-state imaging device according to (2) above, in which the inter-pixel separation unit is formed of a material embedded in a trench formed in a square lattice in a semiconductor layer in which the plurality of photoelectric conversion devices are formed, and physically separates adjacent pixels, and a part of the inter-pixel separation unit protrudes toward the center of the square unit pixel in a projecting shape to form the projection portion.

(4)

The solid-state imaging device according to (2) above, in which the inter-pixel light blocking unit is formed of a material formed in a square lattice in an area between the on-chip lens and a semiconductor layer in which the plurality of photoelectric conversion devices are formed, and blocks light between adjacent pixels, and a part of the inter-pixel light blocking unit protrudes toward the center of the square unit pixel in a projecting shape to form the projection portion.

(5)

The solid-state imaging device according to (2) above, in which the inter-pixel separation unit is formed of a material embedded in a trench formed in a square lattice in a semiconductor layer in which the plurality of photoelectric conversion devices are formed, and physically separates adjacent pixels, the inter-pixel light blocking unit is formed of a material formed in a square lattice in an area between the on-chip lens and a semiconductor layer in which the plurality of photoelectric conversion devices are formed, and blocks light between adjacent pixels, and a part of the inter-pixel separation unit and a part of the inter-pixel light blocking unit protrude toward the center of the square unit pixel in a projecting shape to form the projection portion.

(6)

The solid-state imaging device according to any one of (1) to (5) above, in which the square unit pixel forms an R pixel, a G pixel, or a B pixel corresponding to a red (R), green (G), or blue (B) color filter located immediately below the on-chip lens, respectively, and the projection portion is formed with respect to at least one of the R pixel, the G pixel, and the B pixel among the plurality of pixels arranged in the pixel array unit.

(7)

The solid-state imaging device according to (6) above, in which the projection portion is formed with respect to only the R pixel, the G pixel, or the B pixel.

(8)

The solid-state imaging device according to (6) above, in which the projection portion is formed with respect to all of the R pixel, the G pixel, and the B pixel.

(9)

The solid-state imaging device according to (6) above, in which the projection portion is formed with respect to a combination of two pixels out of the R pixel, the G pixel, and the B pixel.

(10)

The solid-state imaging device according to any one of (6) to (9) above, in which a projecting length of the projection portion differs for each of the R pixel, the G pixel, and the B pixel.

(11)

The solid-state imaging device according to any one of (2) to (10) above, in which a protruding length of the projection portion is determined depending on a focused spot diameter of the on-chip lens.

(12)

The solid-state imaging device according to (11) above, in which the protruding length of the projection portion corresponds to one seventh to one fourth a length of a side of a pitch of the on-chip lens.

(13)

The solid-state imaging device according to any one of (2) to (12) above, in which a depth of a cross section of the projection portion with respect to a surface on a light incident side differs for each projecting part having a projecting shape.

(14)

The solid-state imaging device according to any one of (3) to (5) above, in which the trench is formed from a first surface that is a surface on a light incident side or a second surface that is a surface opposite to the light incident side.

(15)

The solid-state imaging device according to any one of (2) to (14) above, in which in the square unit pixel, the plurality of photoelectric conversion devices formed in a semiconductor layer are separated by an impurity.

(16)

The solid-state imaging device according to any one of (2) to (15) above, in which an output of each of the plurality of photoelectric conversion devices is used for phase difference detection.

(17)

A solid-state imaging device, including:
a pixel array unit, a plurality of pixels being two-dimensionally arranged in the pixel array unit, one photoelectric conversion device being formed in each of the plurality of pixels, the pixel array unit including pixels arranged with respect to one on-chip lens, a part of at least one of an inter-pixel separation unit formed between pixels constituting the pixels arranged with respect to the one on-chip lens and an inter-pixel light blocking unit formed between the pixels constituting the pixels arranged with respect to the one on-chip lens protruding toward a center of the pixels arranged with respect to the one on-chip lens in a projecting shape to form a projection portion.

(18)

The solid-state imaging device according to (17) above, in which
the on-chip lens has an elliptical shape covering two consecutive pixels in a row direction or a column direction, and
a part of at least one of the inter-pixel separation unit and the inter-pixel light blocking unit protrudes between the two consecutive pixels to form the projection portion.

(19)

The solid-state imaging device according to (17) above, in which
the on-chip lens has a circular shape covering four pixels in two rows and two columns, and
a part of at least one of the inter-pixel separation unit and the inter-pixel light blocking unit protrudes toward a center of the four pixels to form the projection portion.

(20)

An electronic apparatus, including:
a solid-state imaging device including
a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

(21)

A solid-state imaging device, comprising:
a pixel array unit, a plurality of pixels being two-dimensionally arranged in the pixel array unit, the plurality of pixels including a pixel in which a plurality of photoelectric conversion devices is formed with respect to one on-chip lens, in which
a fixed charge amount differs between a first area between the plurality of photoelectric conversion devices and a second area excluding the first area on an interface on a side of a light incident surface in a semiconductor layer in which the plurality of photoelectric conversion devices is formed or in a vicinity thereof.

(22)

The solid-state imaging device according to (21) above, in which
the fixed charge amount in the first area is larger than the fixed charge amount in the second area.

(23)

The solid-state imaging device according to (21) or (22) above, in which
an insulation layer formed on the semiconductor layer includes an oxide film, a first film of a part corresponding to the first area, and a second film of a part corresponding to the second area, and
the first film and the second film include different high dielectric constant films.

(24)

The solid-state imaging device according to (23) above, in which
two or more different high dielectric constant films are stacked in at least one of the first film or the second film.

(25)

The solid-state imaging device according to (24) above, in which
the number of stacked layers in the first film is larger than that in the second film.

(26)

The solid-state imaging device according to (21) or (22) above, in which
an insulation layer formed on the semiconductor layer includes an oxide film and a high dielectric constant film, and
a part corresponding to the first area and a part corresponding to the second area in the insulation layer have different thicknesses of the oxide film.

(27)

The solid-state imaging device according to any one of (21) to (26) above, in which
the pixel is configured as a pixel of a color corresponding to a color filter disposed immediately below the on-chip lens.

(28)

The solid-state imaging device according to (27) above, in which
a first photoelectric conversion device formed in a pixel corresponding to a first color and a photoelectric conversion device formed in a pixel corresponding to a second color different from the first color are separated from each other by impurities.

(29)

The solid-state imaging device according to (27) above, in which
a first photoelectric conversion device formed in a pixel corresponding to a first color and a photoelectric conversion device formed in a pixel corresponding to a second color different from the first color are separated from each other by an inter-pixel separation unit containing an oxide film or metal.

(30)

The solid-state imaging device according to (27) above, in which
a transparent electrode is formed between the plurality of photoelectric conversion devices formed in a pixel corresponding to a specific color.

(31)

The solid-state imaging device according to any one of (27) to (30) above, in which
the pixel includes an R pixel, a G pixel, and a B pixel.

(32)

An electronic apparatus, comprising:
a solid-state imaging device that includes a pixel array unit, a plurality of pixels being two-dimensionally arranged in the pixel array unit, the plurality of pixels including a pixel in which a plurality of photoelectric conversion devices is formed with respect to one on-chip lens, in which a fixed charge amount differs between a first area between the plurality of photoelectric conversion devices and a second area excluding the first area on an interface on a side of a light incident surface in a semiconductor layer in which the plurality of photoelectric conversion devices is formed or in a vicinity thereof.

(33)

A solid-state imaging device, comprising:

a pixel array unit, a plurality of pixels being two-dimensionally arranged in the pixel array unit, the plurality of pixels including a pixel in which a plurality of photoelectric conversion devices is formed with respect to one on-chip lens, in which a first separation area is formed between the plurality of photoelectric conversion devices formed in a pixel corresponding to a specific color, a first embedding device containing a low-refractive material being embedded in the first separation area, and a second separation area is formed between a first photoelectric conversion device formed in a pixel corresponding to a first color and a second photoelectric conversion device formed in a pixel corresponding to a second color different from the first color, a second embedding device containing metal being embedded in the second separation area.

(34)

The solid-state imaging device according to (33) above, in which a cross section of the first separation area has a tapered shape in which a width increases as approaching a surface on a light incident side.

(35)

The solid-state imaging device according to (34) above, in which the cross section of the first separation area has a triangular shape.

(36)

The solid-state imaging device according to (35) above, in which the first embedding device disappears at a predetermined depth from the surface on the light incident side in the cross section of the first separation area, and an area below the first separation area is separated by impurities.

(37)

The solid-state imaging device according to (34) above, in which the cross section of the first separation area has a triangular shape from the surface on the light incident side to a predetermined depth and a rectangular shape below the predetermined depth.

(38)

The solid-state imaging device according to (34) above, in which the cross section of the first separation area has a trapezoidal shape tapered from the surface on the light incident side to a surface on a side opposite to the light incident side.

(39)

The solid-state imaging device according to any one of (33) to (38) above, in which a plane of the first separation area has a rectangular shape when viewed from the surface on the light incident side.

(40)

The solid-state imaging device according to any one of (33) to (38) above, in which a plane of the first separation area has a rhombus shape when viewed from the surface on the light incident side.

(41)

The solid-state imaging device according to any one of (33) to (40) above, in which the second embedding device further contains a low-refractive material, and the metal is embedded from the surface on the light incident side to a predetermine depth and the low-refractive material is embedded from a surface on a side opposite to the light incident side to a predetermined depth in a cross section of the second separation area.

(42)

The solid-state imaging device according to any one of (33) to (41) above, in which a fixed charge film is formed on a side wall of the second separation area.

(43)

The solid-state imaging device according to any one of (33) to (42) above, in which the pixel is configured as a pixel of a color corresponding to a color filter disposed immediately below the on-chip lens.

(44)

The solid-state imaging device according to (43) above, in which the pixel includes an R pixel, a G pixel, and a B pixel.

(45)

An electronic apparatus, comprising:

a solid-state imaging device that includes a pixel array unit, a plurality of pixels being two-dimensionally arranged in the pixel array unit, the plurality of pixels including a pixel in which a plurality of photoelectric conversion devices is formed with respect to one on-chip lens, in which a first separation area is formed between the plurality of photoelectric conversion devices formed in a pixel corresponding to a specific color, a first embedding device containing a low-refractive material being embedded in the first separation area, and a second separation area is formed between a first photoelectric conversion device formed in a pixel corresponding to a first color and a second photoelectric conversion device formed in a pixel corresponding to a second color different from the first color, a second embedding device containing metal being embedded in the second separation area.

(46)

A solid-state imaging device, comprising:

a pixel array unit, a plurality of pixels being two-dimensionally arranged in the pixel array unit, the plurality of pixels including a pixel in which a plurality of photoelectric conversion devices is formed with respect to one on-chip lens, in which the on-chip lens is formed of a plurality of types of substances.

(47)

The solid-state imaging device according to (46) above, in which the on-chip lens is formed of two types of substances having different refractive indexes.

(48)
The solid-state imaging device according to (47) above, in which
the on-chip lens is formed a first member having a first refractive index and a second member having a second refractive index lower than the first refractive index,
the first member includes a curved surface on which light is incident, and a part corresponding to a part having a V shape of the second member, and
the second member includes a surface on a side opposite to the curved surface on which light is incident and the part having a V shape.

(49)
The solid-state imaging device according to (46) above, in which
the on-chip lens is formed of three types of substances having different refractive indexes.

(50)
The solid-state imaging device according to (49) above, in which
the on-chip lens is formed of a first member having a first refractive index, a second member having a second refractive index, and a third member having a third refractive index,
the plurality of photoelectric conversion device formed in the pixel is physically separated by an inter-device separation unit,
the first member includes a curved surface on which light is incident, and a part corresponding to a part having a V shape of the second member,
the second member includes a surface on a side opposite to the curved surface on which light is incident and the part having a V shape, and
the third member is formed in an area corresponding to the inter-device separation unit.

(51)
The solid-state imaging device according to (49) above, in which
the pixel is configured as a pixel corresponding to a specific color, and
a height of the on-chip lens in the pixel differs for each specific color.

(52)
The solid-state imaging device according to (51) above, in which
the pixel includes an R pixel, a G pixel, and a B pixel, and
the height of the on-chip lens decreases in an order of the R pixel, the G pixel, and the B pixel.

(53)
The solid-state imaging device according to (49) above, in which
the pixel is configured as a pixel corresponding to a specific color, and
a curvature radius of the on-chip lens in the pixel differs for each specific color.

(54)
The solid-state imaging device according to (53) above, in which
the pixel includes an R pixel, a G pixel, and a B pixel, and
the curvature radius of the on-chip lens decreases in an order of the R pixel, the G pixel, and the B pixel.

(55)
The solid-state imaging device according to any one of (46) to (54) above, in which
the pixel is configured as a pixel of a color corresponding to a color filter disposed immediately below the on-chip lens.

(56)
The solid-state imaging device according to (46) above, in which
a control member that controls a dependency on an incident angle of light is formed for a member forming the on-chip lens.

(57)
The solid-state imaging device according to (56) above, in which
the on-chip lens is formed of a first member having a first refractive index and a second member having a second refractive index lower than the first refractive index,
the first member includes a curved surface on which light is incident, and a part corresponding to a part having a V shape of the second member,
the second member includes a surface on a side opposite to the curved surface on which light is incident and the part having a V shape, and
the control member is formed between the first member and the second member.

(58)
The solid-state imaging device according to (56) or (57) above, in which
the control member is a photonic crystal.

(59)
The solid-state imaging device according to any one of (56) to (58) above, in which
the pixel is configured as a pixel of a color corresponding to spectroscopy by the control member.

(60)
The solid-state imaging device according to (59) above, in which
the pixel includes an R pixel, a G pixel, and a B pixel.

(61)
An electronic apparatus, comprising:
a solid-state imaging device that includes a pixel array unit, a plurality of pixels being two-dimensionally arranged in the pixel array unit, the plurality of pixels including a pixel in which a plurality of photoelectric conversion devices is formed with respect to one on-chip lens, in which
the on-chip lens is formed of a plurality of types of substances.

(62)
A solid-state imaging device, comprising:
a pixel array unit, a plurality of pixels being two-dimensionally arranged in the pixel array unit, the plurality of pixels including a pixel in which a plurality of photoelectric conversion devices is formed with respect to one on-chip lens, in which
a first vertical transistor is formed, from a surface on a side opposite to a light incident side, between the plurality of photoelectric conversion devices formed in a pixel corresponding to a specific color.

(63)
The solid-state imaging device according to (62) above, in which
a blooming path is formed between the plurality of photoelectric conversion devices by applying a voltage to the first vertical transistor.

(64)
The solid-state imaging device according to (62) or (63) above, in which
a second vertical transistor is formed, from the surface on the side opposite to the light incident side, between a first photoelectric conversion device formed in a pixel corresponding to a first color and a second photoelectric conversion device formed in a pixel corresponding to a second color different from the first color.

(65)

The solid-state imaging device according to (64) above, in which charges are generated by applying a voltage to the second vertical transistor.

(66)

The solid-state imaging device according to (64) or (65) above, in which an inter-pixel separation unit is formed, from a surface on the light incident side, between the first photoelectric conversion device and the second photoelectric conversion device.

(67)

The solid-state imaging device according to any one of (62) to (66) above, in which the pixel is configured as a pixel of a color corresponding to a color filter disposed immediately below the on-chip lens.

(68)

The solid-state imaging device according to (67) above, in which the pixel includes an R pixel, a G pixel, and a B pixel.

(69)

An electronic apparatus, comprising:

a solid-state imaging device that includes a pixel array unit, a plurality of pixels being two-dimensionally arranged in the pixel array unit, the plurality of pixels including a pixel in which a plurality of photoelectric conversion devices is formed with respect to one on-chip lens, in which a first vertical transistor is formed, from a surface on a side opposite to a light incident side, between the plurality of photoelectric conversion devices formed in a pixel corresponding to a specific color.

REFERENCE SIGNS LIST

10 CMOS image sensor
11 pixel array unit
100, 100-*ij* pixel
111, 111E on-chip lens
112 color filter
113A, 113B photoelectric conversion device
114 inter-pixel light blocking unit
114P projection portion
115 inter-pixel separation unit
115P projection portion
151A, 151B transfer gate unit
200 pixel
210 silicon layer
211 on-chip lens
212 color filter
213A, 213B photoelectric conversion device
214 inter-pixel light blocking unit
215 inter-pixel separation unit
220 interface layer
221 central area
222 right-and-left area
230 insulation layer
231 oxide film
232A, 232B, 232C, 232D, 232E High-k film
233 oxide film
241 transparent electrode
300 pixel
310 silicon layer
311 on-chip lens
312 color filter
313A, 313B photoelectric conversion device
314 inter-pixel light blocking unit
315 inter-pixel separation unit
321 inter-same-color central portion
322 inter-different-color central portion
331 low refraction area
341 low refraction area
400 pixel
410 silicon layer
411, 411E on-chip lens
411A, 411B, 411C member
412 color filter
413A, 413B photoelectric conversion device
414 inter-pixel light blocking unit
415 inter-pixel separation unit
416 device separation unit
421, 421R, 421G, 421B control member
500 pixel
510 silicon layer
511 on-chip lens
512 color filter
513A, 513B photoelectric conversion device
514 inter-pixel light blocking unit
515 inter-pixel separation unit
521 inter-same-color central portion
522 inter-different-color central portion
531 vertical transistor
532 vertical transistor
1000 electronic apparatus
1001 solid-state imaging device
12031 image capture unit

What is claimed is:

1. An imaging device, comprising:
a plurality of pixels arranged two-dimensionally in a plan view,
wherein each pixel of the plurality of pixels includes a first photoelectric conversion region and a second photoelectric conversion region disposed in a semiconductor substrate, and first material,
wherein, in a cross-sectional view, the first material is disposed between at least a portion of the first photoelectric conversion region and at least a portion of the second photoelectric conversion region, and
wherein a refractive index of the first material is less than a refractive index of the semiconductor substrate.

2. The imaging device according to claim 1, wherein, in the plan view, the first material protrudes toward a center of a corresponding pixel.

3. The imaging device according to claim 1, wherein, in the cross-sectional view, the first material has a triangular shape that is tapered and that decreases in width with distance from a light incident surface of the semiconductor substrate.

4. The imaging device according to claim 1, wherein the first material is a low refractive index material.

5. The imaging device according to claim 1, wherein the first material is an oxide film.

6. The imaging device according to claim 1, wherein the first material is glass.

7. The imaging device according to claim 1, wherein, in the cross-sectional view, the first and second photoelectric conversion regions are further separated by impurities in at least an area not occupied by the first material.

8. The imaging device according to claim 7, wherein each pixel in the plurality of pixels is separated from each neighboring pixel by an inter-pixel separation unit.

9. The imaging device according to claim 8, wherein the inter-pixel separation unit is a metal.

10. The imaging device according to claim 9, wherein the metal is tungsten, aluminum, silver, or rhodium.

11. The imaging device according to claim 1, further comprising:
a plurality of on-chip lenses, wherein each pixel in the plurality of pixels includes one on-chip lens.

12. The imaging device according to claim 11, further comprising:
a plurality of color filters, wherein each pixel in the plurality of pixels includes one color filter.

13. The imaging device according to claim 12, further comprising:
an inter-pixel light blocking unit that extends along boundaries of color filters of neighboring pixels.

14. The imaging device according to claim 1, wherein the substrate is a silicon substrate.

15. The imaging device according to claim 11, wherein for each pixel in the plurality of pixels a part of at least one of an inter-pixel separation unit formed between the plurality of pixels and an inter-pixel light blocking unit formed between the plurality of pixels protrudes toward a center of a corresponding pixel in a projecting shape to form a projection portion.

16. The imaging device according to claim 15, wherein, in the plan view, each pixel in the plurality of pixels is square, and wherein the projection portion extends toward a center of the square.

17. The imaging device according to claim 16, wherein the inter-pixel separation unit is formed of a material embedded in a trench formed in a square lattice in a semiconductor layer in which the photoelectric conversion regions are formed.

18. The imaging device according to claim 15, wherein the inter-pixel separation unit is formed of a material embedded in a trench formed in a square lattice in a semiconductor layer in which the photoelectric conversion regions are formed, and physically separates adjacent pixels, and wherein the inter-pixel light blocking unit is formed of a material formed in a square lattice in an area between the on-chip lens and a semiconductor layer in which the photoelectric conversion regions are formed and blocks light between adjacent pixels.

19. The imaging device according to claim 18, wherein a part of the inter-pixel separation unit and a part of the inter-pixel light blocking unit protrude toward a center of the square unit pixel in a projecting shape to form the projection portion.

20. The imaging device according to claim 19, wherein a protruding length of the projection portion depends on a focused spot diameter of the on-chip lens.

* * * * *